US012793795B2

(12) United States Patent
Shibuya et al.

(10) Patent No.: US 12,793,795 B2
(45) Date of Patent: Nov. 10, 2026

(54) SEMICONDUCTOR MEMORY DEVICE

(71) Applicant: Kioxia Corporation, Tokyo (JP)

(72) Inventors: Taira Shibuya, Fujisawa Kanagawa (JP); Noboru Shibata, Kawasaki Kanagawa (JP); Hironori Uchikawa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 915 days.

(21) Appl. No.: 17/348,814

(22) Filed: Jun. 16, 2021

(65) Prior Publication Data

US 2021/0398598 A1 Dec. 23, 2021

(30) Foreign Application Priority Data

Jun. 19, 2020 (JP) ................................ 2020-106456

(51) Int. Cl.

| | |
|---|---|
| ***H04W 36/36*** | (2009.01) |
| ***G11C 7/06*** | (2006.01) |
| ***G11C 16/08*** | (2006.01) |
| ***G11C 16/12*** | (2006.01) |
| ***G11C 16/26*** | (2006.01) |
| ***G11C 16/34*** | (2006.01) |

(Continued)

(52) U.S. Cl.

CPC .......... *G11C 16/3404* (2013.01); *G11C 7/065* (2013.01); *G11C 16/08* (2013.01); *G11C 16/12* (2013.01); *G11C 16/26* (2013.01); *G11C 16/3459* (2013.01)

(58) Field of Classification Search

CPC ..... G11C 16/3404; G11C 7/065; G11C 16/08; G11C 16/12; G11C 16/26; G11C 16/3459; G11C 16/24; G11C 7/1006; G11C 16/32; G11C 2211/5642; G11C 2211/5643; G11C 11/5642

See application file for complete search history.

(56) References Cited

U.S. PATENT DOCUMENTS

| | | | |
|---|---|---|---|
| 9,190,161 | B2 | 11/2015 | Shibata |
| 9,224,476 | B2 | 12/2015 | Shibata |

(Continued)

FOREIGN PATENT DOCUMENTS

| | | | |
|---|---|---|---|
| JP | 2017224370 | A | 12/2017 |
| JP | 2020107387 | A | 7/2020 |

OTHER PUBLICATIONS

U.S. Appl. No. 17/244,246, First Named Inventor: Noboru Shibata; Title: "Semiconductor Memory"; filed Apr. 29, 2021.

(Continued)

*Primary Examiner* — Joshua L Schwartz

(74) *Attorney, Agent, or Firm* — Holtz, Holtz & Volek PC

(57) ABSTRACT

A semiconductor memory device according to an embodiment includes first memory cells, second memory cells, and a controller. A threshold voltage of each of the first memory cells and the second memory cells is included in one of first through sixteenth state. 8-bit data that includes a first through eighth bit is stored using a combination of a threshold voltage of the first memory cell and a threshold voltage of the second memory cell. The controller is configured to: apply in parallel a plurality of types of read voltages to each of the first memory cells and the second memory cells and externally output data confirmed based on first data read from the first memory cells and second data read from the second memory cells.

7 Claims, 88 Drawing Sheets

(51) Int. Cl.

| | |
|---|---|
| ***H04W 36/00*** | (2009.01) |
| ***H04W 36/08*** | (2009.01) |
| ***H04W 36/24*** | (2009.01) |

(56) References Cited

U.S. PATENT DOCUMENTS

| | | | | |
|---|---|---|---|---|
| 9,558,828 | B2 | 1/2017 | Shibata | |
| 9,799,406 | B2 | 10/2017 | Sato et al. | |
| 10,049,749 | B2 | 8/2018 | Shibata | |
| 10,121,536 | B2 | 11/2018 | Wang et al. | |
| 10,566,051 | B2 | 2/2020 | Shibata et al. | |
| 10,714,170 | B2 | 7/2020 | Shibata et al. | |
| 10,916,300 | B2 | 2/2021 | Shibata | |
| 10,943,651 | B2 | 3/2021 | Shibata et al. | |
| 11,011,239 | B2 | 5/2021 | Shibata et al. | |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2010/0214838 | A1 | 8/2010 | Hishida et al. | |
| 2011/0284946 | A1 | 11/2011 | Kiyotoshi | |
| 2012/0069663 | A1 | 3/2012 | Itagaki et al. | |
| 2016/0027504 | A1* | 1/2016 | Lee | G11C 16/14 365/185.03 |
| 2018/0181301 | A1 | 6/2018 | Bandic et al. | |
| 2019/0259458 | A1 | 8/2019 | Shibata et al. | |
| 2020/0211655 | A1 | 7/2020 | Shibata et al. | |
| 2020/0365212 | A1* | 11/2020 | Lee | G06F 11/1048 |
| 2021/0019087 | A1* | 1/2021 | Kim | G06F 3/0604 |
| 2021/0118495 | A1 | 4/2021 | Shibata et al. | |
| 2021/0151099 | A1 | 5/2021 | Shibata et al. | |

OTHER PUBLICATIONS

Qin, "Fractional Bits-per-cell for NANO Flash with Low Read Latency", IEEE, 2017.

* cited by examiner

8bit/2cell : 2-2-2-3-3-3-3-3 Coding (1st embodiment)

| Page | Decoding rules [a,b,c,d] | Read voltages to use | |
|---|---|---|---|
| | | MTa | MTb |
| PG1 | [1,0,0,1] | R5,R15 | R4,R12 |
| PG2 | [1,0,0,1] | R1,R11 | R5,R13 |
| PG3 | [1,0,0,1] | R7,R9 | R3,R11 |
| PG4 | [1,0,0,1] | R2,R6,R14 | R6,R8,R10 |
| PG5 | [1,0,0,1] | R4,R10,R12 | R6,R8,R10 |
| PG6 | [1,0,0,1] | R3,R8,R13 | R4,R12 |
| PG7 | [1,0,0,1] | R1,R11 | R2,R9,R15 |
| PG8 | [1,0,0,1] | R7,R9 | R1,R7,R14 |

F I G. 11

Decoding rules (1st embodiment)

| Read results | | Decoding rules |
|---|---|---|
| MTa | MTb | |
| 1 | 1 | a |
| 1 | 0 | b |
| 0 | 1 | c |
| 0 | 0 | d |

F I G. 12

| | | | | | | | | | | | | | | | | |
|---|---|---|---|---|---|---|---|---|---|---|---|---|---|---|---|---|
| PG1 | 1 | 1 | 1 | 1 | 1 | 0 | 0 | 0 | 0 | 0 | 0 | 0 | 0 | 0 | 0 | 1 |
| PG2,7 | 1 | 0 | 0 | 0 | 0 | 0 | 0 | 0 | 0 | 0 | 0 | 1 | 1 | 1 | 1 | 1 |
| PG3,8 | 1 | 1 | 1 | 1 | 1 | 1 | 1 | 0 | 0 | 1 | 1 | 1 | 1 | 1 | 1 | 1 |
| PG4 | 1 | 1 | 0 | 0 | 0 | 0 | 1 | 1 | 1 | 1 | 1 | 1 | 1 | 1 | 0 | 0 |
| PG5 | 1 | 1 | 1 | 1 | 0 | 0 | 0 | 0 | 0 | 0 | 1 | 1 | 0 | 0 | 0 | 0 |
| PG6 | 1 | 1 | 1 | 0 | 0 | 0 | 0 | 0 | 1 | 1 | 1 | 1 | 1 | 0 | 0 | 0 |

| | | | | | | | | | | | | | | | | |
|---|---|---|---|---|---|---|---|---|---|---|---|---|---|---|---|---|
| PG1,6 | 1 | 1 | 1 | 1 | 0 | 0 | 0 | 0 | 0 | 0 | 0 | 0 | 1 | 1 | 1 | 1 |
| PG2 | 1 | 1 | 1 | 1 | 1 | 0 | 0 | 0 | 0 | 0 | 0 | 0 | 0 | 1 | 1 | 1 |
| PG3 | 1 | 1 | 1 | 0 | 0 | 0 | 0 | 0 | 0 | 0 | 0 | 1 | 1 | 1 | 1 | 1 |
| PG4,5 | 1 | 1 | 1 | 1 | 1 | 1 | 0 | 0 | 1 | 1 | 0 | 0 | 0 | 0 | 0 | 0 |
| PG7 | 1 | 1 | 0 | 0 | 0 | 0 | 0 | 0 | 0 | 1 | 1 | 1 | 1 | 1 | 1 | 0 |
| PG8 | 1 | 0 | 0 | 0 | 0 | 0 | 0 | 1 | 1 | 1 | 1 | 1 | 1 | 1 | 0 | 0 |

PG4 read operation (1st embodiment)

4bit/1cell: 4-4-3-4 Coding (Comparative example of 1st embodiment)

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Uppermost | 1 | 1 | 1 | 1 | 1 | 0 | 0 | 0 | 0 | 0 | 1 | 1 | 0 | 0 | 0 | 1 |
| Upper | 1 | 1 | 0 | 0 | 0 | 0 | 0 | 0 | 1 | 1 | 1 | 1 | 1 | 1 | 0 | 0 |
| Middle | 1 | 1 | 1 | 0 | 0 | 0 | 0 | 1 | 1 | 0 | 0 | 0 | 0 | 1 | 1 | 1 |
| Lower | 1 | 0 | 0 | 0 | 1 | 1 | 0 | 0 | 0 | 0 | 0 | 1 | 1 | 1 | 1 | 1 |

8bit/2cell : 2-2-2-3-3-3-3-3 Coding (1st modification of 1st embodiment)

| Page | Decoding rules [a,b,c,d] | Read voltages to use | |
|---|---|---|---|
| | | MTa | MTb |
| PG1 | [1,0,0,1] | R5,R15 | R4,R12 |
| PG2 | [1,0,0,1] | R1,R11 | R3,R11 |
| PG3 | [1,0,0,1] | R7,R9 | R5,R13 |
| PG4 | [1,0,0,1] | R2,R6,R14 | R6,R8,R10 |
| PG5 | [1,0,0,1] | R4,R10,R12 | R6,R8,R10 |
| PG6 | [1,0,0,1] | R3,R8,R13 | R4,R12 |
| PG7 | [1,0,0,1] | R1,R11 | R1,R7,R14 |
| PG8 | [1,0,0,1] | R7,R9 | R2,R9,R15 |

FIG. 24

8bit/2cell : 2-2-2-3-3-3-3-3 Coding (2nd modification of 1st embodiment)

| Page | Decoding rules [a,b,c,d] | Read voltages to use | |
|---|---|---|---|
| | | MTa | MTb |
| PG1 | [1,0,0,1] | R5,R15 | R5,R13 |
| PG2 | [1,0,0,1] | R1,R11 | R4,R12 |
| PG3 | [1,0,0,1] | R7,R9 | R3,R11 |
| PG4 | [1,0,0,1] | R2,R10,R14 | R6,R8,R10 |
| PG5 | [1,0,0,1] | R4,R6,R12 | R6,R8,R10 |
| PG6 | [1,0,0,1] | R3,R8,R13 | R4,R12 |
| PG7 | [1,0,0,1] | R5,R15 | R2,R9,R15 |
| PG8 | [1,0,0,1] | R7,R9 | R1,R7,R14 |

FIG. 25

8bit/2cell: 2-2-2-3-3-3-3-3 Coding (3rd modification of 1st embodiment)

| Page | Decoding rules [a,b,c,d] | Read voltages to use | |
|---|---|---|---|
| | | MTa | MTb |
| PG1 | [1,0,0,1] | R5,R15 | R3,R11 |
| PG2 | [1,0,0,1] | R1,R11 | R4,R12 |
| PG3 | [1,0,0,1] | R7,R9 | R5,R13 |
| PG4 | [1,0,0,1] | R2,R10,R14 | R6,R8,R10 |
| PG5 | [1,0,0,1] | R4,R6,R12 | R6,R8,R10 |
| PG6 | [1,0,0,1] | R3,R8,R13 | R4,R12 |
| PG7 | [1,0,0,1] | R5,R15 | R1,R7,R14 |
| PG8 | [1,0,0,1] | R7,R9 | R2,R9,R15 |

8bit/4cell: 1-1-1-1-1-1-1-2 Coding (2nd embodiment)

| Page | Decoding rules [a,b,c,d,e,f,g,h,i,j,k,l,m,n,o,p] | Read voltages to use | |
|---|---|---|---|
| | | MTa,MTb | MTc,MTd |
| PG1 | [1,0,0,1,0,1,1,0,0,1,1,0,1,0,0,1] | R1 | R2 |
| PG2 | [1,0,1,0,1,0,1,0,0,1,0,1,0,1,0,1] | R1 | R2 |
| PG3 | [1,0,1,0,1,0,1,0,0,1,0,1,0,1,0,1] | R3 | R2 |
| PG4 | [1,1,0,0,0,0,1,1,1,1,0,0,0,0,1,1] | R3 | R2 |
| PG5 | [1,1,0,0,1,1,0,0,0,0,1,1,0,0,1,1] | R2 | R3 |
| PG6 | [1,1,0,0,1,1,0,0,0,0,1,1,0,0,1,1] | R2 | R3 |
| PG7 | [1,1,1,1,0,0,0,0,1,1,1,1,0,0,0,0] | R2 | R1 |
| PG8 | [1,0,1,0,1,0,1,0,1,0,1,0,1,0,1,0] | – | R1,R3 |

Decoding rules (2nd embodiment)

| Read results | | | | Decoding rule |
|---|---|---|---|---|
| Memory cell array 10A | | Memory cell array 10B | | |
| MTa | MTb | MTc | MTd | |
| 1 | 1 | 1 | 1 | a |
| 1 | 1 | 1 | 0 | b |
| 1 | 1 | 0 | 1 | c |
| 1 | 1 | 0 | 0 | d |
| 1 | 0 | 1 | 1 | e |
| 1 | 0 | 1 | 0 | f |
| 1 | 0 | 0 | 1 | g |
| 1 | 0 | 0 | 0 | h |
| 0 | 1 | 1 | 1 | i |
| 0 | 1 | 1 | 0 | j |
| 0 | 1 | 0 | 1 | k |
| 0 | 1 | 0 | 0 | l |
| 0 | 0 | 1 | 1 | m |
| 0 | 0 | 1 | 0 | n |
| 0 | 0 | 0 | 1 | o |
| 0 | 0 | 0 | 0 | p |

F I G. 30

PG5&PG6 read operation (2nd embodiment)

2bit/1cell: 1-2 Coding (Comparative example of 2nd embodiment)

| Page | Data | | | |
|---|---|---|---|---|
| | S0 | S1 | S2 | S3 |
| Upper | 1 | 0 | 0 | 1 |
| Lower | 1 | 1 | 0 | 0 |

8bit/4cell: 1-1-1-1-1-1-1-2 Coding (1st modification of 2nd embodiment)

| Page | Decoding rules [a,b,c,d,e,f,g,h,i,j,k,l,m,n,o,p] | Read voltages to use | |
|---|---|---|---|
| | | MTa,MTb | MTc,MTd |
| PG1 | [1,0,1,0,0,1,0,1,1,0,1,0,0,1,0,0] | R1 | R2 |
| PG2 | [1,0,1,0,1,0,1,0,0,1,0,1,0,1,0,0] | R1 | R2 |
| PG3 | [1,0,0,1,1,0,0,1,0,1,1,0,0,1,1,0] | R3 | R2 |
| PG4 | [1,0,0,1,1,0,0,1,0,1,1,0,0,1,1,0] | R3 | R2 |
| PG5 | [1,0,1,0,0,1,0,1,1,0,1,0,0,1,0,0] | R2 | R3 |
| PG6 | [1,0,1,0,1,0,1,0,0,1,0,1,0,1,0,0] | R2 | R3 |
| PG7 | [1,1,1,1,0,0,0,0,1,1,1,1,0,0,0,0] | R2 | R1 |
| PG8 | [1,1,0,0,1,1,0,0,1,1,0,0,1,1,0,0] | – | R1,R3 |

8bit/4cell: 1-1-1-1-1-1-1-2 Coding (2nd modification of 2nd embodiment)

| Page | Decoding rules [a,b,c,d,e,f,g,h,i,j,k,l,m,n,o,p] | Read voltages to use | |
|---|---|---|---|
| | | MTa,MTb | MTc,MTd |
| PG1 | [1,0,0,1,0,1,1,0,1,0,0,1,0,1,1,0] | R2 | R1 |
| PG2 | [1,0,1,0,1,0,1,0,0,1,0,1,0,1,0,0] | R2 | R1 |
| PG3 | [1,0,1,0,1,0,1,0,1,0,1,0,1,0,1,0] | R3 | R2 |
| PG4 | [1,0,0,1,1,0,0,1,0,1,1,0,0,1,1,0] | R3 | R2 |
| PG5 | [1,0,1,0,1,0,1,0,0,1,0,1,0,1,0,0] | R2 | R3 |
| PG6 | [1,1,0,0,0,0,1,1,1,1,0,0,0,0,1,0] | R2 | R3 |
| PG7 | [1,1,0,0,1,1,0,0,0,0,1,1,0,0,1,0] | R1 | R2 |
| PG8 | [1,1,1,1,0,0,0,0,1,1,1,1,0,0,0,0] | R1,R3 | – |

F I G. 37

8bit/4cell: 1-1-1-1-1-1-1-2 Coding (3rd modification of 2nd embodiment)

| Page | Decoding rules [a,b,c,d,e,f,g,h,i,j,k,l,m,n,o,p] | Read voltages to use | |
|---|---|---|---|
| | | MTa,MTb | MTc,MTd |
| PG1 | [1,0,0,1,1,0,0,1,0,1,1,0,0,1,1,0] | R2 | R1 |
| PG2 | [1,0,1,0,0,1,0,1,1,0,1,0,0,1,0,0] | R2 | R1 |
| PG3 | [1,0,1,0,1,0,1,0,1,0,1,0,1,0,1,0] | R3 | R2 |
| PG4 | [1,0,0,1,0,1,1,0,1,0,0,1,0,1,1,0] | R3 | R2 |
| PG5 | [1,0,1,0,0,1,0,1,1,0,1,0,0,1,0,0] | R2 | R3 |
| PG6 | [1,1,0,0,0,0,1,1,1,1,0,0,0,0,1,0] | R2 | R3 |
| PG7 | [1,1,0,0,1,1,0,0,0,0,1,1,0,0,1,0] | R1 | R2 |
| PG8 | [1,1,1,1,1,1,1,1,0,0,0,0,0,0,0,0] | R1,R3 | – |

F I G. 38

8bit/4cell: 1-1-1-1-1-1-1-2 Coding (4th modification of 2nd embodiment)

| Page | Decoding rules [a,b,c,d,e,f,g,h,i,j,k,l,m,n,o,p] | Read voltages to use | |
|---|---|---|---|
| | | MTa,MTb | MTc,MTd |
| PG1 | [1,0,0,1,0,1,1,0,1,0,0,1,0,1,1,0] | R1 | R2 |
| PG2 | [1,0,1,0,1,0,1,0,1,0,1,0,1,0,1,0] | R1 | R2 |
| PG3 | [1,0,0,1,1,0,0,1,0,1,1,0,0,1,1,0] | R2 | R1 |
| PG4 | [1,0,1,0,0,1,0,1,1,0,1,0,0,1,0,0] | R2 | R1 |
| PG5 | [1,0,1,0,0,1,0,1,1,0,1,0,0,1,0,0] | R2 | R3 |
| PG6 | [1,1,0,0,0,0,1,1,1,1,0,0,0,0,1,0] | R2 | R3 |
| PG7 | [1,1,0,0,1,1,0,0,0,0,1,1,0,0,1,0] | R3 | R2 |
| PG8 | [1,1,1,1,1,1,1,1,0,0,0,0,0,0,0,0] | R1,R3 | – |

FIG. 39

8bit/4cell: 1-1-1-1-1-1-1-2 Coding (5th modification of 2nd embodiment)

| Page | Decoding rules [a,b,c,d,e,f,g,h,i,j,k,l,m,n,o,p] | Read voltages to use | |
|---|---|---|---|
| | | MTa,MTb | MTc,MTd |
| PG1 | [1,0,1,0,1,0,1,0,1,0,1,0,1,0,1,0] | R1 | R2 |
| PG2 | [1,0,0,1,1,0,0,1,0,1,1,0,0,1,1,0] | R1 | R2 |
| PG3 | [1,0,0,1,0,1,1,0,1,0,0,1,0,1,1,0] | R2 | R1 |
| PG4 | [1,0,1,0,1,0,1,0,0,1,0,1,0,1,0,0] | R2 | R1 |
| PG5 | [1,0,1,0,1,0,1,0,0,1,0,1,0,1,0,0] | R2 | R3 |
| PG6 | [1,1,0,0,0,0,1,1,1,1,0,0,0,0,1,0] | R2 | R3 |
| PG7 | [1,1,0,0,1,1,0,0,0,0,1,1,0,0,1,0] | R3 | R2 |
| PG8 | [1,1,1,1,0,0,0,0,1,1,1,1,0,0,0,0] | R1,R3 | – |

5bit/2cell : 1-2-2-2-2 Coding (3rd embodiment)

| Page | Decoding rules [a,b,c,d] | Read voltages to use | |
|---|---|---|---|
| | | MTa | MTb |
| PG1 | [1,1,1,0] | R2 | R2 |
| PG2 | [1,0,1,0] | – | R1,R4 |
| PG3 | [1,1,0,0] | R1,R4 | – |
| PG4 | [1,0,0,1] | R3,R5 | R2 |
| PG5 | [1,0,0,1] | R2 | R3,R5 |

2bit/1cell · 1-2 Coding (3rd embodiment)

| Page | Data | | | |
|---|---|---|---|---|
| | S0 | S2 | S4 | S5 |
| PG2 | 1 | 0 | 0 | 1 |
| PG1 | 1 | 1 | 0 | 0 |

7bit/2cell : 1-4-4-3-3-4-4 Coding (4th embodiment)

| Page | Decoding rules [a,b,c,d] | Read voltages to use | |
|---|---|---|---|
| | | MTa | MTb |
| PG1 | [1,1,1,0] | R4 | R4 |
| PG2 | [1,0,0,1] | R4 | R6,R9,R11 |
| PG3 | [1,0,0,1] | R6,R9,R11 | R4 |
| PG4 | [1,1,0,0] | R1,R3,R8 | – |
| PG5 | [1,0,1,0] | – | R1,R3,R8 |
| PG6 | [1,1,0,0] | R2,R5,R7,R10 | – |
| PG7 | [1,0,1,0] | – | R2,R5,R7,R10 |

3bit/1cell: 2-3-2 Coding (Modification of 4th embodiment)

| Page | Data | | | | | | | |
|---|---|---|---|---|---|---|---|---|
| | S0 | S2 | S3 | S4 | S7 | S8 | S9 | S11 |
| PG3 | 1 | 1 | 1 | 0 | 0 | 0 | 0 | 1 |
| PG2 | 1 | 1 | 0 | 0 | 1 | 1 | 0 | 0 |
| PG1 | 1 | 0 | 0 | 0 | 0 | 1 | 1 | 1 |

9bit/2cell: 1-6-6-5-5-6-6-6-6 Coding (5th embodiment)

| Page | Decoding rules [a,b,c,d] | Read voltages to use | |
|---|---|---|---|
| | | MTa | MTb |
| PG1 | [1,1,1,0] | R8 | R8 |
| PG2 | [1,0,0,1] | R8 | R10,R12,R14,R19,R23 |
| PG3 | [1,0,0,1] | R10,R12,R14,R19,R23 | R8 |
| PG4 | [1,1,0,0] | R1,R3,R5,R7,R16 | – |
| PG5 | [1,0,1,0] | – | R1,R3,R5,R7,R16 |
| PG6 | [1,1,0,0] | R2,R6,R9,R13,R17,R21 | – |
| PG7 | [1,0,1,0] | – | R2,R6,R9,R13,R17,R21 |
| PG8 | [1,1,0,0] | R4,R11,R15,R18,R20,R22 | – |
| PG9 | [1,0,1,0] | – | R4,R11,R15,R18,R20,R22 |

F I G. 68

3bit/1cell : 2-3-2 Coding (1st modification of 5th embodiment)

| Page | Data | | | | | | | |
|---|---|---|---|---|---|---|---|---|
| | S0 | S2 | S5 | S8 | S11 | S14 | S17 | S20 |
| PG3 | 1 | 1 | 1 | 0 | 0 | 0 | 0 | 1 |
| PG2 | 1 | 1 | 0 | 0 | 1 | 1 | 0 | 0 |
| PG1 | 1 | 0 | 0 | 0 | 0 | 1 | 1 | 1 |

4bit/1cell : 4-4-3-4 Coding (2nd modification of 5th embodiment)

| Page | Data | | | | | | | | | | | | | | | |
|---|---|---|---|---|---|---|---|---|---|---|---|---|---|---|---|---|
| | S0 | S2 | S3 | S5 | S6 | S8 | S9 | S11 | S12 | S14 | S15 | S17 | S18 | S20 | S21 | S22 |
| Uppermost | 1 | 1 | 1 | 1 | 1 | 0 | 0 | 0 | 0 | 0 | 1 | 1 | 0 | 0 | 0 | 1 |
| Upper | 1 | 1 | 0 | 0 | 0 | 0 | 0 | 0 | 1 | 1 | 1 | 1 | 1 | 1 | 0 | 0 |
| Middle | 1 | 1 | 1 | 0 | 0 | 0 | 0 | 1 | 1 | 0 | 0 | 0 | 0 | 1 | 1 | 1 |
| Lower | 1 | 0 | 0 | 0 | 1 | 1 | 0 | 0 | 0 | 0 | 0 | 1 | 1 | 1 | 1 | 1 |

5bit/2cell : 1-2-2-2-2 Coding (6th embodiment)

| Page | Decoding rules [a,b,c,d] | Read voltages to use | |
|---|---|---|---|
| | | MTc | MTd |
| PG1 | [1,0,0,0] | R4 | R4 |
| PG2 | [1,0,1,0] | – | R2,R5 |
| PG3 | [1,1,0,0] | R2,R5 | – |
| PG4 | [1,0,0,1] | R4 | R1,R3 |
| PG5 | [1,0,0,1] | R1,R3 | R4 |

Combinations of read pages (6th embodiment)

| Page | Read pages to be output | |
|---|---|---|
| | CR1 | CR2 |
| Upper | PG2,PG3 | PG1,PG4,PG5 |
| Lower | PG1,PG4,PG5 | PG2,PG3 |

Combinations of read pages (7th embodiment)

| Page | Read pages to be output | |
|---|---|---|
| | CR1 | CR2 |
| Upper | PG2,PG3 | PG1,PG2,PG3 |
| Lower | PG1,PG4,PG5 | PG4,PG5 |

Combinations of read pages (8th embodiment)

| Page | Read pages to be output | | |
|---|---|---|---|
| | CR1 | CR2 | CR3 |
| Upper | PG6,PG7 | PG6,PG7 | PG1,PG6,PG7 |
| Middle | PG4,PG5 | PG1,PG4,PG5 | PG4,PG5 |
| Lower | PG1,PG2,PG3 | PG2,PG3 | PG2,PG3 |

Combinations of read pages (9th embodiment)

| Page | Read pages to be output | | | |
|---|---|---|---|---|
| | CR1 | CR2 | CR3 | CR4 |
| Uppermost | PG8,PG9 | PG8,PG9 | PG8,PG9 | PG1,PG8,PG9 |
| Upper | PG6,PG7 | PG6,PG7 | PG1,PG6,PG7 | PG6,PG7 |
| Middle | PG4,PG5 | PG1,PG4,PG5 | PG4,PG5 | PG4,PG5 |
| Lower | PG1,PG2,PG3 | PG2,PG3 | PG2,PG3 | PG2,PG3 |

7bit/2cell: 1-4-4-3-3-4-4 Coding (11th embodiment)

| Page | Decoding rules [a,b,c,d] | Read voltages to use | |
|---|---|---|---|
| | | MTc | MTd |
| PG1 | [0,1,1,1] | R8 | R8 |
| PG2 | [0,1,0,0] | R8 | R1,R3,R6 |
| PG3 | [0,1,1,0] | R1,R3,R6 | R8 |
| PG4 | [0,0,1,1] | R4,R9,R11 | – |
| PG5 | [0,1,0,1] | – | R4,R9,R11 |
| PG6 | [0,0,1,1] | R2,R5,R7,R10 | – |
| PG7 | [0,1,0,1] | – | R2,R5,R7,R10 |

2bit/1cell: 1-2 Coding (11th embodiment)

| Page | Data | | | |
|---|---|---|---|---|
| | S0 | S2 | S4 | S6 |
| PG2 | 1 | 0 | 0 | 1 |
| PG1 | 1 | 1 | 0 | 0 |

Read operation (12th embodiment)

7bit/2cell · 1~3~3~3~3~4~4 Coding (13th embodiment)

| Page | First coding in 1st area CR1 and second area CR2 | | | Second coding in 1st area CR1 and second area CR2 | | |
|---|---|---|---|---|---|---|
| | Decoding rules [a,b,c,d] | Read voltages to us | | Decoding rules [a,b,c,d] | Read voltages to us | |
| | | MTa | MTb | | MTa | MTb |
| PG1 | [0,0,0,1] | R4 | R4 | [0,1,1,1] | R8 | R8 |
| PG2 | [0,1,1,0] | R4 | R6,R9,R11 | [0,1,0,0] | R8 | R1,R3,R6 |
| PG3 | [0,1,1,0] | R6,R9,R11 | R4 | [0,1,1,0] | R1,R3,R6 | R8 |
| PG4 | [0,0,1,1] | R1,R3,R8 | – | [0,0,1,1] | R4,R9,R11 | – |
| PG5 | [0,1,0,1] | – | R1,R3,R8 | [0,1,0,1] | – | R4,R9,R11 |
| PG6 | [0,0,1,1] | R2,R5,R7,R10 | – | [0,0,1,1] | R2,R5,R7,R10 | – |
| PG7 | [0,1,0,1] | – | R2,R5,R7,R10 | [0,1,0,1] | – | R2,R5,R7,R10 |

| Page | First coding in 3rd area CR3 and fourth area CR4 | | | Second coding in 3rd area CR3 and fourth area CR4 | | |
|---|---|---|---|---|---|---|
| | Decoding rules [a,b,c,d] | Read voltages to us | | Decoding rules [a,b,c,d] | Read voltages to us | |
| | | MTc | MTd | | MTc | MTd |
| PG1 | [0,0,0,1] | R4 | R4 | [0,1,1,1] | R8 | R8 |
| PG2 | [0,1,1,0] | R4 | R6,R9,R11 | [0,1,0,0] | R8 | R1,R3,R6 |
| PG3 | [0,1,1,0] | R6,R9,R11 | R4 | [0,1,1,0] | R1,R3,R6 | R8 |
| PG4 | [0,0,1,1] | R1,R3,R8 | – | [0,0,1,1] | R4,R9,R11 | – |
| PG5 | [0,1,0,1] | – | R1,R3,R8 | [0,1,0,1] | – | R4,R9,R11 |
| PG6 | [0,0,1,1] | R2,R5,R7,R10 | – | [0,0,1,1] | R2,R5,R7,R10 | – |
| PG7 | [0,1,0,1] | – | R2,R5,R7,R10 | [0,1,0,1] | – | R2,R5,R7,R10 |

F I G. 109

SEMICONDUCTOR MEMORY DEVICE

CROSS-REFERENCE TO RELATED APPLICATIONS

This application is based upon and claims the benefit of priority from Japanese Patent Application No. 2020-106456, filed Jun. 19, 2020, the entire contents of which are incorporated herein by reference.

FIELD

Embodiments described herein relate generally to a semiconductor memory device.

BACKGROUND

A NAND-type flash memory capable of storing data in a non-volatile manner is known.

BRIEF DESCRIPTION OF THE DRAWINGS

FIG. 11 is a table showing an example of share coding used in the semiconductor memory device according to the first embodiment.

FIG. 12 is a table showing an example of an allocation of decoding rules used in the semiconductor memory device according to the first embodiment.

FIG. 24 is a table showing share coding in a first modification of the first embodiment.

FIG. 25 is a table showing share coding in a second modification of the first embodiment.

FIG. 30 is a table showing an example of an allocation of decoding rules used in the semiconductor memory device according to the second embodiment.

FIG. 37 is a table showing share coding in a second modification of the second embodiment.

FIG. 38 is a table showing share coding in a third modification of the second embodiment.

FIG. 39 is a table showing share coding in a fourth modification of the second embodiment.

FIG. 68 is a table showing an example of share coding used in a first area of a memory cell array included in the semiconductor memory device according to the fifth embodiment.

FIG. 109 is a table showing an example of share coding used in each of first through fourth areas of a memory cell array included in the semiconductor memory device according to the 13th embodiment.

DETAILED DESCRIPTION

Figure 1:
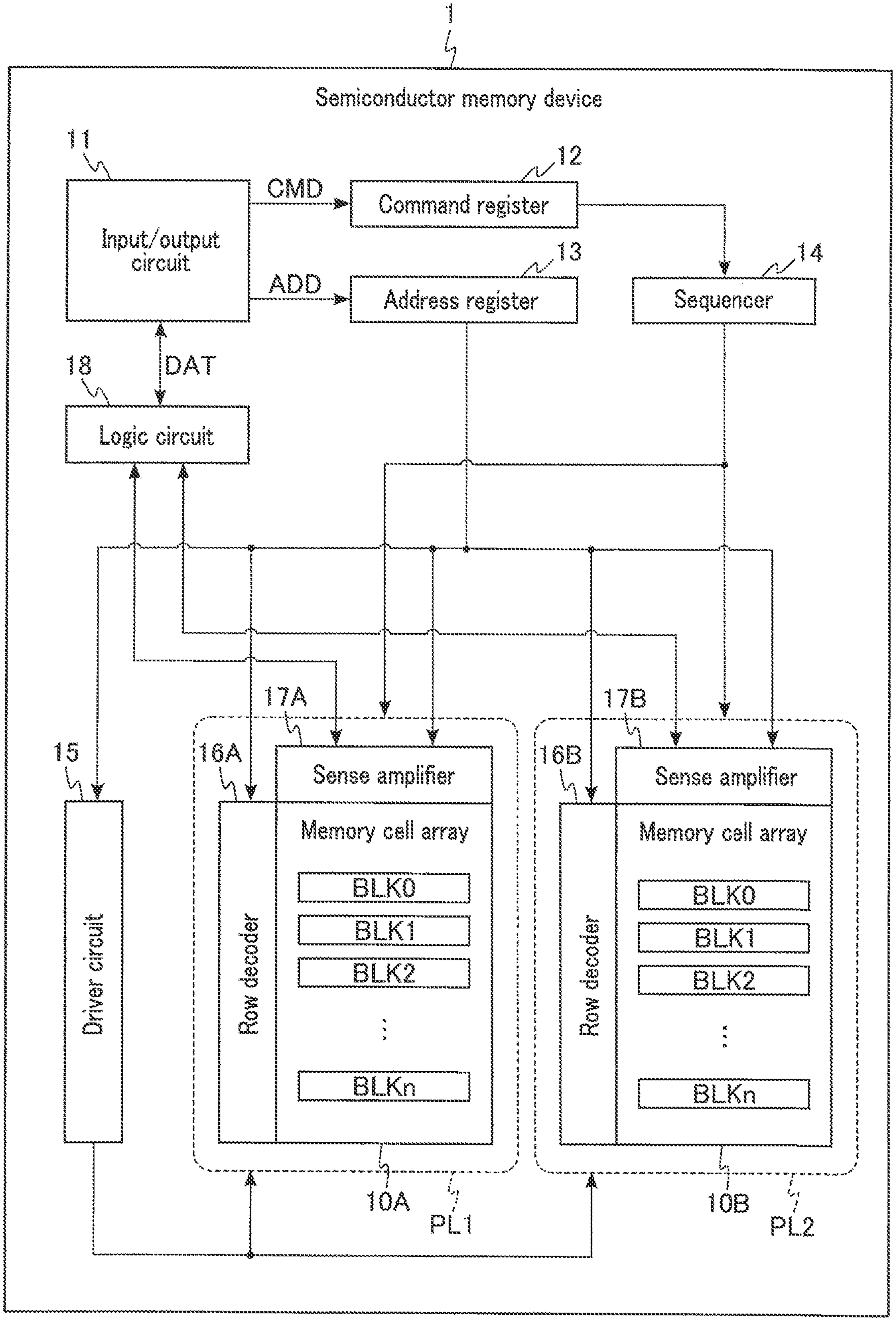
FIG. 1 is a block diagram showing an example of an entire configuration of a semiconductor memory device according to a first embodiment.

In general, according to one embodiment, includes a plurality of first memory cells, a plurality of second memory cells, a first memory cell array, a second memory cell array, a first word line, a second word line, and a controller. A threshold voltage of each of the plurality of first memory cells and the plurality of second memory cells is included in one of a first state, a second state, a third state, a fourth state, a fifth state, a sixth state, a seventh state, an eighth state, a ninth state, a tenth state, an eleventh state, a twelfth state, a thirteenth state, a fourteenth state, a fifteenth state, or a sixteenth state, the states are set from low to high voltages. The first memory cell array includes the plurality of first memory cells. The second memory cell array includes the plurality of second memory cells. The first word line is coupled to the plurality of first memory cells. The second word line is coupled to the plurality of second memory cells. 8-bit data that includes a first bit, a second bit, a third bit, a fourth bit, a fifth bit, a sixth bit, a seventh bit, and an eighth bit is stored using a combination of a threshold voltage of the first memory cell and a threshold voltage of the second memory cell. The controller is configured to: apply in parallel a plurality of types of read voltages to each of the first word line and the second word line and externally output data confirmed based on first data read from the first memory cells and second data read from the second memory cells in each of a read operation for a first page that includes the first bit, a read operation for a second page that includes the second bit, a read operation for a third page that includes the third bit, a read operation for a fourth page that includes the fourth bit, a read operation for a fifth page that includes the fifth bit, a read operation for a sixth page that includes the sixth bit, a read operation for a seventh page that includes the seventh bit, and a read operation for an eighth page that includes the eighth bit.

Hereinafter, the embodiments will be described with reference to the accompanying drawings. Each of the embodiments is an example of an apparatus and a method to embody a technical idea of the invention. The drawings are schematic or conceptual, and the dimensions and ratios, etc. in the drawings are not always the same as the actual ones. The technical idea of the present invention is not specified by the shapes, structures, arrangements, etc. of the components.

In the explanation below, constituent elements having the same functions and configurations will be denoted by the same reference symbols. A numeral following letters constituting a reference symbol is used to distinguish between elements that have the same configuration that are referred to by reference symbols that have the same letters. When components having reference symbols containing the same character string need not be distinguished from each other, these components may be referred to by a reference symbol containing the character string only.

[1] First Embodiment

A semiconductor memory device 1 according to the first embodiment is a type of NAND-type flash memory capable of storing data in a non-volatile manner. The semiconductor memory device 1 according to the first embodiment stores 8-bit data using a combination of two memory cell transistors. Hereinafter, a semiconductor memory device 1 according to a first embodiment will be described.

[1-1] Configuration

[1-1-1] Overall Configuration of Semiconductor Memory Device 1

FIG. 1 shows an example of an overall configuration of a semiconductor memory device 1 according to the first embodiment. As shown in FIG. 1, the semiconductor memory device 1 includes, for example, memory cell arrays 10A and 10B, an input/output circuit 11, a command register 12, an address register 13, a sequencer 14, a driver circuit 15, row decoder modules 16A and 16B, sense amplifier modules 17A and 17B, and a logic circuit 18.

Each of the memory cell arrays 10A and 10B includes a plurality of blocks BLK0 to BLKn (n is an integer equal to or greater than 1). A block BLK is a group of non-volatile memory cell transistors, and is used as, for example, a unit of data erasure. A plurality of bit lines and a plurality of word lines are provided in the memory cell array 10. Each memory cell transistor is associated with a single bit line and a single word line.

The input/output circuit 11 receives data DAT, a command CMD, an address ADD, etc. transmitted from an external memory controller 2 (not shown) and receives data DAT transferred from the logic circuit 18 to the memory controller 2. In other words, the input/output circuit 11 is capable of inputting and outputting data to and from the memory controller 2 and receiving information used in operations for the semiconductor memory device 1.

The command register 12 retains a command CMD transferred from the input/output circuit 11. The command CMD includes an instruction to cause the sequencer 14 to perform, for example, a read operation, a write operation, an erase operation, etc.

The address register 13 retains an address ADD transferred from the input/output circuit 11. The address information ADD includes, for example, a block address, a page address, and a column address. The block address, page address, and column address are used to select a block BLK, a word line, and a bit line, respectively.

The sequencer 14 controls the entire operation of the semiconductor memory device 1. For example, the sequencer 14 controls the driver circuit 15, the row decoder modules 16A and 16B, the sense amplifier modules 17A and 17B, and the logic circuit 18, etc. based on the command CMD retained in the command register 12, to perform a read operation, a write operation, an erase operation, etc.

The driver circuit 15 generates voltages used in a read operation, a write operation, an erase operation, etc. The driver circuit 15 applies a generated voltage to, for example, a signal line corresponding to the selected word line of the memory cell array 10A and to a signal line corresponding to a selected word line of the memory cell array 10B, based on a page address retained in the address register 13. The voltage to be applied to the selected word line, etc. may differ between the memory cell array 10A and the memory cell array 10B.

The row decoder modules 16A and 16B are provided in correspondence to the memory cell arrays 10A and 10B, respectively. The row decoder module 16 selects one block BLK from a corresponding memory cell array 10 based on a block address retained in the address register 13, and transfers a voltage generated by the driver circuit 15 to each interconnect of the corresponding memory cell array 10.

The sense amplifier modules 17A and 17B are provided in correspondence to the memory cell arrays 10A and 10B, respectively. The sense amplifier module 17 applies a predetermined voltage to a plurality of bit lines of a corresponding memory cell array 10 in accordance with write data transferred from the memory controller 2 via the input/output circuit 11. The sense amplifier module 17 reads data stored in the memory cell transistors coupled to the selected word line based on a voltage of a corresponding bit line and transfers a read result to the logical circuit 18.

The logic circuit 18 transmits and receives data DAT to and from the input/output circuit 11. A predetermined encoding process is executed on write data transferred from the input/output circuit 11 and the encoded write data is transmitted to at least one of the sense amplifier module 17A or 17B. The logic circuit 18 performs a predetermined decoding process on a read result transferred from at least one of the sense amplifier module 17A or 17B and transmits the decoded data to the input/output circuit 11 as read data. The logic circuit 18 may omit the encoding and decoding processes depending on data to be input or output.

For example, a group of the above-described memory cell array 10, row decoder module 16, and sense amplifier module 17 may be referred to as a "plane". The semiconductor memory device 1 according to the first embodiment includes a plane PL1 that includes the memory cell array 10A, the row decoder module 16A, and the sense amplifier module 17A, and a plane PL2 that includes the memory cell array 10B, the row decoder module 16B, and the sense amplifier module 17B. A single plane must include at least the memory cell array 10. The sequencer 14 can control multiple planes PL independently.

In the semiconductor memory device 1 according to the first embodiment, multiple bit data is stored by a set of memory cell transistors associated between planes PL1 and PL2. In other words, multiple bit data is stored in a set of a memory cell transistor in the memory cell array 10A and a memory cell transistor in the memory cell array 10B. Physical addresses of the blocks BLK in which those memory cell transistors are included may be the same or different. An association of the memory cell transistors between the planes PL1 and PL2 can be configured with a freely selected combination. In the present specification, data allocation for storing multiple-bit data using a plurality of memory cell transistors MT may be called "share coding". How data is stored will be described later in detail.

Figure 2:
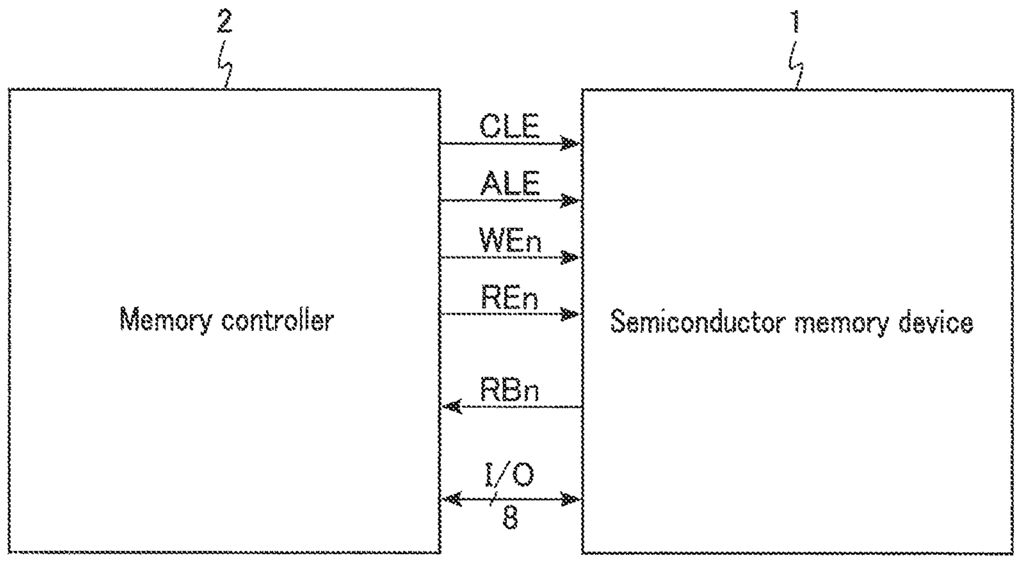
FIG. 2 is a schematic diagram showing an example of control signals used between the semiconductor memory device and the memory controller of the first embodiment.

FIG. 2 shows an example of the control signals used between the semiconductor memory device 1 and the memory controller 2 of the first embodiment. As shown in FIG. 2, the semiconductor memory device 1 is controlled by the external memory controller 2. Communication between the semiconductor memory device 1 and the memory controller 2 supports, for example, a NAND interface standard. Specifically, as the control signals, a command latch enable signal CLE, an address latch enable signal ALE, a write enable signal WEn, a read enable signal REn, a ready/busy signal RBn, and an input/output signal I/O are used, for example.

The command latch enable signal CLE is a signal indicating that the input/output signal I/O received by the semiconductor memory device 1 is a command CMD. The address latch enable signal ALE is a signal indicating that the input/output signal I/O received by the semiconductor memory device 1 is address information ADD. The write enable signal WEn is a signal instructing the semiconductor memory device 1 to input an input/output signal I/O therein. The read enable signal REn is a signal instructing the semiconductor memory device 1 to output an input/output signal I/O therefrom. The ready/busy signal RBn is a signal notifying the memory controller 2 of whether the semiconductor memory device 1 is in a ready state or in a busy state. The ready state is a state in which the semiconductor memory device 1 accepts an order, whereas the busy state is a state in which the semiconductor memory device 1 does not accept an order. The input/output signal I/O is, for example, an 8-bit signal, and may include a command CMD, address information ADD, data DAT, etc.

The above-described semiconductor memory device 1 and memory controller 2 in combination may configure a single semiconductor device. Examples of such semiconductor devices include a memory card such as an SD™ card, and a solid state drive (SSD). The number of bits of the input/output signal I/O is not limited to 8 bits and may be 16 bits, for example. The memory controller 2 may use control signals in addition to those shown in FIG. 2 to control the semiconductor memory device 1.

[1-1-2] Configuration of Semiconductor Memory Device 1

(Re: Circuit Configuration of Memory Cell Array 10)

Figure 3:
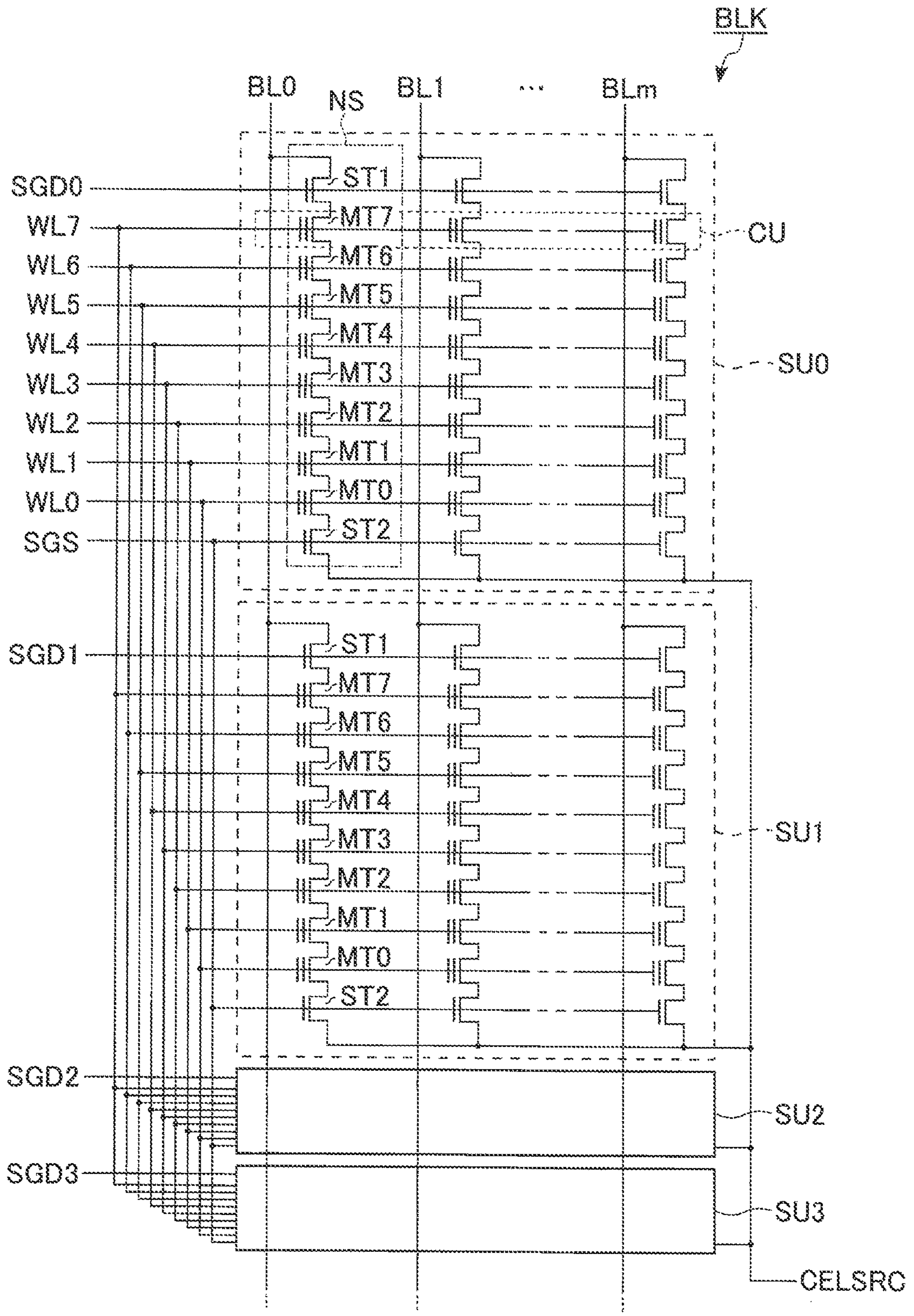
FIG. 3 is a circuit diagram showing an example of a circuit configuration of a memory cell array included in the semiconductor memory device according to the first embodiment.

FIG. 3 shows an example of a circuit configuration of the memory cell array 10 included in the semiconductor memory device 1 according to the embodiment, illustrating one of a plurality of blocks BLK included in the memory cell array 10. As shown in FIG. 3, the block BLK includes, for example, four string units SU0 to SU3.

Each string unit SU includes a plurality of NAND strings NS associated with bit lines BL0 to BLm (m is an integer not less than 1), respectively. Each NAND string NS includes, for example, memory cell transistors MT0 to MT7 and select transistors ST1 and ST2. Each memory cell transistor MT includes a control gate and a charge storage layer, and stores data in a non-volatile manner. Each of the select transistors ST1 and ST2 is used to select a string unit SU at the time of performing various operations.

In each NAND string NS, memory cell transistors MT0 to MT7 are coupled in series. A drain of the select transistor ST1 is coupled to a corresponding bit line BL. A source of the select transistor ST1 is coupled to one end of the memory cell transistors MT0 to MT7 coupled in series. A drain of the select transistor ST2 is coupled to the other end of the set of memory cell transistors MT0 to MT7 coupled in series. The source of the select transistor ST2 is coupled to the source line SL.

The control gates of sets of the memory cell transistors MT0 to MT7 in the same block BLK are respectively coupled to the word lines WL0 to WL7. The gate of the select transistor ST1 in each of the string units SU0 to SU3 is coupled to each of the select gate lines SGD0 to SGD3. The gates of the select transistors ST2 in the same block BLK are coupled in common to the select gate line SGS. The bit line BL is shared among a plurality of NAND strings NS to which the same column address is assigned in each string unit SU. The source line SL is shared among, for example, a plurality of blocks BLK.

In the present specification, a group of memory cell transistors MT coupled to a common word line WL in a single string unit SU is called a "cell unit CU". In the first embodiment, if 1-bit data is stored in a set of a memory cell transistor MT in the plane PL1 and a memory cell transistor MT in the plane PL2, a total amount of data stored in a set of a cell unit CU in the plane PL1 and a cell unit CU in the plane PL2 is defined as "1-page data".

The circuit configuration of the memory cell array 10 included in the semiconductor memory device 1 according to the first embodiment is not limited to the above-described configuration. For example, the number of string units SU included in each block BLK and the number of each of the memory cell transistors MT and the select transistors ST1 and ST2 included in each NAND string NS may be any number. The select gate line SGS may be separately provided for each string unit SU. Each NAND string NS includes a dummy transistor.

(Circuit Configuration of Row Decoder Module 16)

Figure 4:
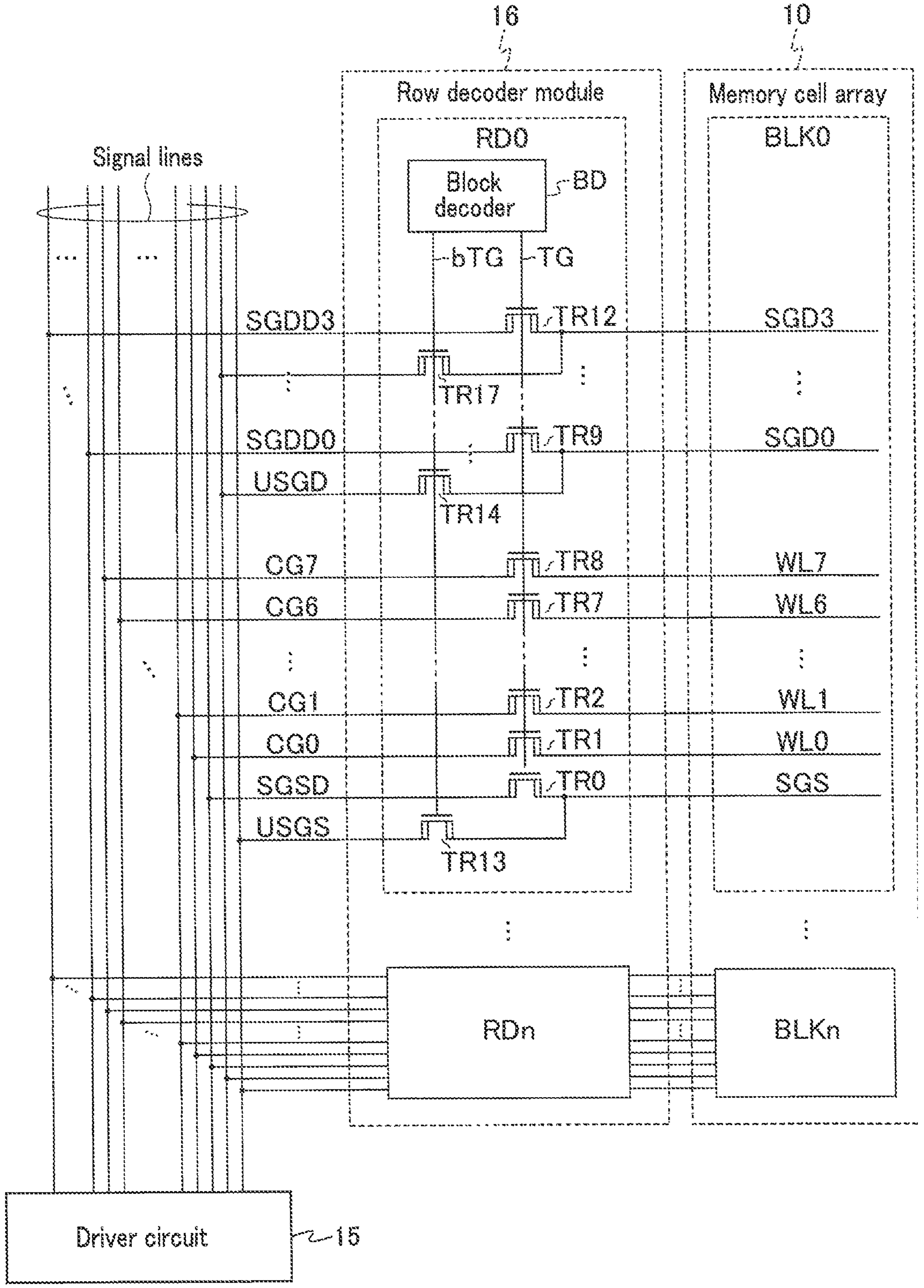
FIG. 4 is a circuit diagram showing an example of the circuit configuration of a row decoder module included in the semiconductor memory according to the first embodiment.

FIG. 4 shows a configuration example of the row decoder module 16 included in the semiconductor memory device 1 according to the first embodiment. As shown in FIG. 4, the row decoder module 16 is coupled to the driver circuit 15 via, for example, signal lines CG0 to CG7, SGDD0 to SGDD3, SGSD, USGD, and USGS.

The row decoder module 16 includes row decoders RD0 through RDn respectively associated with the blocks BLK0 through BLKn. FIG. 4 shows only the details of the circuit configuration of the row decoder RD0. Each row decoder RD includes, for example, a block decoder ED, transfer gate lines TG and bTG, and transistors TR0 through TR17.

The block decoder BD decodes a block address and applies a predetermined voltage to each of the transfer gate lines TG and bTG based on a result of the decoding. The voltage applied to the transfer gate line TG is complementary to the voltage applied to the transfer gate line bTG. Namely, an inversion signal of the transfer gate line TG is input to the transfer gate line bTG.

Each of the transistors TR0 to TR17 is a high breakdown voltage N-type MOS transistor. The gates of the transistors TR0 through TR12 are coupled in common to the transfer gate line TG. The gates of the transistors TR13 through TR17 are coupled in common to the transfer gate line bTG. Each of the transistors TR0 through TR17 is coupled between a signal line coupled to the driver circuit 15 and an interconnect provided in the associated block BLK.

Specifically, the drain of the transistor TR0 is coupled to a signal line SGSD. The source of the transistor TR0 is coupled to the select gate line SGS. The drains of the transistors TR1 to TR8 are coupled to the signal lines CG0 to CG7, respectively. The sources of the memory cell transistors TR1 to TR8 are coupled to the word lines WL0 to WL7, respectively. The drains of the transistors TR9 to TR12 are coupled to the signal lines SGDD0 to SGDD3, respectively. The sources of the transistors TR9 to TR12 are coupled to the select gate lines SGD0 to SGD3, respectively. The drain of the transistor TR13 is coupled to the signal line USGS. The source of the transistor TR13 is coupled to the select gate line SGS. The drain of each of the transistors TR14 to TR17 is coupled to the signal line USGD. The sources of the transistors TR14 to TR17 are coupled to the select gate lines SGD0 to SGD3, respectively.

Thus, the signal lines CG0 through CG7 are used as global word lines shared between blocks BLK. The word lines WL0 through WL7 are used as local word lines provided in each block BLK. The signal lines SGDD0 through SGDD3 and SGSD are used as global transfer gate lines shared between the blocks BLK. The select gate lines SGD0 through SGD3 and SGS are used as local transfer gate lines provided in each block BLK.

In various operations, the block decoder BD corresponding to the selected block BLK applies an “H” level voltage and an “L” level voltage to the transfer gate lines TG and bTG, respectively, and the block decoder BD corresponding to the non-selected block BLK applies an “L” level voltage and an “H” level voltage to the transfer gate lines TG and bTG, respectively. Thus, the row decoder module 16 can select a block BLK.

The circuit configuration of the row decoder module 16 included in the semiconductor memory device 1 according to the first embodiment is not limited to the above-described configuration. For example, the number of transistors TR included in the row decoder module 16 may be a number based on the number of lines provided in each block BLK. The number of signal lines coupling the row decoder module 16 to the driver circuit 15 is also changeable in accordance with the number of the transistors TR.

(Configuration of Sense Amplifier Module 17)

Figure 5:
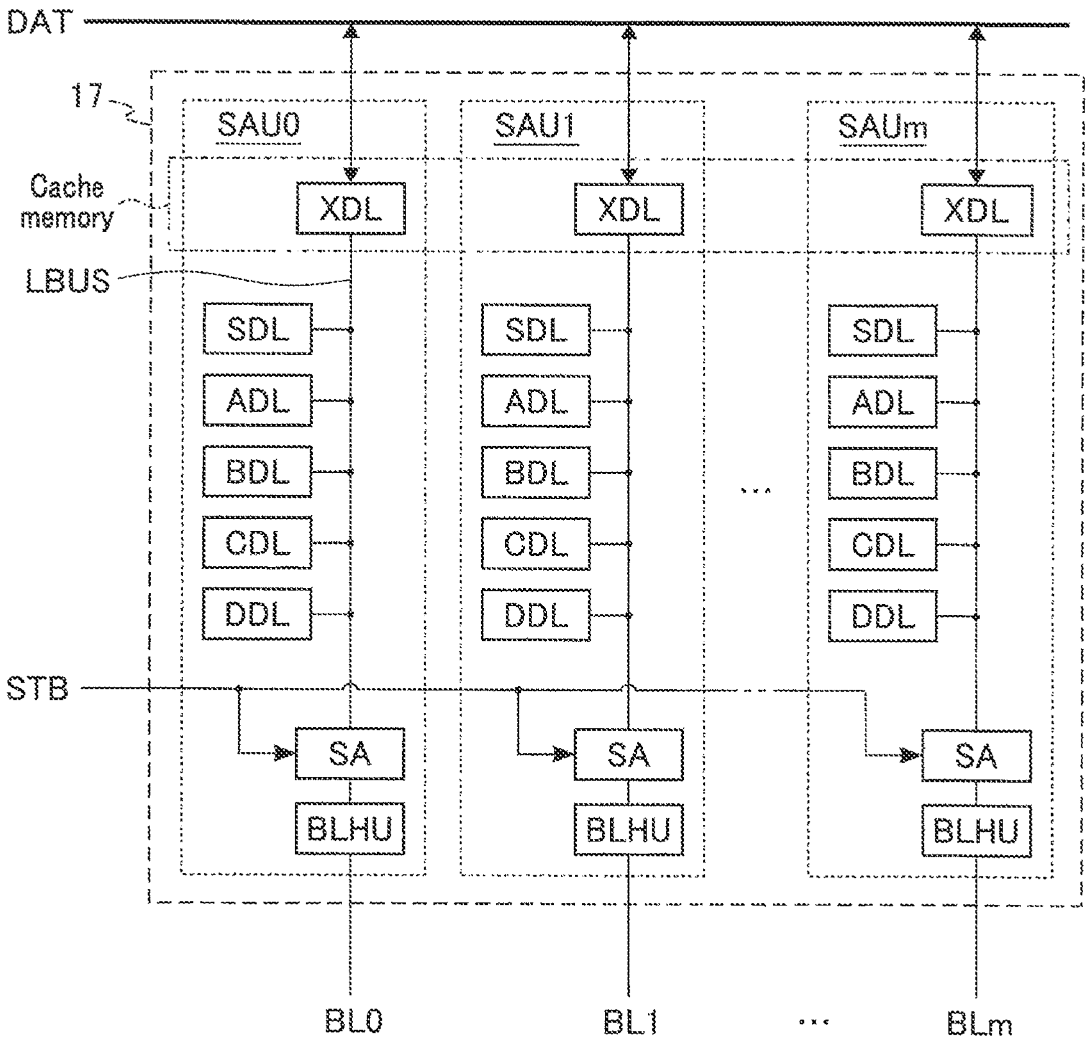
FIG. 5 is a circuit diagram showing an example of the circuit configuration of a sense amplifier module of the semiconductor memory device according to the first embodiment.

FIG. 5 shows a configuration example of the sense amplifier module 17 included in the semiconductor memory device 1 according to the first embodiment. As shown in FIG. 5, the sense amplifier module 17 includes, for example, sense amplifier units SAU0 through SAUm associated with the bit lines BL0 through BLm, respectively. Each sense amplifier unit SAU may include a bit line connecting section BLHU, sense amplifier SA, and latch circuits SDL, ADL, BDL, CDL, DDL, and XDL.

The bit line coupling section BLHU includes a high breakdown voltage transistor coupled between a bit line BL and sense amplifier SA associated with each other. The sense amplifier SA, and the latch circuits SDL, ADL, BDL, CDL, DDL, and XDL are coupled in common to a bus LBUS. The latch circuits SDL, ADL, BDL, CDL, DDL, and XDL can transmit and receive data therebetween via the LBUS.

A control signal STB generated by, for example, the sequencer 14 is input to each sense amplifier SA. The sense amplifier SA determines whether data read out to the associated bit line BL is “0” or “1”, based on the timing of assertion of the control signal STB. Namely, the sense amplifier SA determines data stored in the selected memory cell transistor MT based on the voltage of the bit line BL.

Each of the latch circuits SDL, ADL, BDL, CDL, DDL, and XDL temporarily retains data. The latch circuit XDL is used to input and output data DAT between the logic circuit 18 and the sense amplifier unit SAU. The latch circuit XDL can also be used as, for example, a cache memory of the semiconductor memory device 1. The semiconductor memory device 1 can change to a ready state when at least the latch XDL is available.

Figure 6:
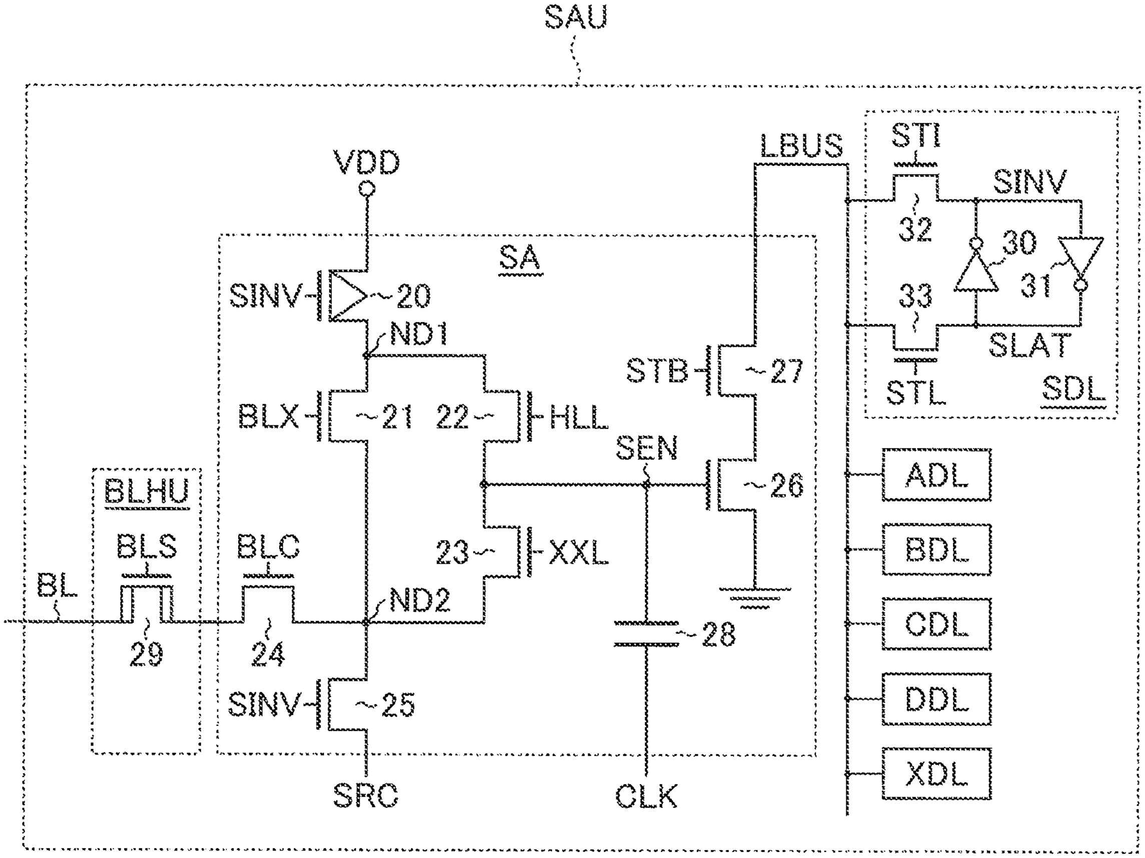
FIG. 6 is a circuit diagram showing an example of the circuit configuration of a memory cell array included in the semiconductor memory device according to the first embodiment.

FIG. 6 is a circuit diagram showing an example of the circuit configuration of a sense amplifier unit SAU included in the sense amplifier module 17 of the semiconductor memory device 1 according to the first embodiment. As shown in FIG. 6, the sense amplifier SA may include transistors 20-27 and a capacitor 28, and the bit line coupling section BLHU may include a transistor 29. The transistor 20 is a P-type MOS transistor. Each of the transistors 21 to 27 is an N-type MOS transistor. The transistor 29 is an N-type MOS transistor with a breakdown voltage higher than those of the transistors 20 to 27.

The source of the transistor 20 is coupled to a power line. The drain of the transistor 20 is coupled to a node ND1. The gate of the transistor 20 is coupled to a node SINV in the latch circuit SDL. The drain of the transistor 21 is coupled to the node ND1. The source of the transistor 21 is coupled to a node ND2. A control signal BLX is input to the gate of the transistor 21. The drain of the transistor 22 is coupled to a node ND1. The source of the transistor 22 is coupled to a node SEN. A control signal HLL is input to the gate of the transistor 22. The drain of the transistor 23 is coupled to the node SEN. The source of the transistor 23 is coupled to the node ND2. A control signal XXL is input to the gate of the transistor 23. The drain of the transistor 24 is coupled to a node ND2. A control signal BLC is input to the gate of the transistor 24.

The drain of the transistor 25 is coupled to a node ND2. The source of the transistor 25 is coupled to a node SRC. The gate of the transistor 25 is coupled to, for example, the node SINV in the latch circuit SDL. The source of the transistor 26 is grounded. The gate of the transistor 26 is coupled to the node SEN. The drain of the transistor 27 is coupled to the bus LBUS. The source of the transistor 27 is coupled to the drain of the transistor 26. A control signal STB is input to the gate of the transistor 27. One electrode of the capacitor 28 is coupled to the node SEN. A clock signal CLK is input to the other electrode of the capacitor 28. The drain of the transistor 29 is coupled to the source of the transistor 24. The source of the transistor 29 is coupled to the bit line BL. A control signal BLS is input to the gate of the transistor 29.

The latch circuit SDL includes, for example, inverters 30 and 31, and N-type MOS transistors 32 and 33. The input node of the inverter 30 is coupled to a node SLAT. The output node of the inverter 30 is coupled to a node SINV. The input node of the inverter 31 is coupled to a node SINV. The output node of the inverter 31 is coupled to a node SLAT. One end of the transistor 32 is coupled to a node SINV. The other end of the transistor 32 is coupled to a bus LBUS. A control signal STI is input to the gate of the transistor 32. One end of the transistor 33 is coupled to node SLAT. The other end of the transistor 33 is coupled to bus LBUS. A control signal STL is input to the gate of the transistor 33. For example, the data retained in the node SLAT corresponds to the data retained in the latch circuit SDL. The data retained in the node SINV, on the other hand, corresponds to inversion data of the data retained in the node SLAT.

The circuit configurations of the latch circuits ADL, BDL, CDL, DDL, and XDL are, for example, the same as that of the latch circuit SDL. For example, the latch circuit ADL holds data in the node ALAT and holds inversion data of the data in the node AINV. Then, a control signal ATI is input to the gate of the transistor 32 of the latch circuit ADL, and a control signal ATL is input to the gate of the transistor 33 of the latch circuit ADL. Descriptions of the latch circuits BDL, CDL, DDL, and XDL will be omitted, as the configurations thereof are similar to those of the latch circuits ADL and BDL.

In the above-described circuit configuration of the sense amplifier unit SAU, a source voltage VDD for example is applied to the power line coupled to the source of the transistor 20. A ground voltage VSS for example is applied to the node SRC. The above-described control signals BLX, HLL, XXL, BLC, STB, and BLS and the clock signal CLK are each generated by, for example, the sequencer 14. The node SEN may be called a "sense node of the sense amplifier SA". In the present example, asserting a control signal corresponds to temporarily changing an "L"-level voltage to an "H"-level voltage.

The circuit configuration of the sense amplifier module 17 included in the semiconductor memory device 1 according to the first embodiment is not limited to the above-described one. For example, the number of latch circuits included in each sense amplifier unit SAU may be changed as appropriate based on the number of pages stored in one cell unit CU. The sense amplifier unit SAU may include a calculating circuit capable of performing basic logical operations. If the transistor whose gate is coupled to a sense node is a P-type transistor, asserting a control signal STB corresponds to temporarily changing an "H"-level voltage to an "L"-level voltage.

[1-1-3] Structure of Memory Cell Array 10

An exemplary structure of the memory cell array 10 in the semiconductor memory device 1 according to the first embodiment will be described hereinafter. In the drawings that will be referred to hereinafter, "X direction" corresponds to the direction in which the word lines WL extend, "Y direction" corresponds to the direction in which the bit lines BL extend, and "Z direction" corresponds to the direction vertical to the surface of the semiconductor substrate (the stacking direction), which is used to form the semiconductor memory device 1. In the plan views, hatching is applied as appropriate for improved visibility. The hatching applied in the planar views does not necessarily relate to the material or characteristics of the hatched components.

(Planar Layout of Memory Cell Array 10)

Figure 7:
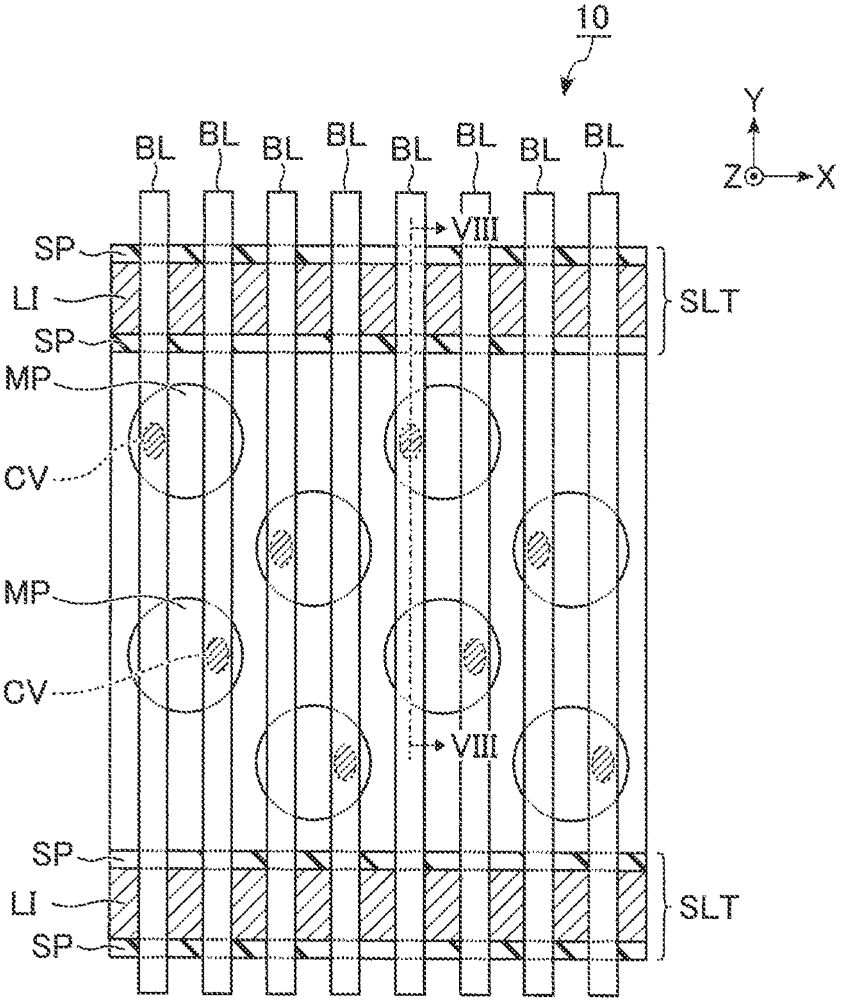
FIG. 7 is a plan view showing an example of a planar layout of the memory cell array included in the semiconductor memory device according to the first embodiment.

FIG. 7 is a plan view showing an example of a planar layout of the memory cell array 10 included in the semiconductor memory device 1 according to the first embodiment. As shown in FIG. 7, a memory cell array 10 includes, for example, a plurality of slits SLT, a plurality of memory pillars MP, and a plurality of contacts CV.

At least a part of each slit SLT is provided in such a manner that the part extends in the X direction. The slits SLT are aligned in the Y direction. Each slit SLT splits any two conductive layers arranged in the same interconnect layer and adjacent to each other with the slit SLT interposed therebetween. Specifically, each slit SLT splits a plurality of interconnect layers respectively corresponding to, for example, the word lines WL0 to WL7 and select gate lines SGD and SGS.

Each slit SLT includes a spacer SP and a contact LI, for example. In each slit SLT, at least a part of the contact LI is provided in such a manner that the part extends in the X direction. The spacer SP is provided on a side surface of the contact LI. The spacer SP distances and insulates between the contact LI and the interconnect layers adjacent to the slit SLT. The contact LI is used as the source line CELSRC. The contact LI may be semi-conductive or metallic.

Each memory pillar MP functions as, for example, a single NAND string NS. The memory pillars MP are in a 4-row staggered arrangement in, for example, an area between adjacent two slits SLT. The number and arrangement of the memory pillars MP between two adjacent slits SLT are not limited to this example and may be suitably changeable. Each memory pillar MP is overlain by at least one bit line BL. At least a part of each bit line BL extends in the Y direction and they are aligned in the X direction. One of the bit lines BL that overlap a memory pillar MP and the memory pillar MP are electrically coupled by a contact CV.

The above-described planar layout of the memory cell array 10 is repeatedly arranged in the Y direction. Also, each of the areas separated by the slits SLT corresponds to a single string unit SU. That is, string units SU0 to SU3, each extending in the X direction, are aligned in the Y direction. One contact CV is coupled to a bit line BL in each space partitioned by the slits SLT.

(Cross-Sectional Structure of Memory Cell Array 10)

Figure 8:
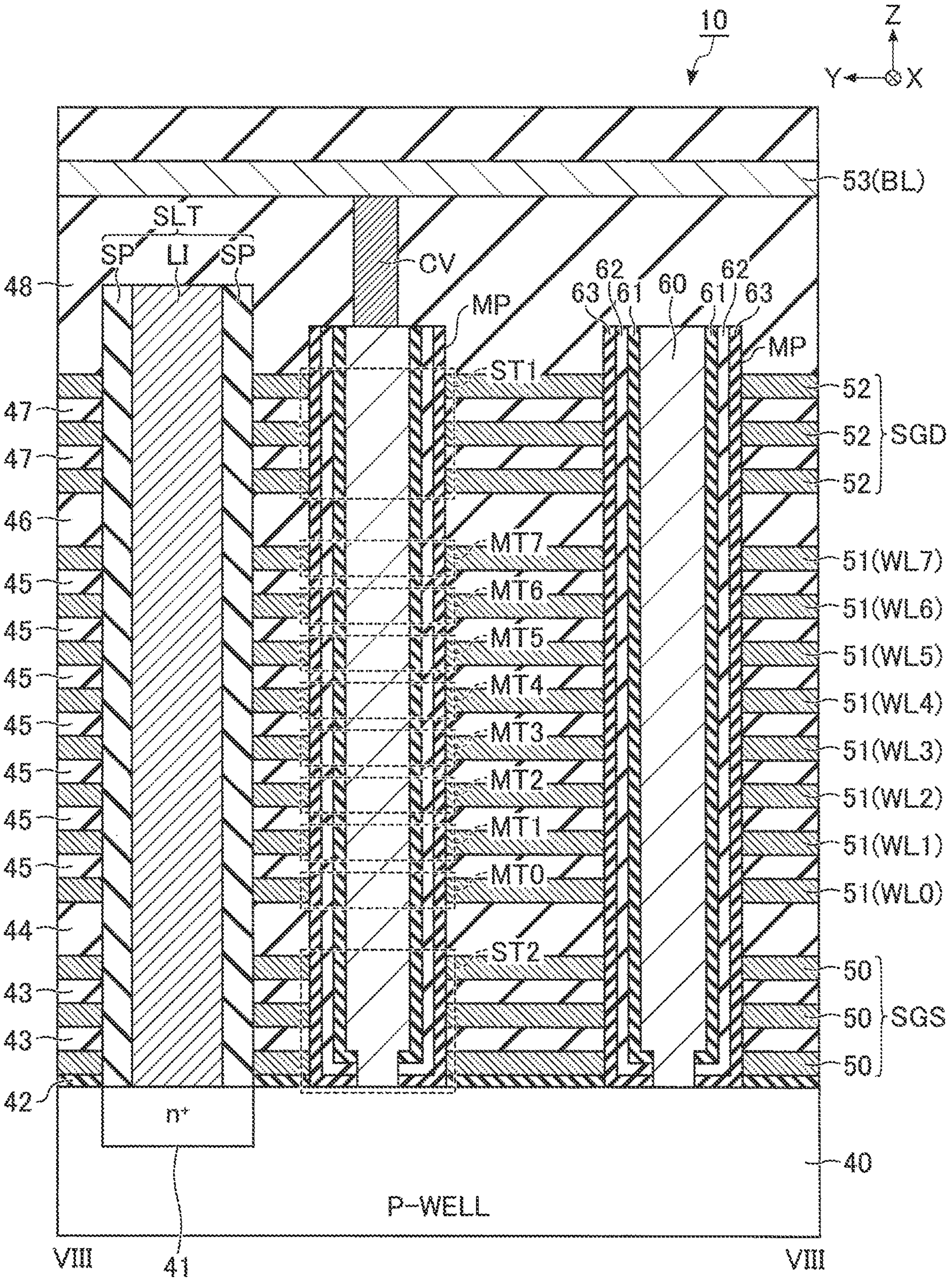
FIG. 8 is a cross-sectional view taken along line VIII-VIII of FIG. 7, showing an example of a cross-sectional structure of the semiconductor memory device according to the first embodiment.

FIG. 8 shows an example of a cross section of the memory cell 10 of the semiconductor memory device 1 according to the first embodiment, taken along line VIII-VIII of FIG. 7. As shown in FIG. 8, the memory cell array 10 further includes, for example, a P-type well region 40, insulating layers 42 to 48, and conductive layers 50 to 53.

The P-type well region 40 is arranged in the vicinity of the surface of the semiconductor substrate, and includes an N-type semiconductor region 41. The N-type semiconductor region 41 serves as an N-type impurity diffusion region arranged in the vicinity of the surface of the P-type well region 40. The N-type semiconductor region 41 may be doped with phosphorus (P).

An insulating layer 42 is provided on the P-type well region 40. The conductive layers 50 and insulating layers 43 are alternately stacked on the insulating layer 42. The conductive layer 50 is formed in a plate shape extending along the XY plane, for example. The stacked conductive layers 50 are used as a select gate line SGS. The conductive layers 50 contain, for example, tungsten (W).

An insulating layer 44 is provided on top of the uppermost conductive layer 50. The conductive layers 51 and insulating layers 45 are alternately stacked on the insulating layer 44. The conductive layer 51 is formed in a plate shape extending along the XY plane, for example. The stacked conductive layers 51 are employed as word lines WL0 to WL7, in ascending order from the side of the P-type well region 40. The conductive layers 51 contain, for example, tungsten (W).

An insulating layer 46 is provided on top of the uppermost conductive layer 51. The conductive layers 52 and insulating layers 47 are alternately stacked on the insulating layer 46. The conductive layer 52 is formed in a plate shape extending along the XY plane, for example. The stacked conductive layers 52 are used as select gate line SGD. The conductive layers 52 contain, for example, tungsten (W).

An insulating layer 48 is provided on top of the uppermost conductive layer 52. A conductive layer 53 is provided on the insulating layer 48. The conductive layer 53 is formed into, for example, a line extending in the Y direction and is employed as a bit line BL. That is, a plurality of conductive layers 53 are aligned in the X direction in an unillustrated region. The conductive layers 53 contain, for example, copper (Cu).

Each of the memory pillars MP is provided so as to extend in the Z direction and penetrates the insulating layers 42 to 47 and the conductive layers 50 to 52. The bottom of the memory pillar MP is in contact with the P-type well region 40. Each memory pillar MP includes, for example, a semiconductor layer 60, a tunnel insulating film 61, an insulating film 62, and a block insulating film 63. The semiconductor layer 60 is provided so as to extend in the Z direction. The top end of the semiconductor layer 60 is included in a layer above the topmost conductive layers 52, while the bottom end of the semiconductor layer 60 is in contact with the P-type well region 40. The tunnel insulating film 61 covers the side surface of the semiconductor layer 60. The insulating film 62 covers the side surface of the tunnel insulating film 61. The block insulating film 63 covers the side surface of the insulating film 62. Both of the tunnel insulating film 61 and the block insulating film 63 include, for example, silicon oxide ($SiO_2$). The insulating film 62 includes, for example, silicon nitride (SiN).

Pillar-shaped contacts CV are provided on the semiconductor layers 60 of the memory pillars MP. In the figure, a contact CV corresponding to one of the two memory pillars MP is shown. A contact CV is coupled, in a region not shown in the figure, to the other memory pillar MP to which a contact CV is not coupled in the region shown in the figure. A top surface of the contact CV is in contact with one conductive layer 53 (one bit line BL). As described above, a single contact CV is coupled to one conductive layer 53 in each space separated by the slits SLT. That is, a memory pillar MP arranged between two adjacent slits SLT is electrically coupled to each of the conductive layers 53.

The slits SLT are formed, for example, in a shape extending in the XZ plane, and split the insulating layers 42 to 47 and the conductive layers 50 to 52. The top end of the slit SLT is included in a layer in which the conductive layer 48 is arranged. The bottom end of the slit SLT is in contact with the N-type semiconductor region 41 of the P-type well region 40. Specifically, the contact LI in the slit SLT is formed in a plate shape extending in the XZ plane. The bottom of the contact LI is electrically coupled to the N-type semiconductor region 41. The contact LI is distanced from the conductive layers 50 to 52 by the spacer SP.

The structure of the memory cell array 10 included in the semiconductor memory device 1 according to the first embodiment is not limited to the above-described configuration. The slits SLT are provided at least at the boundaries of the blocks BLK. When a plurality of string units SU are arranged between adjacent slits SLT, at least one slit that splits the select gate line SGD is provided between the adjacent slits SLT.

[1-1-4] Data Store Method

In the semiconductor memory device 1 according to the first embodiment, 8-bit data is stored by a combination of one memory cell transistor MT in the memory cell array 10A and one memory cell transistor MT in the memory cell array 10B. In this case, a set of a cell unit CU in the memory cell array 10A and a cell unit CU in the memory cell array 10B stores 8-page data. Hereinafter, details of the data storage method in the first embodiment are described.

In the first embodiment, data of eight pages stored in a cell unit CU in the memory cell array 10A and a cell unit CU in the memory cell array 10B will be called page PG1, PG2, PG3, PG4, PG5, PG6, PG7, and PG8. Page PG1 to page PG8 include first-bit data to eighth-bit data, respectively. Read operations performed on page PG1, PG2, PG3, PG4, PG5, PG6, PG7, and PG8 will be called a “PG1 read operation”, “PG2 read operation”, a “PG3 read operation”, a “PG4 read operation”, a “PG5 read operation”, a “PG6 read operation”, a “PG7 read operation”, and a “PG8 read operation”, respectively.

(Threshold Distributions of Memory Cell Transistor MT)

Figure 9:
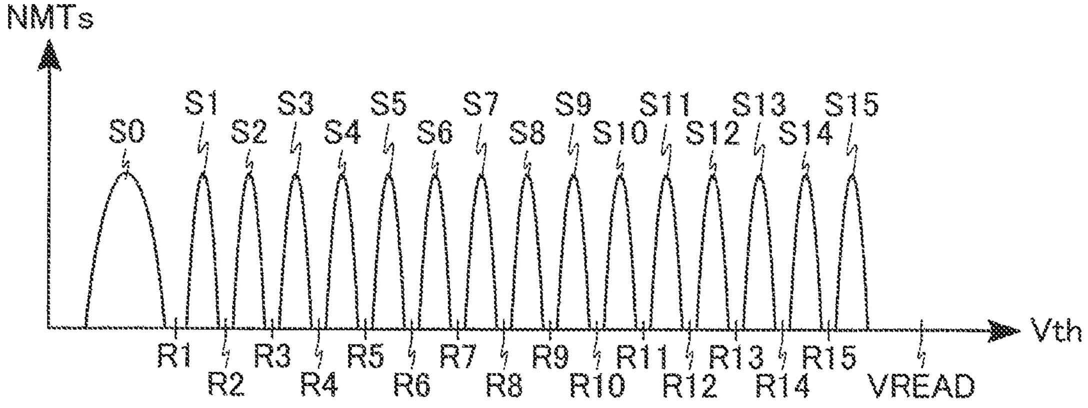
FIG. 9 is a schematic diagram showing an example of a threshold voltage distribution of memory cell transistors in the semiconductor memory device according to the first embodiment.

FIG. 9 shows an example of a threshold voltage distribution of the memory cell transistors MT in the semiconductor memory device 1 according to the first embodiment, particularly a threshold voltage distribution after a write operation targeting a cell unit CU is performed. In similar drawings referred to hereinafter, “NMTs” of the vertical axis represent the number of memory cell transistors MT, and “Vth” of the horizontal axis represents the threshold voltage Vth of the memory cell transistors MT.

As shown in FIG. 9, a threshold voltage distribution of the memory cell transistors MT included in a cell unit CU may form 16 types of states. Hereinafter, the 16 states are called an “S0” state, an “S1” state, an “S2” state, an “S3” state, an “S4” state, an “S5” state, an “S6” state, an “S7” state, an “S8” state, an “S9” state, an “S10” state, an “S11” state, an “S12” state, an “S13” state, an “S14” state, and an “S15” state, from lower to higher threshold voltages. Each of these states may be called a “write state”.

A read voltage used is set between adjacent states. Specifically, the read voltage R1 is set between the states “S0” and “S1”. The read voltage R2 is set between the states “S1” and “S2”. The read voltage R3 is set between the states “S2” and “S3”. The read voltage R4 is set between the states “S3” and “S4”. The read voltage R5 is set between the states “S4” and “S5”. The read voltage R6 is set between the states “S5” and “S6”. The read voltage R7 is set between the states “S6” and “S7”. The read voltage R8 is set between the states “S7” and “S8”. The read voltage R9 is set between the states “S8” and “S9”. The read voltage R10 is set between the states “S9” and “S10”. The read voltage R11 is set between the states “S10” and “S11”. The read voltage R12 is set between the states “S11” and “S12”. The read voltage R13 is set between the states “S12” and “S3”. The read voltage R14 is set between the states “S13” and “S14”. The read voltage R15 is set between the states “S14” and “S15”. The read pass voltage VREAD is set at a voltage higher than the “S15” state. When the read pass voltage VREAD is applied to the control gate of a memory cell transistor MT, the memory cell transistor MT is turned on regardless of the data stored therein.

Figure 13:
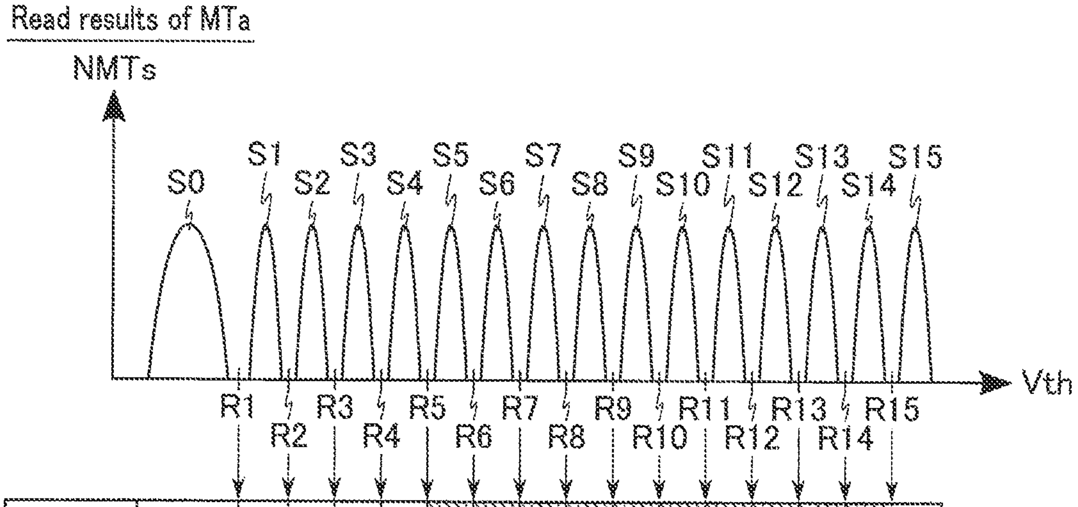
FIG. 13 is a table showing an example of read results of memory cell transistors MTa in the semiconductor memory device according to the first embodiment.

For example, if one of the memory cell transistors MT included in the NAND string NS shown in FIG. 13 is a target of a read operation, one of the read voltages R1 to R15 is applied to a word line coupled to the control gate of this memory cell transistor MT (selected word line), and a read pass voltage VREAD is applied to word lines coupled to the control gates of the other memory cell transistors MT (non-selected word lines). Thus, if one of the memory cell transistors MT included in the NAND string NS is a target of a read operation, the read voltage VREAD is applied to the control gates of the other memory cell transistors MT. For this reason, the read voltage VREAD is set sufficiently low that an application of the VREAD to the control gate would not affect the threshold voltage of the memory cell transistor MT (sufficiently low that "disturb" does not cause any substantial problems). Furthermore, as shown in FIG. 9, the threshold voltage distributions of the "S0" state through "S15" state with which each memory cell transistor MT may be set need to be located in a range lower than the read pass voltage VREAD. For this reason, it is necessary to narrow the distribution of each state if the number of states with which the memory cell transistors MT may be set is large. On the other hand, if the number of states with which the memory cell transistors MT may be set is small, the distribution of each state may be widened.

(Circuit Configuration Relating to Share Coding)

Figure 10:
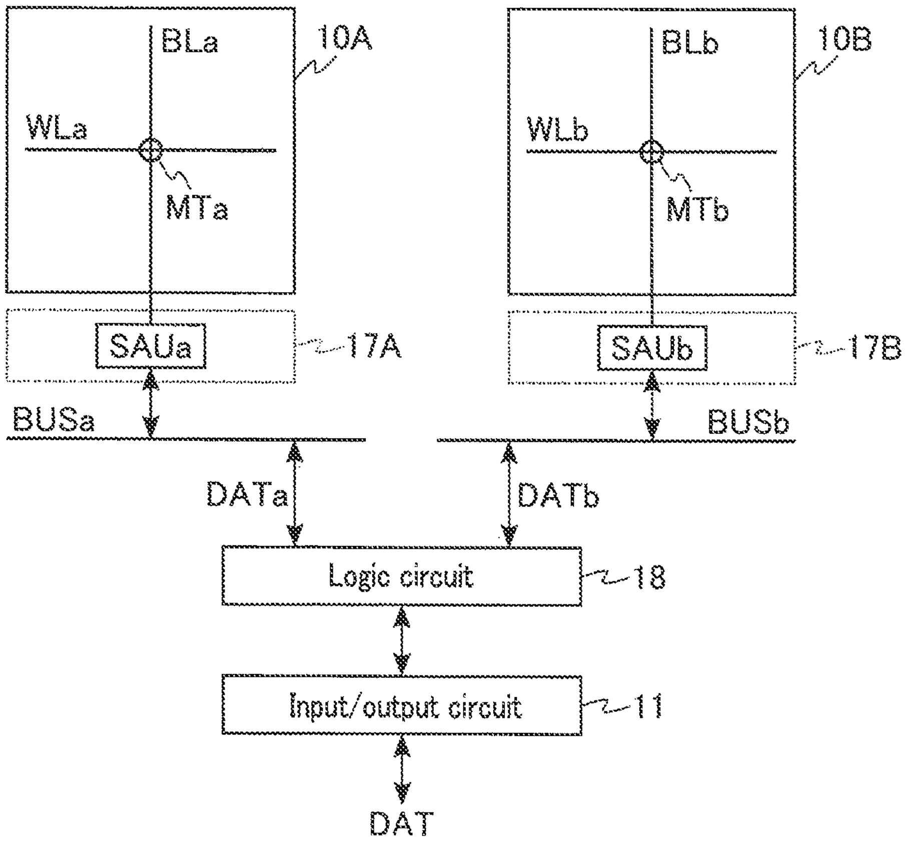
FIG. 10 is a circuit diagram showing an example of couplings used in share coding in the semiconductor memory device according to the first embodiment.

FIG. 10 shows an example of the couplings in the circuit configuration used in share coding in the semiconductor memory device 1 according to the first embodiment. As shown in FIG. 10, the memory cell array 10A includes a memory cell array MTa coupled to a bit line BLa and a word line WLa. The memory cell array 10B includes a memory cell array MTb coupled to a bit line BLb and a word line WLb.

Data DATa stored in the memory cell transistor MTa is read by a sense amplifier unit SAUa included in the sense amplifier module 17A and transferred to the logic circuit 18 via the data bus BUSa. Similarly, data DATb stored in the memory cell transistor MTh is read by a sense amplifier unit SAUb included in the sense amplifier module 17B and transferred to the logic circuit 18 via the data bus BUSb. Then, the logic circuit 18 performs a decoding process using the data DATa read from the memory cell transistor MTa and the data DATb read from the memory cell transistor MTh, and outputs the decoded data DAT to the memory controller 2 via the input/output circuit 11.

A threshold voltage of each of the memory cell transistors MTa and MTb may be included in one of the 16 states, as described above with reference to FIG. 9. In other words, in the semiconductor memory device 1 of the first embodiment, 16 states that may be applied to the memory cell transistor MTa and 16 states that may be applied to the memory cell transistor MTb make up 256 combinations. Different 8-bit data is allocated to each of 256 combinations in the semiconductor memory device 1 of the first embodiment. In the present specification, data allocation in share coding is confirmed by a combination of a "decoding rule" and a "read voltage".

(Details of Share Coding)

FIG. 11 shows an example of share coding used in the semiconductor memory device 1 of the first embodiment, and shows combinations of decoding rules used in a read operation for each page and read voltages. In the semiconductor memory device 1 of the first embodiment, decoding rules and read voltages are set for each page as shown in FIG. 11 and the drawings thereafter.

(Example) Read page: decoding rules [a,b,c,d], read voltages to be used [read voltages set for MTa/read voltages set for MTb]

PG1:[1,0,0,1], [(R5,R15)/(R4,R12)]
PG2:[1,0,0,1], [(R1,R11)/(R5,R13)]
PG3:[1,0,0,1], [(R7,R9)/(R3,R11)]
PG4:[1,0,0,1], [(R2,R6,R14)/(R6,R8,R10)]
PG5:[1,0,0,1], [(R4,R10,R12)/(R6,R8,R10)]
PG6:[1,0,0,1], [(R3,R8,R13)/(R4,R12)]
PG7:[1,0,0,1], [(R1,R11)/(R2,R9,R15)]
PG8:[1,0,0,1], [(R7,R9)/(R1,R7,R14)]

FIG. 12 shows an example of the allocation of the decoding rules used in the semiconductor memory device 1 according to the first embodiment. In the semiconductor memory device 1 of the first embodiment, one of the coding rules "a" to "d" is allocated to each combination of read results of the memory cell transistors MTa and MTh, as shown in FIG. 12 and thereafter.

(Example) Read result of MTa/Read result of MTb: Decoding rule

"1"/"1":"a"
"1"/"0":"b"
"0"/"1":"c"
"0"/"0":"d"

Figure 14:
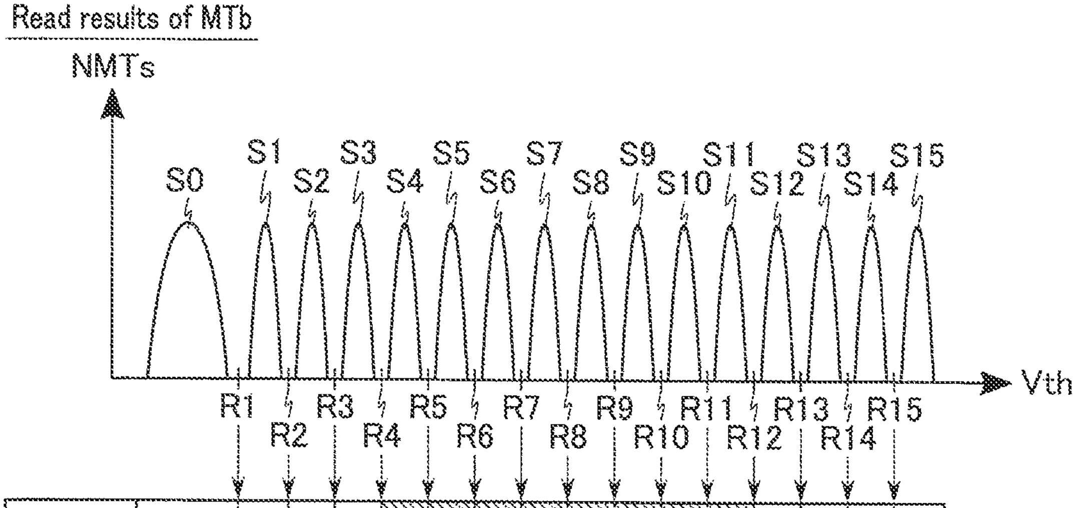
FIG. 14 is a table showing an example of read results of memory cell transistors MTb in the semiconductor memory device according to the first embodiment.

FIGS. 13 and 14 show an example of read results of the memory cell transistors MTa and MTh in the semiconductor memory device 1 of the first embodiment. As shown in FIG. 13, as the read voltages applied to the memory cell transistors MTa, all 15 read voltages shown in FIG. 9 are used. Similarly, as shown in FIG. 14, as the read voltages applied to the memory cell transistor MTb, all 15 read voltages shown in FIG. 9 are used. For this reason, a read operation on the memory cell transistors MTa and MTb can determine which of states "S0" through "S15" the memory cell transistors MTa and MTb are included in.

In the memory cell transistor MTa, the same read voltage is used in the PG2 read operation and the PG7 read operation, and the same read voltage is used in the PG3 read operation and the PG8 read operation. In the memory cell transistor MTb, the same read voltage is used in the PG1 read operation and the PG6 read operation, and the same read voltage is used in the PG4 read operation and the PG5 read operation.

In other words, the same voltage is used in the PG2 read operation and the PG7 read operation in the memory cell transistor MTa on one hand, and the read voltages are different between the PG2 read operation and the PG7 read operation in the memory cell transistor MTb on the other hand. The same voltage is used in the PG1 read operation and the PG6 read operation in the memory cell transistor MTa on one hand, and the read voltages are different between the PG1 read operation and the PG6 read operation in the memory cell transistor MTb on the other hand.

Thus, the semiconductor memory device 1 of the first embodiment can have a pair of a memory cell transistor MTa and a memory cell transistor MTb store 8-bit data. For example, in a read operation, the logic circuit 18 first checks a combination of read results of the memory cell transistors MTa and MTb. Then, the logic circuit 18 outputs, to the input/output circuit 11, the data that is set with the decoding rules allocated to this combination.

Specifically, if the read result of the PG1 read operation on the memory cell transistor MTa is "1" and the read result of the memory cell transistor MTb is "1", the logic circuit 18 outputs "1" data that is set with the decoding rule "a" of the page PG1 to the input/output circuit 11. In the PG2 read operation, if the read result of the memory cell transistor MTa is "1" and the read result of the memory cell transistor MTb is "0", the logic circuit 18 outputs to the input/output circuit 11 "0" data that is set with the decoding rule "b" of the page PG2. For the other combinations of read results, the logical circuit 18 can confirm read data in a similar manner based on the share coding shown in FIG. 11 and the decoding rules shown in FIG. 12.

The above-described coding in which 8-bit data is stored in two memory cell transistors MTa and MTb may be called "8 bit/2 cell share coding". In the share coding in the first embodiment, the number of times of data reading in PG1, PG2, PG3, PG4, PG5, PG6, PG7, and PG8 is two, two, two, three, three, three, three, and three, respectively. For this reason, the share coding in the first embodiment may be called “2-2-2-3-3-3-3-3 coding”.

[1-2] Read Operation

The semiconductor memory device 1 according to the first embodiment is capable of performing a read operation for each page. Hereinafter, a read operation in the semiconductor memory device 1 according to the first embodiment will be described below, in the order of the PG1 read operation, . . . , the PG8 read operation. In the descriptions hereinafter, it is assumed that a voltage applied to a word line WL is applied by the driver circuit 15 and the row decoder module 16 based on the control of the sequencer 14.

(PG1 Read Operation)

Figure 15:
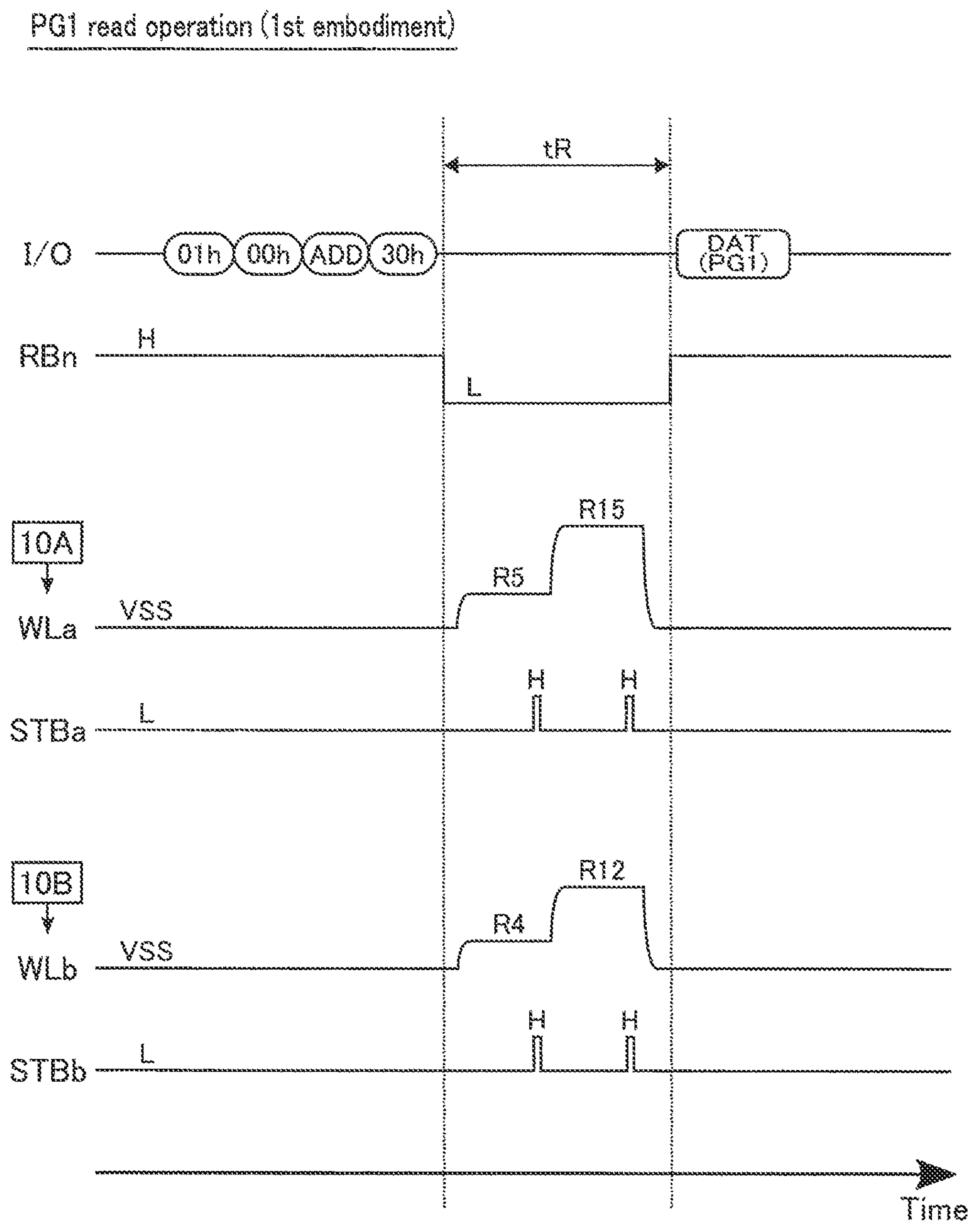
FIG. 15 is a timing chart showing an example of a PG1 read operation in the semiconductor memory device according to the first embodiment.

FIG. 15 is an example of a timing chart of a PG1 read operation in the semiconductor memory device 1 according to the first embodiment. FIG. 15 shows an input/output signal I/O, a ready/busy signal RBn, voltages of the word lines WLa and WLb, and control signals STBa and STBb. “STBa” and “STBb” correspond to the control signals STB associated with the memory cell arrays 10A and 10B respectively. In an initial state before a read operation begins, the ready/busy signal RBn is in an “H” level (ready state). The voltage of each of the word lines WLa and WLb is VSS. Each of the control signals STBa and STBb is at an “L” level.

As shown in FIG. 15, first, the memory controller 2 sequentially sends, for example, a command “01h”, a command “00h”, address information ADD, and a command “30h” in this order to the semiconductor memory device 1. The command “01h” is a command for instructing the performance of an operation for the page PG1. The command “00h” is a command for instructing a read operation. The command “30h” is a command for instructing the semiconductor memory device 1 to start a read operation based on the command stored in the command register 12 and the address stored in the address register 13.

When the command “30h” is stored in the command register 12, the sequencer 14 changes a ready state (RBn=“H” level) of the semiconductor memory device 1 to a busy state (RBn=“L” level) and commences a PG1 read operation. In the PG1 read operation, the sequencer 14 commences a read operation on the memory cell array 10A and a read operation on the memory cell array 10B simultaneously and performs the operations in parallel.

In a read operation on the memory cell array 10A, the read voltages R5 and R15 are applied in this order to a selected word line WLa. The sequencer 14 asserts the control signal STBa during the time when the read voltage R5 is applied to the word line WLa and the time when the read voltage R15 is applied to the word line WLa. Each sense amplifier unit SAUa confirms a read result of the memory cell transistor MTa based on a plurality of read results obtained in the read operation, and causes, for example, the latch circuit XDL to store the confirmed data.

In a read operation on the memory cell array 10B, the read voltages R4 and R12 are applied to a selected word line WLb in this order. The sequencer 14 asserts the control signal STBb during the time when the read voltage R4 is applied to the word line WLb and the time when the read voltage R12 is applied to the word line WLb. Each sense amplifier unit SAUb confirms a read result of the memory cell transistor MTb based on a plurality of read results obtained by the read operation and causes, for example, the latch circuit XDL to store the confirmed data.

The above-described application of the read voltage R5 to the word line WLa and the application of the voltage R4 to the word line WLb are performed in parallel. Similarly, the application of the read voltage R15 to the word line WLa and the application of the voltage R12 to the word line WLb are performed in parallel. The timing of asserting the control signal STBa and the timing of asserting the control signal STBb may be either in or out of sync, as long as the timings occur during the application of the read voltages to the word lines WLa and WLb in parallel.

Upon completion of the read operation on the memory cell array 10A and the read operation on the memory cell array 10B, the sequencer 14 finishes the PG1 read operation and changes the semiconductor memory device 1 from a busy state to a ready state. Upon detection of the completion of the PG1 read operation based on the changes in the ready/busy signal RBn, the memory controller 2 for example toggles the read enable signal REn to subsequently output read data of the page PG1 (“DAT(PG1)”), to the semiconductor memory device 1.

Briefly, the read results stored in the plurality of latch circuits XDL in the sense amplifier modules 17A and 17B are first transferred to the logic circuit 18. Then, the logic circuit 18 confirms the read data of the page PG1 based on the following: the read result of the memory cell transistors MTa read from the memory cell array 10A, the read result of the memory cell transistors MTb read from the memory cell array 10B, the share coding shown in FIG. 11, and the decoding rules shown in FIG. 12. Thereafter, the confirmed read data of the page PG1, DAT(PG1), is transferred to the input/output circuit 11 and subsequently output to the memory controller 2 based on the read enable signal REn.

The above-described process of read data decoding by the logic circuit 18 may be performed to the extent possible in advance of the transition of the semiconductor memory device 1 to a ready state. For example, using a pipeline, the sequencer 14 may sequentially transfer the read data to the vicinity of the input/output circuit 11 in advance of the transition, in the order of the output of the read data from a read-target cell unit CU. The semiconductor memory device 1 of the first embodiment can thus advance the start of the output of the read data by performing the control in preparation of such data output.

(PG2 Read Operation)

Figure 16:
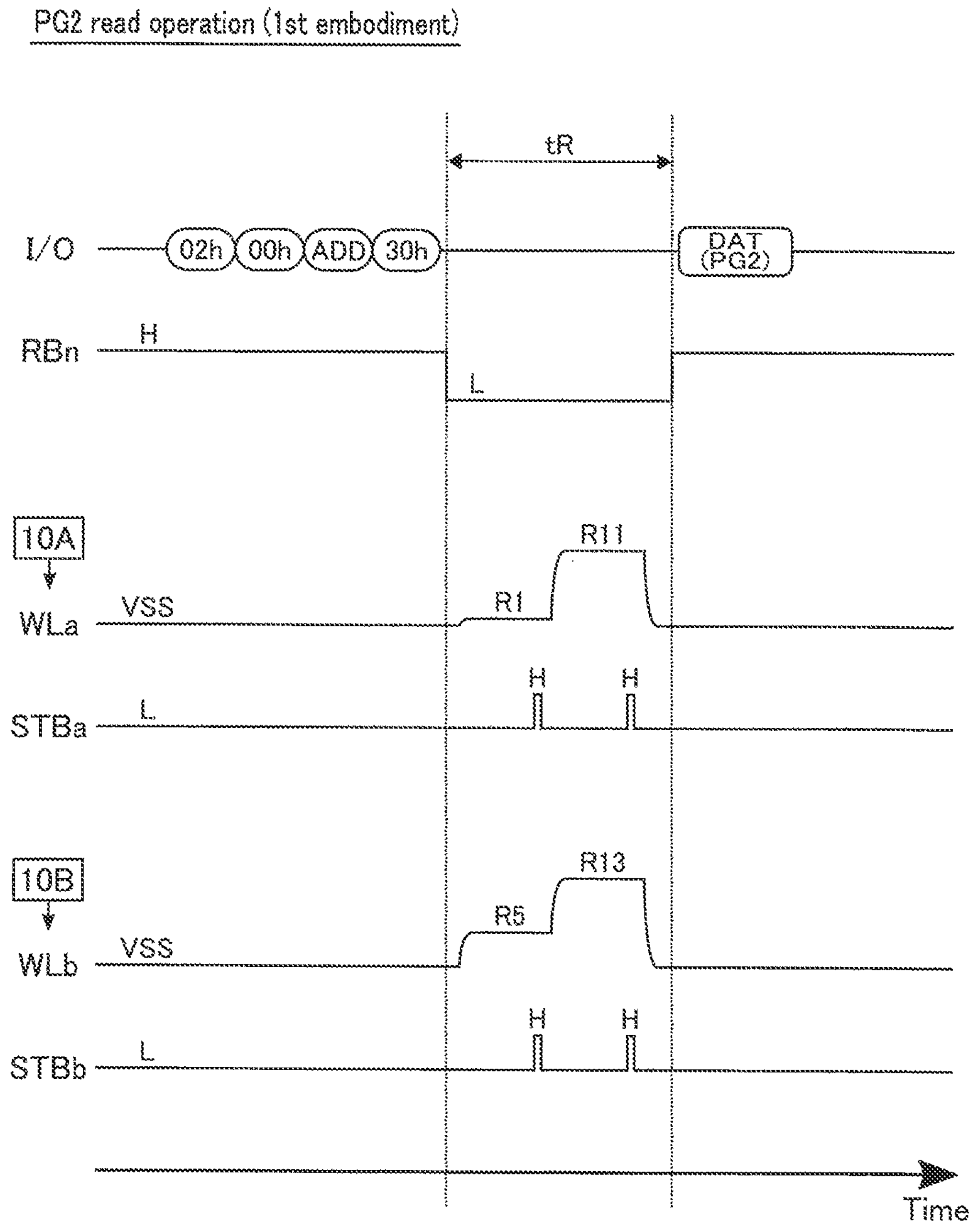
FIG. 16 is a timing chart showing an example of a PG2 read operation in the semiconductor memory device according to the first embodiment.

FIG. 16 is an example of a timing chart of a PG2 read operation in the semiconductor memory device 1 according to the first embodiment. As shown in FIG. 16, the command sequence and the read voltages used in the PG2 read operation differ from those used in the PG1 read operation, which was previously described with reference to FIG. 15.

Specifically, the command sequence in the PG2 read operation has a configuration in which the command “01h” in the PG1 read operation is replaced with the command “02h”. The command “02h” is a command for instructing the performance of an operation for the page PG2. In the PG2 read operation, the read voltages R1 and R11 are subsequently applied to the word line WLa, and in parallel to that, the read voltages R5 and R13 are subsequently applied to the word line WLb. Then, after the PG2 read operation, the decoding based on the decoding rules of the page PG2 is performed and the read data of page PG2 (“DAT(PG2)”) is subsequently output. The other operations in the PG2 read operation are the same as those in the PG1 read operation.

(PG3 Read Operation)

Figure 17:
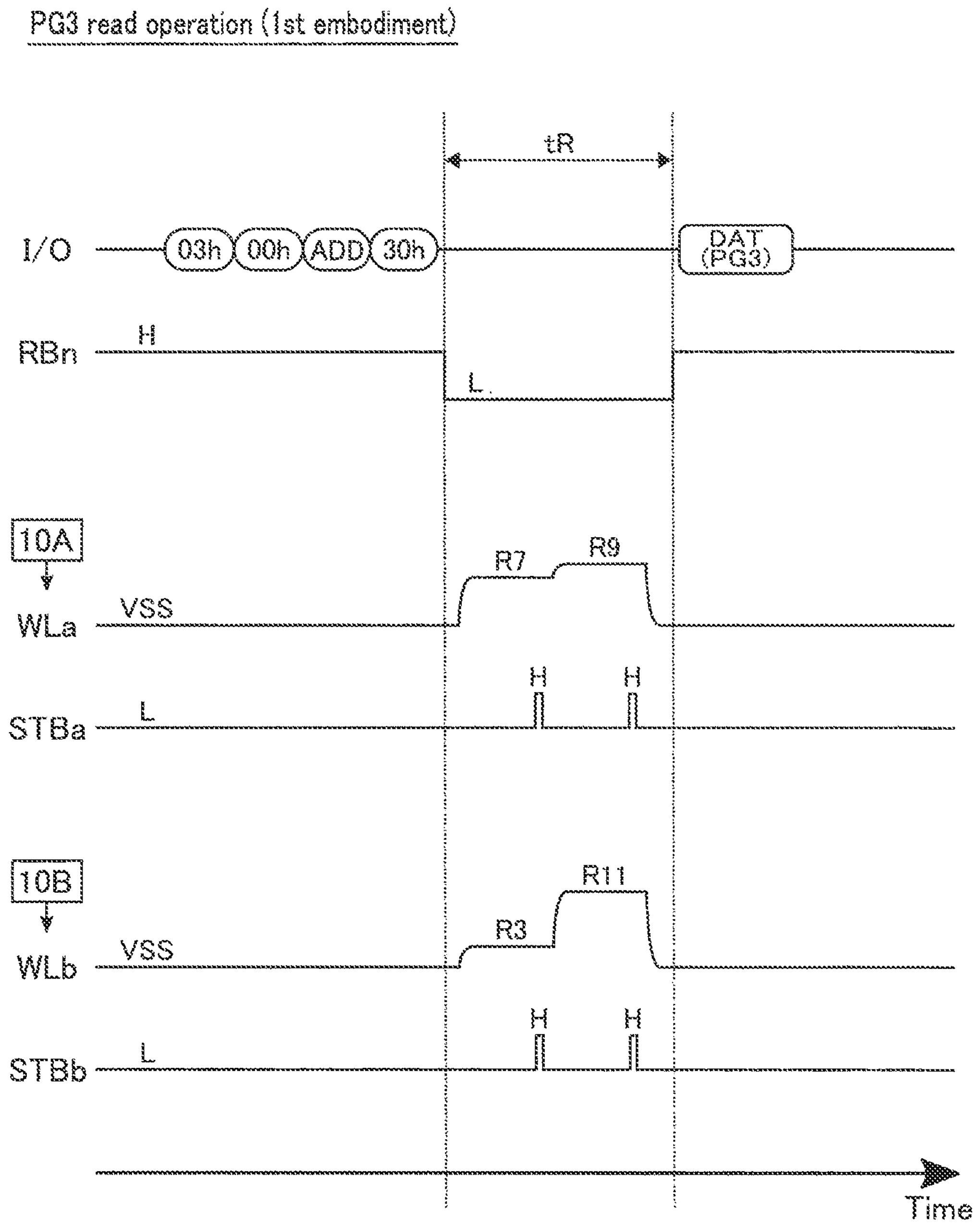
FIG. 17 is a timing chart showing an example of a PG3 read operation in the semiconductor memory device according to the first embodiment.

FIG. 17 is an example of a timing chart of the PG3 read operation in the semiconductor memory device 1 according to the first embodiment. As shown in FIG. 17, the command sequence and the read voltages used in the PG3 read operation differ from those used in the PG1 read operation, which was previously described with reference to FIG. 15.

Specifically, the command sequence in the PG3 read operation has a configuration in which the command "01h" in the PG1 read operation is replaced with the command "03h". The command "03h" is a command for instructing the performance of an operation for the page PG3. In the PG3 read operation, the read voltages R7 and R9 are sequentially applied to the word line WLa, and the read voltages R3 and R11 are sequentially applied to the word line WLb. Then, after the PG3 read operation, the decoding based on the decoding rules of the page PG3 is performed and the read data of page PG3 ("DAT(PG3)") is subsequently output. The other operations in the PG3 read operation are the same as those in the PG1 read operation.

(PG4 Read Operation)

Figure 18:
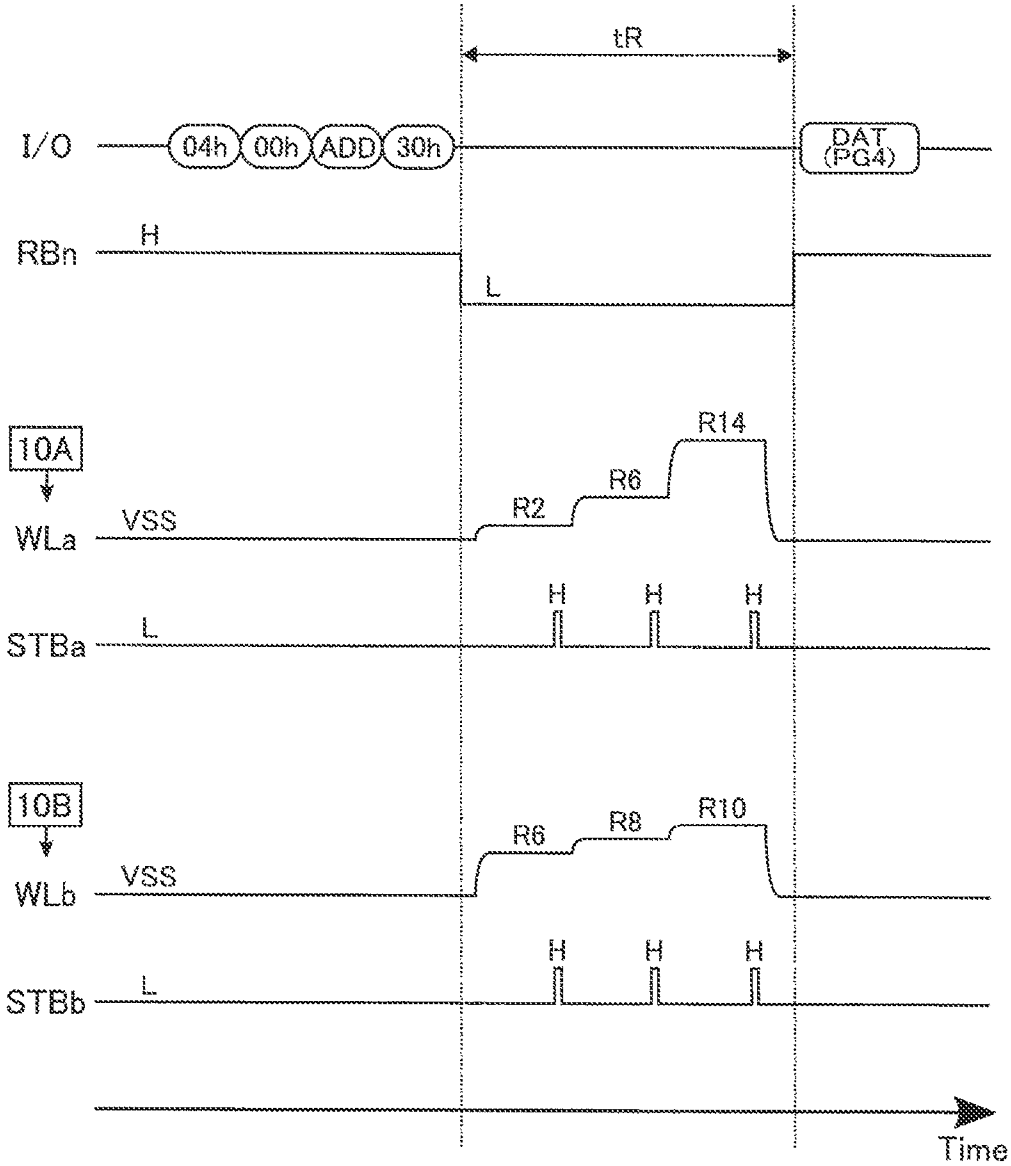
FIG. 18 is a timing chart showing an example of a PG4 read operation in the semiconductor memory device according to the first embodiment.

FIG. 18 is an example of a timing chart of the PG4 read operation in the semiconductor memory device 1 according to the first embodiment. As shown in FIG. 18, the command sequence and the read voltages used in the PG4 read operation differ from those used in the PG1 read operation, which was previously described with reference to FIG. 15.

Specifically, the command sequence in the PG4 read operation has a configuration in which the command "01h" in the PG1 read operation is replaced with the command "04h". The command "04h" is a command for instructing the performance of an operation for the page PG4. In the PG4 read operation, the read voltages R2, R6 and R14 are sequentially applied to the word line WLa, and the read voltages R6, R8 and R10 are sequentially applied to the word line WLb. Then, after the PG4 read operation, the decoding based on the decoding rules of the page PG4 is performed and the read data of page PG4 ("DAT(PG4)") is subsequently output. The other operations in the PG4 read operation are the same as those in the PG1 read operation.

(PG5 Read Operation)

Figure 19:
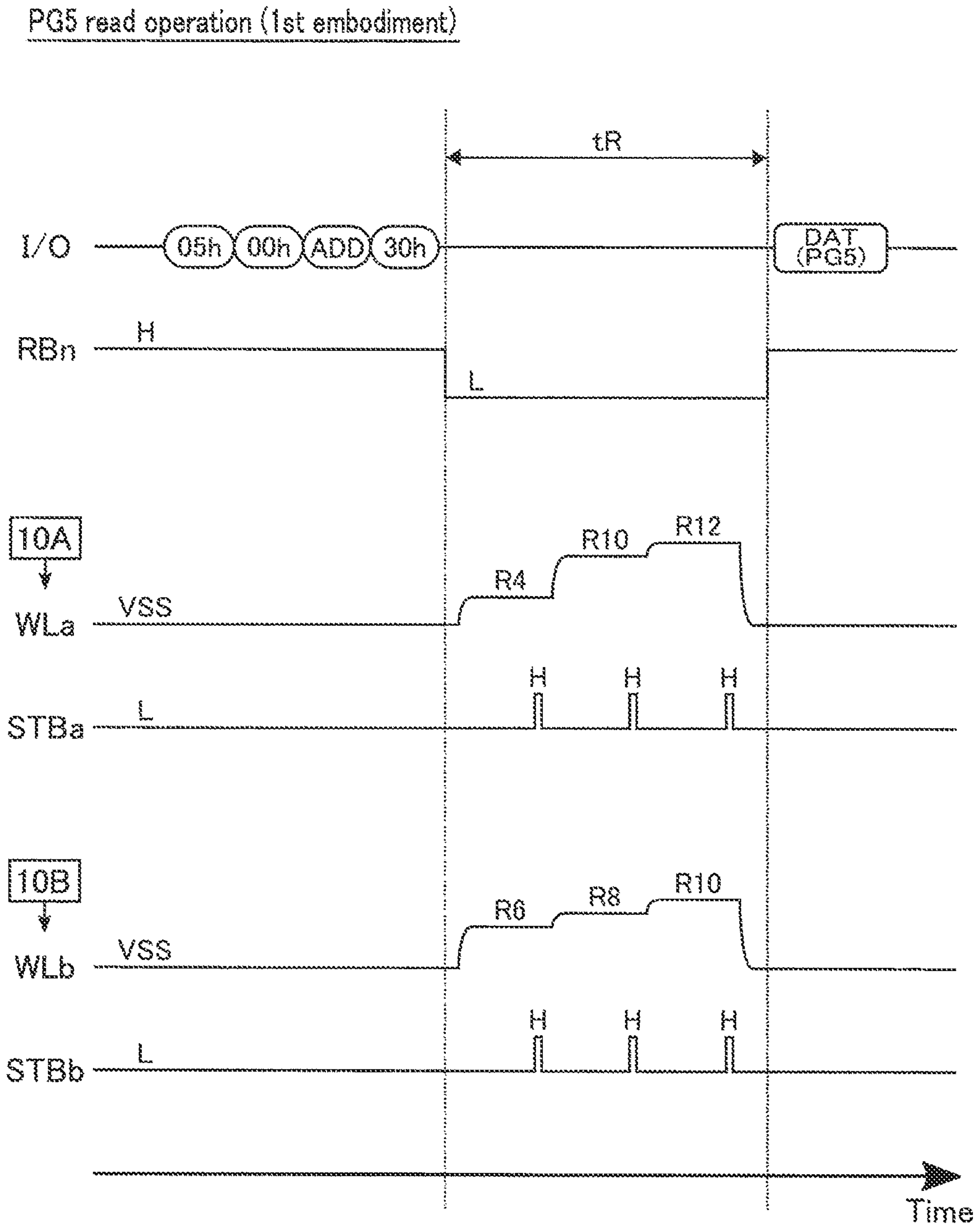
FIG. 19 is a timing chart showing an example of a PG5 read operation in the semiconductor memory device according to the first embodiment.

FIG. 19 is an example of a timing chart of the PG5 read operation in the semiconductor memory device 1 according to the first embodiment. As shown in FIG. 19, the command sequence and the read voltages used in the PG5 read operation differ from those used in the PG4 read operation, which was previously described with reference to FIG. 18.

Specifically, the command sequence in the PG5 read operation has a configuration in which the command "04h" in the PG4 read operation is replaced with the command "05h". The command "05h" is a command for instructing the performance of an operation for the page PG5. In the PG5 read operation, the read voltages R4, R10 and R12 are sequentially applied to the word line WLa, and the read voltages R6, R8 and R10 are sequentially applied to the word line WLb. Then, after the PG5 read operation, the decoding based on the decoding rules of the page PG5 is performed and the read data of page PG5 ("DAT(PG5)"), is subsequently output. The other operations in the PG5 read operation are the same as those in the PG4 read operation.

(PG6 Read Operation)

Figure 20:
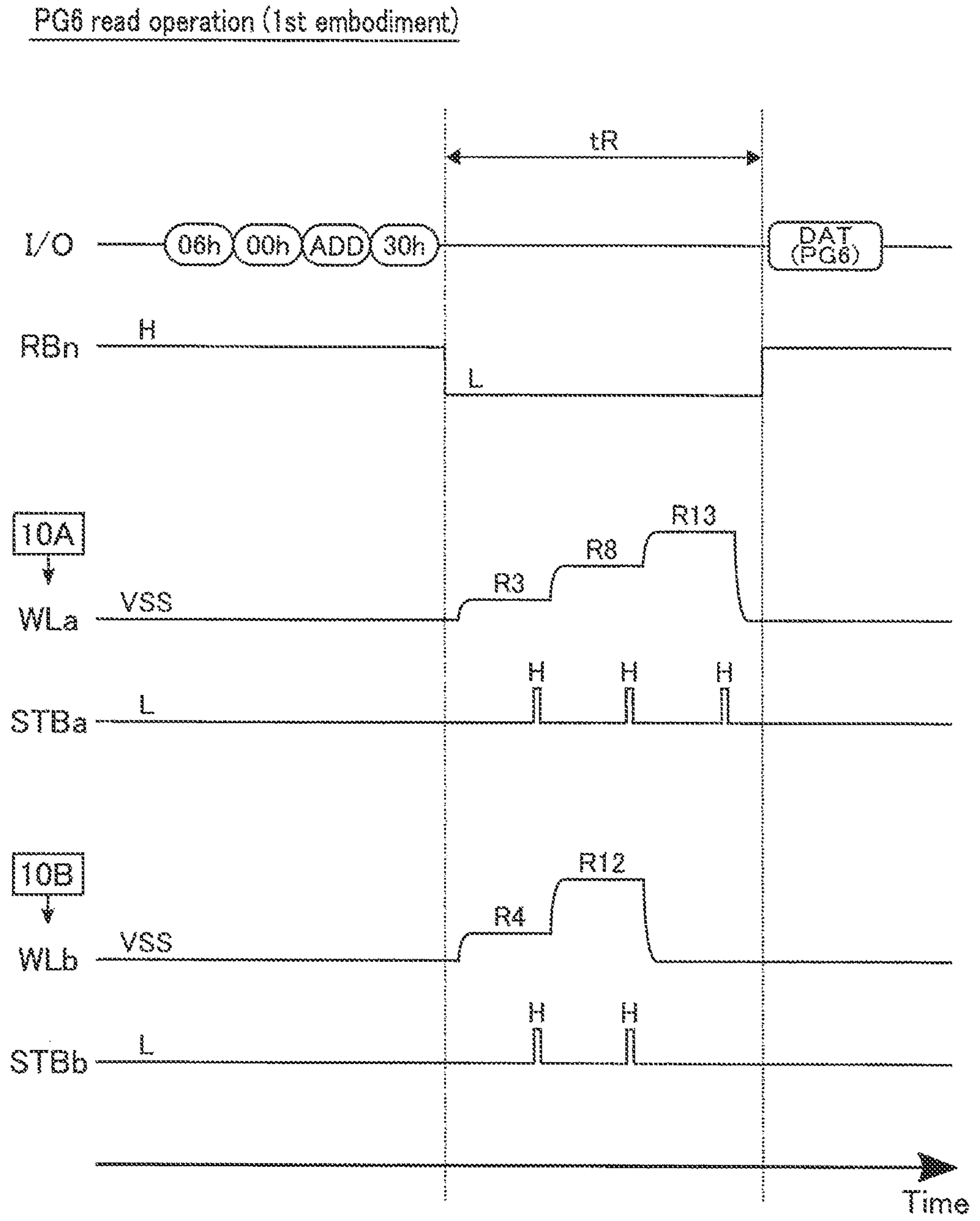
FIG. 20 is a timing chart showing an example of a PG6 read operation in the semiconductor memory device according to the first embodiment.

FIG. 20 is an example of a timing chart of the PG6 read operation in the semiconductor memory device 1 according to the first embodiment. As shown in FIG. 20, the command sequence and the read voltages used in the PG6 read operation differ from those used in the PG4 read operation, which was previously described with reference to FIG. 18.

Specifically, the command sequence in the PG6 read operation has a configuration in which the command "04h" in the PG4 read operation is replaced with the command "06h". The command "06h" is a command for instructing the performance of an operation for the page PG6. In the PG6 read operation, the read voltages R3, R8, and R13 are sequentially applied to the word line WLa, and the read voltages R4 and R12 are sequentially applied to the word line WLb. The application of the read voltage R3 to the word line WLa and the application of the voltage R4 to the word line WLb are performed in parallel. The application of the read voltage R8 to the word line WLa and the application of the voltage R12 to the word line WLb are performed in parallel. While the read voltage R13 is being applied to the word line WLa, the voltage applied to the word line WLb is lowered. Then, after the PG6 read operation, the decoding based on the decoding rules of the page PG6 is performed and the read data of page PG6 ("DAT(PG6)") is subsequently output. The other operations in the PG6 read operation are the same as those in the PG4 read operation.

(PG7 Read Operation)

Figure 21:
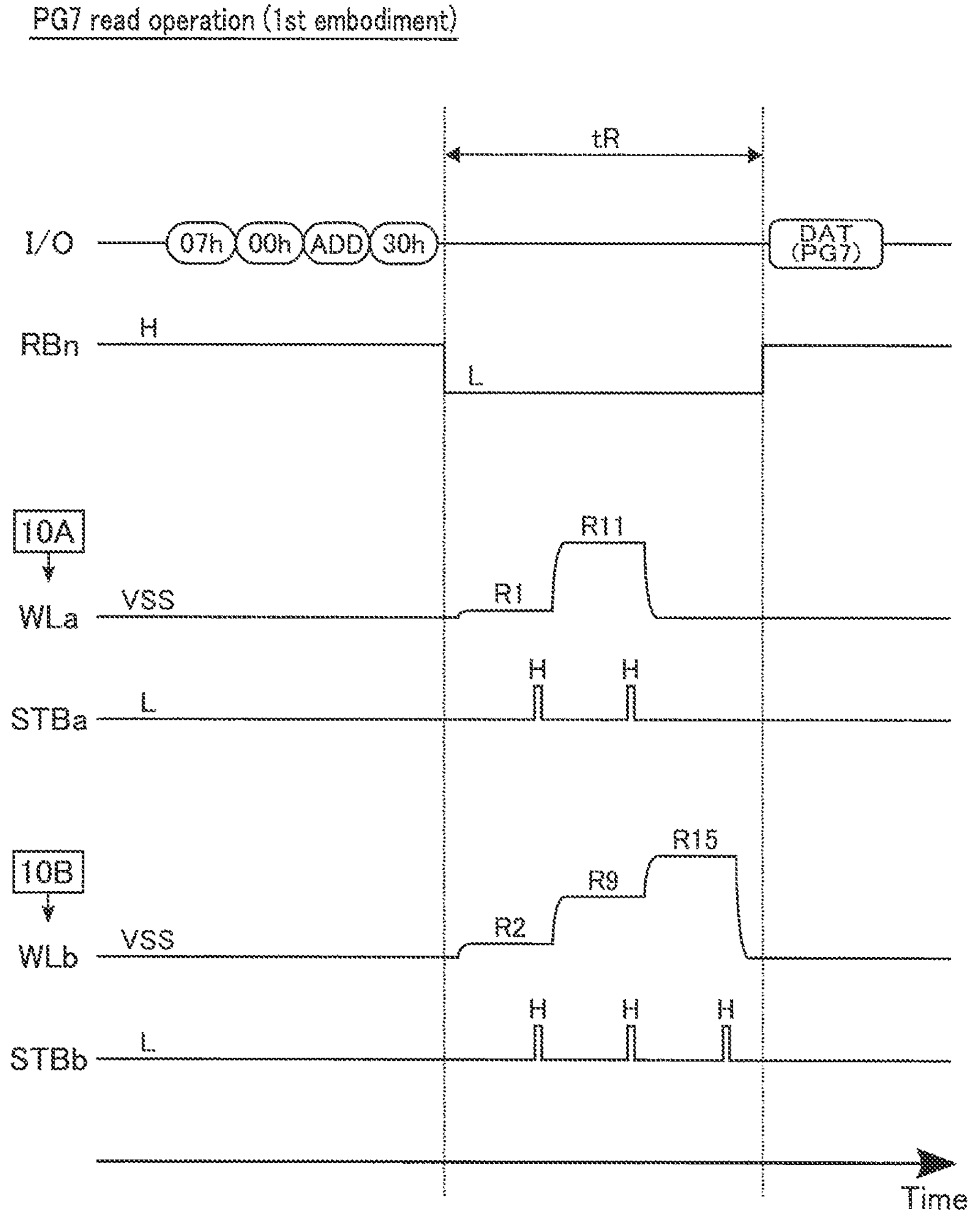
FIG. 21 is a timing chart showing an example of a PG7 read operation in the semiconductor memory device according to the first embodiment.

FIG. 21 is an example of a timing chart of the PG7 read operation in the semiconductor memory device 1 according to the first embodiment. As shown in FIG. 21, the command sequence and the read voltages used in the PG7 read operation differ from those used in the PG4 read operation, which was previously described with reference to FIG. 18.

Specifically, the command sequence in the PG7 read operation has a configuration in which the command "04h" in the PG4 read operation is replaced with the command "07h". The command "07h" is a command for instructing the performance of an operation for the page PG7. In the PG7 read operation, the read voltages R1 and R11 are sequentially applied to the word line WLa, and the read voltages R2, R9, and R15 are sequentially applied to the word line WLb. The application of the read voltage R1 to the word line WLa and the application of the voltage R2 to the word line WLb are performed in parallel. The application of the read voltage R11 to the word line WLa and the application of the voltage R9 to the word line WLb are performed in parallel. While the read voltage R15 is being applied to the word line WLb, the voltage applied to the word line WLa is lowered. Then, after the PG7 read operation, the decoding based on the decoding rules of the page PG7 is performed and the read data of page PG7 ("DAT(PG7)") is subsequently output. The other operations in the PG7 read operation are the same as those in the PG4 read operation.

(PG8 Read Operation)

Figure 22:
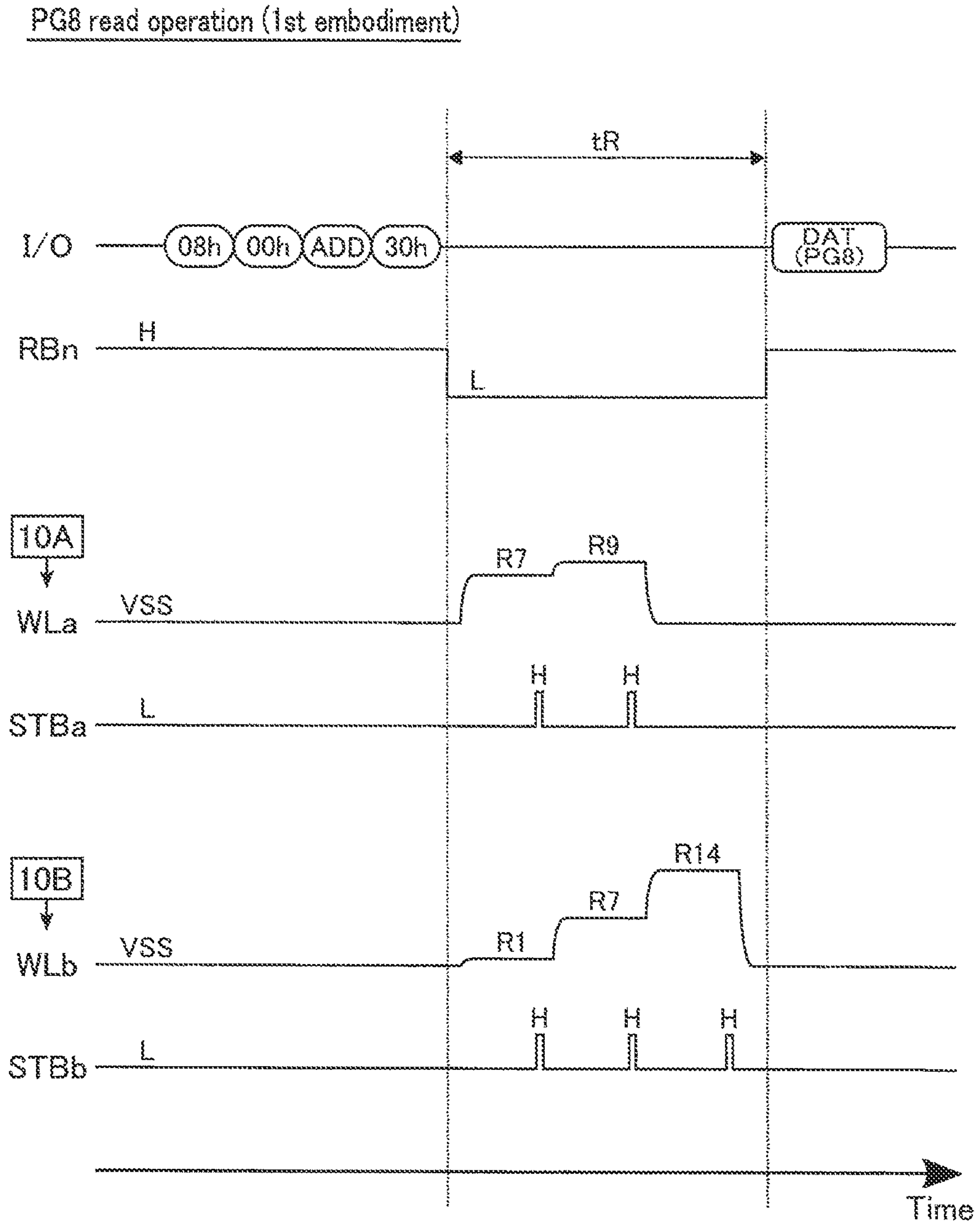
FIG. 22 is a timing chart showing an example of a PG8 read operation in the semiconductor memory device according to the first embodiment.

FIG. 22 is an example of a timing chart of the PG8 read operation in the semiconductor memory device 1 according to the first embodiment. As shown in FIG. 22, the command sequence and the read voltages used in the PG8 read operation differ from those used in the PG4 read operation, which was previously described with reference to FIG. 18.

Specifically, the command sequence in the PG8 read operation has a configuration in which the command "04h" in the PG4 read operation is replaced with the command "08h". The command "08h" is a command for instructing the performance of an operation for the page PG8. In the PG8 read operation, the read voltages R7 and R9 are sequentially applied to the word line WLa, and the read voltages R1, R7, and R14 are sequentially applied to the word line WLb. The application of the read voltage R7 to the word line WLa and the application of the voltage R1 to the word line WLb are performed in parallel. The application of the read voltage R9 to the word line WLa and the application of the voltage R7 to the word line WLb are performed in parallel. While the read voltage R14 is being applied to the word line WLb, the voltage applied to the word line WLa is lowered. Then, after the PG8 read operation, the decoding based on the decoding rules of the page PG8 is performed and the read data of page PG8 ("DAT(PG8)") is subsequently output. The other operations in the PG8 read operation are the same as those in the PG4 read operation.

In the above-described PG1 through PG8 read operations, the period during which the ready/busy signal RBn is in an "L" level corresponds to the processing time tR of each read operation. The length tR of each read operation depends on a larger number of read voltages applied to either the word line WLa or WLb. For example, in the PG1 read operation, since two types of read voltages are used in both of the word lines WLa and WLb, a read time tR is set so that a read operation is performed twice. In the PG6 read operation, since three types of read voltages are used in the word line WLa whereas two types are used in the word line WLb, a read time tR is set so that a read operation is performed three times, regardless of performing the read operation twice in the word line WLb. Thus, the length of the read time tR is set in accordance with the increase in the number of times of performing a read operation.

[1-3] Advantageous Effects of First Embodiment

The above-described semiconductor memory device 1 according to the first embodiment can speed up a read operation performed on each page. Hereinafter, detailed advantageous effects of the semiconductor memory device 1 according to the first embodiment will be described, using a comparative example.

Figure 23:
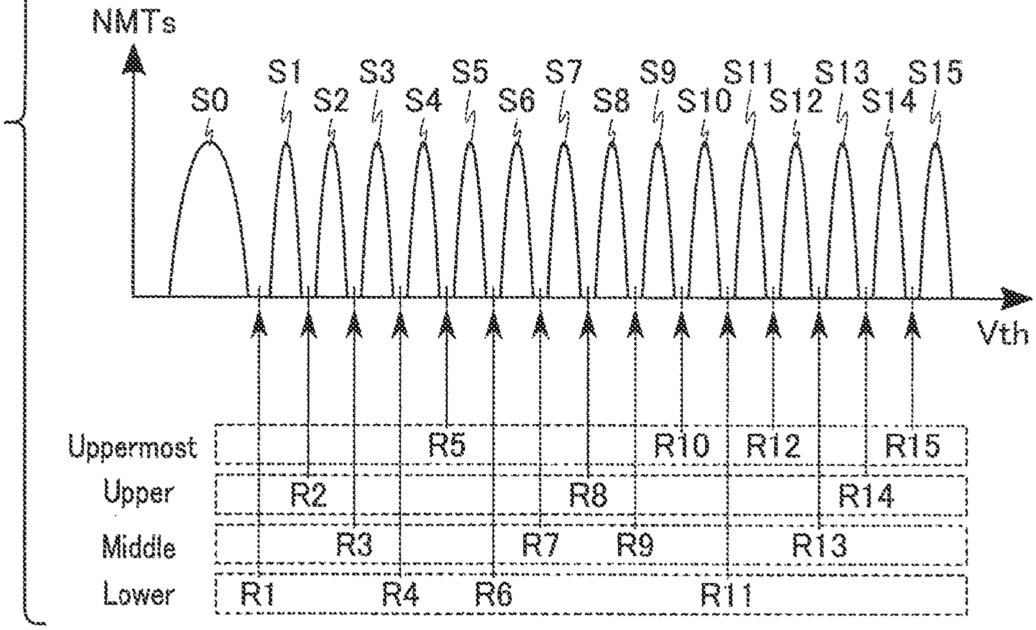
FIG. 23 is a table showing an example of 4 bit/1 cell coding in a comparative example of the first embodiment.

FIG. 23 shows an example of 4 bit/1 cell (quadruple-level cell, QLC) coding in a comparative example of the first embodiment. As shown in FIG. 23, in the comparative example of the first embodiment, mutually different 4-bit data is allocated to each of 16 states similar to those of the first embodiment. In this comparative example, lower page data is confirmed by read operations using the read voltages R1, R4, R6, and R11. Middle page data is confirmed by read operations using the read voltages R3, R7, R9, and R13. Upper page data is confirmed by read operations using the read voltages R2, R8, and R14. Uppermost page data is confirmed by read operations using the read voltages R5, R10, R12, and R15. Such 4 bit/1 cell coding is called, for example, "4-4-3-4 coding" based on the number of times the read operations are performed for each page.

In the coding of the comparative example of the first embodiment, 4-bit data is stored using one memory cell transistor MT. The number of times read operations are performed per page is, for example, (4+4+3+4)/4=3.75.

On the other hand, the semiconductor memory device 1 according to the first embodiment stores 8-bit data using a pair of two memory cell transistors MT. The number of times read operations are performed per page is, for example, (2+2+2+3+3+3+3+3)/8=2.625.

Thus, the storage capacity per memory cell transistor MT in the semiconductor memory device 1 of the first embodiment is the same as that in the comparative example of the first embodiment, whereas the number of times read operations are performed per page is smaller in the former than in the latter. Thus, the semiconductor memory device 1 of the first embodiment can realize the same storage capacity as that of the comparative example of the first embodiment with the same storage area size, and can increase the rate of the read operation per page compared to the comparative example of the first embodiment.

[1-4] Modifications of First Embodiment

The share coding having advantageous effects similar to those of the first embodiment is not limited to the share coding shown in FIG. 11. A few examples of the share coding having advantageous effects similar to those of the first embodiment will be described in the following. There may be other types of share coding having the same advantageous effects as the first embodiment than the following modifications of the first embodiment.

First Modification of First Embodiment

FIG. 24 shows the share coding in the first modification of the first embodiment. In the first modification of the first embodiment, decoding rules and read voltages are set for each page, as shown in FIG. 24 and in the following.

(Example) Read page: [Decoding rules], [Read voltages to be used]

PG1:[1,0,0,1], [(R5,R15)/(R4,R12)]
PG2:[1,0,0,1], [(R1,R11)/(R3,R11)]
PG3:[1,0,0,1], [(R7,R9)/(R5,R13)]
PG4:[1,0,0,1], [(R2,R6,R14)/(R6,R8,R10)]
PG5:[1,0,0,1], [(R4,R10,R12)/(R6,R8,R10)]
PG6:[1,0,0,1], [(R3,R8,R13)/(R4,R12)]
PG7:[1,0,0,1], [(R1,R11)/(R1,R7,R14)]
PG8:[1,0,0,1], [(R7,R9)/(R2,R9,R15)]

Second Modification of First Embodiment

FIG. 25 shows the share coding in the second modification of the first embodiment. In the second modification of the first embodiment, decoding rules and read voltages are set for each page, as shown in FIG. 25 and in the following.

(Example) Read page: [Decoding rules], [Read voltages to be used]

PG1:[1,0,0,1], [(R5,R15)/(R5,R13)]
PG2:[1,0,0,1], [(R1,R11)/(R4,R12)]
PG3:[1,0,0,1], [(R7,R9)/(R3,R11)]
PG4:[1,0,0,1], [(R2,R10,R14)/(R6,R8,R10)]
PG5:[1,0,0,1], [(R4,R6,R12)/(R6,R8,R10)]
PG6:[1,0,0,1], [(R3,R8,R13)/(R4,R12)]
PG7:[1,0,0,1], [(R5,R15)/(R2,R9,R15)]
PG8:[1,0,0,1], [(R7,R9)/(R1,R7,R14)]

Third Modification of First Embodiment

Figures 26, 27:
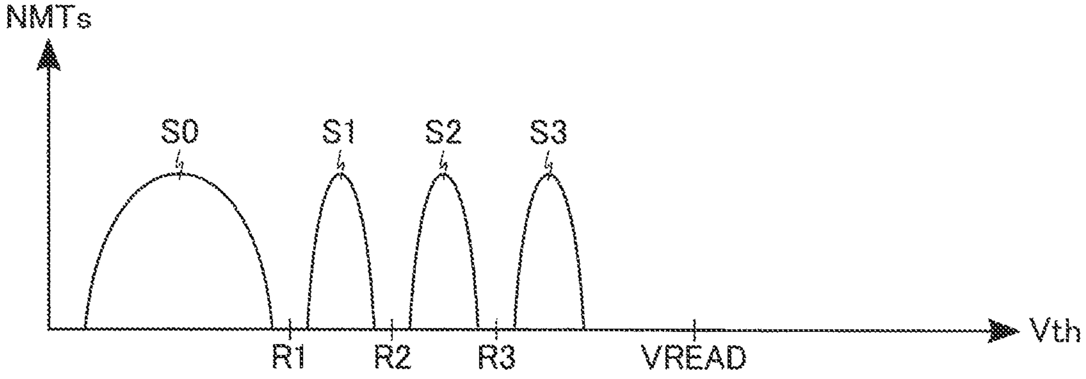
FIG. 26 is a table showing share coding in a third modification of the first embodiment.
FIG. 27 is a schematic diagram showing an example of a threshold voltage distribution of memory cell transistors in the semiconductor memory device according to a second embodiment.

FIG. 26 shows the share coding in the third modification of the first embodiment. In the third modification of the first embodiment, decoding rules and read voltages are set for each page, as shown in FIG. 26 and in the following.

(Example) Read page: [Decoding rules], [Read voltages to be used]

PG1:[1,0,0,1], [(R5,R15)/(R3,R11)]
PG2:[1,0,0,1], [(R1,R11)/(R4,R12)]
PG3:[1,0,0,1], [(R7,R9)/(R5,R13)]
PG4:[1,0,0,1], [(R2,R10,R14)/(R6,R8,R10)]
PG5:[1,0,0,1], [(R4,R6,R12)/(R6,R8,R10)]
PG6:[1,0,0,1], [(R3,R8,R13)/(R4,R12)]
PG7:[1,0,0,1], [(R5,R15)/(R1,R7,R14)]
PG8:[1,0,0,1], [(R7,R9)/(R2,R9,R15)]

[2] Second Embodiment

The semiconductor memory device 1 according to the second embodiment stores 8-bit data using a combination of four memory cell transistors. In the following, differences in the semiconductor memory device 1 according to the second embodiment from the first embodiment will be described.

[2-1] Configuration

In the semiconductor memory device 1 of the second embodiment, 8-bit data is stored in a combination of four memory cell transistors MT consisting of two memory cell transistors MT in the memory cell array 10A and two memory cell transistor MT in the memory cell array 10B. In this case, a set of a cell unit CU in the memory cell array 10A and a cell unit CU in the memory cell array 10B stores 8-page data, similarly to the first embodiment. Hereinafter, matters regarding the data storage method in the semiconductor memory device 1 according to the second embodiment will be described.

(Threshold Distribution of Memory Cell Transistors MT)

FIG. 27 shows an example of a threshold voltage distribution of the memory cell transistors MT in the semiconductor memory device 1 according to the second embodiment, particularly a threshold voltage distribution after a write operation targeting a cell unit CU is performed. As shown in FIG. 27, a threshold voltage distribution of the memory cell transistors MT included in a cell unit CU may form four types of states. Specifically, the threshold voltage distribution in the second embodiment has the same states but the "S4" to "S15" of the 16 states in the first embodiment described with reference to FIG. 9 are omitted, and each of the remaining states is widened.

(Circuit Configuration Relating to Share Coding)

Figures 28, 29:
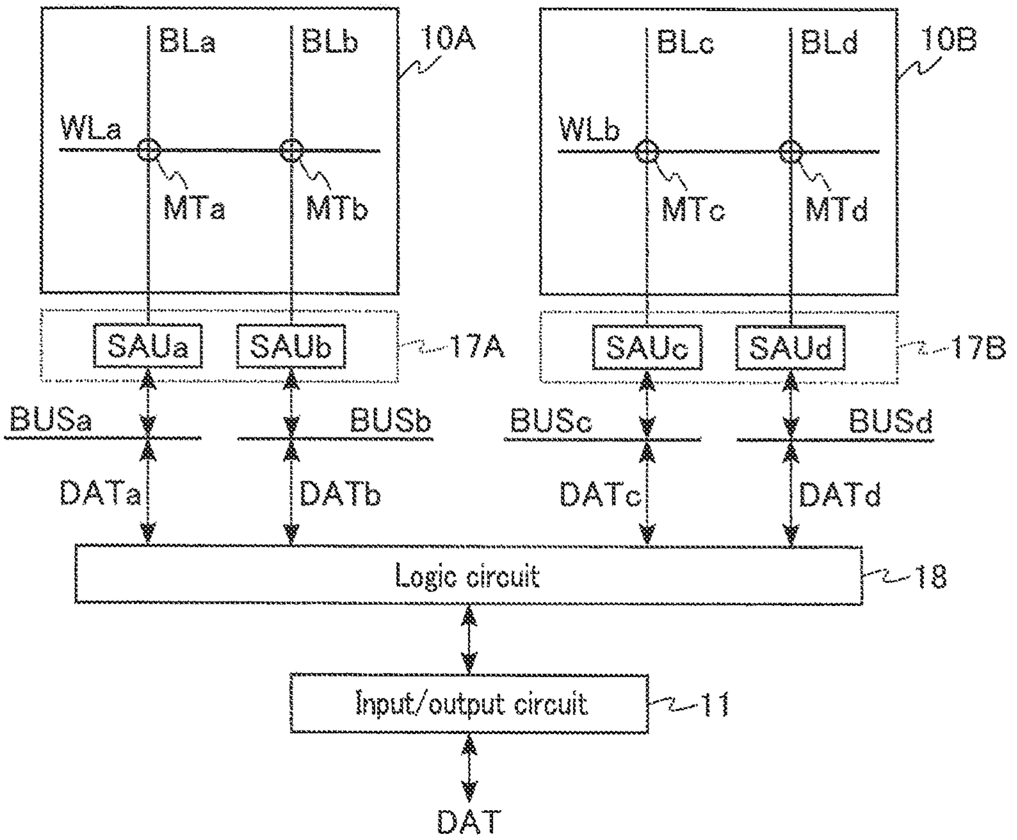
FIG. 28 is a circuit diagram showing an example of couplings used in share coding in the semiconductor memory device according to the second embodiment.
FIG. 29 is a table showing an example of share coding used in the semiconductor memory device according to the second embodiment.

FIG. 28 shows an example of the couplings in the circuit configuration used in share coding in the semiconductor memory device 1 according to the first embodiment. As shown in FIG. 10, the memory cell array 10A includes memory cell arrays MTa and MTh coupled to bit lines BLa and BLb respectively and coupled in common to a word line WLa. The memory cell array 10B includes memory cell arrays MTc and MTd coupled to bit lines BLc and BLd respectively and coupled in common to a word line WLb.

Data DATa stored in the memory cell transistor MTa is read by a sense amplifier unit SAUa included in the sense amplifier module 17A and transferred to the logic circuit 18 via the data bus BUSa. Data DATb stored in the memory cell transistor MTb is read by a sense amplifier unit SAUb included in the sense amplifier module 17A and transferred to the logic circuit 18 via the data bus BUSb.

Data DATc stored in the memory cell transistor MTc is read by a sense amplifier unit SAUc included in the sense amplifier module 17B and transferred to the logic circuit 18 via the data bus BUSc. Data DATd stored in the memory cell transistor MTd is read by a sense amplifier unit SAUd included in the sense amplifier module 17B and transferred to the logic circuit 18 via the data bus BUSd.

Then, the logic circuit 18 performs a decoding process using the data DATa read from the memory cell transistor MTa, the data DATb read from the memory cell transistor MTb, the data DATc read from the memory cell transistor MTc, and the data DATd read from the memory cell transistor MTd, and the logic circuit 18 then outputs the decoded data DAT to the memory controller 2 via the input/output circuit 11.

(Details of Share Coding Used in the Present Embodiment)

A threshold voltage of each of the memory cell transistors MTa, MTh, MTc, and MTd may be included in one of the 4 states, as described above with reference to FIG. 27. In other words, in the semiconductor memory device 1 of the second embodiment, there are 256 combinations made up of four states that may be applied to the memory cell transistor MTa, four states that may be applied to the memory cell transistor MTb, four states that may be applied to the memory cell transistor MTc, and four states that may be applied to the memory cell transistor MTd. Different 8-bit data is allocated to each of 256 combinations in the semiconductor memory device 1 of the second embodiment.

FIG. 29 shows an example of share coding used in the semiconductor memory device 1 according to the second embodiment. In the semiconductor memory device 2 of the first embodiment, decoding rules and read voltages are set for each page as shown in FIG. 29 and the drawings thereafter.

(Example) Read page: decoding rules [a,b,c,d,e,f,g,h,i,j,k,l,m,n,o,p], read voltages to be used [read voltages set for MTa and MTb/read voltages set for MTc and MTd]

PG1:[1,0,0,1,0,1,1,0,0,1,1,0,1,0,0,1], [R1/R2]
PG2:[1,0,1,0,1,0,1,0,0,1,0,1,0,1,0,1], [R1/R2]
PG3:[1,0,1,0,1,0,1,0,0,1,0,1,0,1,0,1], [R3/R2]
PG4:[1,1,0,0,0,0,1,1,1,1,0,0,0,0,1,1], [R3/R2]
PG5:[1,1,0,0,1,1,0,0,0,0,1,1,0,0,1,1], [R2/R3]
PG6:[1,1,0,0,1,1,0,0,0,0,1,1,0,0,1,1], [R2/R3]
PG7:[1,1,1,1,0,0,0,0,1,1,1,1,0,0,0,0], [R2/R1]
PG8:[1,0,1,0,1,0,1,0,1,0,1,0,1,0,1,0], [–/(R1,R3)]

FIG. 30 shows an example of the allocation of the decoding rules used in the semiconductor memory device 1 according to the second embodiment. In the semiconductor memory device 1 of the second embodiment, one of the coding rules "a" to "p" is allocated to each combination of read results of the memory cell transistors MTa, MTb, MTc, and MTd as shown in FIG. 30 and thereafter.

(Example) Read result of MTa/Read result of MTb/Read result of MTc/Read result of MTd: Decoding rule "1"/"1"/"1"/"1":"a"
"1"/"1"/"1"/"0":"b"
"1"/"1"/"0"/"1":"c"
"1"/"1"/"0"/"0":"d"
"1"/"0"/"1"/"1":"e"
"1"/"0"/"1"/"0":"f"
"1"/"0"/"0"/"1":"g"
"1"/"0"/"0"/"0":"h"
"0"/"1"/"1"/"1":"i"
"0"/"1"/"1"/"0":"j"
"0"/"1"/"0"/"1":"k"
"0"/"1"/"0"/"0":"l"
"0"/"0"/"1"/"1":"m"
"0"/"0"/"1"/"0":"n"
"0"/"0"/"0"/"1":"o"
"0"/"0"/"0"/"0":"p"

Thus, the semiconductor memory device 1 of the second embodiment can have a set of four memory cell transistors MTa, MTh, MTc, and MTd store 8-bit data. For example, in a read operation, the logic circuit 18 first checks a combination of read results of the memory cell transistors MTa, MTb, MTc, and MTd. Then, the logic circuit 18 outputs, to the input/output circuit 11, the data that is set with the decoding rules allocated to this combination.

Specifically, in the PG1 read operation, if the read results of the memory cell transistors MTa, MTb, MTc, and MTd are "1", "1", "1", and "1", the logic circuit 18 outputs, to the input/output circuit 11, "1" data that is set with the decoding rule "a" of the page PG1. In the PG2 read operation, if the read results of the memory cell transistors MTa, MTb, MTc, and MTd are "1", "1", "1", and "0", the logic circuit 18 outputs, to the input/output circuit 11, "0" data that is set with the decoding rule "b" of the page PG2. For the other combinations of read results, the logical circuit 18 can confirm read data in a similar manner based on the share coding shown in FIG. 29 and the decoding rules shown in FIG. 30.

The above-described coding for storing 8-bit data in four memory cell transistors MTa, MTb, MTc, and MTd may be called "8-bit/4-cell share coding". In the share coding in the second embodiment, the number of times of data reading in PG1, PG2, PG3, PG4, PG5, PG6, PG7, and PG8 is one, one, one, one, one, one, one, and two, respectively. For this reason, the share coding in the second embodiment may be called "1-1-1-1-1-1-1-2 coding". The rest of the configuration of the semiconductor memory device 1 according to the second embodiment is the same as that of the first embodiment.

[2-2] Read Operation

In the share coding according to the second embodiment, there are combinations of pages that use the same read voltages. Specifically, between the PG1 read operation and the PG2 read operation, the read voltages applied to the memory cell transistors MTa and MTb are the same as those applied to the memory cell transistors MTc and MTd. Between the PG3 read operation and the PG4 read operation, the read voltages applied to the memory cell transistors MTa and MTh are the same as those applied to the memory cell transistors MTc and MTd. Between the PG5 read operation and the PG6 read operation, the read voltages applied to the memory cell transistors MTa and MTb are the same as those applied to the memory cell transistors MTc and MTd. Between the PG7 read operation and the PG8 read operation, some of the read voltages applied to the memory cell transistors MTc and MTd are the same.

Thus, the semiconductor memory device 1 of the second embodiment can simultaneously perform the PG1 and PG2 read operations, the PG3 and PG4 read operations, the PG5 and PG6 read operations, and the PG7 and PG8 read operations. In other words, the semiconductor memory device 1 of the second embodiment may perform a read operation in a unit of two pages. Hereinafter, a read operation targeting the pages PG1 and PG2 will be referred to as a "PG1&PG2 read operation"; a read operation targeting the pages PG3 and PG4 will be referred to as a "PG3&PG4 read operation"; a read operation targeting the pages PG5 and PG6 will be referred to as a "PG5&PG6 read operation"; a read operation targeting the pages PG7 and PG8 will be referred to as a "PG7&PG8 read operation". Hereinafter, a read operation in the semiconductor memory device 1 according to the second embodiment will be described below, in the order of the PG1&PG2 read operation, the PG3&PG4 read operation, the PG5&PG6 read operation, and the PG7&PG8 read operation.

(PG1&PG2 Read Operation)

Figure 31:
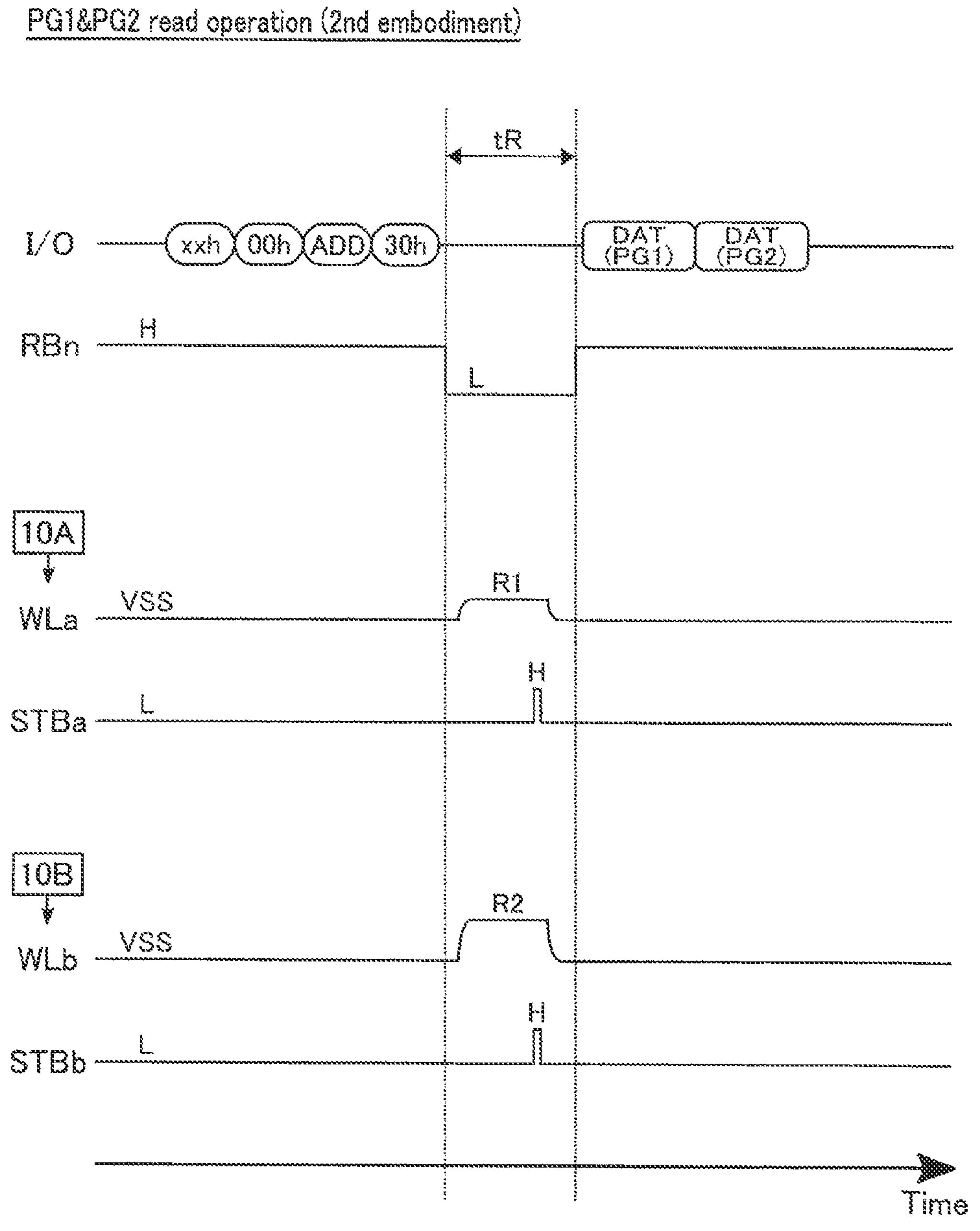
FIG. 31 is a timing chart showing an example of PG1 and PG2 read operations in the semiconductor memory device according to the second embodiment.

FIG. 31 is an example of a timing chart of the PG1&PG2 read operation in the semiconductor memory device 1 according to the second embodiment. FIG. 31 shows an input/output signal I/O, a ready/busy signal RBn, voltages of the word lines WLa and WLb, and control signals STBa and STBb. An initial state before the semiconductor memory device 1 of the second embodiment commences a read operation is the same as that in the first embodiment.

As shown in FIG. 31, first, the memory controller 2 sequentially sends a command "xxh", a command "00h", address information ADD, and a command "30h" to the semiconductor memory device 1 in this order. The command "xxh" is a command for instructing the performance of an operation for the pages PG1 and PG2. When the command "30h" is stored in the command register 12, the sequencer 14 changes a ready state (RBn="H" level) of the semiconductor memory device 1 to a busy state (RBn="L" level) and commences a PG1&PG2 read operation. In the PG1&PG2 read operation, the sequencer 14 commences a read operation on the memory cell array 10A and a read operation on the memory cell array 10B simultaneously and performs the operations in parallel.

In a read operation on the memory cell array 10A, the read voltage R1 is applied to a selected word line WLa. The sequencer 14 asserts the control signal STBa while the read voltage R1 is being applied to the word line WLa. Each sense amplifier unit SAUa causes, for example, the latch circuit XDL to store a read result of the memory cell transistor MTa obtained in the read operation. Similarly, each sense amplifier unit SAUb causes, for example, the latch circuit XDL to store a read result of the memory cell transistor MTb obtained in the read operation.

In a read operation on the memory cell array 10B, the read voltage R2 is applied to a selected word line WLb. The sequencer 14 asserts the control signal STBb while the read voltage R2 is being applied to the word line WLb. Each sense amplifier unit SAUb causes, for example, the latch circuit XDL to store a read result of the memory cell transistor MTc obtained in the read operation. Similarly, each sense amplifier unit SAUd causes, for example, the latch circuit XDL to store a read result of the memory cell transistor MTd obtained in the read operation.

The above-described application of the read voltage R1 to the word line WLa and the application of the voltage R2 to the word line WLb are performed in parallel. The timing of asserting the control signal STBa and the timing of asserting the control signal STBb may be either in or out of sync, as long as these timings occur during the application of the read voltages to the word lines WLa and WLb in parallel.

Upon completion of the read operation on the memory cell array 10A and the read operation on the memory cell array 10B, the sequencer 14 finishes the PG1&PG2 read operation and changes the semiconductor memory device 1 from a busy state to a ready state. Upon detection of the completion of the PG1&PG2 read operation based on the changes in the ready/busy signal RBn, the memory controller 2 for example toggles the read enable signal REn to subsequently output read data of pages PG1 and PG2 ("DAT(PG1)" and "DAT(PG2)"), to the semiconductor memory device 1.

Briefly, the read results stored in the plurality of latch circuits XDL in the sense amplifier modules 17A and 17B are first transferred to the logic circuit 18. Then, the logic circuit 18 confirms the read data of pages PG1 and PG2 based on the following: the read results of the memory cell transistors MTa and MTb read from the memory cell array 10A; the read results of the memory cell transistors MTc and MTd read from the memory cell array 10B; the share coding shown in FIG. 29; and the decoding rules shown in FIG. 30. Thereafter, the confirmed read data DAT(PG1) and DAT (PG2) are transferred to the input/output circuit 11 and subsequently output to the memory controller 2 based on the read enable signal REn.

Similarly to the first embodiment, the above-described process of read data decoding by the logic circuit 18 may be performed to the extent possible in advance of the transition of the semiconductor memory device 1 to a ready state. For example, using a pipeline, the sequencer 14 may sequentially transfer the read data to the vicinity of the input/output circuit 11 in advance of the transition, in the order of the output of the read data from a read-target cell unit CU. The semiconductor memory device 1 of the second embodiment can thus advance the start of the output of the read data by performing the control in preparation of such data output.

(PG3&PG4 Read Operation)

Figure 32:
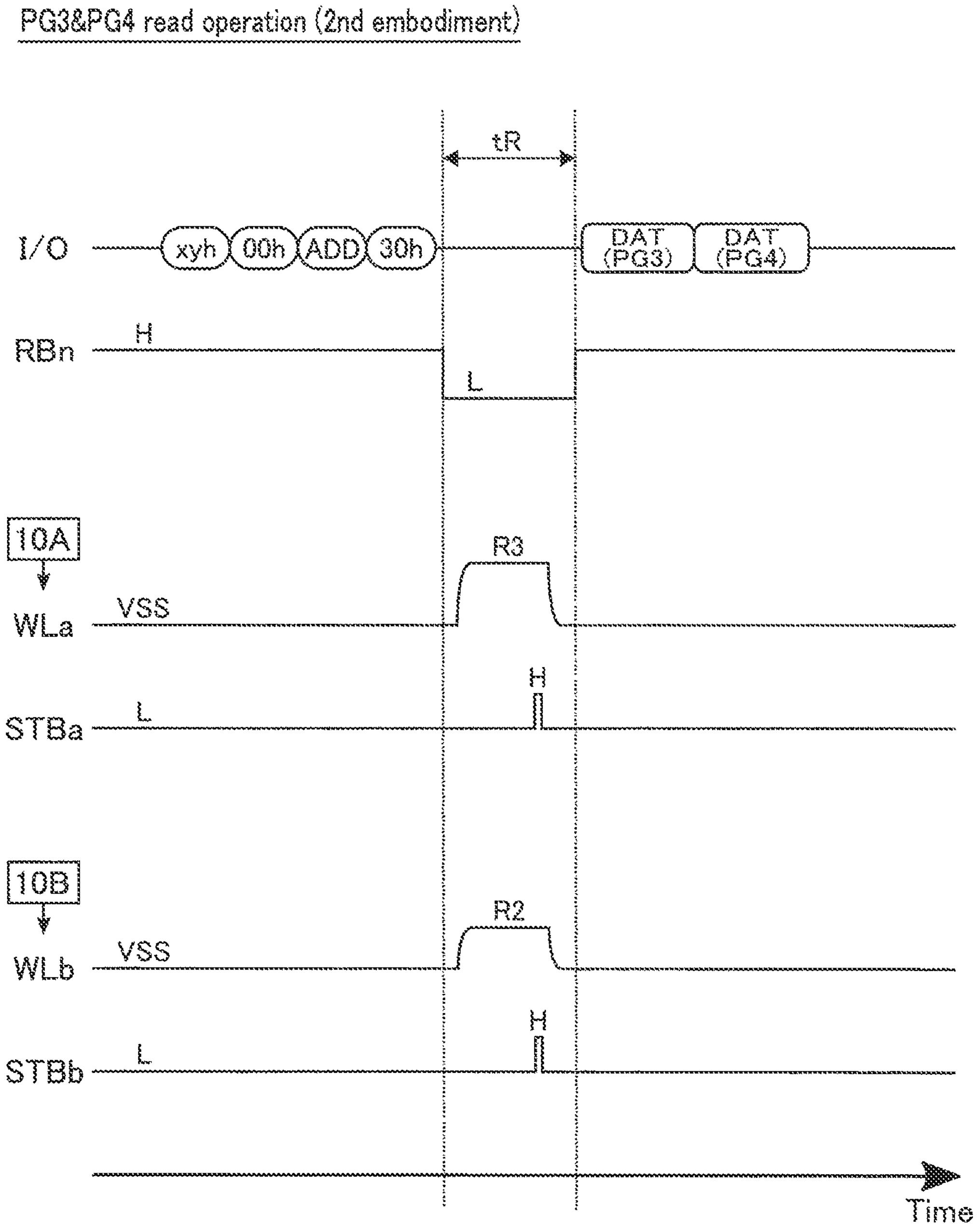
FIG. 32 is a timing chart showing an example of PG3 and PG4 read operations in the semiconductor memory device according to the second embodiment.

FIG. 32 is an example of a timing chart of the PG3&PG4 read operation in the semiconductor memory device 1 according to the second embodiment. As shown in FIG. 32, the command sequence and the read voltages used in the PG3&PG4 read operation differ from those used in the PG1&PG2 read operation, which was previously described with reference to FIG. 31.

Specifically, the command sequence in the PG3&PG4 read operation has a configuration in which the command "xxh" in the PG1&PG2 read operation is replaced with the command "xyh". The command "xyh" is a command for instructing the performance of an operation for pages PG3 and PG4. In the PG3&PG4 read operation, the read voltage R3 is applied to the word line WLa, and in parallel to that, the read voltage R2 is applied to the word line WLb. Then, after the PG3&PG4 read operation, the decoding based on the decoding rules of page PG3 and the decoding based on the decoding rules of page PG4 are performed and the read data of pages PG3 and PG4 ("DAT(PG3)" and "DAT (PG4)") is subsequently output. The other operations in the PG3&PG4 read operation are the same as those in the PG1&PG2 read operation.

(PG5&PG6 Read Operation)

Figure 33:
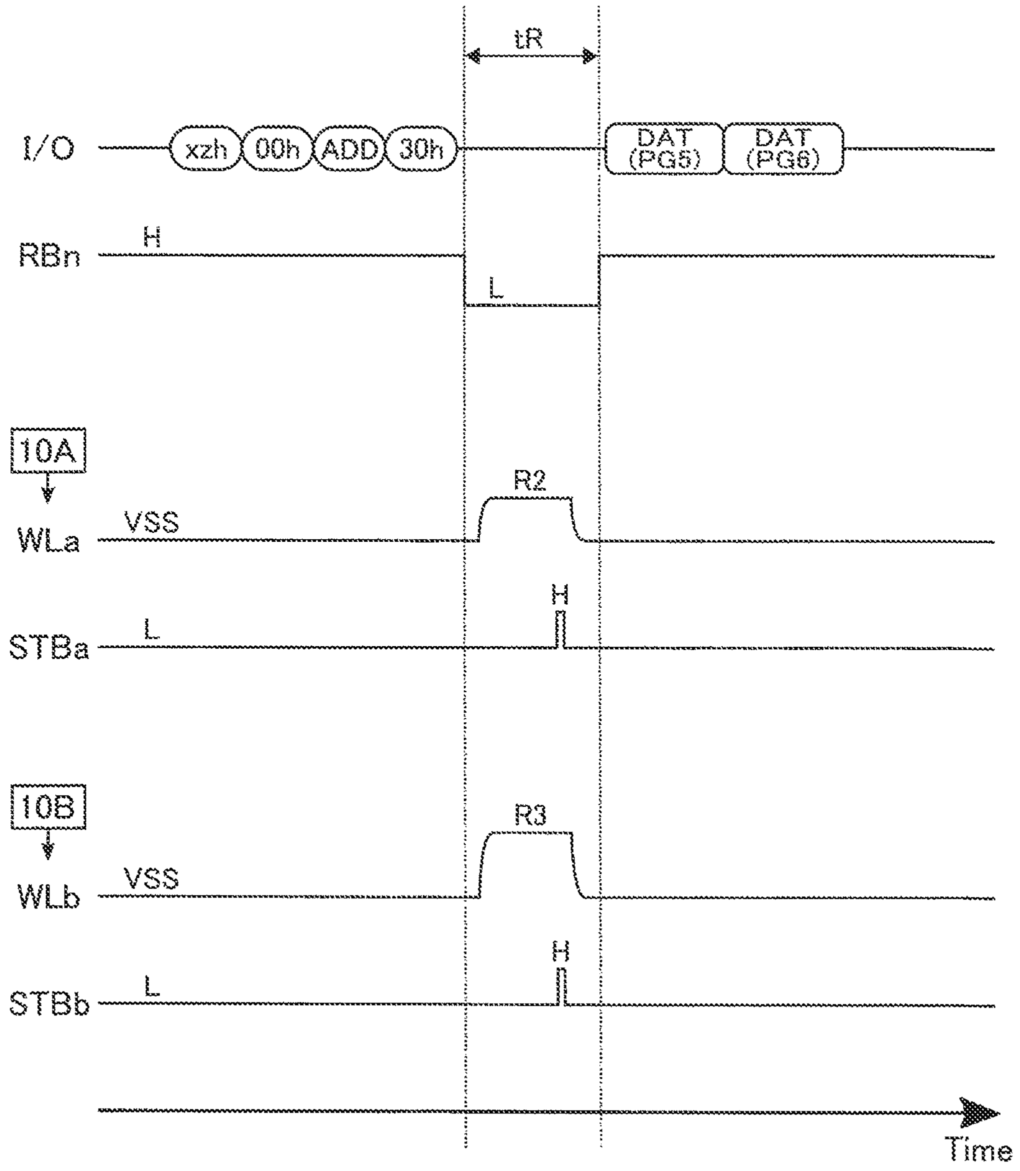
FIG. 33 is a timing chart showing an example of PG5 and PG6 read operations in the semiconductor memory device according to the second embodiment.

FIG. 33 is an example of a timing chart of the PG5&PG6 read operation in the semiconductor memory device 1 according to the second embodiment. As shown in FIG. 33, the command sequence and the read voltages used in the PG5&PG6 read operation differ from those used in the PG1&PG2 read operation, which was previously described with reference to FIG. 33.

Specifically, the command sequence in the PG5&PG6 read operation has a configuration in which the command "xxh" in the PG1&PG2 read operation is replaced with the command "xzh". The command "xzh" is a command for instructing the performance of an operation for pages PG5 and PG6. In the PG5&PG6 read operation, the read voltage R2 is applied to the word line WLa, and in parallel to that, the read voltage R3 is applied to the word line WLb. Then, after the PG5&PG6 read operation, the decoding based on the decoding rules of page PG5 and the decoding based on the decoding rules of page PG6 are performed and the read data of pages PG5 and PG6 ("DAT(PG5)" and "DAT (PG6)") is subsequently output. The other operations in the PG5&PG6 read operation are the same as those in the PG1&PG2 read operation.

(PG7&PG8 Read Operation)

Figure 34:
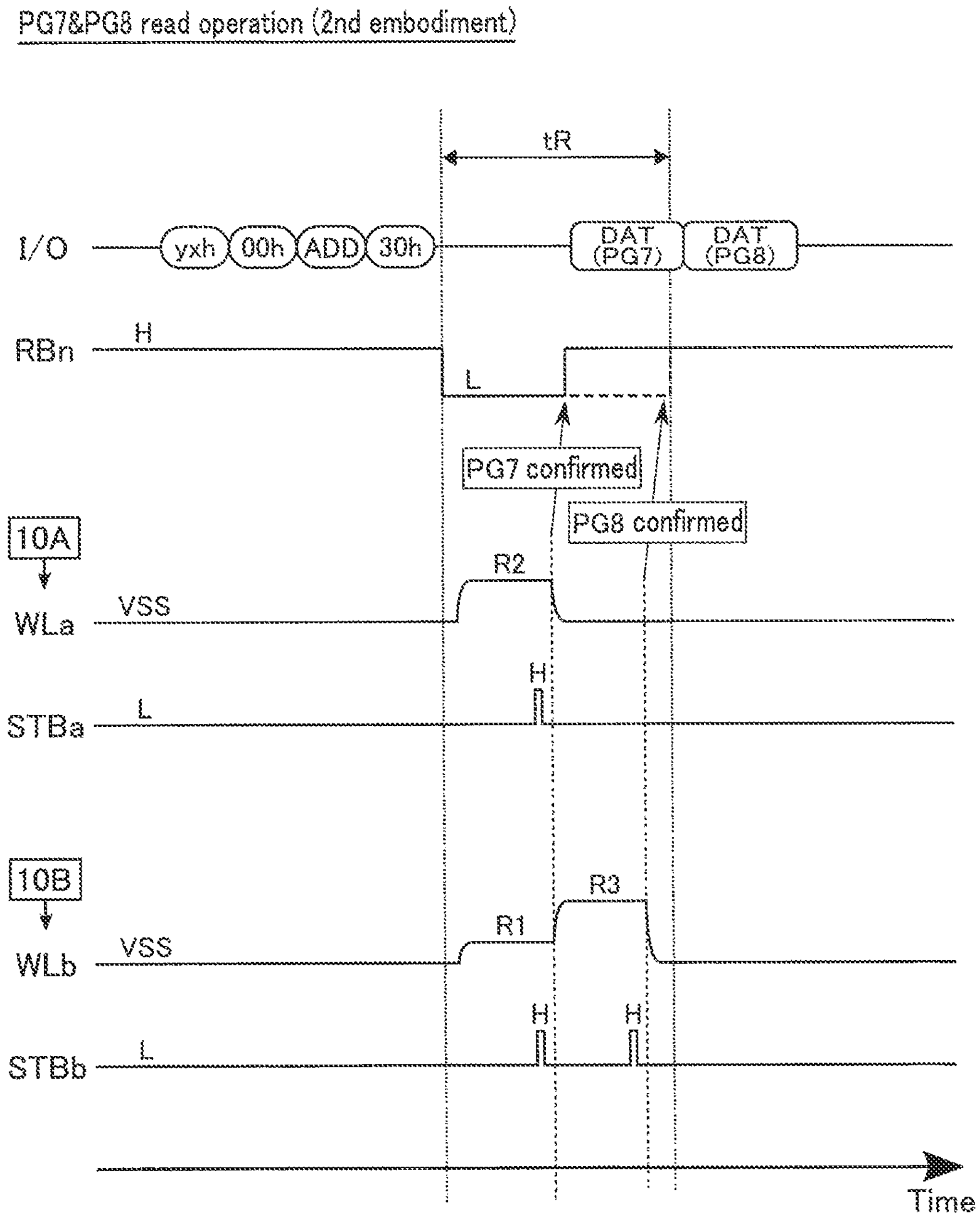
FIG. 34 is a timing chart showing an example of PG7 and PG8 read operations in the semiconductor memory device according to the second embodiment.

FIG. 34 is an example of a timing chart of the PG7&PG8 read operation in the semiconductor memory device 1 according to the second embodiment. As shown in FIG. 34, the command sequence and the read voltages used in the PG7&PG8 read operation differ from those used in the PG1&PG2 read operation, which was previously described with reference to FIG. 33.

Specifically, the command sequence in the PG7&PG8 read operation has a configuration in which the command "xxh" in the PG1&PG2 read operation is replaced with the command "yxh". The command "yxh" is a command for instructing the performance of an operation for pages PG7 and PG8. In the PG7&PG8 read operation, the read voltage R2 is applied to the word line WLa, and in parallel to that, the read voltages R1 and R3 are sequentially applied to the word line WLb. The application of the read voltage R2 to the word line WLa and the application of the voltage R1 to the word line WLb are performed in parallel. While the read voltage R3 is being applied to the word line WLb, the voltage applied to the word line WLa is lowered.

The read data of page PG7 is confirmed based on read results of the memory cell transistors MTa and MTb obtained by applying the read voltage R2 to the word line WLa and read results of the memory cell transistors MTc and MTd obtained by applying the read voltage R1 to the word line WLb. On the other hand, the read data of page PG8 is confirmed based on read results of the memory cell transistors MTa and MTb obtained by applying the read voltages R1 and R3 to the word line WLb. Thus, in the PG7&PG8 read operation, the timing of confirming the read data in page PG7 is earlier than that in page PG8.

For this reason, the sequencer 14 changes the semiconductor memory device 1 from a busy state to a read state during the application of the read voltage R3 to the word line WLb so as to commence outputting of the read data of page PG7 ("DAT(PG7)"). In this case, the read data of page PG8 ("DAT(PG8)") is confirmed upon the completion of the read operation in which the read voltage R3 is applied to the word line WLb, while the read data DAT(PG7) is being output. After the output of the read data DAT(PG7) is completed, the confirmed read data DAT(PG8) is subsequently output.

The sequencer 14 may change the semiconductor memory device 1 from a busy state to a ready state after the read data of page PG8 is confirmed, as shown in the dotted line in FIG. 34. In this case, both of the read data DAT(PG7) and the read data DAT(PG8) are output after the read data of page PG8 is confirmed. The other operations in the PG7&PG8 read operation are the same as those in the PG1&PG2 read operation.

[2-3] Advantageous Effects of Second Embodiment

The above-described semiconductor memory device 1 according to the second embodiment can speed up a read operation performed for each page. Hereinafter, detailed advantageous effects of the semiconductor memory device 1 according to the second embodiment will be described, using a comparative example.

Figures 35, 36:
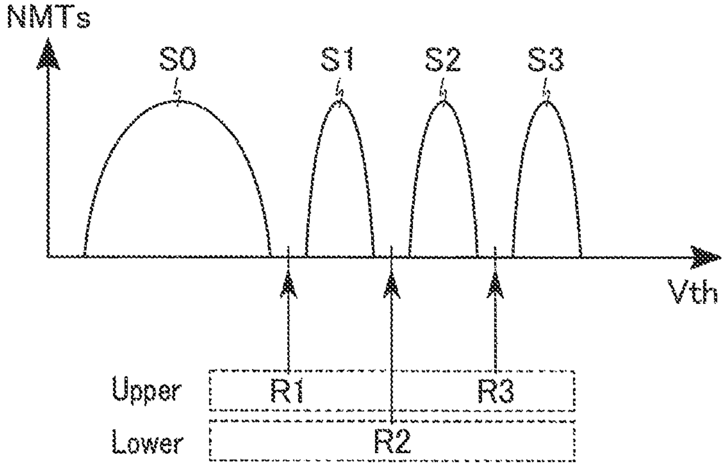
FIG. 35 is a table showing an example of 2 bit/1 cell coding in a comparative example of the second embodiment.
FIG. 36 is a table showing share coding in a first modification of the second embodiment.

FIG. 35 shows an example of 2 bit/1 cell (multi-level cell, MLC) coding in a comparative example of the second embodiment. As shown in FIG. 35, in the comparative example of the second embodiment, mutually different 2-bit data is allocated to each of four states similar to those of the second embodiment. In this comparative example, lower page data is confirmed by a read operation using the read voltage R2. Upper page data is confirmed by read operations using the read voltages R1 and R3. Such 2 bit/1 cell coding is called, for example, "1-2 coding" based on the number of times the read operations are performed for each page.

In the coding of the comparative example of the second embodiment, 2-bit data is stored using one memory cell transistor MT. The number of times read operations are performed per page is, for example, (1+2)/2=1.5.

On the other hand, the semiconductor memory device 1 according to the second embodiment stores 4-bit data using a pair of two memory cell transistors MT. The number of times read operations are performed for each page is, for example, (1+1+1+1+1+1+1+2)/8=1.125.

Thus, the storage capacity per memory cell transistor MT in the semiconductor memory device 1 of the second embodiment is the same as that in the comparative example of the second embodiment, whereas the number of times read operations are performed for each page is smaller in the former than in the latter. Thus, the semiconductor memory device 1 of the second embodiment can realize the same storage capacity as that of the comparative example of the second embodiment with the same storage area size, and can increase the rate of the read operation per page compared to the comparative example of the second embodiment.

[2-4] Modifications of Second Embodiment

Share coding having advantageous effects similar to those of the second embodiment is not limited to the share coding shown in FIG. 29. Other examples of share coding having advantageous effects similar to those of the second embodiment will be described below as first to fifth modifications of the second embodiment. There may be other types of share coding having the same advantageous effects as the second embodiment than the following modifications of the second embodiment.

First Modification of Second Embodiment

FIG. 36 shows the share coding in the first modification of the second embodiment. In the first modification of the second embodiment, decoding rules and read voltages are set for each page, as shown in FIG. 36 and in the following.

(Example) Read page: [Decoding rules], [Read voltages to be used]

PG1:[1,0,0,1,0,1,1,0,0,1,1,0,1,0,0,1], [R1/R2]
PG2:[1,0,1,0,1,0,1,0,0,1,0,1,0,1,0,1], [R1/R2]
PG3:[1,0,1,0,1,0,1,0,0,1,0,1,0,1,0,1], [R3/R2]
PG4:[1,1,0,0,0,0,1,1,1,1,0,0,0,0,1,1], [R3/R2]
PG5:[1,1,0,0,1,1,0,0,0,0,1,1,0,0,1,1], [R2/R3]
PG6:[1,1,0,0,1,1,0,0,0,0,1,1,0,0,1,1], [R2/R3]
PG7:[1,1,1,1,0,0,0,0,1,1,1,1,0,0,0,0], [R2/R1]
PG8:[1,0,1,0,1,0,1,0,1,0,1,0,1,0,1,0], [–/(R1,R3)]

Second Modification of Second Embodiment

FIG. 37 shows the share coding in the second modification of the second embodiment. In the second modification of the second embodiment, decoding rules and read voltages are set for each page, as shown in FIG. 37 and in the following.

(Example) Read page: [Decoding rules], [Read voltages to be used]

PG1:[1,0,0,1,0,1,1,0,1,0,0,1,0,1,1,0], [R2/R1]
PG2:[1,0,1,0,1,0,1,0,0,1,0,1,0,1,0,0], [R2/R1]
PG3:[1,0,1,0,1,0,1,0,1,0,1,0,1,0,1,0], [R3/R2]
PG4:[1,0,0,1,1,0,0,1,0,1,1,0,0,1,1,0], [R3/R2]
PG5:[1,0,1,0,1,0,1,0,0,1,0,1,0,1,0,0], [R2/R3]
PG6:[1,1,0,0,0,0,1,1,1,1,0,0,0,0,1,0], [R2/R3]
PG7:[1,1,0,0,1,1,0,0,0,0,1,1,0,0,1,0], [R1/R2]
PG8:[1,1,1,1,0,0,0,0,1,1,1,1,0,0,0,0], [(R1,R3)/–]

Third Modification of Second Embodiment

FIG. 38 shows the share coding in the third modification of the second embodiment. In the third modification of the second embodiment, decoding rules and read voltages are set for each page, as shown in FIG. 38 and in the following.

(Example) Read page: [Decoding rules], [Read voltages to be used]

PG1:[1,0,0,1,1,0,0,1,0,1,1,0,0,1,1,0], [R2/R1]
PG2:[1,0,1,0,0,1,0,1,1,0,1,0,0,1,0,0], [R2/R1]
PG3:[1,0,1,0,1,0,1,0,1,0,1,0,1,0,1,0], [R3/R2]
PG4:[1,0,0,1,0,1,1,0,1,0,0,1,0,1,1,0], [R3/R2]
PG5:[1,0,1,0,0,1,0,1,1,0,1,0,0,1,0,0], [R2/R3]
PG6:[1,1,0,0,0,0,1,1,1,1,0,0,0,0,1,0], [R2/R3]
PG7:[1,1,0,0,1,1,0,0,0,0,1,1,0,0,1,0], [R1/R2]
PG8:[1,1,1,1,1,1,1,1,0,0,0,0,0,0,0,0], [(R1,R3)/–]

Fourth Modification of Second Embodiment

FIG. 39 shows the share coding in the fourth modification of the second embodiment. In the fourth modification of the second embodiment, decoding rules and read voltages are set for each page, as shown in FIG. 39 and in the following.

(Example) Read page: [Decoding rules], [Read voltages to be used]

PG1:[1,0,0,1,0,1,1,0,0,1,0,1,1,0], [R1/R2]
PG2:[1,0,1,0,1,0,1,0,1,0,1,0,1,0,1,01], [R2/R21]
PG3:[1,0,0,1,1,0,0,1,0,1,1,0,0,1,1,0], [R2/R1]
PG4:[1,0,1,0,0,1,0,1,1,0,1,0,0,1,0,0], [R2/R1]
PG5:[1,0,1,0,0,1,0,1,1,0,1,0,0,1,0,0], [R2/R3]
PG6:[1,1,0,0,0,0,1,1,1,1,0,0,0,0,1,0], [R2/R3]
PG7:[1,1,0,0,1,1,0,0,0,0,1,1,0,0,1,0], [R3/R2]
PG8:[1,1,1,1,1,1,1,1,0,0,0,0,0,0,0,0], [(R1,R3)/–]

Figure 40:
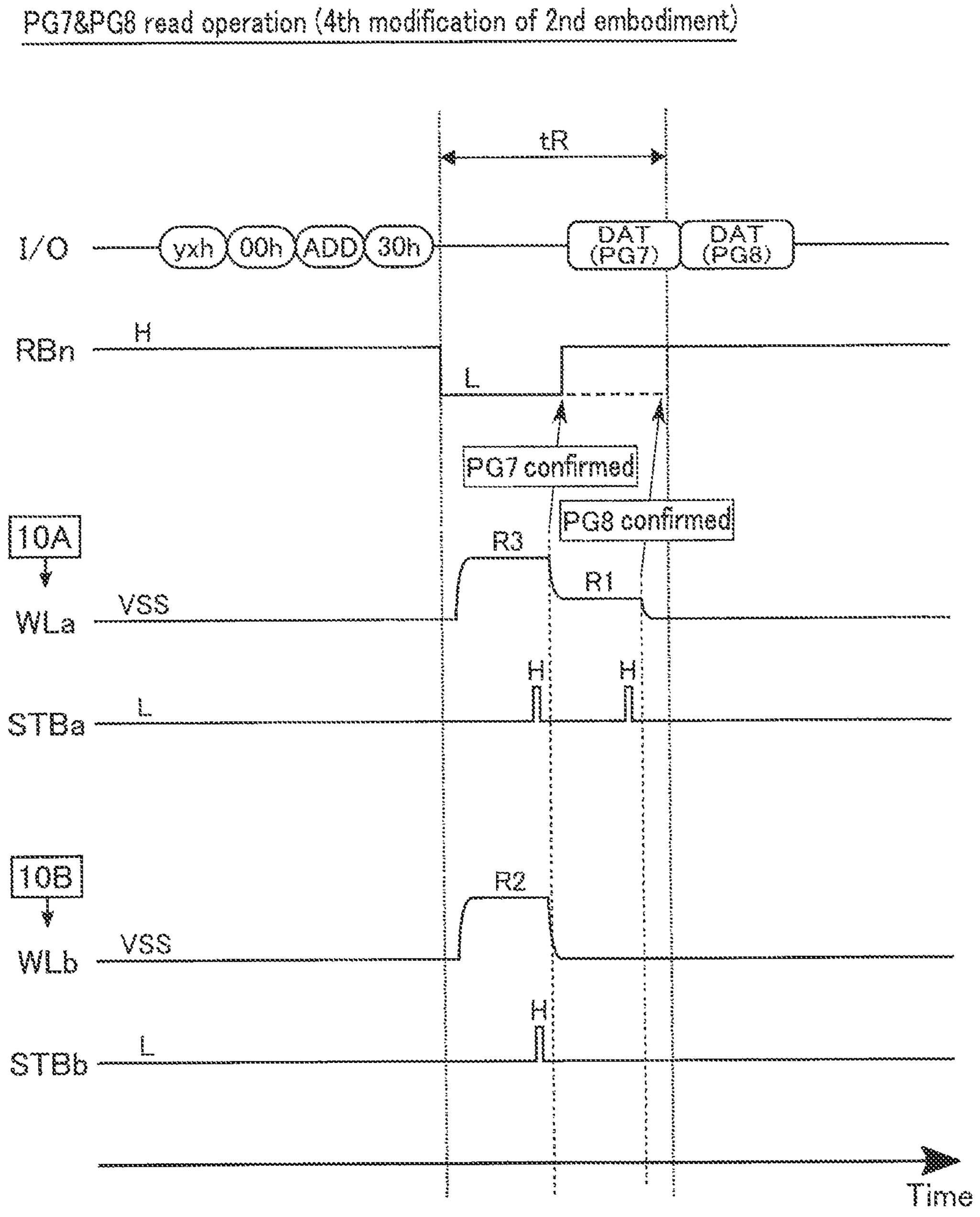
FIG. 40 is a timing chart showing an example of PG7 and PG8 read operations in the fourth modification of the second embodiment.

In the share coding of the fourth modification of the second embodiment, the action in the PG7&PG8 read operation differs from that in each of the second embodiment and the first to third modifications of the second embodiment. FIG. 40 shows an example of the PG7&PG8 read operation in the fourth modification of the second embodiment. As shown in FIG. 40, the PG7&PG8 read operation in the fourth modification of the second embodiment uses reverse reading. Reverse reading is a read operation in which a plurality of read voltages are sequentially applied from higher to lower voltages.

Specifically, in the PG7&PG8 read operation according to the fourth modification of the second embodiment, the read voltages R3 and R1 are subsequently applied to the word line WLa in this order, and in parallel to that, the read voltage R2 is subsequently applied to the word line WLb. The application of the read voltage R3 to the word line WLa and the application of the voltage R2 to the word line WLb are performed in parallel. While the read voltage R1 is being applied to the word line WLa, the voltage applied to the word line WLa is lowered.

The read data of page PG7 is confirmed based on read results of the memory cell transistors MTa and MTb obtained by applying the read voltage R3 to the word line WLa and read results of the memory cell transistors MTc and MTd obtained by applying the read voltage R2 to the word line WLb. On the other hand, the read data of page PG8 is confirmed based on read results of the memory cell transistors MTa and MTb obtained by applying the read voltages R1 and R3 to the word line WLb.

The PG7&PG8 read operation in the fourth modification of the second embodiment can have the same timing of confirming the read data of each of pages PG7 and PG8 as that in the second embodiment by applying the above-described reverse reading to the read operation on the memory cell array 10A. The other operations in the PG7&PG8 read operation in the fourth modification of the second embodiment are the same as those of the second embodiment.

Fifth Modification of Second Embodiment

Figures 41, 42:
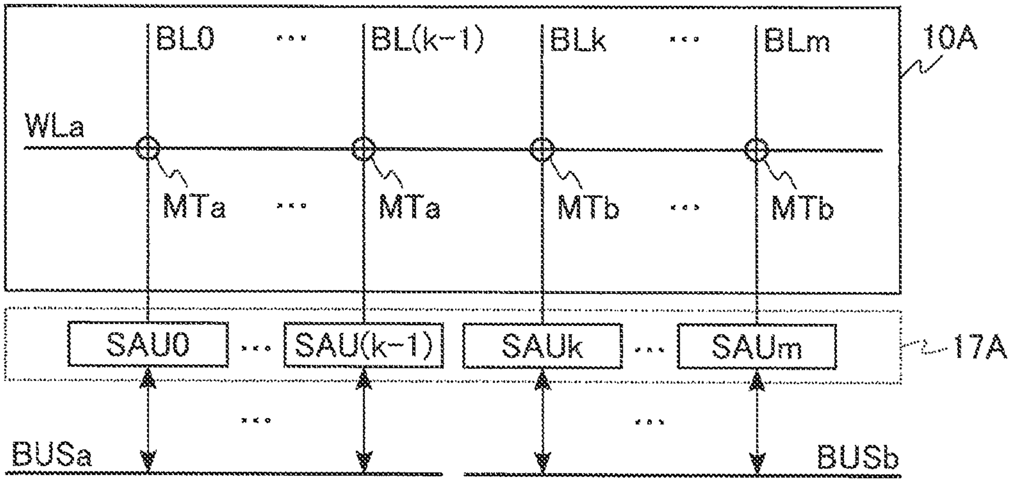
FIG. 41 is a table showing share coding in a fifth modification of the second embodiment.
FIG. 42 is a circuit diagram showing an example of an arrangement of memory cell transistors according to a sixth modification of the second embodiment.

FIG. 41 shows the share coding in the fifth modification of the second embodiment. In the fifth modification of the second embodiment, decoding rules and read voltages are set for each page, as shown in FIG. 41 and in the following.

(Example) Read page: [Decoding rules], [Read voltages to be used]

PG1:[1,0,1,0,1,0,1,0,1,0,1,0,1,0,1,0], [R1/R2]
PG2:[1,0,0,1,1,0,0,1,0,1,1,0,0,1,1,0], [R2/R2]
PG3:[1,0,0,1,0,1,1,0,1,0,0,1,0,1,1,0], [R2/R1]
PG4:[1,0,1,0,1,0,1,0,0,1,0,1,0,1,0,0], [R2/R3]
PG5:[1,0,1,0,1,0,1,0,0,1,0,1,0,1,0,0], [R2/R3]

PG6:[1,1,0,0,0,0,1,1,1,1,0,0,0,0,1,0], [R2/R3]
PG7:[1,1,0,0,1,1,0,0,0,0,1,1,0,0,1,0], [R3/R2]
PG8:[1,1,1,1,0,0,0,0,1,1,1,1,0,0,0,0], [(R1,R3)/−]

In the share coding of the fifth modification of the second embodiment, the reverse reading may be adopted in the PG7&PG8 read operation, similarly to the fourth modification of the second embodiment. The rest of the configuration and other operations in the fifth modification of the second embodiment are the same as those of the second embodiment.

Sixth and Modification of Second Embodiment

The sixth and seventh modifications of the second embodiment relate to arrangements of the memory cell transistors MT combined in the share coding in the second embodiment. The sixth and seventh modifications of the second embodiment will be explained below.

FIG. 42 shows an arrangement of memory cell transistors MT in the sixth modification of the second embodiment and shows a part of the configuration corresponding to the memory cell array 10A. An arrangement of the memory cell transistors MTc and MTd in the memory cell array 10B is the same as that of the memory cell transistors MTa and MTb in the memory cell array 10A in the sixth modification of the second embodiment.

As shown in FIG. 42, the memory cell transistors MTa are respectively allocated to the bit lines BL0 to BL(k−1) (k is a number corresponding to 2/m), and the memory cell transistors MTb are respectively allocated to the bit lines BLk to BLm. In other words, the memory cell transistors MTa are respectively allocated to the sense amplifier unit SAU0 to SAU(k−1), and the memory cell transistors MTb are respectively allocated to the sense amplifier units SAUk to SAUm.

In this case, the memory cell array 10A includes an area in which the plurality of memory cell transistors MTa are continuously aligned and an area in which the plurality of memory cell transistors MTb are continuously aligned. Similarly, although not shown, the memory cell array 10B includes an area in which the plurality of memory cell transistors MTc are continuously aligned and an area in which the plurality of memory cell transistors MTd are continuously aligned. The rest of the configuration and other operations of the sixth modification of the second embodiment are the same as those of the second embodiment.

Seventh Modification of Second Embodiment

Figure 43:
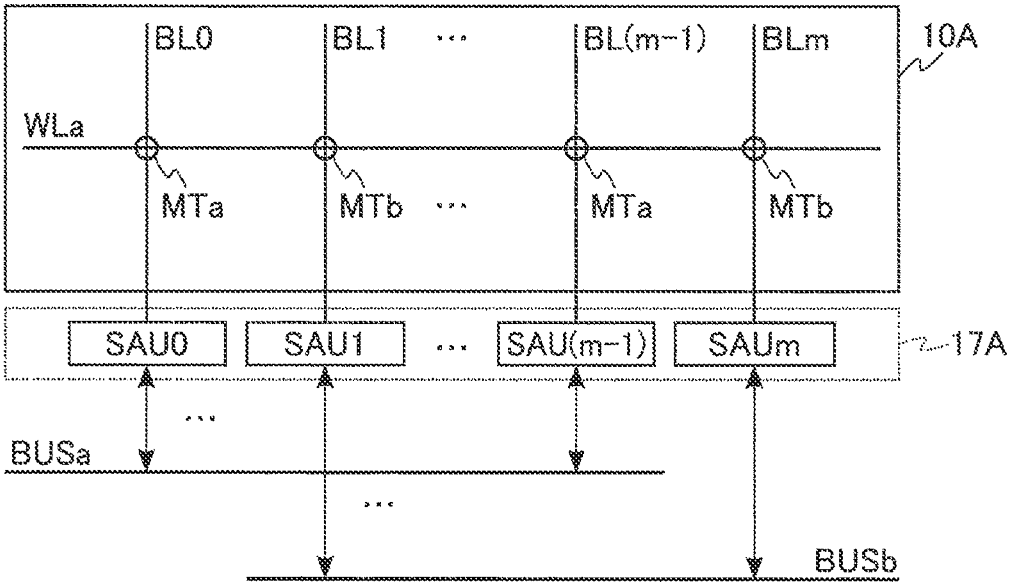
FIG. 43 is a circuit diagram showing an example of an arrangement of memory cell transistors according to a seventh modification of the second embodiment.

FIG. 43 shows an example of an arrangement of memory cell transistors MT according to the seventh modification of the second embodiment, and shows a part of the configuration corresponding to the memory cell array 10A. An arrangement of the memory cell transistors MTc and MTd in the memory cell array 10B is the same as those of the memory cell transistors MTa and MTb in the memory cell array 10A in the seventh modification of the second embodiment.

As shown in FIG. 43, the memory cell transistors MTa are respectively allocated to the even-numbered bit lines BL, and the memory cell transistors MTb are respectively allocated to the odd-numbered bit lines BL. In other words, the memory cell transistors MTa are respectively allocated to the even-numbered sense amplifier units SAU, and the memory cell transistors MTb are respectively allocated to the odd-numbered sense amplifier units SAU.

In this case, in the memory cell array 10A, the memory cell transistors MTa and MTb are alternately arranged. Similarly, in the memory cell array 10B, the memory cell transistors MTc and MTd are alternately arranged. A group of the memory cell transistors MTa and a group of the memory cell transistors MTb may be alternately arranged. The rest of the configuration and other operations of the seventh modification of the second embodiment are the same as those of the second embodiment.

In each of the sixth and seventh modifications of the second embodiment, it is desirable that at least one memory cell transistor be selected from each of the memory cell transistors MTa and MTb in the memory cell array 10A and that at least one memory cell transistor be selected from each of the memory cell transistors MTc and MTd in the memory cell array 10B and that they be combined to store data using share coding, and that they may be arranged at discretionarily determined locations.

Each of the sense amplifier unit SAUa coupled to the memory cell transistors MTa, the sense amplifier unit SAUb coupled to the memory cell transistors MTb, the sense amplifier unit SAUc coupled to the memory cell transistors MTc, and the sense amplifier unit SAUd coupled to the memory cell transistors MTd may be arranged at discretionarily determined locations in accordance with the arrangements of corresponding memory cells MT.

Eighth Modification of Second Embodiment

The eighth and ninth modifications of the second embodiment relate to circuit configurations in the case where simple logic calculating is performed in the sense amplifier module 17. In the following, the eighth and ninth modifications of the second embodiment will be explained below.

Figure 44:
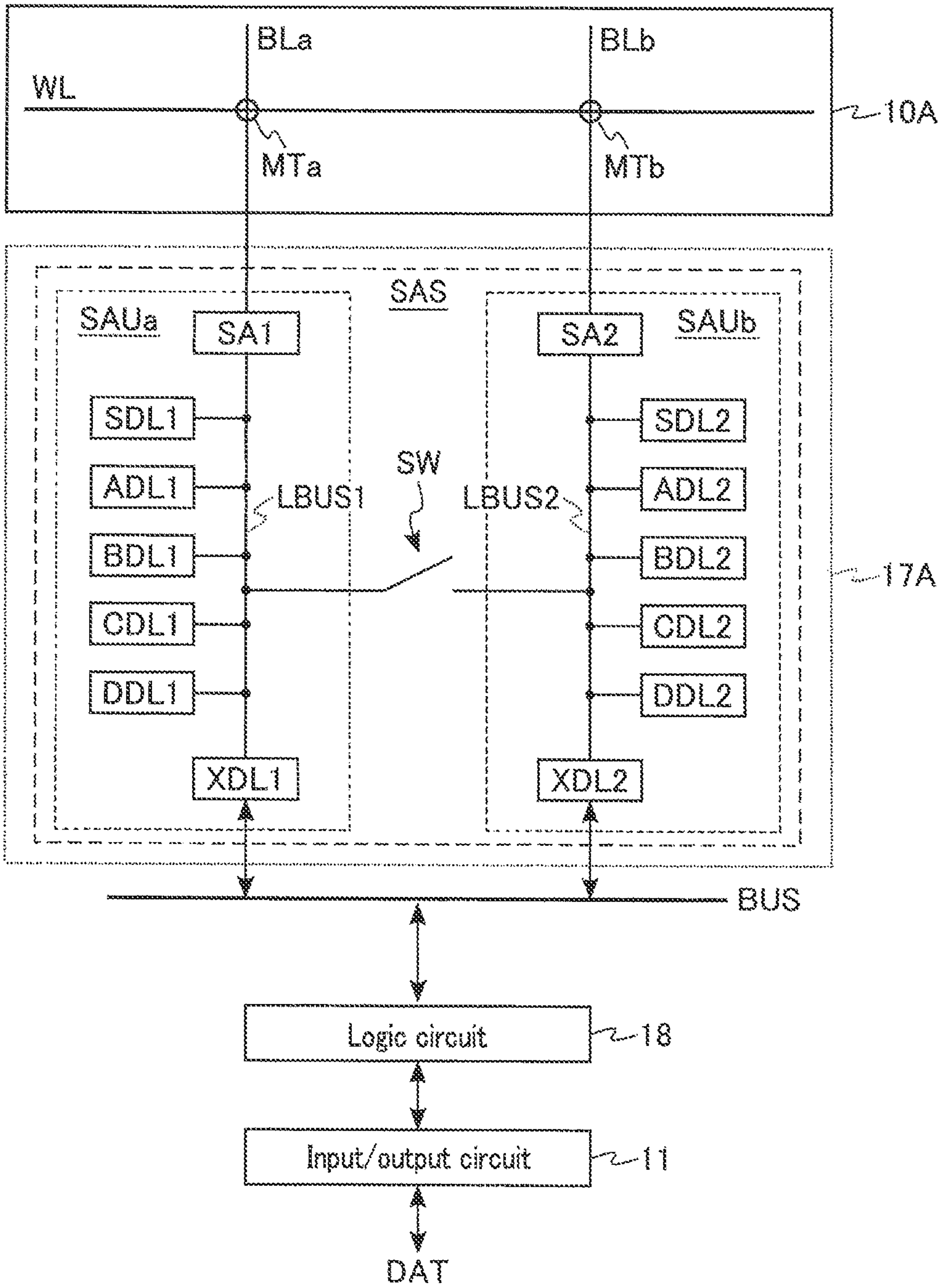
FIG. 44 is a circuit diagram showing an example of a circuit configuration of a sense amplifier module according to an eighth modification of the second embodiment.

FIG. 44 shows an example of a circuit configuration of the sense amplifier module 17A according to the eighth modification of the second embodiment, and shows a part of the configuration corresponding to the memory cell array 10A. The configuration of the sense amplifier module 17B is the same as the sense amplifier module 17A in the eighth modification of the second embodiment.

As shown in FIG. 44, the sense amplifier module 17A includes a plurality of sense amplifier sets SAS. Each sense amplifier set SAS includes a switch SW and a combination of one sense amplifier unit SAUa and one sense amplifier unit SAUb. The sense amplifier unit SAUa includes a sense amplifier SA1, and latch circuits SDL1, ADL1, BDL1, CDL1, DDL1, and XDL1, coupled in common to a bus LBUS1. The sense amplifier unit SAUb includes a sense amplifier SA2, and latch circuits SDL2, ADL2, BDL2, CDL2, DDL2, and XDL2, coupled in common to a bus LBUS2. Each of the latch circuits XDL1 and XDL2 is coupled to the logic circuit 18 via a bus BUS. The switch SW is coupled between the buses LBUS1 and LBUS2, and switches between on and off under the control of the sequencer 14.

Each sense amplifier set SAS is capable of executing simple logical calculating by using the latch circuit in the sense amplifier unit SAUa or SAUb. Similarly, a sense amplifier set SAS that includes the sense amplifier units SAUc and SAUd is provided in the sense amplifier module 17B. The rest of the configuration and other operations of the eighth modification of the second embodiment are the same as those of the second embodiment.

Ninth Modification of Second Embodiment

Figure 45:
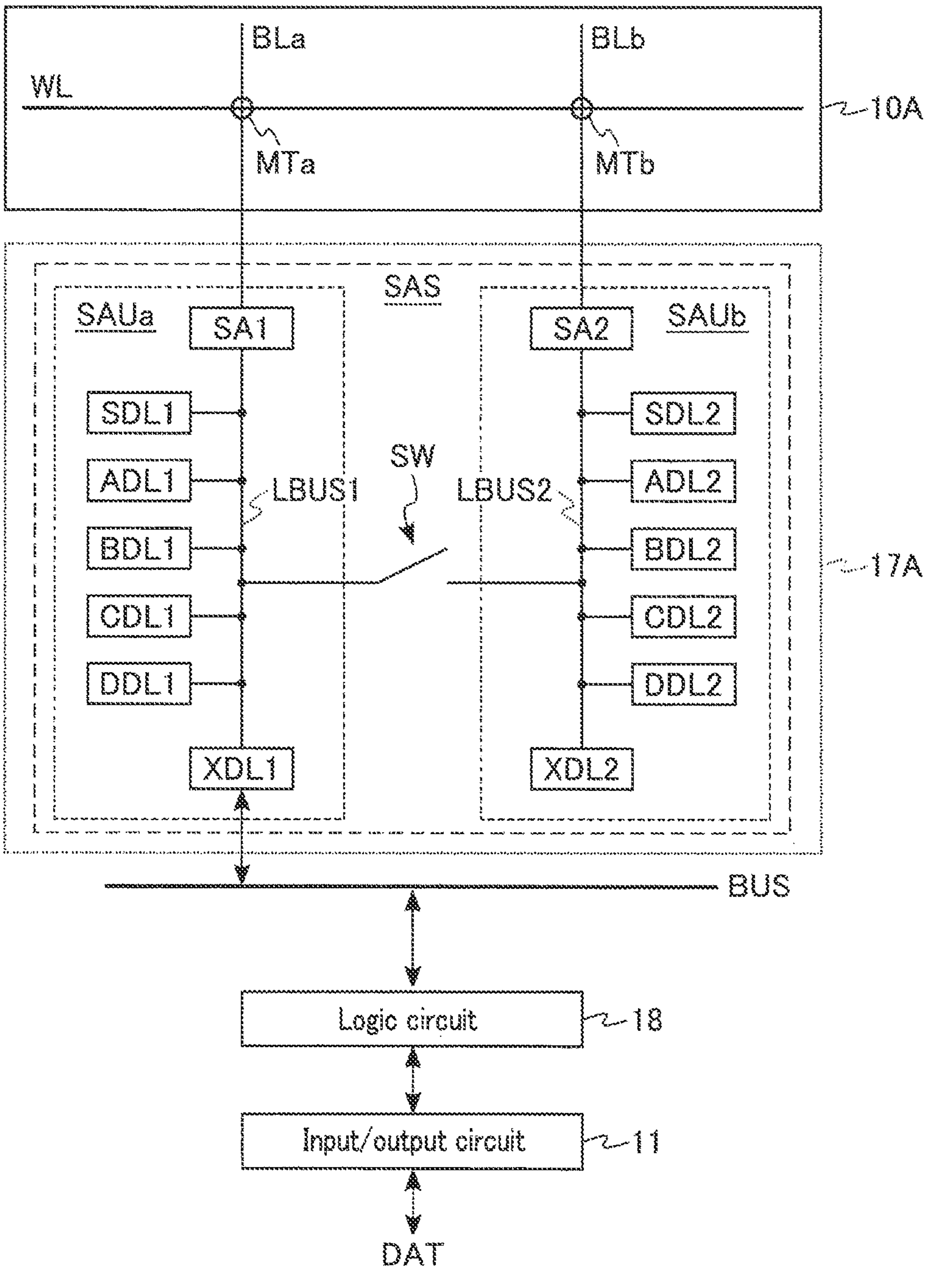
FIG. 45 is a circuit showing an example of a circuit configuration of a sense amplifier module according to a ninth modification of the second embodiment.

FIG. 45 shows an example of a circuit configuration of the sense amplifier module 17A according to the ninth modification of the second embodiment, and shows a part of the configuration corresponding to the memory cell array 10A. The configuration of the sense amplifier module 17B is the same as the sense amplifier module 17A in the ninth modification of the second embodiment.

As shown in FIG. 45, the sense amplifier module 17A in the ninth modification of the second embodiment has the same structure as the sense amplifier module 17A in the eighth modification of the second embodiment described with reference to FIG. 44, but the coupling between the latch circuit XDL2 and the bus BUS is omitted. In other words, in the ninth modification of the second embodiment, each sense amplifier set SAS is coupled to the logic circuit 18 via a single latch circuit XDL. The rest of the configuration and other operations of the ninth modification of the second embodiment are the same as those of the eighth modification of the second embodiment.

In each of the eighth and ninth modifications of the second embodiment, each sense amplifier set SAS can execute a portion of calculating which is performed by the logic circuit 18 in the second embodiment. Thus, in each of the eighth and ninth modifications of the second embodiment, a circuit area of the logic circuit 18 can be reduced. If the sense amplifier set SAS is capable of performing all operations in the logic circuit 18, the logic circuit 18 may be omitted. The sense amplifier set SAS is preferably coupled to the logic circuit 18 via at least one latch circuit XDL, as in the eighth and ninth modifications of the second embodiment.

In each of the eighth and ninth modifications of the second embodiment, for example the arrangement explained in the seventh modification of the second embodiment is adopted for the arrangement of the sense amplifier unit SAUa and SAUb. The arrangement is not limited to the above example; the sense amplifier units SAUa and SAUb included in the sense amplifier set SAS of the sense amplifier module 17A are not necessarily next to each other, as long as they are arranged in such a manner that they can communicate with each other. Similarly, the sense amplifier units SAUc and SAUd included in the sense amplifier set SAS of the sense amplifier module 17B are not necessarily next to each other, as long as they are arranged in such a manner that they can communicate with each other.

An example where the buses BUSa, BUSb, BUSc, and BUSd are separately provided has been described above, but the second embodiment is not limited thereto. A number and a combination of the buses BUS provided between the sense amplifier module 17 and the logic circuit 18 may be discretionarily designed.

[3] Third Embodiment

In the semiconductor memory device 1 according to the third embodiment, a storage area to which 5 bit/2 cell share coding is applied and a storage area to which conventional coding is applied are combined so as to make the page sizes of the read pages uniform. In the following, differences between the semiconductor memory device 1 according to the third embodiment and the first and second embodiments will be described.

[3-1] Configuration

Figure 46:
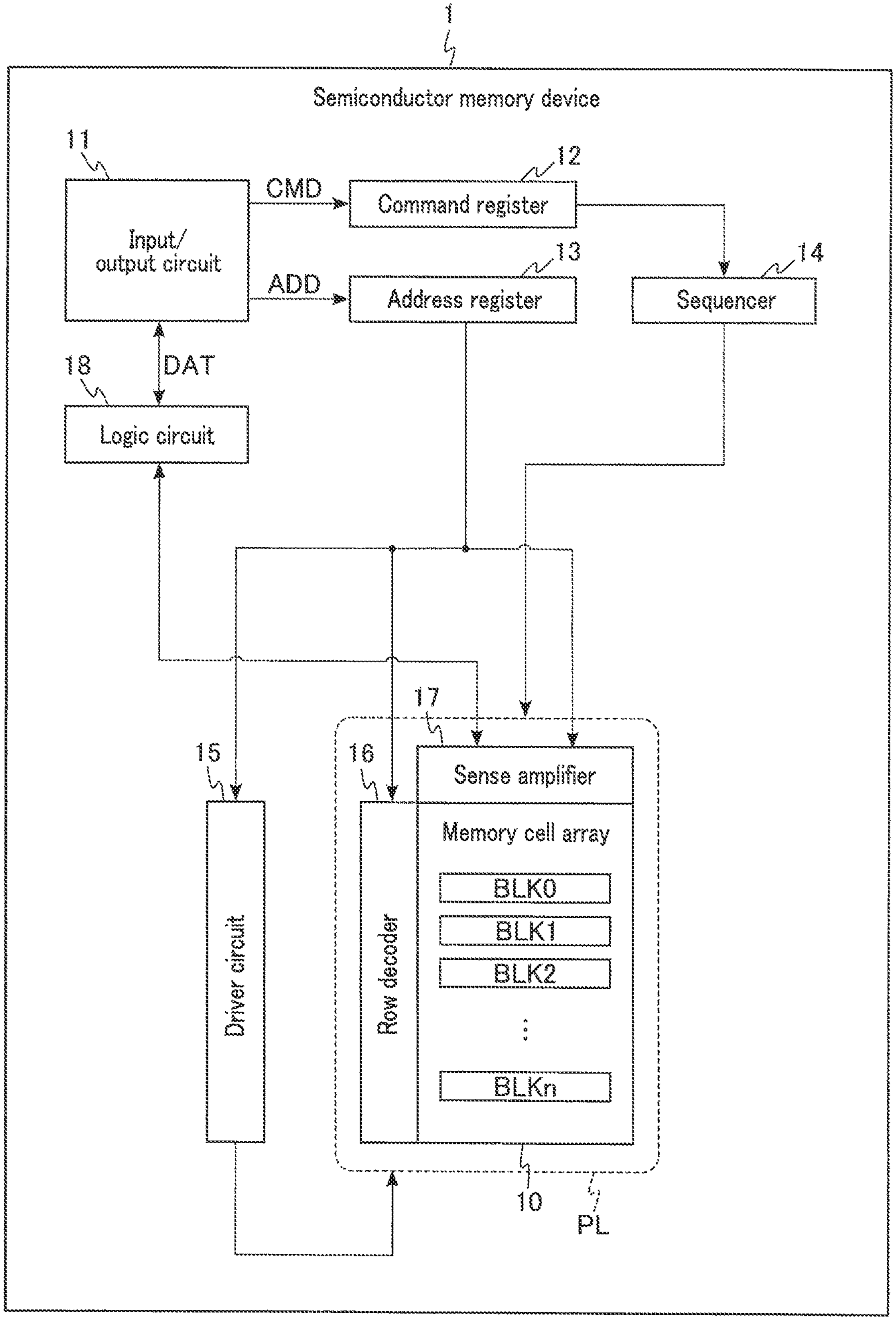
FIG. 46 is a block diagram showing an example of an entire configuration of a semiconductor memory device according to a third embodiment.

FIG. 46 shows an example of an overall configuration of the semiconductor memory device 1 according to the third embodiment. As shown in FIG. 46, the semiconductor memory device 1 according to the third embodiment has the same configuration as the semiconductor memory device 1 of the first embodiment, which was previously described with reference to FIG. 1, but a single plane PL is omitted. The semiconductor memory device 1 of the third embodiment includes at least one plane PL and may include a plurality of planes PL. The configuration and operations described below may be applied to each of a plurality of planes PL. Hereinafter, matters regarding the data storage method in the semiconductor memory device 1 according to the third embodiment will be described.

(Layout of Storage Areas)

Figure 47:
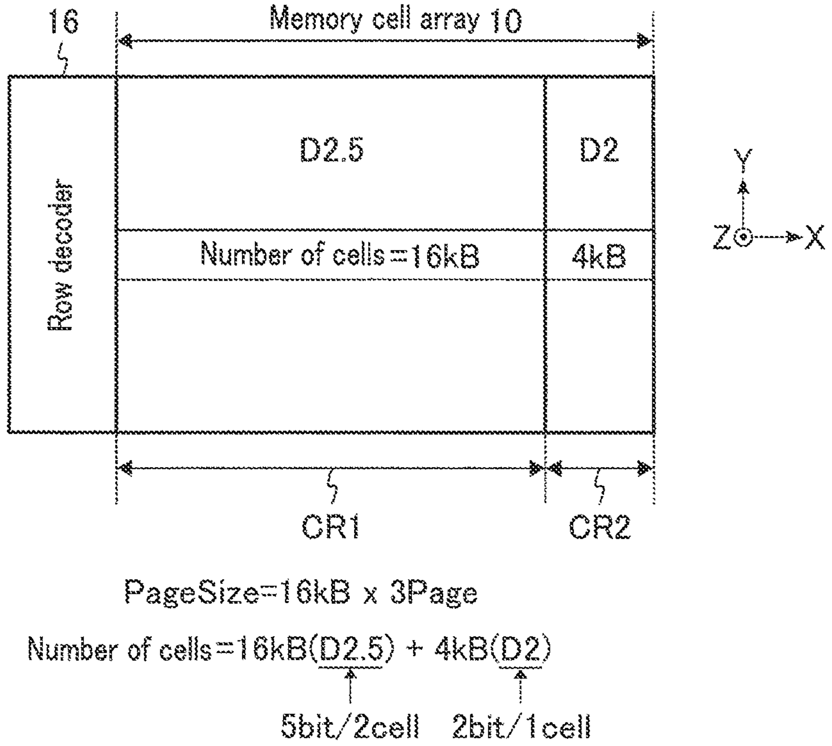
FIG. 47 is a block diagram showing an example of a memory cell array included in the semiconductor memory device according to the third embodiment.

FIG. 47 shows an example of a layout of the storage areas of the memory cell array 10 included in the semiconductor memory device 1 according to the third embodiment. As shown in FIG. 47, the memory cell array 10 of the third embodiment includes a first area CR1 and a second area CR2 arranged in the X direction. The row decoder module 16 is provided on, for example, the first area CR1 side, and controls the memory cell transistors MT using the word lines WL shared between the first area CR1 and the second area CR2.

The storage methods adopted in the first area CR1 and the second area CR2 are different. For example, 5 bit/2 cell share coding (D2.5), which will be described later, is applied to the first area CR1, and 2 bit/1 cell share coding (D2) is applied to the second area CR2. For example, at least 16 k memory cell transistors MT are coupled to a single word line WL within the first area CR1 (the number of cells=16 kB), and at least 4 k memory cell transistors MT are coupled to a single word line WL within the second area CR2 (the number of cells=4 kB) In the embodiment described hereinafter, data stored in the memory cell transistors MT coupled in common to a word line WL, namely a single cell unit CU, is defined as "page data". A single cell unit CU may store multiple-page data in accordance with a coding method being used. In the semiconductor memory device 1 of the third embodiment, 3-page data is stored in a single cell unit CU, and a size of each page of 3-page data is made uniform to be 16 kB.

(Circuit Configuration Relating to Share Coding)

Figure 48:
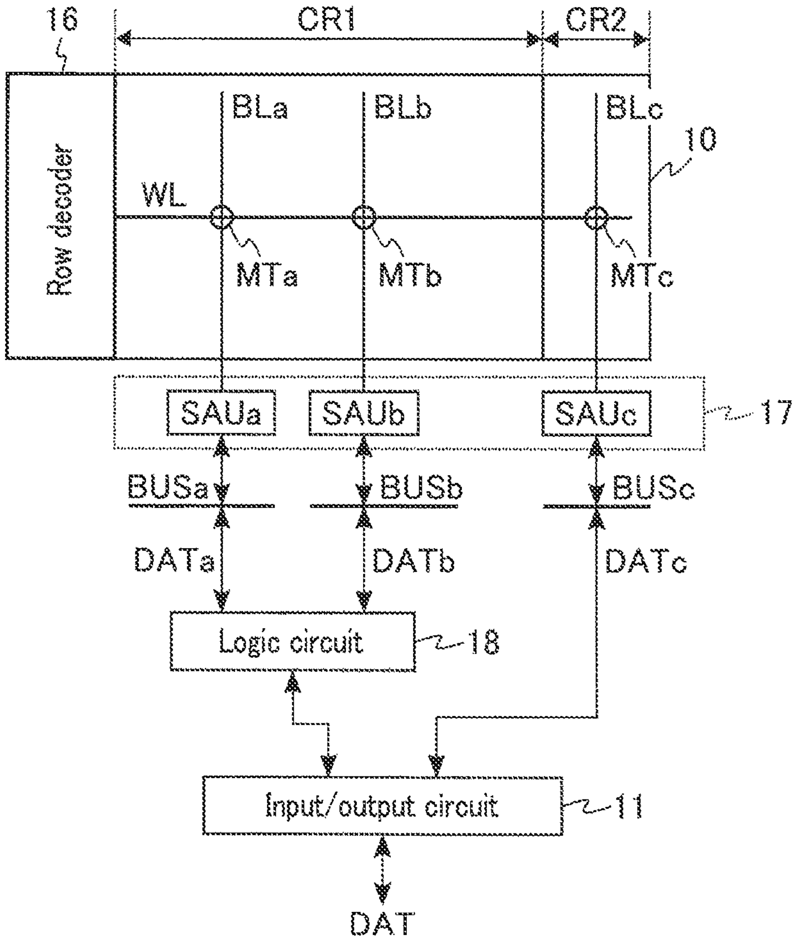
FIG. 48 is a circuit diagram showing an example of couplings used in page data storage in the semiconductor memory device according to the third embodiment.

FIG. 48 shows an example of couplings used in page data stored in the semiconductor memory device 1 according to the third embodiment. As shown in FIG. 48, the first area CR1 includes a plurality of memory cell transistors MTa and a plurality of memory cell transistors MTb, and the second area CR2 includes a plurality of memory cell transistors MTc. The memory cell transistors MTa and MTh in the first area CR1 and the memory cell transistors MTc in the second area CR2 share the word lines WL. The memory cell transistors MTa, MTh, and MTc are coupled to the bit lines BLa, BLb, and BLc, respectively.

Data DATa stored in the memory cell transistor MTa is read by a sense amplifier unit SAUa included in the sense amplifier module 17 and transferred to the logic circuit 18 via the data bus BUSa. Data DATb stored in the memory cell transistor MTb is read by a sense amplifier unit SAUb included in the sense amplifier module 17 and transferred to the logic circuit 18 via the data bus BUSb. The logic circuit 18 performs a decoding process using the data DATa read from the memory cell transistor MTa and the data DATb read from the memory cell transistor MTb, and outputs the decoded data DAT to the memory controller 2 via the input/output circuit 11.

Data DATc stored in the memory cell transistor MTc is read by a sense amplifier unit SAUc included in the sense amplifier module 17 and transferred to the input/output circuit 11 via the data bus BUSc. Data DATc is output as-is as read data DAT, without being subjected to a decoding process performed by the logic circuit 18. Data DATc may be transferred to the input/output circuit 11 via the logic circuit 18. In this case, the logic circuit 18 omits a decoding process performed on data DATc and transfers data DATc as-is to the input/output circuit 11. The data buses BUSa, BUSb, and BUSc are not necessarily separated. If it is possible to perform the operations described in the third embodiment, the data buses may be shared as needed.

(Details of Share Coding Used in First Area CR1)

Figure 49:
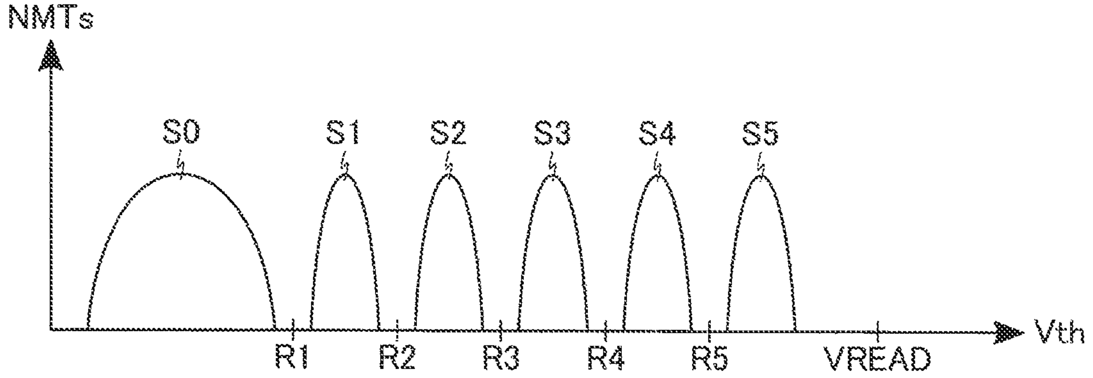
FIG. 49 is a schematic diagram showing an example of a threshold voltage distribution of memory cell transistors in a first area of a memory cell array included in the semiconductor memory device according to the third embodiment.

FIG. 49 shows an example of a threshold voltage distribution of the memory cell transistors MT in the first area CR1 of the memory cell array 10 included in the semiconductor memory device 1 according to the third embodiment. As shown in FIG. 49, a threshold voltage distribution of the memory cell transistors MT in the first area CR1 may form six types of states. Specifically, the threshold voltage distribution in the third embodiment has the same states but the "S6" to "S15" of the 16 states in the first embodiment described with reference to FIG. 9 are omitted, and each of the remaining states is widened.

A threshold voltage of each of the memory cell transistors MTa and MTb in the first area CR1 may be included in one of the above-described six states. In other words, in the first area CR1 of the third embodiment, there are 36 combinations made up of six states applicable to the memory cell transistor MTa and six states applicable to the memory cell transistor MTh. Different 5-bit data is allocated to each of 36 combinations in the semiconductor memory device 1 of the third embodiment. At least 32 combinations are necessary to allocate different 5-bit data to each combination. For this reason, the same 5-bit data may be allocated to some of the combinations.

Figures 50, 51:
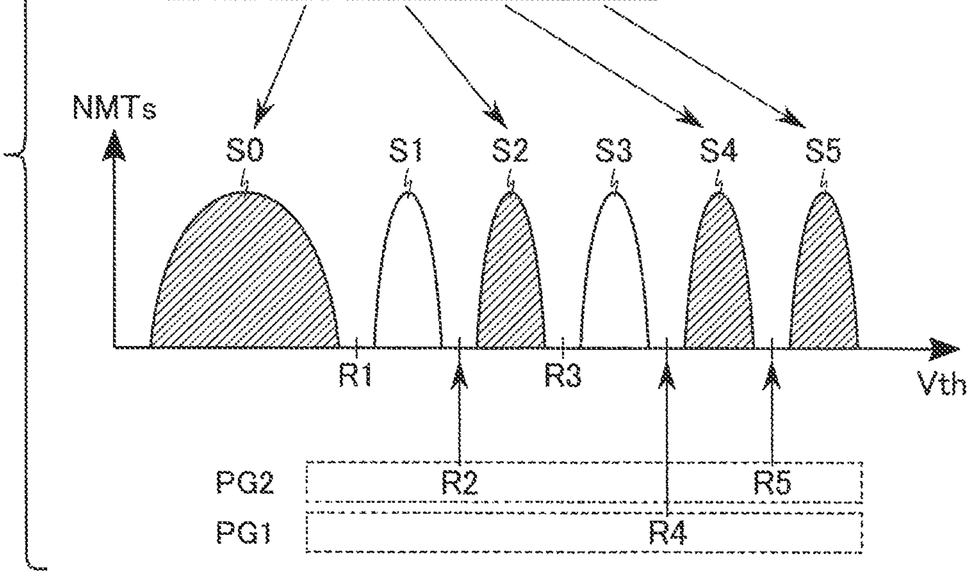
FIG. 50 is a table showing an example of share coding used in a first area of a memory cell array included in the semiconductor memory device according to the third embodiment.
FIG. 51 is a schematic diagram showing an example of an allocation of coding and data used in a second area of a memory cell array included in the semiconductor memory device according to the third embodiment.

FIG. 50 shows an example of share coding used in the first area CR1 of a memory cell array 10 included in the semiconductor memory device 1 according to the third embodiment. In the first area CR1 in the third embodiment, decoding rules and read voltages are set for each page, as shown in FIG. 50 and in the following.

(Example) Read page: decoding rules [a,b,c,d], read voltages to be used [read voltages set for MTa/read voltages set for MTb]

PG1:[1,1,1,0], [R2/R2]

PG2:[1,0,1,0], [–/(R1,R4)]

PG3:[1,1,0,0], [(R1,R4)/–]

PG4:[1,0,0,1], [(R3,R5)/R2]

PG5:[1,0,0,1], [R2/(R3,R5)]

The above-described coding in which 5-bit data is stored in two memory cell transistors MTa and MTb may be called "5 bit/2 cell share coding". In the share coding used in the first area CR1 of the third embodiment, the number of read operations performed in each of PG1, PG2, PG3, PG4, PG5 is one, two, two, two, and two. For this reason, the share coding used in the first area CR1 of the third embodiment may be called "1-2-2-2-2" coding.

(Coding Used in Second Area CR2)

FIG. 51 shows an example of coding used in the second area CR2 of the memory cell array 10 included in the semiconductor memory device 1 according to the third embodiment. As shown in FIG. 51, in the second area CR2 of the third embodiment, 2-bit data is allocated to some of the six states used in the first area CR1.

In the example, "11 (first bit/second bit)" data is allocated to the "S0" state. "10" data is allocated to the "S2" state. "00" data is allocated to the "S4" state. "01" data is allocated to the "S5" state.

In a read operation for page PG1 including a first bit, the read voltage R4 is used. In a read operation for page PG2 including a second bit, the read voltages R2 and R5 are used. Thus, in this example, 2 bit/l cell coding, namely 1-2 coding is used in the second area CR2. The rest of the configuration of the semiconductor memory device 1 according to the third embodiment is the same as that of the first embodiment.

In the third embodiment, it suffices that the threshold voltages of the memory cell transistors MT that store "11" data fall within the range of the "S0" to "S1" states. And it suffices that the threshold voltages of the transistors MT that store "01" data fall within the range of the "S2" to "S3" states. The third embodiment is not limited to this example, as long as the 2 bit/1 cell coding used in the second area CR2 uses at least one of the read voltages used in the shared coding PG1 read operation in the first area CR1.

[3-2] Read Operation

Figure 52:
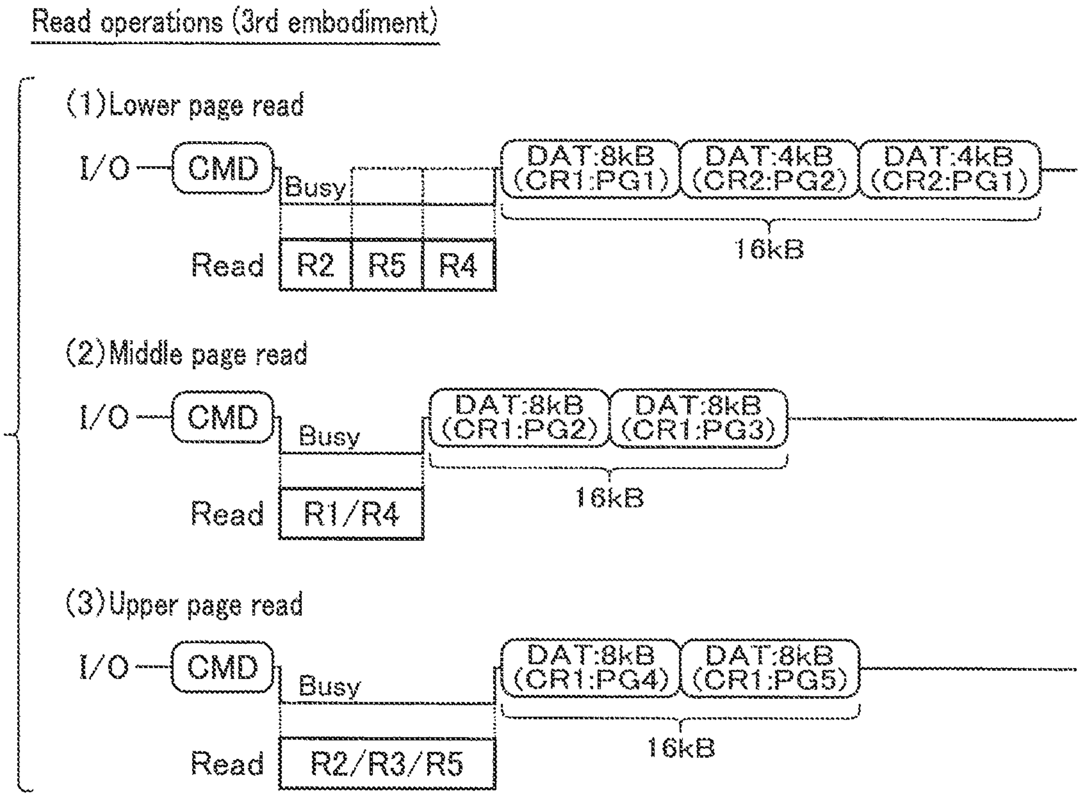
FIG. 52 is a schematic diagram showing an example of a flow of a read operation for each page in the semiconductor memory device according to the third embodiment.

FIG. 52 shows an example of a flow of a read operation for each page in the semiconductor memory device 1 according to the third embodiment. As shown in FIG. 52, the semiconductor memory device 1 according to the third embodiment is capable of performing a read operation for each page of three-page data based on an instruction from the memory controller 2. FIGS. 52 (1) through (3) correspond to a lower-page read operation, a middle-page read operation, and an upper-page read operation, respectively. In the following, details of a read operation for each page in the third embodiment are explained. Hereinafter, a read operation for lower-page data will be referred to as a "lower-page read operation". A read operation for middle-page data will be referred to as a "middle-page read operation". A read operation for upper-page data will be referred to as an "upper-page read operation".

(Lower-Page Read Operation)

The lower-page data corresponds to a combination of page PG1 of the first area CR1 and pages PG1 and PG2 of the second area CR2. As shown in FIG. 52(1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R2, R5, and R4 are sequentially applied to a selected word line WL. When a read operation using the read voltage R2 is completed, data of page PG1 in the first area CR1 is confirmed. When a read operation using the read voltage R5 is completed, data of page PG2 in the second area CR2 is confirmed. When a read operation using the read voltage R4 is completed, data of page PG1 in the second area CR2 is confirmed.

After the read operations using the read voltages R2, R5, and R4 are completed, the semiconductor memory device 1 transitions from a busy state to a ready state and commences outputting data DAT. In a lower-page read operation, data DAT is output in order, page PG1 of the first area CR1 (8 kB), page PG2 of the second area CR2 (4 kB), and then page PG1 of the second area CR2 (4 kB), for example. The page size of the lower-page data is 8 kB (CR1:PG1)+4 kB (CR2:PG1)+4 kB (CR2:PG2)=16 kB.

(Middle-Page Read Operation)

The middle-page read operation corresponds to a combination of pages PG2 and PG3 of the first area CR1. As shown in FIG. 52 (2), upon receipt of a command set CMD that instructs a middle-page read operation from the memory the memory controller 2, the semiconductor memory device 1 transitions to a busy state and performs a middle-page read operation.

In the middle-page read operation, for example the read voltages R1 and R4 are sequentially applied to a selected word line WL. When a read operation using the read voltages R1 and R4 is completed, data in each of page PG2 and PG3 in the first area CR1 is confirmed.

After the read operations using the read voltages R1 and R4 are completed, the semiconductor memory device 1 transitions from a busy state to a ready state and commences outputting data DAT. In a middle-page read operation, data DAT is output in order, first page PG2 of the first area CR1 (8 kB) and then page PG3 of the first area CR1 (8 kB), for example. The page size of middle-page data is 8 kB (CR1: PG2)+8 kB (CR1:PG3)=16 kB.

(Upper-Page Read Operation)

The upper-page read operation corresponds to a combination of pages PG4 and PG5 of upper memory first area CR1. As shown in FIG. 52 (3), upon receipt of a command set CMD that instructs an upper-page read operation from the memory controller 2, the semiconductor memory device 1 transitions to a busy state and performs an upper-page read operation.

In the upper-memory page read operation, for example the read voltages R2, R3, and R5 are sequentially applied to a selected word line WL. When a read operation using the read voltage R2, R3, and R5 is completed, data in each of pages PG4 and PG5 in the first area CR1 is confirmed.

After the read operations using the read voltages R2, R3, and R5 are completed, the semiconductor memory device 1 transitions from a busy state to a ready state and commences outputting data DAT. In an upper-page read operation, data DAT is output in order, page PG4 of the first area CR1 (8 kB) and then page PG5 of the first area CR1 (8 kB), for example. The page size of the upper page data is 8 kB (CR1:PG4)+8 kB (CR1:PG5)=16 kB.

Thus, the data sizes of all pages in the third embodiment are equalized to 16 kB. The order of the data output in a read operation for each page may be changed as needed. The semiconductor memory device 1 in the lower-page read operation may transition to a ready state after each of the data of page PG1 of the first area CR1 and the data of page PG2 of the second area CR2 are confirmed and then commence outputting of the confirmed data. The semiconductor memory device 1 in the lower-page read operation may transition to a ready state after each of the data of page PG1 of the first area CR1 and the data of page PG2 of the second area CR2 are confirmed and then commence outputting of the confirmed data.

[3-3] Advantageous Effects of Third Embodiment

According to the above-described semiconductor memory device 1 of the third embodiment, it is possible to make the page size of each read page uniform when share coding is used. Hereinafter, detailed advantageous effects of the semiconductor memory device 3 according to the third embodiment will be described, using a comparative example.

Figure 53:
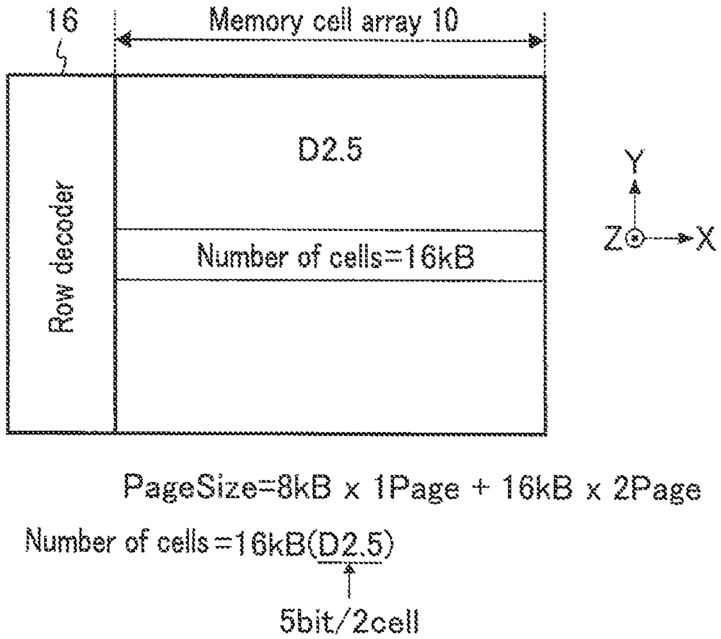
FIG. 53 is a block diagram showing an example of a configuration of a memory cell array in a comparative example of the third embodiment.

FIG. 53 shows an example of a layout of the storage areas of the memory cell array 10 in the comparative example of the third embodiment. As shown in FIG. 53, the memory cell array 10 in the comparative example of the third embodiment only has an area to which 5 bit/2 cell share coding (D2.5) similar to the 5 bit/2 cell share coding in the third embodiment is applied.

Figure 54:
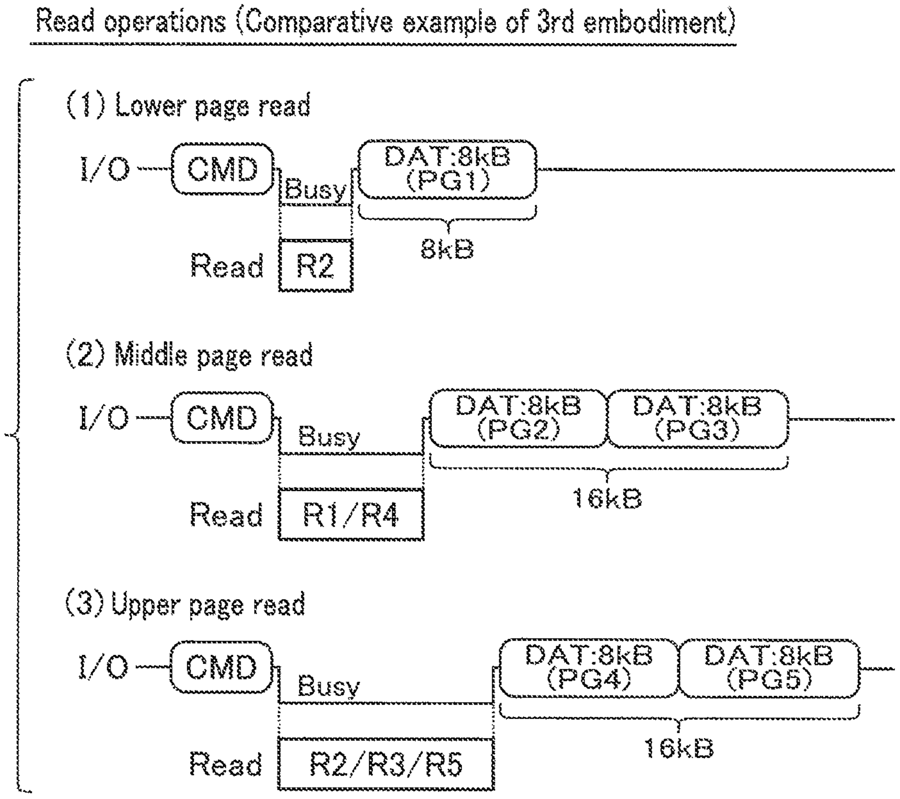
FIG. 54 is a schematic diagram showing an example of a read operation in a comparative example of the third embodiment.

FIG. 54 shows an example of a read operation for each page in the comparative example of the third embodiment. As shown in FIG. 54, the lower-page data in the comparative example in the third embodiment corresponds to page PG1 of 5 bit/2 cell share coding. In other words, the page size of the lower-page data is 8 kB (PG1) in the comparative example of the third embodiment.

The 5 bit/2 cell share coding described in the third embodiment uses the same read voltages set for pages PG2 and PG3; it is thereby possible to simultaneously perform read operations for pages PG2 and PG3. If pages PG2 and PG3 are allocated to the middle-page data, the page size of the middle-page data is 8 kB (PG2)+8 kB (PG3)=16 kB. Similarly, the read operations for pages PG4 and PG5 can be performed simultaneously. If pages PG4 and PG5 are allocated to the upper-page data, the page size of the upper-page data is 8 kB (PG4)+8 kB (PG5)=16 kB.

The semiconductor memory device 1 of the comparative example of the third embodiment can increase the speed of the read operation by reading multiple pages of the share coding in a batch as described above. However, the page size of the lower-page data (8 kB) differs from the page size of the other pages (16 kB). The handling of data by the memory controller 2 may be complicated by variations in page sizes; for this reason, it is preferable that page sizes of the read pages be made uniform.

On the other hand, the semiconductor memory device 1 of the third embodiment has two storage areas using different types of coding (first area CR1 and second area CR2). Specifically, the first area CR1 is used as a main storage area and the 5 bit/2 cell share coding described in the third embodiment is used. The second area CR2 is used as a sub-storage area, and for example 2 bit/1 cell coding is used.

In the lower-page read operation, the semiconductor memory device 1 of the third embodiment performs a read operation for page PG1 of the first area CR1 and a read operation for pages PG1 and PG2 of the second area CR2 in a batch. The page size of the lower-page data is 16 kB, which is the same as the data size of the other pages, if a plurality of memory cell transistors MT arranged in the second area CR2 have the same storage capacity as page PG1 of the first area CR1.

As a result, the semiconductor memory device 1 of the third embodiment can make the page size of each read page uniform when share coding is used. Furthermore, the memory controller 2 that controls the semiconductor memory device 1 of the third embodiment can simplify the handling of data, and it is thereby possible to suppress design costs for the memory controller 2.

In the word lines WL, delays in voltage changes may occur in the portions distant from the row decoder module 16. For this reason, the second area CR2 to which 2 bit/1 cell coding is applied is arranged in an area which is further from the row decoder module 16 than the first area CR1 is. Rooms between neighboring states are larger in the coding applied to the second area CR2 than in the share decoding applied to the first area CR1. For this reason, the arrangement of the first area CR1 and the second area CR2 described in the third embodiment can suppress the occurrence of error bits caused by delays in voltage changes in the word line WL.

[3-4] Modification of Third Embodiment

A combination of the coding in the area CR1 and the coding in the area CR2 that achieves advantageous effects similar to those of the third embodiment is not limited to the coding combination described in the third embodiment. In the following, a coding combination that achieves advantageous effects similar to those of the third embodiment will be described as a modification of the third embodiment. There may be other coding combinations that achieve advantageous effects similar to those of the third embodiment than the modification of the third embodiment.

Figure 55:
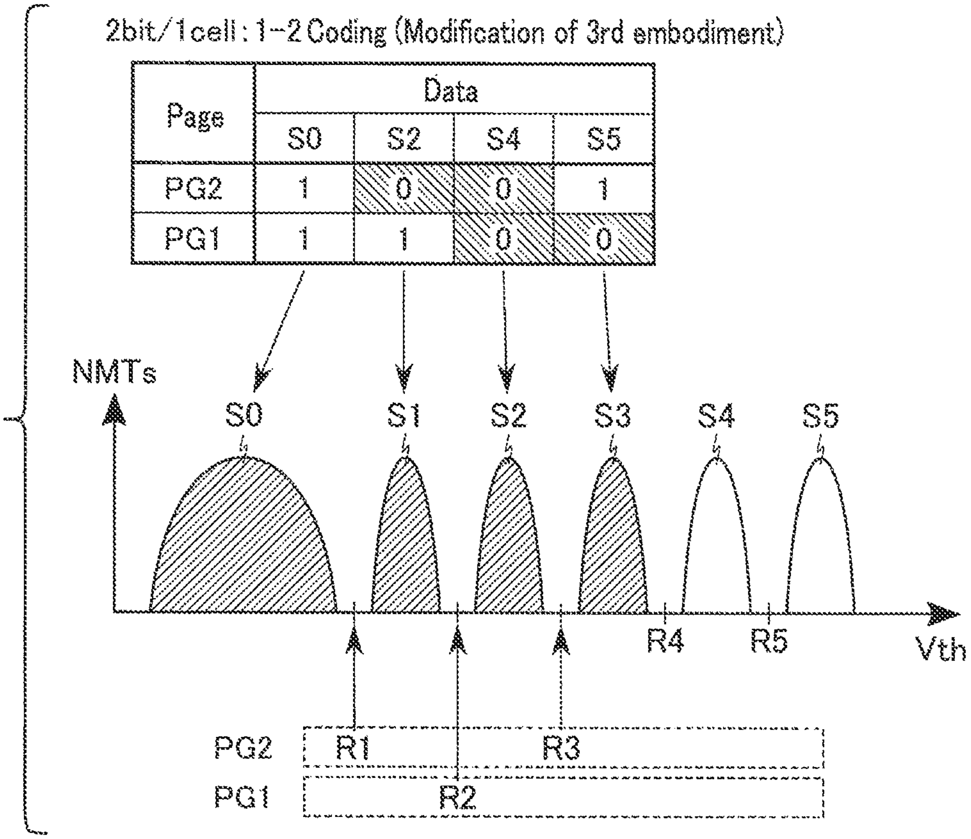
FIG. 55 is a schematic diagram showing an example of an allocation of coding and data used in a second area of a memory cell array in a comparative example of the third embodiment.

In the modification of the third embodiment, the share coding used in the first area CR1 of the memory cell array 10 is the same as that in the third embodiment. On the other hand, the coding used in the second area CR2 of the memory cell array 10 differs from that in the third embodiment. FIG. 55 shows an example of coding used in the second area CR2 of the memory cell array 10 in the modification of the third embodiment.

As shown in FIG. 55, the allocation of 2-bit data in the second area CR2 differs between the modification and the third embodiment. In the example, "11 (first bit/second bit)" data is allocated to the "S0" state. "10" data is allocated to the "S1" state. "00" data is allocated to the "S2" state. "01" data is allocated to the "S3" state.

In a read operation for page PG1 including a first bit, the read voltage R2 is used. In a read operation for page PG2 including a second bit, the read voltages R1 and R3 are used. Thus, in this example, 2 bit/1 cell coding, namely 1-2 coding is used in the second area CR2.

In the third embodiment, it suffices that the threshold voltages of the memory cell transistors MT that store "01" data fall within the range of the "S3" to "S5" states. Any type of coding can be applied to the second area CR2, as long as at least one of the read voltages used in reading of PG1 in the share coding applied to the first area CR1 is used.

Figure 56:
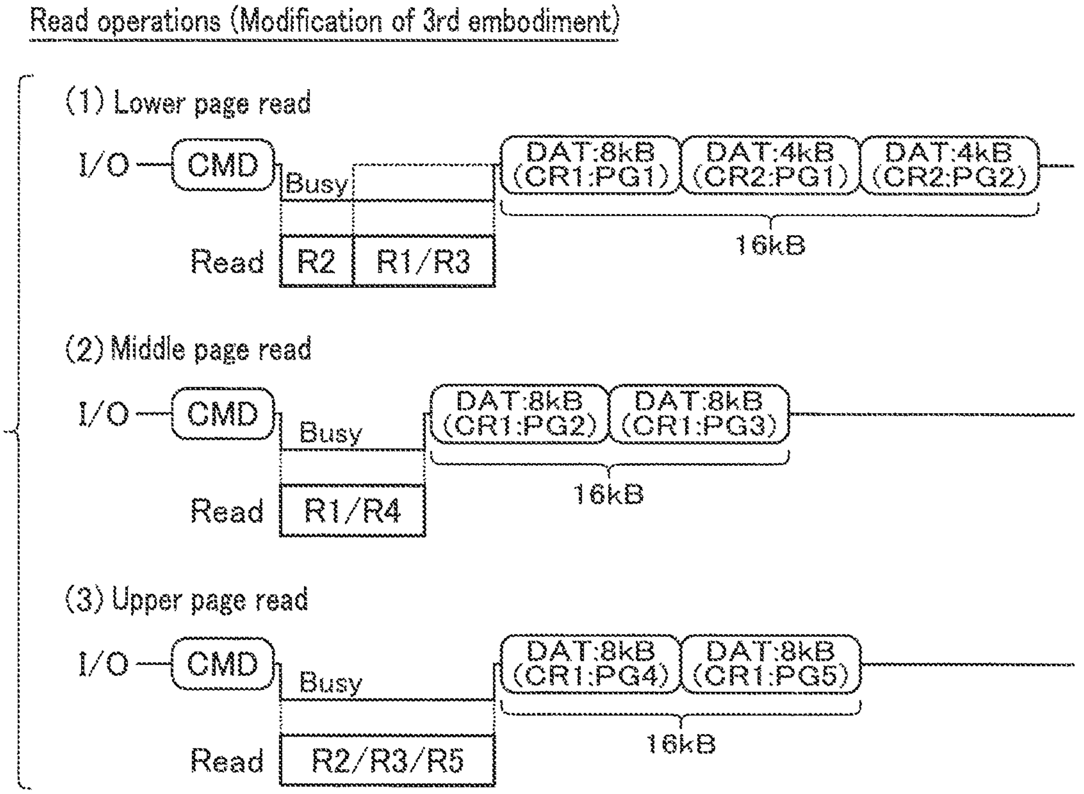
FIG. 56 is a schematic diagram showing an example of a flow of a read operation for each page in a modification of the third embodiment.

FIG. 56 shows an example of a flow of a read operation for each page in the modification of the third embodiment. As shown in FIG. 56, in the modification of the third embodiment, the details of the read operation performed on the lower page differ from the read operation in the third embodiment.

In the modification of the third embodiment, the lower-page data corresponds to a combination of page PG1 of the first area CR1 and pages PG1 and PG2 of the second area CR2, similarly to the third embodiment. On the other hand, in a read operation for a lower page in the modification of the third embodiment, read voltages R2, R1, and R3 are sequentially applied to a selected word line WL. When a read operation using the read voltage R2 is completed, data of page PG1 in each of the first area CR1 and the second area CR2 is confirmed. When a read operation using the read voltages R1 and R3 is completed, data of page PG2 in the second area CR2 is confirmed. The rest of the configuration and other operations of the modification of the third modification are the same as those of the third embodiment.

Thus, in a read operation for a lower page in the modification of the third embodiment, the number of read voltages applied in order to confirm data of page PG1 of the second area CR2 is smaller than that in the third embodiment. As a result, the semiconductor memory device 1 of the modification of the third embodiment can obtain advantageous effects similar to those in the third embodiment and can output the data of page PG1 of the second area CR2 in a lower-page read operation faster than the third embodiment.

[4] Fourth Embodiment

In the semiconductor memory device 1 according to the fourth embodiment, a storage area to which the 7 bit/2 cell share coding is applied and a storage area to which conventional coding is applied are combined so as to make the page sizes of the read pages uniform. In the following, differences in the semiconductor memory device 1 between the fourth embodiment and the first to third embodiments will be described.

[4-1] Configuration

The semiconductor memory device 1 of the fourth embodiment differs from that of the third embodiment in the layout of storage areas and coding used therein. The rest of the configuration of the semiconductor memory device 1 according to the fourth embodiment is the same as that of the third embodiment. Hereinafter, matters regarding the data storage method in the semiconductor memory device 1 according to the fourth embodiment will be described.

(Layout of Storage Area)

Figure 57:
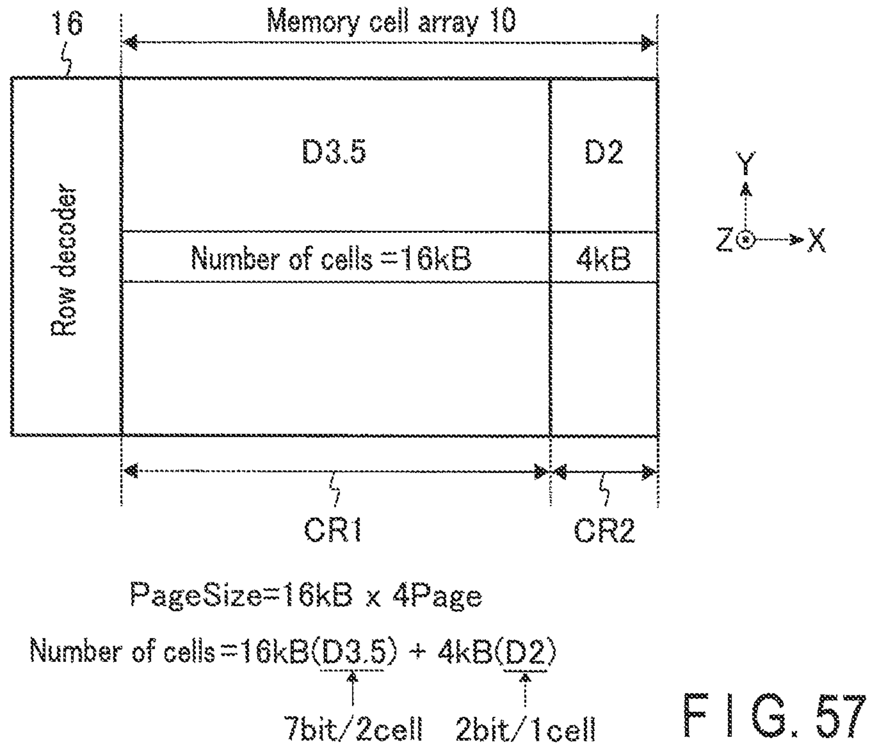
FIG. 57 is a block diagram showing an example of a configuration of a memory cell array included in the semiconductor memory device according to a fourth embodiment.

FIG. 57 shows an example of a layout of the storage areas of the memory cell array 10 included in the semiconductor memory device 1 according to the fourth embodiment. As shown in FIG. 57, the memory cell array 10 in the fourth embodiment has a layout similar to the one described in the third embodiment with reference to FIG. 47 but with different storage methods applied to the first area CR1 and the second area CR2.

Specifically, 7 bit/2 cell share coding (D3.5), which will be described later, is applied to the first area CR1, and 2 bit/1 cell share coding (D2) is applied to the second area CR2. For example, a single word line WL is coupled to at least 16 k memory cell transistors MT in the first area CR1 (the number of cells=16 kB) and at least 4 k memory cell transistors MT in the second area CR2 (the number of cells=4 kB). Thus, in the semiconductor memory device 1 of the fourth embodiment, 4-page data is stored in a single cell unit CU, and a size of each page of 4-page data is made uniform to be 16 kB. The couplings between the memory cell array 10 and the input/output circuit 11 in the fourth embodiment are the same as those in the third embodiment.

(Details of Share Coding Used in First Area CR1)

Figures 58, 59:
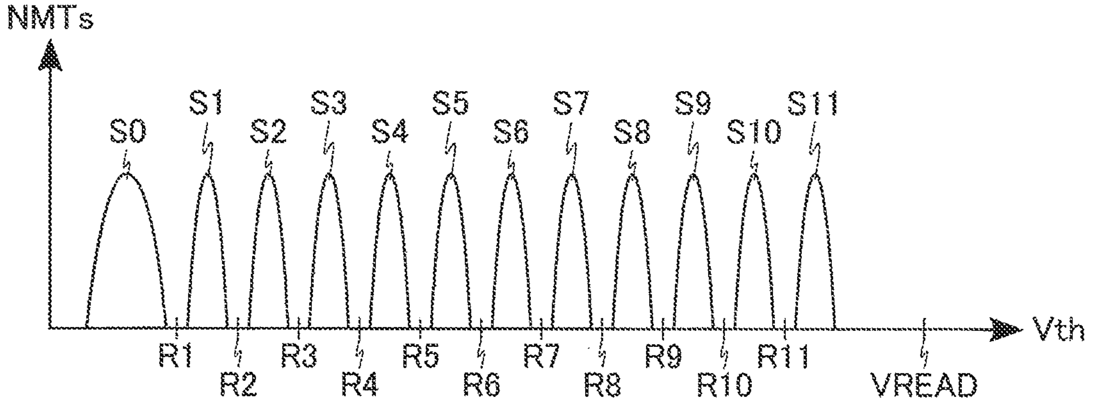
FIG. 58 is a schematic diagram showing an example of a threshold voltage distribution of memory cell transistors in a first area of a memory cell array included in the semiconductor memory device according to the fourth embodiment.
FIG. 59 is a table showing an example of share coding used in a first area of a memory cell array included in the semiconductor memory device according to the fourth embodiment.

FIG. 58 shows an example of a threshold voltage distribution of the memory cell transistors MT in the first area CR1 of a memory cell array 10 included in the semiconductor memory device 1 according to the fourth embodiment. As shown in FIG. 58, a threshold voltage distribution of the memory cell transistors MT in the first area CR1 may form 12 types of states. Specifically, the threshold voltage distribution in the fourth embodiment has the same states but the "S12" to "S15" of the 16 states in the first embodiment described with reference to FIG. 9 are omitted, and each of the remaining states is widened.

A threshold voltage of each of the memory cell transistors MTa and MTb in the first area CR1 may be included in one of the above-described 12 states. In other words, in the first area CR1 of the fourth embodiment, there are 144 combinations made up of 12 states applicable to the memory cell transistor MTa and 12 states applicable to the memory cell transistor MTb. Different 7-bit data is allocated to each of 144 combinations in the semiconductor memory device 1 of the fourth embodiment. There need to be at least 128 combinations in order to allocate different sets of 7-bit data to the combinations. For this reason, the same 7-bit data may be allocated to some of the combinations.

FIG. 59 shows an example of share coding used in the first area CR1 of a memory cell array 10 included in the semiconductor memory device 1 according to the fourth embodiment. In the semiconductor memory device 4 of the first embodiment, decoding rules and read voltages are set for each page as shown in FIG. 59 and the drawings thereafter.

(Example) Read page: decoding rules [a,b,c,d], read voltages to be used [read voltages set for MTa/read voltages set for MTb]

PG1:[1,1,1,0], [R4/R4]
PG2:[1,0,0,1], [R4/(R6,R9,R11)]
PG3:[1,0,0,1], [(R6,R9,R11)/R4]
PG4:[1,1,0,0], [(R1,R3,R8)/−]
PG5:[1,0,1,0], [−/(R1,R3,R8)]
PG6:[1,1,0,0], [(R2,R5,R7,R10)/−]
PG7:[1,0,1,0], [−/(R2,R5,R7,R10)]

The above-described coding in which 5-bit data is stored in two memory cell transistors MTa and MTb may be called "7 bit/2 cell share coding". In the share coding used in the first area CR1 of the fourth embodiment, the number of read operations performed in each of PG1, PG2, PG3, PG4, PG5, PG6, PG7 is one, four, four, three, three, four, and four. For this reason, the share coding used in the first area CR1 of the fourth embodiment may be called "1-4-4-3-3-4-4 coding".

(Details of Share Coding Used in Second Area CR2)

Figure 60:
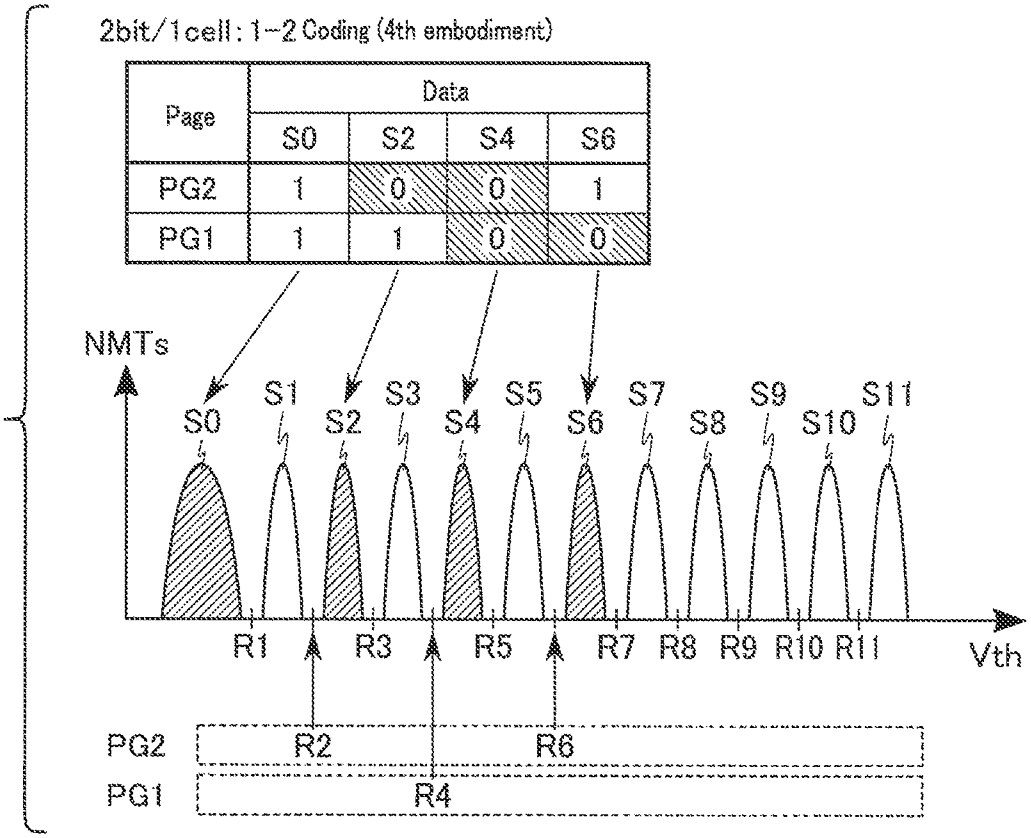
FIG. 60 is a schematic diagram showing an example of an allocation of coding and data used in a second area of a memory cell array included in the semiconductor memory device according to the fourth embodiment.

FIG. 60 shows an example of coding used in the second area CR2 of the memory cell array 10 included in the semiconductor memory device 1 according to the fourth embodiment. As shown in FIG. 60, in the second area CR2 of the fourth embodiment, 2-bit data is allocated to some of the 12 states used in the first area CR1.

In the example, "11 (first bit/second bit)" data is allocated to the "S0" state. "10" data is allocated to the "S2" state. "00" data is allocated to the "S4" state. "01" data is allocated to the "S6" state.

In a read operation for page PG1 including a first bit, the read voltage R4 is used. In a read operation for page PG2 including a second bit, the read voltages R2 and R6 are used. In other words, in this example, 2 bit/1 cell coding, namely 1-2 coding is used in the second area CR2. The rest of the configuration of the semiconductor memory device 1 according to the fourth embodiment is the same as that of the fourth embodiment.

In the fourth embodiment, it suffices that the threshold voltages of the memory cell transistors MT that store "11" data fall within the range of the "S0" to "S1" states. And it suffices that the threshold voltages of the transistors MT that store "10" data fall within the range of the "S2" to "S3" states. And it suffices that the threshold voltages of the transistors MT that store "00" data fall within the range of the "S4" to "S5" states. And it suffices that the threshold voltages of the transistors MT that store "01" data fall within the range of the "S6" to "S11" states. The fourth embodiment is not limited to this example, as long as the 2 bit/1 cell coding used in the second area CR2 uses at least one of the read voltages used in a PG1 read operation performed in the first area CR1 with the share coding.

[4-2] Read Operation

Figure 61:
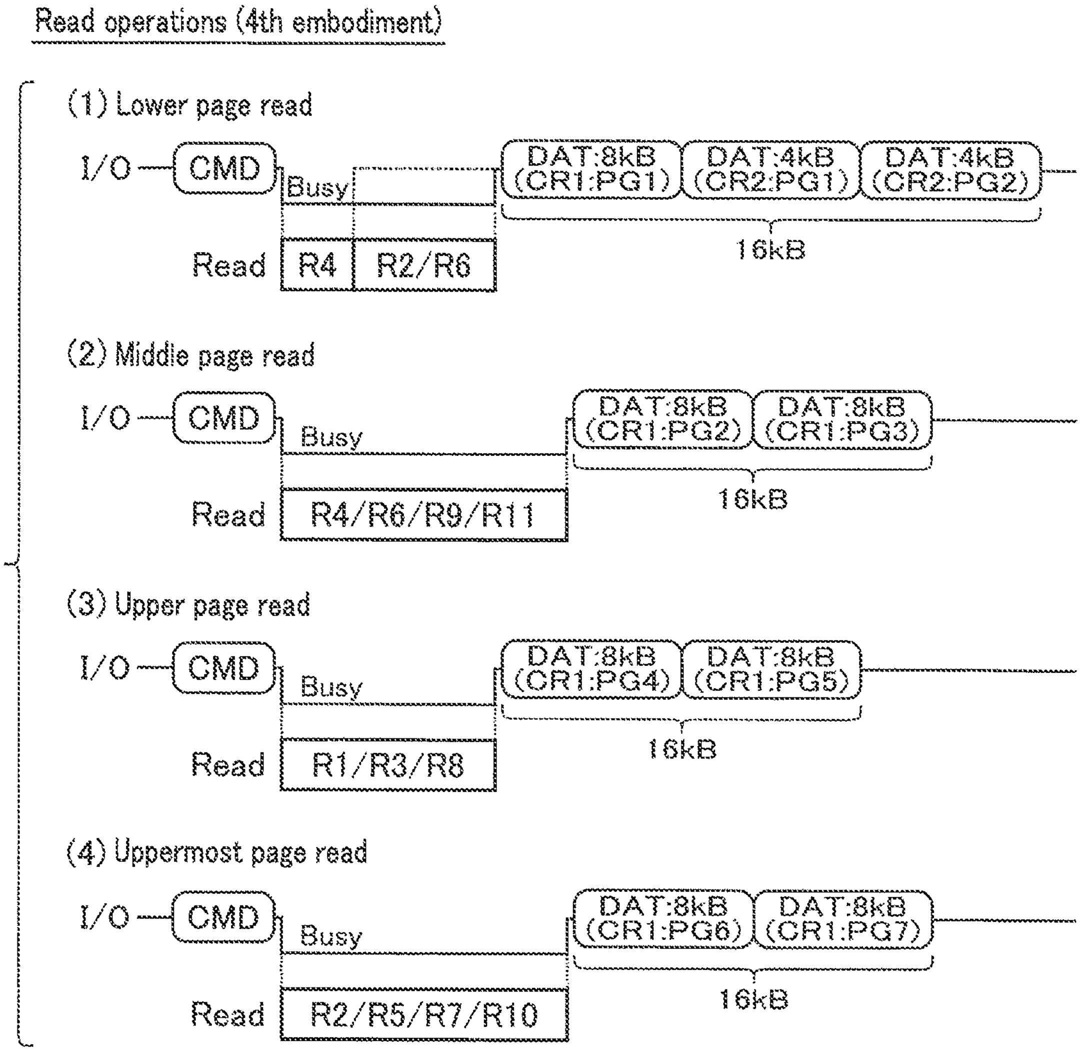
FIG. 61 is a schematic diagram showing an example of a flow of a read operation for each page in the semiconductor memory device according to the fourth embodiment.

FIG. 61 shows an example of a flow of a read operation for each page in the semiconductor memory device 1 according to the fourth embodiment. As shown in FIG. 61, the semiconductor memory device 1 according to the fourth embodiment is capable of performing a read operation for each page of four-page data based on an instruction from the memory controller 2. FIGS. 61(1) through (4) correspond to a lower-page read operation, a middle-page read operation, an upper-page read operation, and an uppermost-page read operation, respectively. In the following, details of a read operation for each page in the fourth embodiment are explained. Hereinafter, a read operation for uppermost-page data will be referred to as an "uppermost-page read operation".

(Lower-Page Read Operation)

The lower-page data corresponds to a combination of page PG1 of the first area CR1 and pages PG1 and PG2 of the second area CR2. As shown in FIG. 61 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R4, R2, and R6 are sequentially applied to a selected word line WL. When a read operation using the read voltage R4 is completed, data of page PG1 in the first area CR1 and data of PG1 in the second area CR2 are confirmed. When a read operation using the read voltages R2 and R6 is completed, data of page PG2 in the second area CR2 is confirmed.

After the read operations using the read voltages R4, R2, and R6 are completed, the semiconductor memory device 1 transitions from a busy state to a ready state and commences outputting of data DAT. In a lower-page read operation, data DAT is output in order of page PG1 of the first area CR1 (8 kB), page PG2 of the second area CR2 (4 kB), and then page PG1 of the second area CR2 (4 kB), for example. The page size of the lower-page data is 8 kB (CR1:PG1)+4 kB (CR2:PG1)+4 kB (CR2:PG2)=16 kB.

(Middle-Page Read Operation)

The middle-page read operation corresponds to a combination of pages PG2 and PG3 of the first area CR1. As shown in FIG. 61(2), upon receipt of a command set CMD that instructs a middle-page read operation from the memory controller 2, the semiconductor memory device 1 transitions to a busy state and performs a middle-page read operation.

In the middle-page read operation, for example the read voltages R1, R6, R9, and R11 are sequentially applied to a selected word line WL. When a read operation using the read voltages R1, R6, R9, and R11 is completed, data in each of page PG2 and PG3 in the first area CR1 is confirmed.

After the read operations using the read voltages R1, R6, R9, and R11 are completed, the semiconductor memory device 1 transitions from a busy state to a ready state and commences outputting of data DAT. In a middle-page read operation, data DAT is output in order of page PG2 of the first area CR1 (8 kB) and then page PG3 of the first area CR1 (8 kB), for example. The page size of middle-page data is 8 kB (CR1:PG2)+8 kB (CR1:PG3)=16 kB.

(Upper-Page Read Operation)

The middle-page read operation corresponds to a combination of pages PG4 and PG5 of the first area CR1. As shown in FIG. 61 (3), upon receipt of a command set CMD that instructs an upper-page read operation from the memory controller 2, the semiconductor memory device 1 transitions to a busy state and performs an upper-page read operation.

In the upper-page read operation, for example the read voltages R1, R3, and R8 are sequentially applied to a selected word line WL. When a read operation using the read voltage R1, R3, and R8 is completed, data in each of pages PG4 and PG5 in the first area CR1 is confirmed.

After the read operations using the read voltages R1, R3, and R8 are completed, the semiconductor memory device 1 transitions from a busy state to a ready state and commences outputting of data DAT. In an upper-page read operation, data DAT is output in order of page PG4 of the first area CR1 (8 kB) and then page PG5 of the first area CR1 (8 kB), for example. The page size of the upper page data is 8 kB (CR1:PG4)+8 kB (CR1:PG5)=16 kB.

(Uppermost-Page Read Operation)

The uppermost-page read operation corresponds to a combination of pages PG6 and PG7 of the first area CR1. As shown in FIG. 61 (4), upon receipt of a command set CMD that instructs an uppermost-page read operation from the memory controller 2, the semiconductor memory device 1 transitions to a busy state and performs an uppermost-page read operation.

In the uppermost-page read operation, for example the read voltages R2, R5, R7, and R10 are sequentially applied to a selected word line WL. When a read operation using the read voltage R2, R5, R7, and R10 is completed, data in each of pages PG6 and PG7 in the first area CR1 is confirmed.

After the read operations using the read voltages R2, R5, R7, and R10 are completed, the semiconductor memory device 1 transitions from a busy state to a ready state and commences outputting of data DAT. In an uppermost-page read operation, data DAT is output in order of page PG6 of the first area CR1 (8 kB) and then page PG7 of the first area CR1 (8 kB), for example. The page size of the uppermost page data is 8 kB (CR1:PG6)+8 kB (CR1:PG7)=16 kB.

Thus, the data sizes of all pages in the fourth embodiment are equalized to 16 kB. The order of the data output in a read operation for each page may be changed as needed. The semiconductor memory device 1 in the lower-page read operation may transition to a ready state after each of the data of page PG1 of the first area CR1 and the data of page PG1 of the second area CR2 are confirmed and then commence outputting of the confirmed data.

[4-3] Advantageous Effects of Fourth Embodiment

According to the above-described semiconductor memory device 1 of the fourth embodiment, it is possible to make the page size of each read page uniform when share coding is adopted. Hereinafter, advantageous effects of the semiconductor memory device 1 according to the fourth embodiment will be described in detail, using a comparative example.

Figure 62:
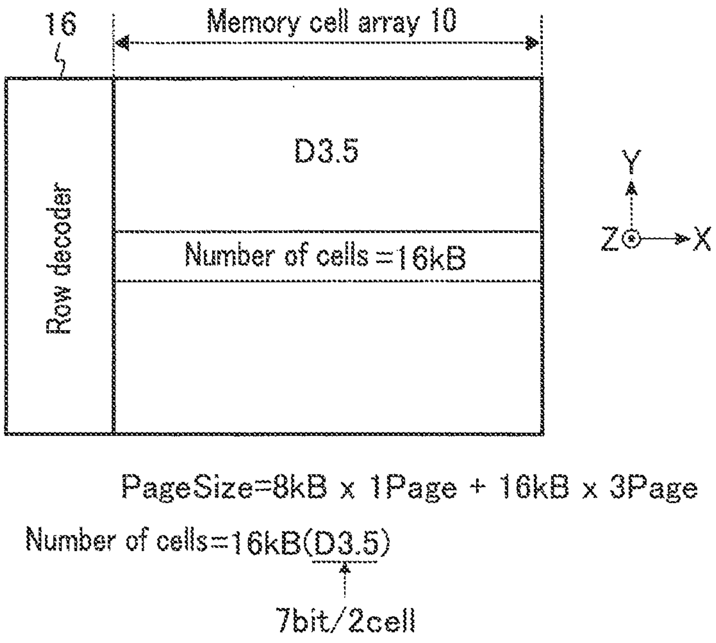
FIG. 62 is a block diagram showing an example of a configuration of a memory cell array in a comparative example of the fourth embodiment.

FIG. 62 shows an example of a layout of the storage area of the memory cell array 10 in the comparative example of the fourth embodiment. As shown in FIG. 62, the memory cell array 10 in the comparative example of the fourth embodiment only has an area to which the 7 bit/2 cell share coding (D3.5) similarly to the fourth embodiment is applied.

Figure 63:
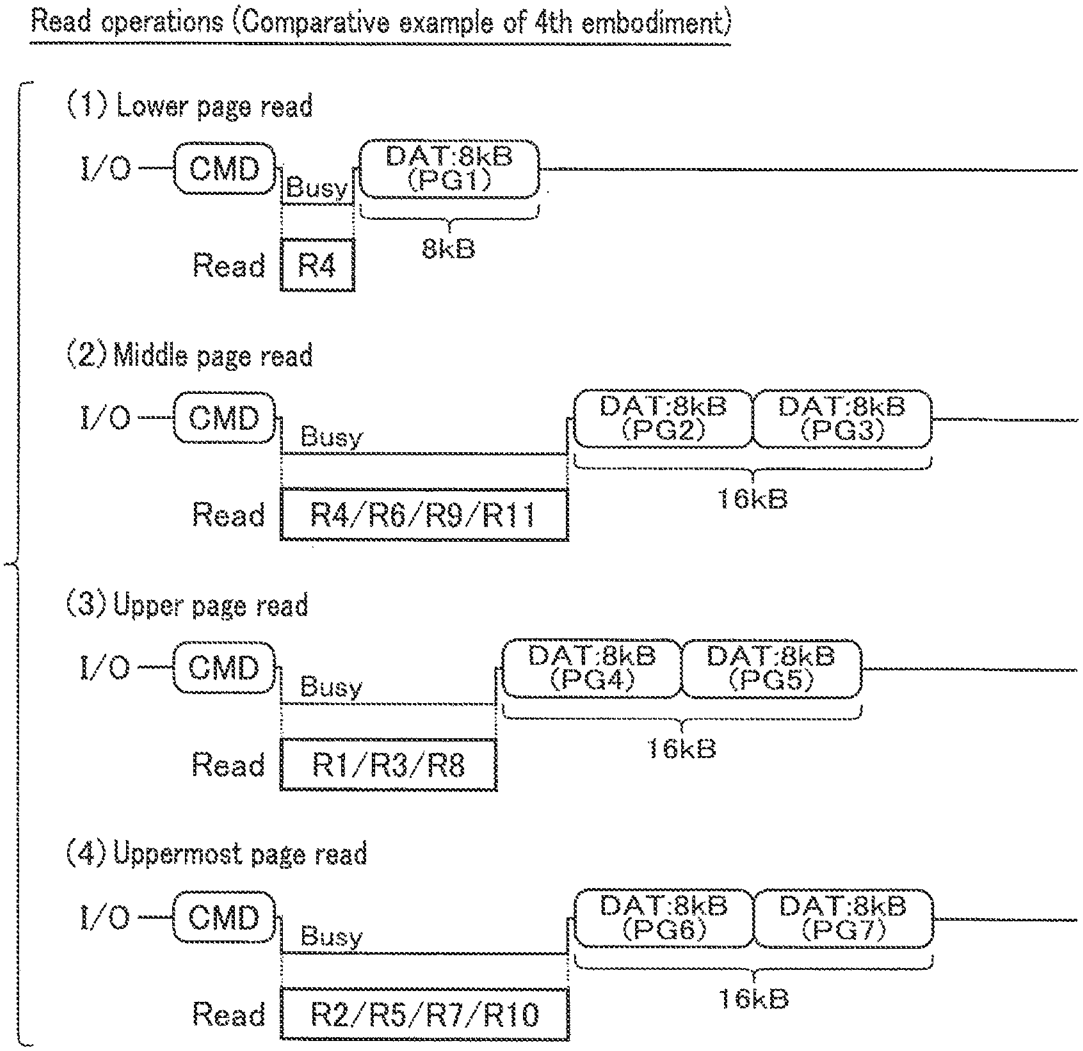
FIG. 63 is a schematic diagram showing an example of a flow of a read operation for each page in a comparative example of the fourth embodiment.

FIG. 63 shows an example of a flow of a read operation for each page in the comparative example of the fourth embodiment. As shown in FIG. 63, the lower-page data in the comparative example in the fourth embodiment corresponds to page PG1 of the 7 bit/2 cell share coding. In other words, the page size of the lower-page data is 8 kB (PG1) in the comparative example of the fourth embodiment.

In the 7 bit/2 cell share coding described in the fourth embodiment, the same read voltages are set for pages PG2 and PG3; it is thereby possible to simultaneously perform read operations for pages PG2 and PG3. If pages PG2 and PG3 are allocated to the middle-page data, the page size of the middle-page data is 8 kB (PG2)+8 kB (PG3)=16 kB. Similarly, the read operations for pages PG4 and PG5 and the read operations for pages PG6 and PG7 can be performed simultaneously. If pages PG4 and PG5 are allocated to the middle-page data, the page size of the middle-page data is 8 kB (PG4)+8 kB (PG5)=16 kB. If pages PG6 and PG7 are allocated to the upper-page data, the page size of the upper-page data is 8 kB (PG6)+8 kB (PG7)=16 kB.

The semiconductor memory device 1 of the comparative example of the fourth embodiment can increase the speed of the read operation by reading multiple pages of the share coding in a batch as described above. However, the page size of the lower-page data (8 kB) differs from the page size of the other pages (16 kB).

On the other hand, the semiconductor memory device 1 of the fourth embodiment has two storage areas using different types of coding (first area CR1 and second area CR2). Specifically, the first area CR1 is used as a main storage area and the 7 bit/2 cell share coding described in the third embodiment is applied to the first area CR1. The second area CR2 is used as a sub-storage area, and for example 2 bit/1 cell coding is applied to the second area CR2.

In the lower-page read operation, the semiconductor memory device 1 of the fourth embodiment performs a read operation for page PG1 of the first area CR1 and a read operation for pages PG1 and PG2 of the second area CR2 in a batch. The page size of the lower-page data is 16 kB, which is the same as the data size of the other pages, if a plurality of memory cell transistors MT arranged in the second area CR2 have the same storage capacity as page PG1 of the first area CR1.

As a result, the semiconductor memory device 1 of the fourth embodiment can make the page size of each read page uniform when share coding is used. Furthermore, the memory controller 2 that controls the semiconductor memory device 1 of the fourth embodiment can simplify the handling of data, and it is thereby possible to suppress design costs of the memory controller 2.

For this reason, in the semiconductor memory device 1 of the fourth embodiment, the second area CR2 to which 2 bit/1 cell coding is applied is arranged in an area which is further from the row decoder module 16 than the first area CR1 is, similarly to the third embodiment. For this reason, the arrangement of the first area CR1 and the second area CR2 described in the fourth embodiment can suppress the occurrence of error bits caused by delays in voltage changes in the word line WL.

[4-4] Modification of Fourth Embodiment

The semiconductor memory device 1 of the fourth embodiment may have the memory cell transistors MT included in the second area CR2 of the memory cell array 10 store 3-bit data. An example of other share coding applied to the second area CR2 will be described in the following as a modification of the fourth embodiment.

Figure 64:
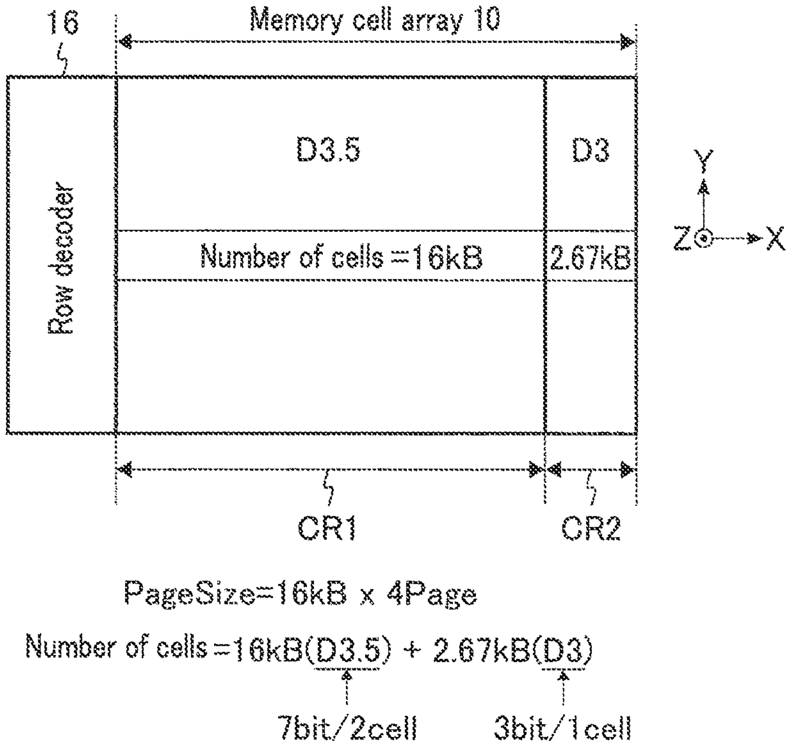
FIG. 64 is a block diagram showing an example of a configuration of a memory cell array in a modification of the fourth embodiment.

FIG. 64 shows an example of a layout of the storage area of the memory cell array 10 in the modification of the fourth embodiment. As shown in FIG. 64, the memory cell array 10 in the modification of the fourth embodiment has a configuration in which the 3 bit/1 cell share coding (D3) is applied to the second area CR2 of the layout described in the fourth embodiment with reference to FIG. 57.

If at least 16 k memory cell transistors MT are coupled to a single word line WL in the first area CR1, at least 2.67 k memory cell transistors MT are coupled in the second area CR2 (the number of cells=2.67 kB). Thus, in the modification of the fourth embodiment, 4-page data is stored in a single cell unit CU, and a size of each page of 4-page data is made uniform to be 16 kB.

Figure 65:
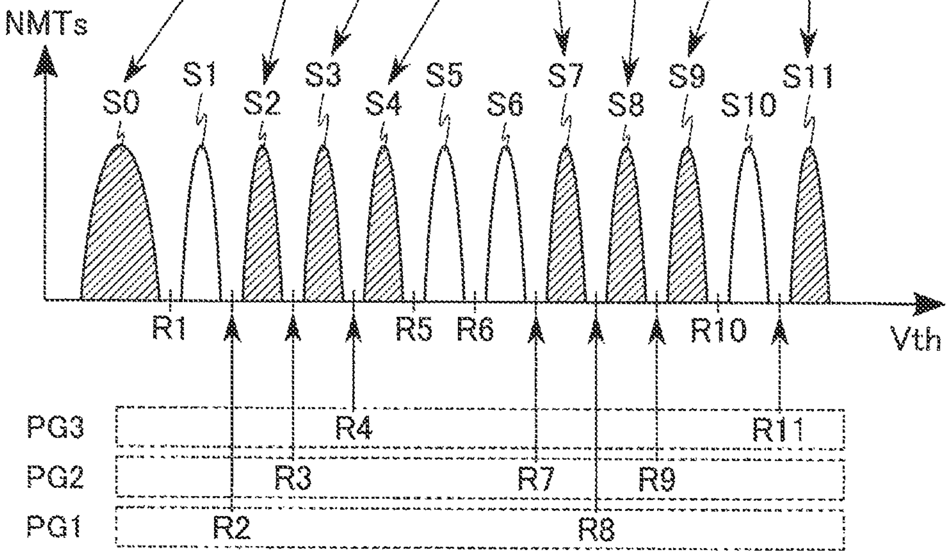
FIG. 65 is a schematic diagram showing an example of an allocation of coding and data used in a second area of a memory cell array in a modification of the fourth embodiment.

FIG. 65 shows an example of coding used in the second area CR2 of the memory cell array 10 included in the modification of the fourth embodiment. As shown in FIG.

65, in the second area CR2 of the fourth embodiment, 3-bit data is allocated to some of the 12 states used in the first area CR1.

Specifically, "111 (first bit/second bit/third bit)" data is allocated to the "S0" state. "011" data is allocated to the "S2" state. "001" data is allocated to the "S3" state. "000" data is allocated to the "S4" state. "010" data is allocated to the "S7" state. "110" data is allocated to the "S8" state. "100" data is allocated to the "S9" state. "101" data is allocated to the "S11" state.

In a read operation for page PG1 including a first bit, the read voltages R2 and R8 are used. In a read operation for page PG2 including a second bit, the read voltages R3, R7, and R9 are used. In a read operation for page PG3 including a third bit, the read voltages R4 and R11 are used. Thus, in this example, 3 bit/1 cell coding, namely 2-3-2 coding is used in the second area CR2.

The 3 bit/l cell coding used in the second area CR2 in the modification of the fourth embodiment is not limited to the above-described one. Any type of 3 bit/1 cell coding may be used in the second area CR2, as long as the coding uses at least one of the read voltages used in a PG1 read operation performed in the first area CR1 with the share coding. Furthermore, in the modification of the fourth embodiment, in the lower-page read operation, the data of each page of the second area CR2 is read together with the data of page PG1 of the first area CR1. The rest of the configuration and other operations of the modification of the fourth embodiment are the same as those of the fourth embodiment.

As a result, the modification of the fourth embodiment can make the page size of each read page uniform when share coding is used, and can achieve advantageous effects similar to those of the fourth embodiment. Furthermore, it is possible to reduce the size of the second area CR2 in the modification of the fourth embodiment compared to the fourth embodiment. Thus, the modification of the fourth embodiment can reduce the chip size of the semiconductor memory device 1 compared to the fourth embodiment.

[5] Fifth Embodiment

In the semiconductor memory device 1 according to the fifth embodiment, a storage area to which the 9 bit/2 cell share coding is applied and a storage area to which conventional coding is applied are combined so as to make the page sizes of the read pages uniform. In the following, differences in the semiconductor memory device 1 between the fifth embodiment and the first to fourth embodiments will be described.

[5-1] Configuration

The semiconductor memory device 1 of the fifth embodiment differs from that of the third embodiment in the layout of storage areas and coding used therein. The rest of the configuration of the semiconductor memory device 1 according to the fifth embodiment is the same as that of the third embodiment. Hereinafter, matters regarding the data storage method in the semiconductor memory device 1 according to the fifth embodiment will be described.

(Layout of Storage Area)

Figure 66:
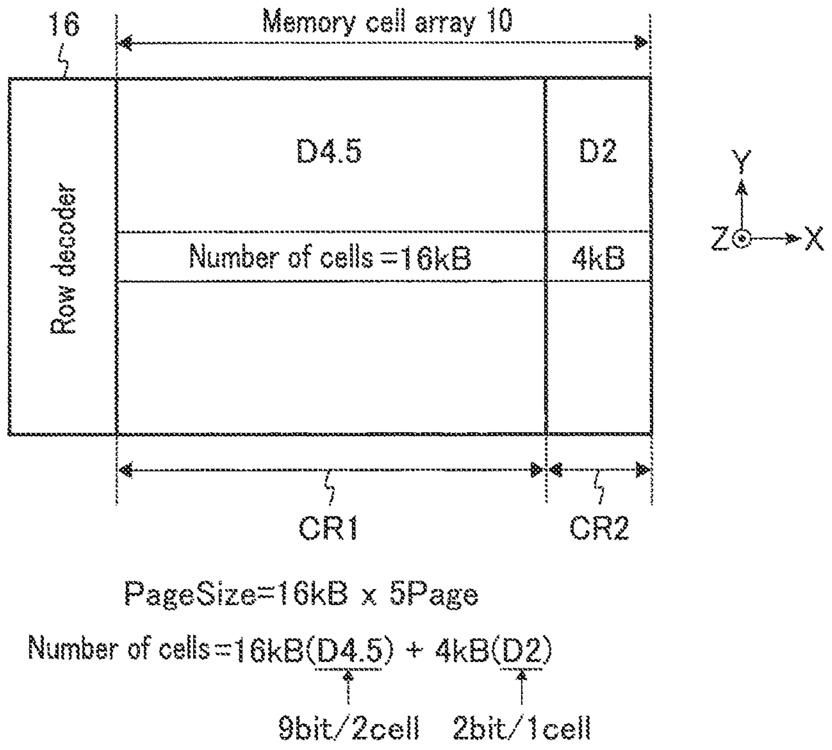
FIG. 66 is a block diagram showing an example of a configuration of a memory cell array included in the semiconductor memory device according to a fifth embodiment.

FIG. 66 shows an example of a layout of the storage areas of the memory cell array 10 included in the semiconductor memory device 1 according to the fifth embodiment. As shown in FIG. 66, the memory cell array 10 in the fifth embodiment has a layout similar to the one described in the third embodiment with reference to FIG. 47 but with different storage methods applied to the first area CR1 and the second area CR2.

Specifically, 9 bit/2 cell share coding (D4.5), which will be described later, is applied to the first area CR1, and 2 bit/1 cell share coding (D2) is applied to the second area CR2. For example, a single word line WL is coupled to at least 16 k memory cell transistors MT in the first area CR1 (the number of cells=16 kB) and at least 4 k memory cell transistors MT in the second area CR2 (the number of cells=4 kB). Thus, in the semiconductor memory device 1 of the fifth embodiment, 5-page data is stored in a single cell unit CU, and a size of each page of 5-page data is made uniform to be 16 kB. The couplings between the memory cell array 10 and the input/output circuit 11 in the fifth embodiment are the same as those in the third embodiment.

(Details of Share Coding Used in First Area CR1)

Figure 67:
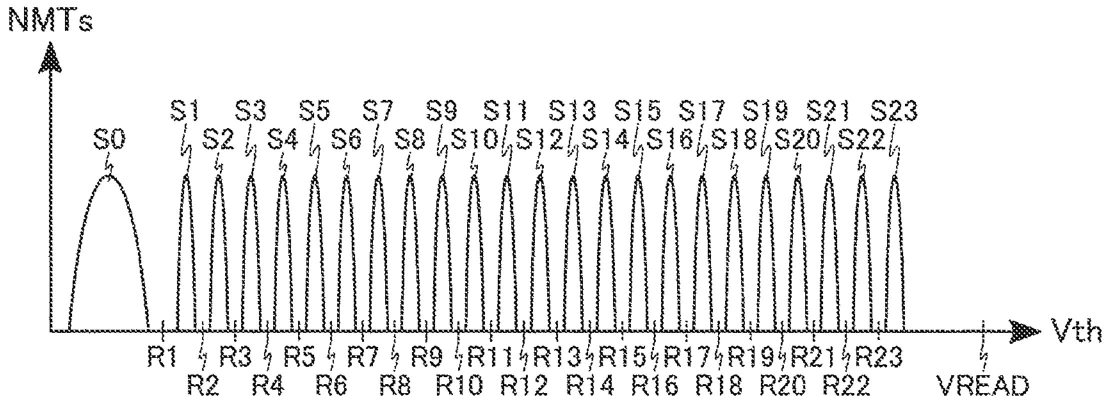
FIG. 67 is a schematic diagram showing an example of a threshold voltage distribution of memory cell transistors in the semiconductor memory device according to the fifth embodiment.

FIG. 67 shows an example of a threshold voltage distribution of the memory cell transistors MT in the first area CR1 of a memory cell array 10 included in the semiconductor memory device 1 according to the fifth embodiment. As shown in FIG. 67, a threshold voltage distribution of the memory cell transistors MT in the first area CR1 may form 24 types of states. Specifically, the threshold voltage distribution in the fifth embodiment has the "S16" to "S23" states in addition to the 16 states in the first embodiment described with reference to FIG. 9.

The "S16" to "S23" states are set at voltages higher than the "S16" state and in an ascending order. The read voltage R16 is set between the states "S15" and "S16". The read voltage R16 is higher than the read voltage R15. The read voltage R17 is set between the states "S16" and "S17". The read voltage R18 is set between the states "S17" and "S18". The read voltage R19 is set between the states "S18" and "S19". The read voltage R20 is set between the states "S19" and "S20". The read voltage R21 is set between the states "S20" and "S21". The read voltage R22 is set between the states "S21" and "S22". The read voltage R23 is set between the states "S22" and "S23". The read voltage R23 is lower than the read voltage VREAD.

A threshold voltage of each of the memory cell transistors MTa and MTh in the first area CR1 may be included in one of the above-described 24 states. In other words, in the first area CR1 of the fifth embodiment, there are 576 combinations made up of 24 states applicable to the memory cell transistor MTa and 24 states applicable to the memory cell transistor MTb. Different 9-bit data is allocated to each of 576 combinations in the semiconductor memory device 1 of the fourth embodiment. There need to be at least 512 combinations in order to allocate different sets of 9-bit data to the combinations. For this reason, the same 9-bit data may be allocated to some of the combinations.

FIG. 68 shows an example of share coding used in the first area CR1 of a memory cell array 10 included in the semiconductor memory device 1 according to the fifth embodiment. In the semiconductor memory device 1 of the fifth embodiment, decoding rules and read voltages are set for each page as shown in FIG. 59 and the drawings thereafter.

Read page: decoding rules [a,b,c,d], read voltages to be used [read voltages set for MTa/read voltages set for MTb]

PG1:[1,1,1,0], [R8/R8]

PG2:[1,0,0,1], [R8/(R10,R12,R14,R19,R23)]

PG3:[1,0,0,1], [(R10,R12,R14,R19,R23)/R8]

PG4:[1,1,0,0], [(R1,R3,R5,R7,R16)/–]

PG5:[1,0,1,0], [–/(R1,R3,R5,R7,R16)]

PG6:[1,1,0,0], [(R2,R6,R9,R13,R17,R21)/–]

PG7:[1,0,1,0], [−/(R2,R6,R9,R13,R17,R21)]

PG8:[1,1,0,0], [(R4,R11,R15,R18,R20,R22)/−]

PG9:[1,0,1,0], [−/(R4,R11,R15,R18,R20,R22)]

The above-described coding in which 9-bit data is stored in two memory cell transistors MTa and MTb may be called "9 bit/2 cell share coding". In the share coding used in the first area CR1 of the fifth embodiment, the number of read operations performed in each of PG1, PG2, PG3, PG4, PG5, PG6, PG7, PG8, and PG9 is one, six, six, five, five, six, six, six, and six. For this reason, the share coding used in the first area CR1 of the fifth embodiment may be called "1-6-6-5-5-6-6-6-6" coding.

(Details of Share Coding Used in Second Area CR2)

Figure 69:
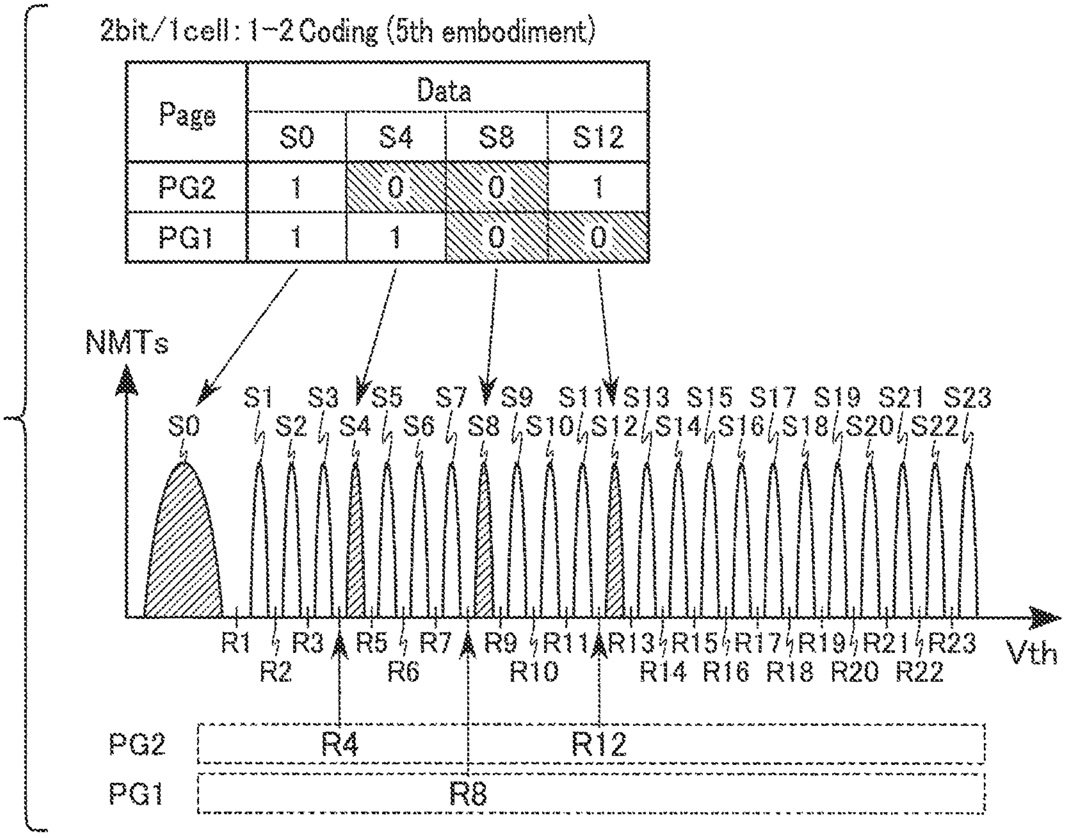
FIG. 69 is a schematic diagram showing an example of an allocation of coding and data used in a second area of a memory cell array included in the semiconductor memory device according to the fifth embodiment.

FIG. 69 shows an example of coding used in the second area CR2 of the memory cell array 10 included in the semiconductor memory device 1 according to the fifth embodiment. As shown in FIG. 69, in the second area CR2 of the fifth embodiment, 2-bit data is allocated to some of the 24 states used in the first area CR1.

Specifically, "11 (first bit/second bit)" data is allocated to the "S0" state. "10" data is allocated to the "S4" state. "00" data is allocated to the "S8" state. "01" data is allocated to the "S12" state.

In a read operation for page PG1 including a first bit, the read voltage R8 is used. In a read operation for page PG2 including a second bit, the read voltages R4 and R12 are used. Thus, in this example, 2 bit/i cell coding, namely 1-2 coding, is used in the second area CR2. The rest of the configuration of the semiconductor memory device 1 according to the fifth embodiment is the same as that of the fourth embodiment.

The 2 bit/i cell coding used in the second area CR2 of the fifth embodiment is not limited to the above-described one. Any type of 2 bit/i cell coding may be used in the second area CR2, as long as the coding uses at least one of the read voltages used in a PG1 read operation performed in the first area CR1 with the share coding.

[5-2] Read Operation

Figure 70:
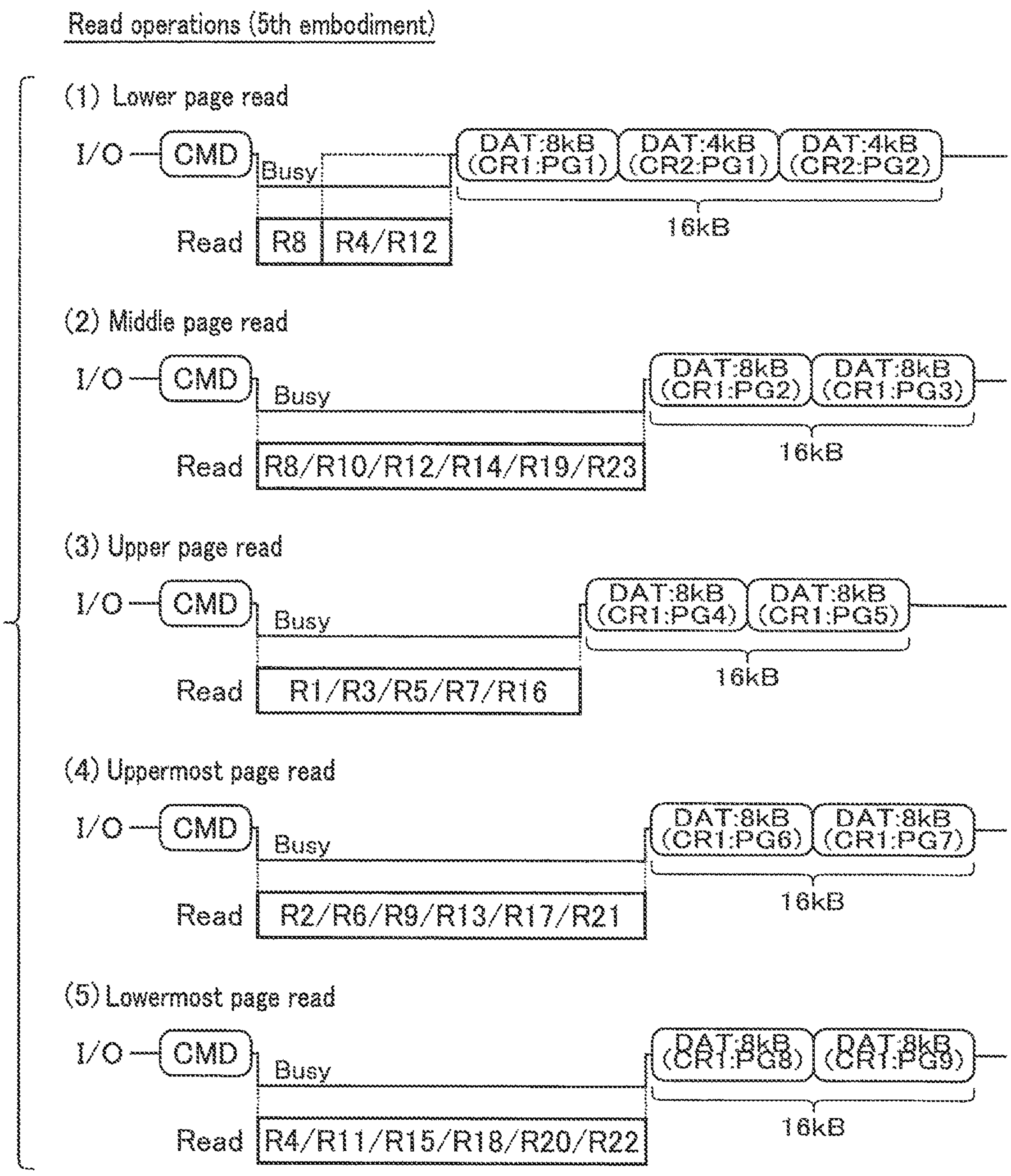
FIG. 70 is a schematic diagram showing an example of a flow of a read operation for each page in the semiconductor memory device according to the fifth embodiment.

FIG. 70 shows an example of a flow of a read operation for each page in the semiconductor memory device 1 according to the fifth embodiment. As shown in FIG. 70, the semiconductor memory device 1 according to the fifth embodiment is capable of performing a read operation for each page of five-page data based on an instruction from the memory controller 2. FIGS. 70(1) through (5) correspond to a lower-page read operation, a middle-page read operation, an upper-page read operation, an uppermost-page read operation, and a lowermost-page read operation, respectively. In the following, details of a read operation for each page in the fifth embodiment are explained. Hereinafter, a read operation for lowermost-page data will be referred to as a "lowermost-page read operation".

(Lower-Page Read Operation)

The lower-page data corresponds to a combination of page PG1 of the first area CR1 and pages PG1 and PG2 of the second area CR2. As shown in FIG. 70 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R8, R4, and R12 are sequentially applied to a selected word line WL. When a read operation using the read voltage RB is completed, data of page PG1 in the first area CR1 and data of PG1 in the second area CR2 are confirmed. When a read operation using the read voltages R4 and R12 is completed, data of page PG2 in the second area CR2 is confirmed.

After the read operations using the read voltages R8, R4, and R12 are completed, the semiconductor memory device 1 transitions from a busy state to a ready state and commences outputting of data DAT. In a lower-page read operation, data DAT is output in order of page PG1 of the first area CR1 (8 kB), page PG1 of the second area CR2 (4 kB), and then page PG2 of the second area CR2 (4 kB), for example. The page size of the lower-page data is 8 kB (CR1:PG1)+4 kB (CR2:PG1)+4 kB (CR2:PG2)=16 kB.

(Middle-Page Read Operation)

The middle-page read operation corresponds to a combination of pages PG2 and PG3 of the first area CR1. As shown in FIG. 70 (2), upon receipt of a command set CMD that instructs a middle-page read operation from the memory controller 2, the semiconductor memory device 1 transitions to a busy state and performs a middle-page read operation.

In the middle-page read operation, for example the read voltages R8, R10, R12, R14, R19, and R23 are sequentially applied to a selected word line WL. When a read operation using the read voltage R8, R10, R12, R14, R19, and R23 is completed, data in each of pages PG2 and PG3 in the first area CR1 is confirmed.

After the read operations using the read voltages R8, R10, R12, R14, R19, and R23 are completed, the semiconductor memory device 1 transitions from a busy state to a ready state and commences outputting of data DAT. In a middle-page read operation, data DAT is output in the order page PG2 of the first area CR1 (8 kB) and page PG3 of the first area CR1 (8 kB), for example. The page size of middle-page data is 8 kB (CR1:PG2)+8 kB (CR1:PG3)=16 kB.

(Upper-Page Read Operation)

The upper-page read operation corresponds to a combination of pages PG4 and PG5 of the first area CR1. As shown in FIG. 70 (3), upon receipt of a command set CMD that instructs an upper-page read operation from the memory controller 2, the semiconductor memory device 1 transitions to a busy state and performs an upper-page read operation.

In the upper-page read operation, for example the read voltages R1, R3, R5, R7, and R16 are sequentially applied to a selected word line WL. When a read operation using the read voltage R1, R3, R5, R7, and R16 is completed, data in each of pages PG4 and PG5 in the first area CR1 is confirmed.

After the read operations using the read voltages R1, R3, R5, R7, and R16 are completed, the semiconductor memory device 1 transitions from a busy state to a ready state and commences outputting of data DAT. In an upper-page read operation, data DAT is output in order of page PG4 of the first area CR1 (8 kB) and then page PG5 of the first area CR1 (8 kB), for example. The page size of the upper page data is 8 kB (CR1:PG4)+8 kB (CR1:PG5)=16 kB.

(Uppermost-Page Read Operation)

The uppermost-page read operation corresponds to a combination of pages PG6 and PG7 of the first area CR1. As shown in FIG. 70 (4), upon receipt of a command set CMD that instructs an uppermost-page read operation from the memory controller 2, the semiconductor memory device 1 transitions to a busy state and performs an uppermost-page read operation.

In the uppermost-page read operation, for example the read voltages R2, R6, R9, R13, R17, and R21 are sequentially applied to a selected word line WL. When a read operation using the read voltage R2, R6, R9, R13, R17, and R21 is completed, data in each of pages PG6 and PG7 in the first area CR1 is confirmed.

After the read operations using the read voltages R2, R6, R9, R13, R17, and R21 are completed, the semiconductor memory device 1 transitions from a busy state to a ready state and commences outputting of data DAT. In an uppermost-page read operation, data DAT is output in order of page PG6 of the first area CR1 (8 kB) and then page PG7 of the first area CR1 (8 kB), for example. The page size of the upper page data is 8 kB (CR1:PG6)+8 kB (CR1:PG7)=16 kB.

(Lowermost-Page Read Operation)

The lowermost-page read operation corresponds to a combination of pages PG8 and PG9 of the first area CR1. As shown in FIG. 70 (5), upon receipt of a command set CMD that instructs a lowermost-page read operation from the memory controller 2, the semiconductor memory device 1 transitions to a busy state and performs a lowermost-page read operation.

In the lowermost-page read operation, for example the read voltages R4, R11, R15, R18, R20, and R22 are sequentially applied to a selected word line WL. When a read operation using the read voltages R4, R11, R15, R18, R20, and R22 is completed, data in each of pages PG8 and PG9 in the first area CR1 is confirmed.

After the read operations using the read voltages R4, R11, R15, R18, R20, and R22 are completed, the semiconductor memory device 1 transitions from a busy state to a ready state and commences outputting of data DAT. In a lowermost-page read operation, data DAT is output in order of page PG8 of the first area CR1 (8 kB) and then page PG9 of the first area CR1 (8 kB), for example. The page size of the lowermost page data is 8 kB (CR1:PG8)+8 kB (CR1:PG9) =16 kB.

Thus, the data sizes of all pages in the fifth embodiment are equalized to 16 kB. The order of the data output in a read operation for each page may be changed as needed. The semiconductor memory device 1 in the lower-page read operation may transition to a ready state after each of the data of page PG1 of the first area CR1 and the data of page PG2 of the second area CR2 are confirmed and then commence outputting of the confirmed data.

[5-3] Advantageous Effects of Fifth Embodiment

According to the above-described semiconductor memory device 1 of the fifth embodiment, it is possible to make the page size of each read page uniform when share coding is adopted. Hereinafter, advantageous effects of the semiconductor memory device 1 according to the fifth embodiment will be described in detail, using a comparative example.

Figure 71:
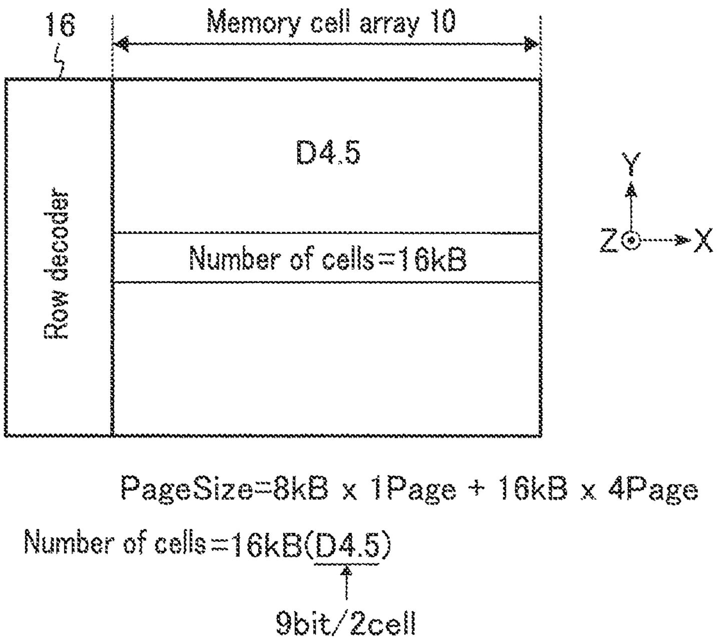
FIG. 71 is a block diagram showing an example of a configuration of a memory cell array in a comparative example of the fifth embodiment.

FIG. 71 shows an example of a layout of the storage area of the memory cell array 10 in the comparative example of the fifth embodiment. As shown in FIG. 71, the memory cell array 10 in the comparative example of the fifth embodiment only has an area in which the 9 bit/2 cell share coding (D4.5) similarly to the fifth embodiment is adopted.

Figure 72:
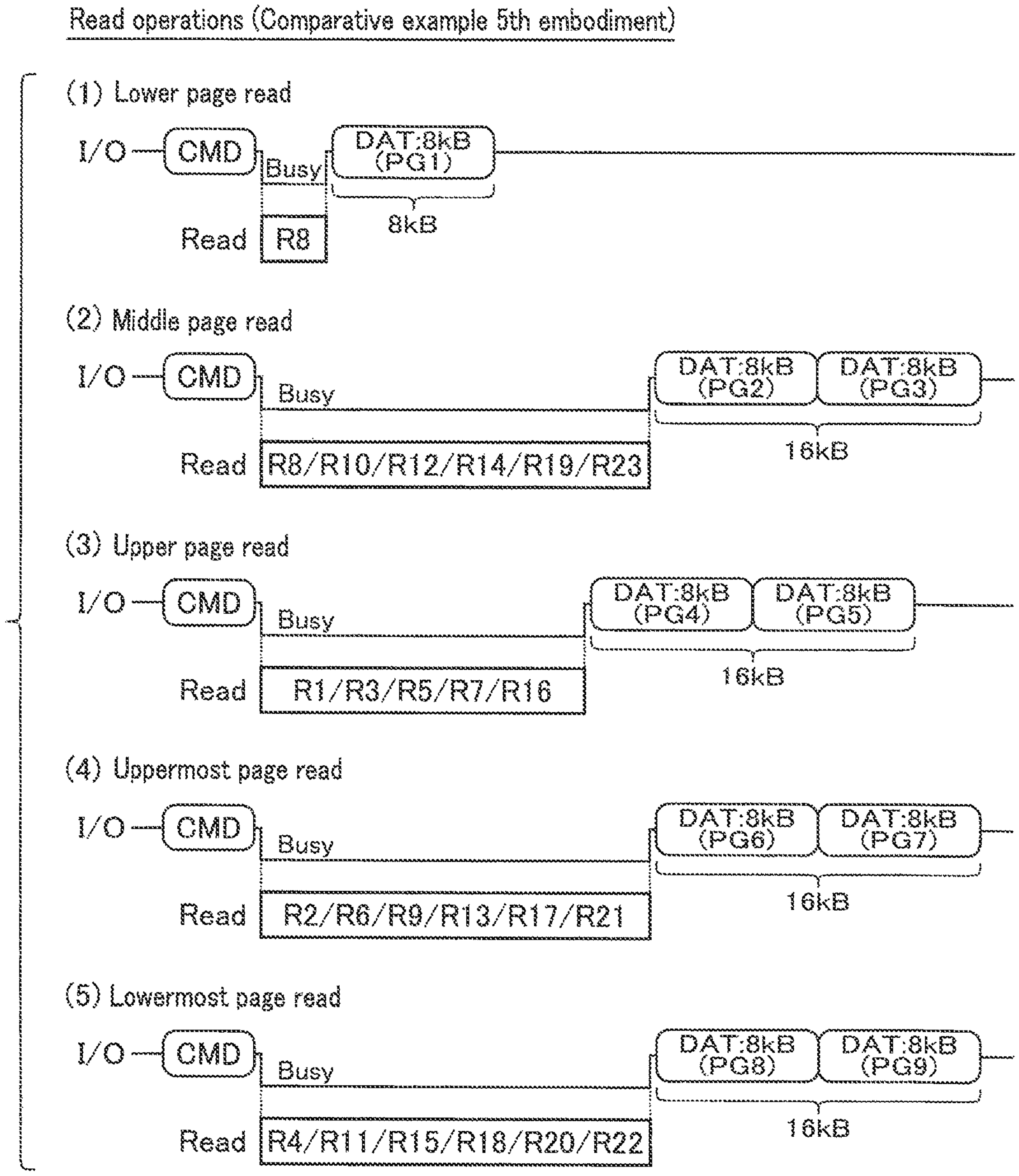
FIG. 72 is a schematic diagram showing an example of a flow of a read operation for each page in a comparative example of the fifth embodiment.

FIG. 72 shows an example of a read operation for each page in the comparative example of the fifth embodiment. As shown in FIG. 72, the lower-page data in the comparative example in the fifth embodiment corresponds to page PG1 of the 9 bit/2 cell share coding. In other words, the page size of the lower-page data is 8 kB (PG1) in the comparative example of the fifth embodiment.

In the 9 bit/2 cell share coding described in the fifth embodiment, the same read voltages are set for pages PG2 and PG3; it is thereby possible to simultaneously perform read operations for pages PG2 and PG3. If pages PG2 and PG3 are allocated to the middle-page data, the page size of the middle-page data is 8 kB (PG2)+8 kB (PG3)=16 kB. Similarly, the read operations for pages PG4 and PG5, the read operations for pages PG6 and PG7, and the read operations for pages PG8 and PG9 can be performed simultaneously. If pages PG4 and PG5 are allocated to the middle-page data, the page size of the middle-page data is 8 kB (PG4)+8 kB (PG5)=16 kB. If pages PG6 and PG7 are allocated to the upper-page data, the page size of the upper-page data is 8 kB (PG6)+8 kB (PG7)=16 kB. If pages PG8 and PG9 are allocated to the uppermost-page data, the page size of the uppermost-page data is 8 kB (PG8)+8 kB (PG9)=16 kB.

The semiconductor memory device 1 of the comparative example of the fifth embodiment can increase the speed of the read operation by reading multiple pages of the share coding in a batch as described above. However, the page size of the lower-page data (8 kB) differs from the page size of the other pages (16 kB).

On the other hand, the semiconductor memory device 1 of the fifth embodiment has two storage areas using different types of coding (first area CR1 and second area CR2). Specifically, the first area CR1 is used as a main storage area, and the 9 bit/2 cell share coding described in the third embodiment is applied to the first area CR1. The second area CR2 is used as a sub-storage area, and for example 2 bit/1 cell coding is applied to the second area CR2.

In the lower-page read operation, the semiconductor memory device 1 of the fifth embodiment performs a read operation for page PG1 of the first area CR1 and a read operation for pages PG1 and PG2 of the second area CR2 in a batch. The page size of the lower-page data is 16 kB, which is the same as the data size of the other pages, if a plurality of memory cell transistors MT arranged in the second area CR2 have the same storage capacity as page PG1 of the first area CR1.

As a result, the semiconductor memory device 1 of the fifth embodiment can make the page size of each read page uniform when share coding is used. Furthermore, the memory controller 2 that controls the semiconductor memory device 1 of the fifth embodiment can simplify the handling of data, and it is thereby possible to suppress design costs for the memory controller 2.

In the semiconductor memory device 1 of the fifth embodiment, the second area CR2 to which 2 bit/1 cell coding is applied is arranged in an area which is further from the row decoder module 16 than the first area CR1 is, similarly to the third embodiment. For this reason, the arrangement of the first area CR1 and the second area CR2 described in the fifth embodiment can suppress the occurrence of error bits caused by delays in voltage changes in the word line WL, similarly to the third embodiment.

[5-4] Modifications of Fifth Embodiment

The semiconductor memory device 1 of the fifth embodiment may have the memory cell transistors MT included in the second area CR2 of the memory cell array 10 store three-or-more-bit data, similarly to the modification of the fourth modification. An example of other coding applied to the second area CR2 will be described as first and second modifications of the fifth embodiment in the following.

First Modification of Fifth Embodiment

Figure 73:
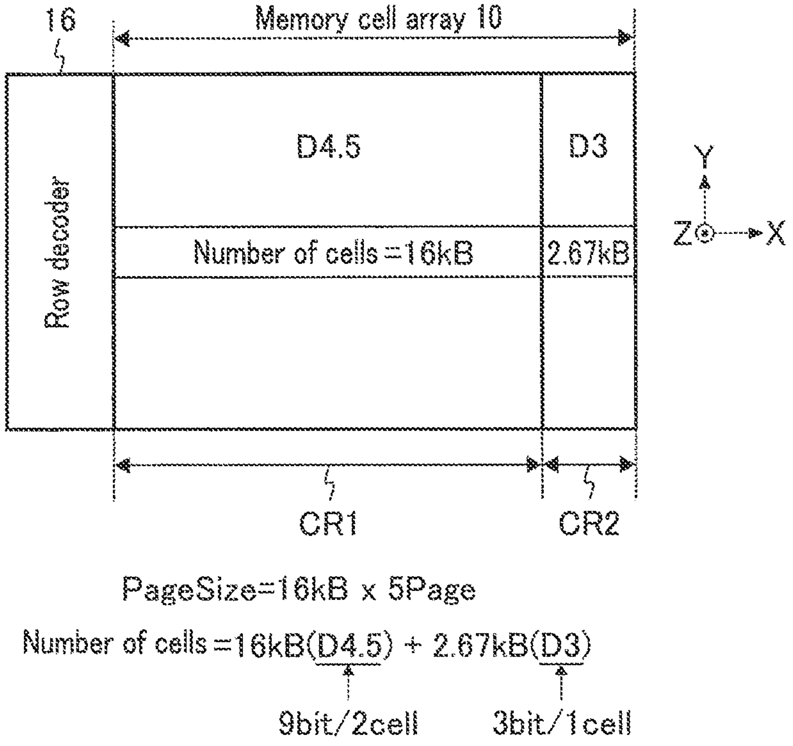
FIG. 73 is a block diagram showing an example of a configuration of a memory cell array in a first modification of the fifth embodiment.

FIG. 73 shows an example of a layout of the storage area of the memory cell array 10 in the first modification of the fifth embodiment. As shown in FIG. 73, the memory cell array 10 in the first modification of the fifth embodiment has the layout described in the fifth embodiment with reference to FIG. 66 but 3 bit/1 cell coding (D3) is applied to the second area CR2 in this modification.

If 16 k memory cell transistors MT are coupled to a single word line WL in the first area CR1, at least 2.67 k memory cell transistors MT are coupled in the second area CR2 (the number of cells=2.67 kB). Thus, in the first modification of the fifth embodiment, 5-page data is stored in a single cell unit CU, and a size of each page of 5-page data is made uniform to be 16 kB.

Figure 74:
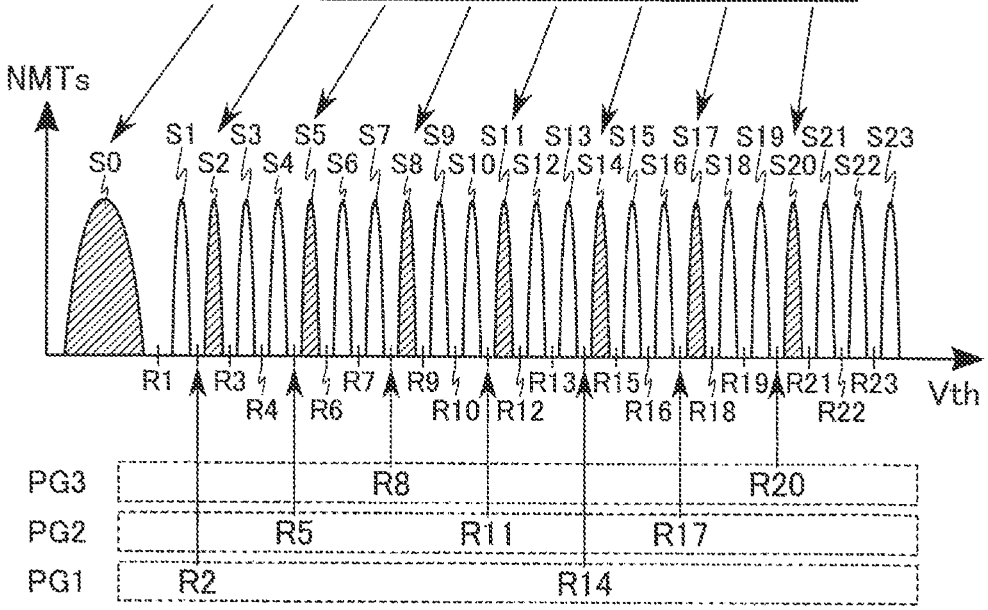
FIG. 74 is a schematic diagram showing an example of an allocation of coding and data used in a second area of a memory cell array in a first modification of the fifth embodiment.

FIG. 74 shows an example of coding used in the second area CR2 of the memory cell array 10 included in the first modification of the fifth embodiment. As shown in FIG. 74, in the second area CR2 of the fifth embodiment, 3-bit data is allocated to some of the 24 states used in the first area CR1.

Specifically, "111 (first bit/second bit/third bit)" data is allocated to the "S0" state. "011" data is allocated to the "S2" state. "001" data is allocated to the "S5" state. "000" data is allocated to the "S8" state. "010" data is allocated to the "S11" state. "110" data is allocated to the "S14" state. "100" data is allocated to the "S17" state. "101" data is allocated to the "S20" state.

In a read operation for page PG1 including a first bit, the read voltages R2 and R14 are used. In a read operation for page PG2 including a second bit, the read voltages R5, R11, and R17 are used. In a read operation for page PG3 including a third bit, the read voltages R8 and R20 are used. Thus, in this example, 3 bit/1 cell coding, namely 2-3-2 coding, is used in the second area CR2.

The 3 bit/1 cell coding used in the second area CR2 in the first modification of the fifth embodiment is not limited to the above-described one. Any type of 3 bit/1 cell coding may be used in the second area CR2, as long as the coding uses at least one of the read voltages used in a PG1 read operation performed in the first area CR1 with the share coding. Furthermore, in the first modification of the fifth embodiment, in a lower-page read operation, data of each page of the second area CR2 is read together with data of page PG1 of the first area CR1. The rest of the configuration and other operations of the first modification of the fifth embodiment are the same as those of the fifth embodiment.

As a result, the first modification of the fifth embodiment can make the page size of each read page uniform when share coding is used, and can achieve advantageous effects similar to those of the fifth embodiment. Furthermore, the size of the second area CR2 in the first modification of the fifth embodiment can further be reduced to a size smaller than that in the fifth embodiment. Thus, it is possible to reduce a chip size area of the semiconductor memory device 1 of the first modification of the fifth embodiment, compared to the fifth embodiment.

Second Modification of Fifth Embodiment

Figure 75:
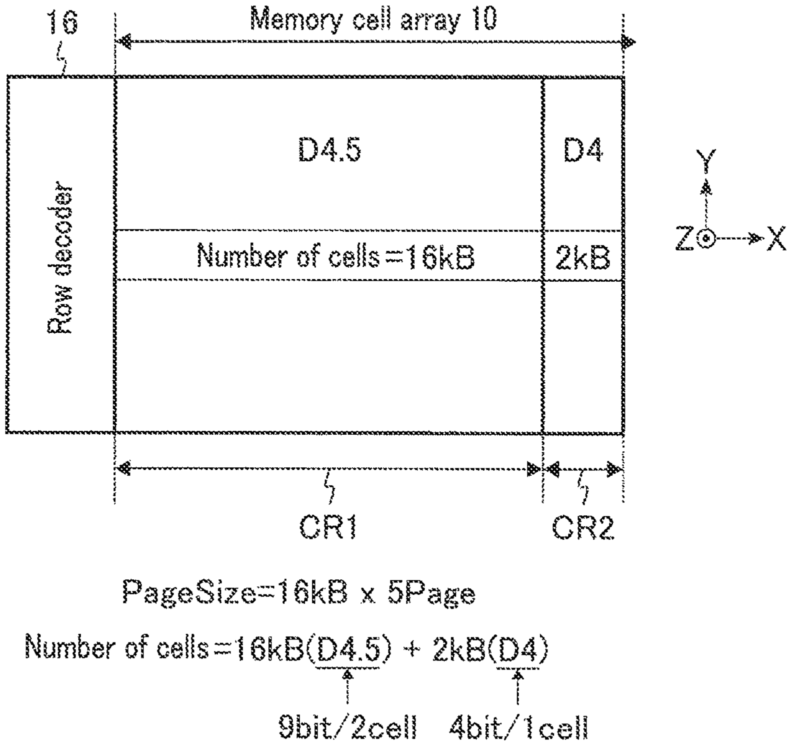
FIG. 75 is a block diagram showing an example of a configuration of a memory cell array in a second modification of the fifth embodiment.

FIG. 75 shows an example of a layout of the storage area of the memory cell array 10 in the second modification of the fifth embodiment. As shown in FIG. 75, the memory cell array 10 in the modification of the fifth embodiment has the layout described in the fifth embodiment with reference to FIG. 66 but 4 bit/1 cell coding (D4) is applied to the second area CR2 in this modification.

If 16 k memory cell transistors MT are coupled to a single word line WL in the first area CR1, at least 2 k memory cell transistors MT are coupled in the second area CR2 (the number of cells=2 kB). Thus, in the second modification of the fifth embodiment, 5-page data is stored in a single cell unit CU, and a size of each page of 5-page data is made uniform to be 16 kB.

Figure 76:
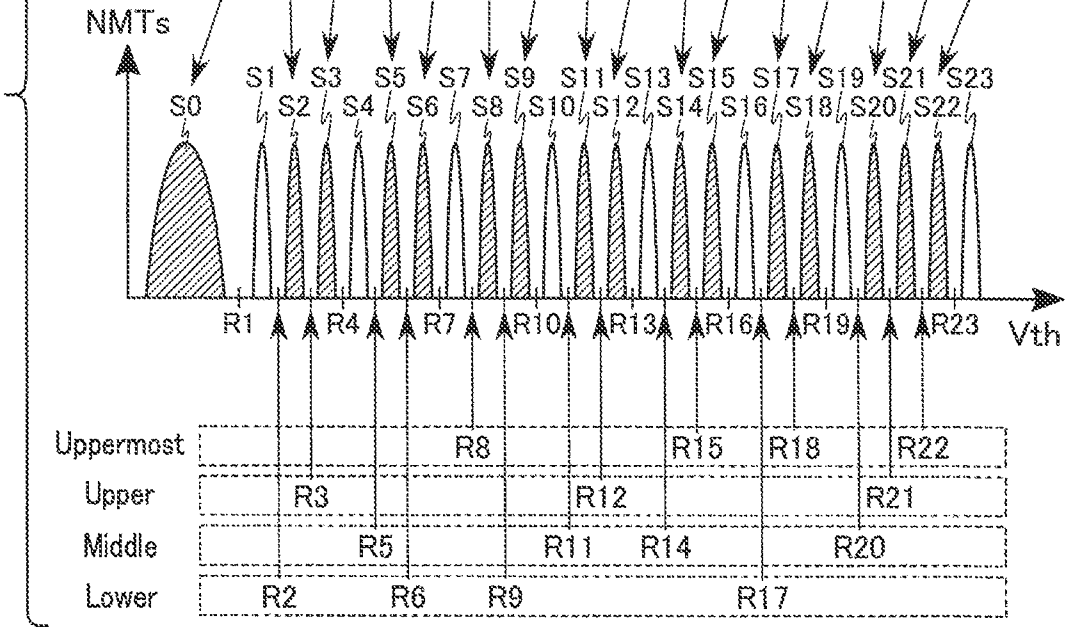
FIG. 76 is a schematic diagram showing an example of an allocation of coding and data used in a second area of a memory cell array in a second modification of the fifth embodiment.

FIG. 76 shows an example of coding used in the second area CR2 of the memory cell array 10 included in the second modification of the fifth embodiment. As shown in FIG. 76, in the second area CR2 of the fifth embodiment, 4-bit data is allocated to some of the 24 states used in the first area CR1.

Specifically, "1111 (first bit/second bit/third bit/fourth bit)" data is allocated to the "S0" state. "0111" data is allocated to the "S2" state. "0101" data is allocated to the "S3" state. "0001" data is allocated to the "S5" state. "1001" data is allocated to the "S6" state. "1000" data is allocated to the "S8" state. "0000" data is allocated to the "S9" state. "0100" data is allocated to the "S11" state. "0110" data is allocated to the "S12" state. "0010" data is allocated to the "S14" state. "0011" data is allocated to the "S15" state. "1011" data is allocated to the "S17" state. "1010" data is allocated to the "S18" state. "1110" data is allocated to the "S20" state. "1100" data is allocated to the "S21" state. "1101" data is allocated to the "S22" state.

In a read operation for page PG1 including a first bit, the read voltages R2, R6, R9, and R17 are used. In a read operation for page PG2 including a second bit, the read voltages R5, R11, R14, and R20 are used. In a read operation for page PG3 including a third bit, the read voltages R3, R12, and R21 are used. In a read operation for page PG4 including a fourth bit, the read voltages R8, R15, R18, and R22 are used. Thus, in this example, 4 bit/1 cell coding, namely 4-4-3-4 coding is used in the second area CR2.

The 4 bit/1 cell coding used in the second area CR2 in the second modification of the fifth embodiment is not limited to the above-described one. Any type of 4 bit/1 cell coding may be used in the second area CR2, as long as the coding uses at least one of the read voltages used in a PG1 read operation performed in the first area CR1 with the share coding. Furthermore, in the second modification of the fifth embodiment, in a lower-page read operation, data of each page of the second area CR2 is read together with data of page PG1 of the first area CR1. The rest of the configuration and other operations of the second modification of the fifth embodiment are the same as those of the fifth embodiment.

As a result, the first modification of the fifth embodiment can make the page size of each read page uniform when share coding is used, and can achieve advantageous effects similar to those of the fifth embodiment. Furthermore, the size of the second area CR2 in the second modification of the fifth embodiment can further be reduced to a size smaller than that in the first modification of the fifth embodiment. Thus, it is possible to reduce a chip size area of the semiconductor memory device 1 of the second modification of the fifth embodiment, compared to the first modification of the fifth embodiment.

[6] Sixth Embodiment

In the semiconductor memory device 1 according to the sixth embodiment, two types of 5 bit/2 cell share coding are used and a first storage area and a second area to which different share coding methods are applied are combined so as to make the page sizes of the read pages uniform. In the following, differences in the semiconductor memory device 1 according to the sixth embodiment from the first to fifth embodiments will be described.

[6-1] Configuration

The semiconductor memory device 1 of the sixth embodiment differs from that of the third embodiment in the layout of storage areas and coding used therein. The rest of the configuration of the semiconductor memory device 1 according to the sixth embodiment is the same as that of the third embodiment. Hereinafter, matters regarding the data storage method in the semiconductor memory device 1 according to the sixth embodiment will be described.

(Layout of Storage Area)

Figure 77:
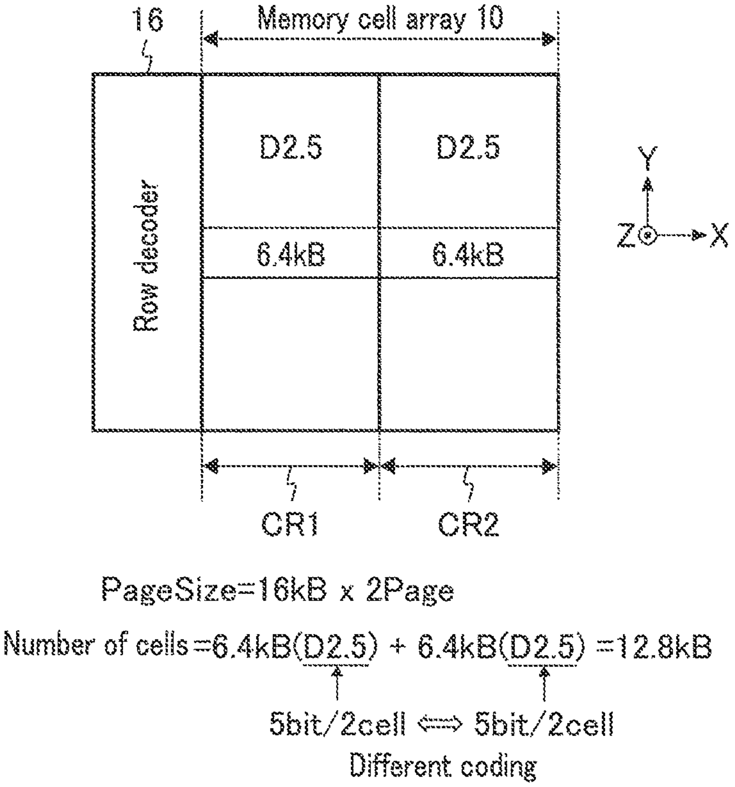
FIG. 77 is a block diagram showing an example of a configuration of a memory cell array included in the semiconductor memory device according to a sixth embodiment.

FIG. 77 shows an example of a layout of the storage areas of the memory cell array 10 included in the semiconductor memory device 1 according to the sixth embodiment. As shown in FIG. 77, the memory cell array 10 of the sixth embodiment includes a first area CR1 and a second area CR2 arranged in the X direction. The row decoder module 16 is provided on, for example, the first area CR1 side, and controls the memory cell transistors MT using the word lines WL shared between the first area CR1 and the second area CR2.

The first area CR1 and the second area CR2 have approximately the same area size. Different types of share coding are applied to the first area CR1 and the second area CR2. For example, the 5 bit/2 cell share coding (D2.5) described in the third embodiment is applied to the first area CR1. 5 bit/2 cell share coding (D2.5) of a different type from that applied to the first area CR1 is applied to the second CR2. Details of share coding used in the second area CR2 will be described later.

For example, a single word line WL is coupled to at least 6.4 k memory cell transistors MT in the first area CR1 (the number of cells=6.4 kB) and at least 6.4 k memory cell transistors MT in the second area CR2 (the number of cells=6.4 kB). Thus, in the semiconductor memory device 1 of the sixth embodiment, 2-page data is stored in a cell unit CU that includes at least 12.8 k memory cell transistors MT, and a size of each page of 2-page data is made uniform to be 16 kB.

(Circuit Configuration Relating to Share Coding)

Figures 78, 79:
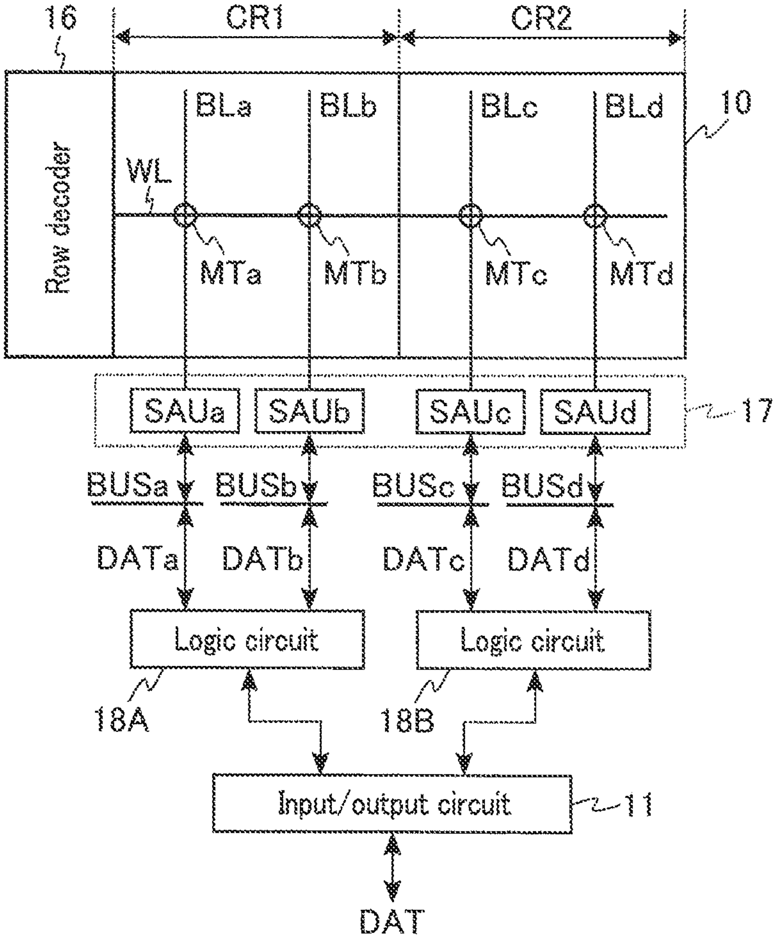
FIG. 78 is a circuit diagram showing an example of couplings used in page data storage in the semiconductor memory device according to the sixth embodiment.
FIG. 79 is a table showing an example of share coding used in a second area of a memory cell array included in the semiconductor memory device according to the sixth embodiment.

FIG. 78 shows an example of couplings used in page data storage in the semiconductor memory device 1 according to the sixth embodiment. As shown in FIG. 78, the semiconductor memory device 1 includes two logic circuits 18A and 18B. The logic circuit 18A performs calculating relating to the 5 bit/2 cell share coding explained in the third embodiment. The logic circuit 18B performs calculating relating to the 5 bit/2 cell share coding which will be described later.

In the sixth embodiment, the first area CR1 includes a plurality of memory cell transistors MTa and a plurality of memory cell transistors MTb. The second area CR2 includes a plurality of memory cell transistors MTc and a plurality of memory cell transistors MTd. The memory cell transistors MTa and MTh in the first area CR1 and the memory cell transistors MTc and MTd in the second area CR2 share the word lines WL. The memory cell transistors MTa, MTb, MTc, and MTd are coupled to the bit lines BLa, BLb, BLc, and BLd, respectively.

Data DATa stored in the memory cell transistor MTa is read by a sense amplifier unit SAUa included in the sense amplifier module 17 and transferred to the logic circuit 18A via the data bus BUSa. Data DATb stored in the memory cell transistor MTb is read by a sense amplifier unit SAUb included in the sense amplifier module 17 and transferred to the logic circuit 18A via the data bus BUSb. Then, the logic circuit 18A performs a decoding process using the data read from the memory cell transistor MTa and the data DATb read from the memory cell transistor MTb, and outputs the decoded data DAT to the memory controller 2 via the input/output circuit 11.

Data DATc stored in the memory cell transistor MTc is read by a sense amplifier unit SAUc included in the sense amplifier module 17 and transferred to the logic circuit 18B via the data bus BUSc. Data DATd stored in the memory cell transistor MTd is read by a sense amplifier unit SAUd included in the sense amplifier module 17 and transferred to the logic circuit 18B via the data bus BUSd. The logic circuit 18B performs a decoding process using the data DATc read from the memory cell transistor MTc and the data DATd read from the memory cell transistor MTd, and outputs the decoded data DAT to the memory controller 2 via the input/output circuit 11.

The foregoing descriptions describe the case where the semiconductor memory 1 includes two logic circuits 18A and 18B; however, the embodiment is not limited thereto. For example, calculating of each of the share coding used in the first area CR1 and the share coding used in the second area CR2 may be performed by a single logic circuit 18. The logic circuit 18 may include a part shared by two types of share coding and parts provided for each share coding type. The data buses BUSa, BUSb, BUSc, and BUSd are not necessarily separated. If it is possible to perform the operations described in the sixth embodiment, the data buses may be shared as needed.

(Details of Share Coding Used in Second Area CR2)

A threshold voltage of each of the memory cell transistors MTc and MTd in the second area CR2 may be included in one of the above-described six states shown in FIG. 49. In other words, in the second area CR2 of the sixth embodiment, there are 36 combinations made up of 6 states applicable to the memory cell transistor MTc and 6 states applicable to the memory cell transistor MTd. Different 5-bit data is allocated to each of 36 combinations in the semiconductor memory device 1 of the sixth embodiment. There need to be at least 32 combinations in order to allocate different sets of 5-bit data to the combinations. For this reason, the same 5-bit data may be allocated to some of the combinations.

FIG. 79 shows an example of share coding used in the second area CR2 of a memory cell array 10 included in the semiconductor memory device 1 according to the sixth embodiment. In the second area CR2 in the sixth embodiment, decoding rules and read voltages are set for each page, as shown in FIG. 79 and in the following.

(Example) Read page: decoding rules [a,b,c,d], read voltages to be used [read voltages set for MTc/read voltages set for MTd]

PG1:[1,0,0,0], [R4/R4]
PG2:[1,0,1,0], [–/(R2,R5)]
PG3:[1,1,0,0], [(R2,R5)/–]
PG4:[1,0,0,1], [R4/(R1,R3)]
PG5:[1,0,0,1], [(R1,R3)/R4]

In the share coding used in the second area CR2 of the sixth embodiment, the number of read operations performed in each of PG1, PG2, PG3, PG4, PG5 is one, two, two, three, and three. In the semiconductor memory device 1 according to the sixth embodiment, the share coding used in the second area CR2 corresponds to 1-2-2-3-3 coding, similarly to the first area CR1.

[6-2] Read Operation

Figures 80, 81:
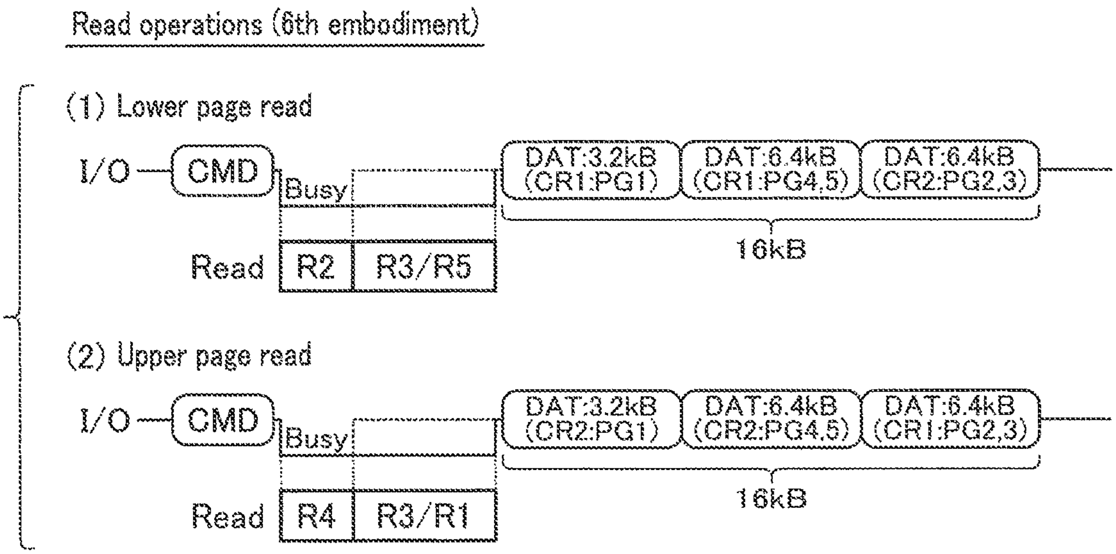
FIG. 80 is a schematic diagram showing an example of a flow of a read operation for each page in the semiconductor memory device according to the sixth embodiment.
FIG. 81 is a table showing an example of combinations of read pages used in a read operation in the semiconductor memory device according to the sixth embodiment.

FIG. 80 shows an example of a flow of a read operation for each page in the semiconductor memory device 1 according to the sixth embodiment. As shown in FIG. 80, the semiconductor memory device 1 according to the sixth embodiment is capable of performing a read operation for each page of two-page data based on an instruction from the memory controller 2. FIGS. 80 (1) and (2) correspond to a lower-page read operation and an upper-page read operation, respectively. In the following, details of a read operation for each page in the sixth embodiment will be explained.

(Lower-Page Read Operation)

The lower-page data corresponds to a combination of pages PG1, PG4, and PG5 of the first area CR1 and pages PG2 and PG3 of the second area CR2. As shown in FIG. 80 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R2, R3, and R5 are sequentially applied to a selected word line WL. When a read operation using the read voltage R2 is completed, data of page PG1 in the first area CR1 is confirmed. When a read operation using the read voltages R3 and R5 is completed, data of pages PG4 and PG5 in the first area CR1 and data of pages PG2 and PG3 in the second area CR2 are confirmed.

After the read operations using the read voltages R2, R3, and R5 are completed, the semiconductor memory device 1 transitions from a busy state to a ready state and commences outputting of data DAT. In a lower-page read operation, data DAT is output in order of page PG1 of the first area CR1 (3.2 kB), pages PG4 and PG5 of the first area CR1 (6.4 kB), and then pages PG2 and PG3 of the second area CR2 (6.4 kB), for example. The page size of the lower-page data is 3.2 kB (CR1:PG1)+6.4 kB (CR1:PG4 and PG5)+6.4 kB (CR2:PG2 and PG3)=16 kB.

(Upper-Page Read Operation)

The upper-page data corresponds to a combination of pages PG1, PG4, and PG5 of the second area CR2, and pages PG2 and PG3 of the first area CR1. As shown in FIG. 80 (2), upon receipt of a command set CMD that instructs an upper-page read operation from the memory controller 2, the semiconductor memory device 1 transitions from a ready state to a busy state and performs an upper-page read operation.

In the upper-page read operation, for example the read voltages R4, R3, and R1 are sequentially applied to a selected word line WL. When a read operation using the read voltage R4 is completed, data of page PG1 in the second area CR2 is confirmed. When a read operation using the read voltages R3 and R1 is completed, data in pages PG4 and PG5 of the second area CR2 and data in pages PG2 and PG3 in the first area CR1 are confirmed.

After the read operations using the read voltages R4, R3, and R1 are completed, the semiconductor memory device 1 transitions from a busy state to a ready state and commences outputting of data DAT. In an upper memory-page read operation, data DAT is output in order of page PG1 of the second area CR2 (3.2 kB), pages PG4 and PG5 of the second area CR2 (6.4 kB), and then pages PG2 and PG3 of the first area CR1 (6.4 kB), for example. The page size of middle-page data is 3.2 kB (CR2:PG1)+6.4 kB (CR2:PG4 and PG)+6.4 kB (CR1:PG2 and PG3)=16 kB.

(Combinations of Read Pages)

FIG. 81 shows combinations of read pages that are output in each page-read operation in the semiconductor memory device 1 according to the sixth embodiment. As shown in FIG. 81, the lower-page data includes three pages (PG1, PG4, and PG5) of the first area CR1 and two pages (PG2 and PG3) of the second area CR2. The upper-page data includes two pages (PG2 and PG3) of the first area CR1 and three pages (PG1, PG4, and PG5) of the second area CR2. In other words, each of the lower page data and the upper page data includes 5-page data in the first area CR1 and the second area CR2. As a result, the data sizes of all pages in the sixth embodiment are equalized to 16 kB.

The order of the data output in each page-read operation may be changed as needed. The semiconductor memory device 1 in the lower-page read operation may transition to a ready state after the data of page PG1 of the first area CR1 is confirmed and then commence outputting of the confirmed data. The semiconductor memory device 1 in the upper-page read operation may transition to a ready state after the data of page PG1 of the second area CR2 is confirmed and then commence outputting of the confirmed data.

[6-3] Advantageous Effects of Sixth Embodiment

As described above, the semiconductor memory device 1 of the sixth embodiment has two storage areas (first area CR1 and second area CR2) having approximately the same area size and using different types of coding. In each of the two storage areas, 5 bit/2 cell share coding (D2.5) is applied. Then, the semiconductor memory device 1 of the sixth embodiment forms 2-page data using the two storage areas and the 5 bit/2 cell share coding.

Specifically, in the lower-page read operation, the semiconductor memory device 1 simultaneously performs a read operation for pages PG1, PG4, and PG5 of the first area CR1 and a read operation for pages PG2 and PG3 of the second area CR2. In an upper-page read operation, the semiconductor memory device 1 simultaneously performs a read operation for pages PG2 and PG3 of the first area CR1 and a read operation for pages PG1, PG4, and PG5 of the second area CR2.

In other words, five pages formed in the first area CR1 by 5 bit/2 cell share coding and five pages formed in the second area CR2 by 5 bit/2 cell share coding, for a total of 10 pages, are divided into two groups of five pages. Furthermore, those groups of five pages are respectively allocated to lower page data and upper page data.

As a result, the semiconductor memory device 1 of the sixth embodiment can make the page size of each read page uniform when share coding is used. Furthermore, the memory controller 2 that controls the semiconductor memory device 1 of the sixth embodiment can simplify the handling of data, and it is thereby possible to suppress design costs for the memory controller 2.

[7] Seventh Embodiment

In the semiconductor memory device 1 according to the seventh embodiment, 5 bit/2 cell share coding is used and timings of outputting data of a certain page are changed in two storage areas so as to make the page sizes of the read pages uniform. In the following, differences in the semiconductor memory device 1 between the seventh embodiment and the first to sixth embodiments will be described.

[7-1] Configuration

The semiconductor memory device 1 of the seventh embodiment differs from that of the third embodiment in the layout of storage areas and coding used therein. Hereinafter, a layout of storage areas in the semiconductor memory device 1 according to the seventh embodiment will be described.

Figure 82:
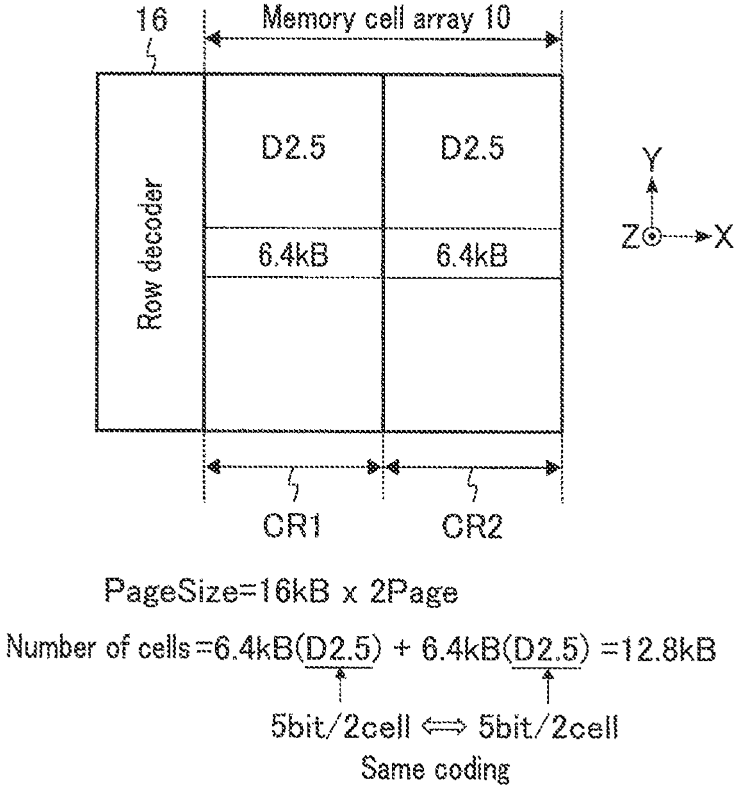
FIG. 82 is a block diagram showing an example of a configuration of a memory cell array included in the semiconductor memory device according to a seventh embodiment.

FIG. 82 shows an example of a layout of the storage areas of the memory cell array 10 included in the semiconductor memory device 1 according to the seventh embodiment. As shown in FIG. 82, the memory cell array 10 according to the seventh embodiment has a layout similar to that of the memory cell array 10 explained in the sixth embodiment with reference to FIG. 77.

Furthermore, the same share coding is applied to the first area CR1 and the second area CR2 in the seventh embodiment. As the share coding used in the seventh embodiment, the 5 bit/2 cell share coding (D2.5) described in the third embodiment is used, for example. Thus, in the semiconductor memory device 1 of the seventh embodiment, 2-page data is stored in a single cell unit CU that includes at least 12.8 k memory cell transistors MT, and a size of each page of 2-page data is made uniform to be 16 kB, similarly to the sixth embodiment. The rest of the configuration of the semiconductor memory device 1 according to the seventh embodiment is the same as that of the third embodiment.

[7-2] Read Operation

Figure 83:
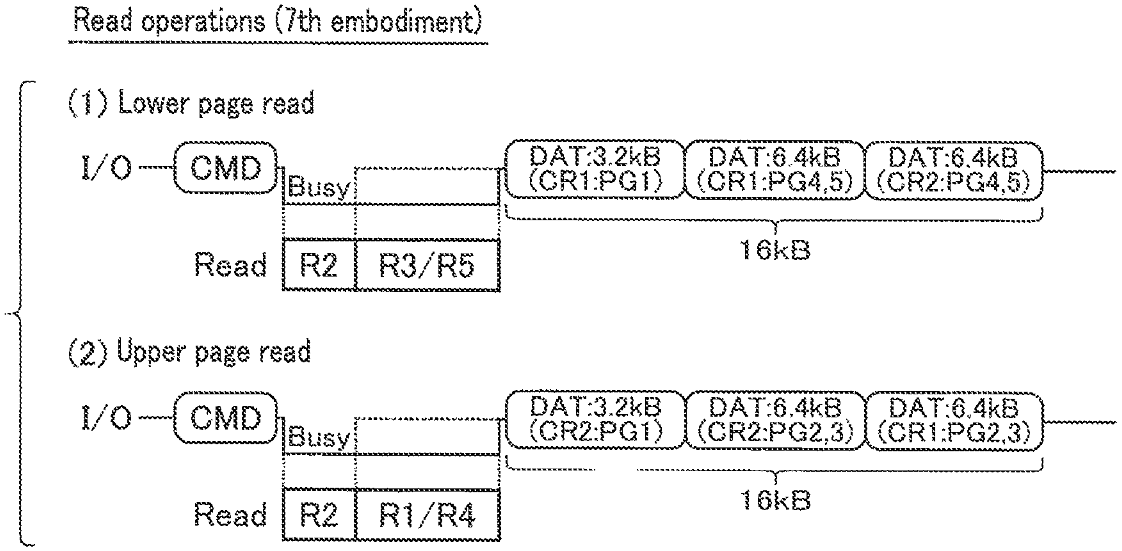
FIG. 83 is a schematic diagram showing an example of a flow of a read operation for each page in the semiconductor memory device according to the seventh embodiment.

FIG. 83 shows an example of a flow of a read operation for each page in the semiconductor memory device 1 according to the seventh embodiment. As shown in FIG. 83, the semiconductor memory device 1 according to the seventh embodiment is capable of performing a read operation for each page of 2-page data based on an instruction from the memory controller 2. FIGS. 83 (1) and (2) correspond to a lower-page read operation and an upper-page read operation, respectively. In the following, details of a read operation for each page in the seventh embodiment are explained.

(Lower-Page Read Operation)

The lower-page data corresponds to a combination of page PG1 of the first area CR1 and pages PG4 and PG5 of each of the first area CR1 and the second area CR2. As shown in FIG. 83 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R2, R3, and R5 are sequentially applied to a selected word line WL. When a read operation using the read voltage R2 is completed, data of page PG1 in each of the first area CR1 and the second area CR2 is confirmed. When a read operation using the read voltages R3 and R5 is completed, data of pages PG4 and PG5 in each of the first area CR1 and the second area CR2 is confirmed.

After the read operations using the read voltages R2, R3, and R5 are completed, the semiconductor memory device 1 transitions from a busy state to a ready state and commences outputting of data DAT. In a lower-page read operation, data DAT is output in order of page PG1 of the first area CR1 (3.2 kB), pages PG4 and PG5 of the first area CR1 (6.4 kB), and then pages PG4 and PG5 of the second area CR2 (6.4 kB), for example. On the other hand, the output of data DAT of page PG1 of the second area CR2 is omitted. The page size of the lower-page data is 3.2 kB (CR1:PG1)+6.4 kB (CR1:PG4 and PG5)+6.4 kB (CR2:PG4 and PG5)=16 kB.

(Upper-Page Read Operation)

The upper-page data corresponds to a combination of page PG1 of the second area CR2, and pages PG2 and PG3 of each of the first area CR1 and the second area CR2. As shown in FIG. 83 (2), upon receipt of a command set CMD that instructs an upper-page read operation from the memory controller 2, the semiconductor memory device 1 transitions from a ready state to a busy state and performs an upper-page read operation.

In the upper-page read operation, for example the read voltages R2, R1, and R4 are sequentially applied to a selected word line WL. When a read operation using the read voltage R2 is completed, data of page PG1 in each of the first area CR1 and the second area CR2 is confirmed. When a read operation using the read voltages R1 and R4 is completed, data of pages PG2 and PG3 in each of the first area CR1 and the second area CR2 is confirmed.

After the read operations using the read voltages R2, R1, and R4 are completed, the semiconductor memory device 1 transitions from a busy state to a ready state and commences outputting of data DAT. In an upper-page read operation, data DAT is output in order of page PG1 of the second area CR2 (3.2 kB), pages PG2 and PG3 of the second area CR2 (6.4 kB), and then pages PG2 and PG3 of the first area CR1 (6.4 kB), for example. On the other hand, the output of data DAT of page PG1 of the first area CR1 is omitted. The page size of upper-page data is 3.2 kB (CR2:PG1)+6.4 kB (CR2:PG2 and PG3)+6.4 kB (CR1:PG2 and PG3)=16 kB.

(Combinations of Read Pages)

Figures 84, 85:
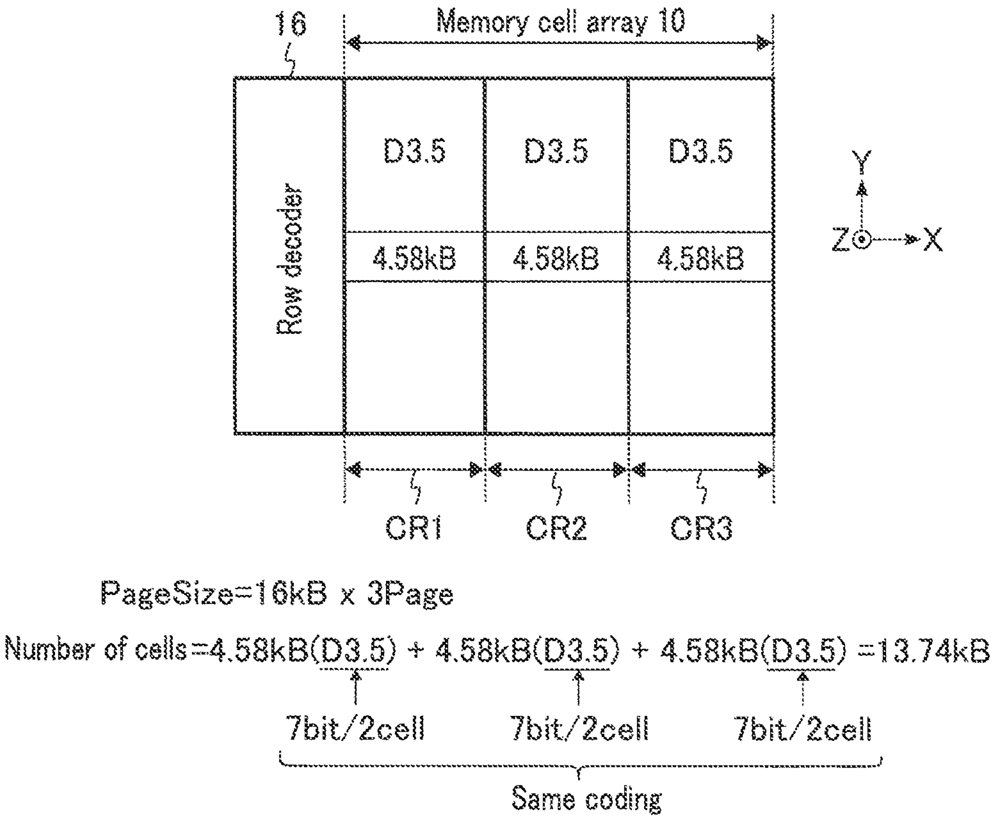
FIG. 84 is a table showing an example of combinations of read pages used in a read operation in the semiconductor memory device according to the seventh embodiment.
FIG. 85 is a block diagram showing an example of a configuration of a memory cell array included in the semiconductor memory device according to an eighth embodiment.

FIG. 84 shows combinations of read pages that are output in each page-read operation in the semiconductor memory device 1 according to the seventh embodiment. As shown in FIG. 84, the lower-page data includes three pages (PG1, PG4, and PG5) of the first area CR1 and two pages (PG4 and PG5) of the second area CR2. The upper-page data includes two pages (PG2 and PG3) of the first area CR1 and three pages (PG1, PG2, and PG3) of the second area CR2.

Thus, in the semiconductor memory device 1 of the seventh embodiment, each of the lower page data and the upper page data includes 5-page data in the first area CR1 and the second area CR2. As a result, the data size of each page in the seventh embodiment is equalized to 16 kB.

The order of the data output in each page-read operation may be changed as needed. The semiconductor memory device 1 in the lower-page read operation may transition to a ready state after each piece of the data of page PG1 of the first area CR1 is confirmed and then commence outputting of the confirmed data. The semiconductor memory device 1 in the upper-page read operation may transition to a ready state after each piece of the data of page PG1 of the second area CR2 is confirmed and then commence outputting of the confirmed data.

[7-3] Advantageous Effects of Seventh Embodiment

As described above, the semiconductor memory device 1 of the seventh embodiment has two storage areas (first area CR1 and second area CR2) having approximately the same area size and to which the same coding is applied. In each of the two storage areas, 5 bit/2 cell share coding (D2.5) is applied. Then, the semiconductor memory device 1 of the seventh embodiment forms 2-page data using the two storage areas and the 5 bit/2 cell share coding.

Briefly, in a lower-page read operation, the semiconductor memory device 1 simultaneously performs a read operation for pages PG4 and PG5 of the first area CR1 and a read operation for pages PG1, PG4, and PG5 of the second area CR2. In an upper-page read operation, the semiconductor memory device 1 simultaneously performs a read operation for pages PG2 and PG3 of the first area CR1 and a read operation for pages PG1, PG2, and PG3 of the second area CR2.

Thus, a total of 10 pages of five pages formed by 5 bit/2 cell coding in the first area CR1 and five pages formed by 5 bit/2 cell coding in the second area CR2 are divided into units of five pages. The two groups of five pages are respectively allocated to the lower page data and the upper page data.

As a result, the semiconductor memory device 1 of the seventh embodiment can make the page size of each read page uniform when share coding is used. Furthermore, the memory controller 2 that controls the semiconductor memory device 1 of the seventh embodiment can simplify the handling of data, and it is thereby possible to suppress design costs for the memory controller 2.

[8] Eighth Embodiment

In the semiconductor memory device 1 according to the eighth embodiment, 7 bit/2 cell share coding is used and timings of outputting data of a certain page are changed in three storage areas so as to make the page sizes of the read pages uniform. In the following, differences in the semiconductor memory device 1 between the eighth embodiment and the first to seventh embodiments will be described.

[8-1] Configuration

The semiconductor memory device 1 of the eighth embodiment differs from that of the third embodiment in the layout of storage areas and coding used therein. The rest of the configuration of the semiconductor memory device 1 according to the eighth embodiment is the same as that of the third embodiment. Hereinafter, matters regarding the data storage method in the semiconductor memory device 1 according to the eighth embodiment will be described.

(Layout of Storage Area)

FIG. 85 shows an example of a layout of the storage areas of the memory cell array 10 included in the semiconductor memory device 1 according to the eighth embodiment. As shown in FIG. 85, the memory cell array 10 of the eighth embodiment includes a first area CR1, a second area CR2, and a third area CR3 arranged in the X direction. The row decoder module 16 is provided on, for example, the first area CR1 side, and controls the memory cell transistors MT using the word lines WL shared between the first area CR1, and the second area CR2, and the third area CR3.

Furthermore, the same share coding is applied to each of the first area CR1, the second area CR2, and the third area CR3 in the eighth embodiment. As the share coding used in the eighth embodiment, the 7 bit/2 cell share coding (D3.5) described in the fourth embodiment with reference to FIG. 59 is used, for example.

For example, a single word line WL is coupled to at least 4.58 k memory cell transistors MT in each of the first area CR1, the second area CR2, and the third area CR3 (the number of cells=4.58 kB). Thus, in the semiconductor memory device 1 of the eighth embodiment, 3-page data is stored in a single cell unit CU that includes at least 13.74 k memory cell transistors MT, and a size of each page of 3-page data is made uniform to be 16 kB.

(Circuit Configuration Relating to Share Coding)

Figure 86:
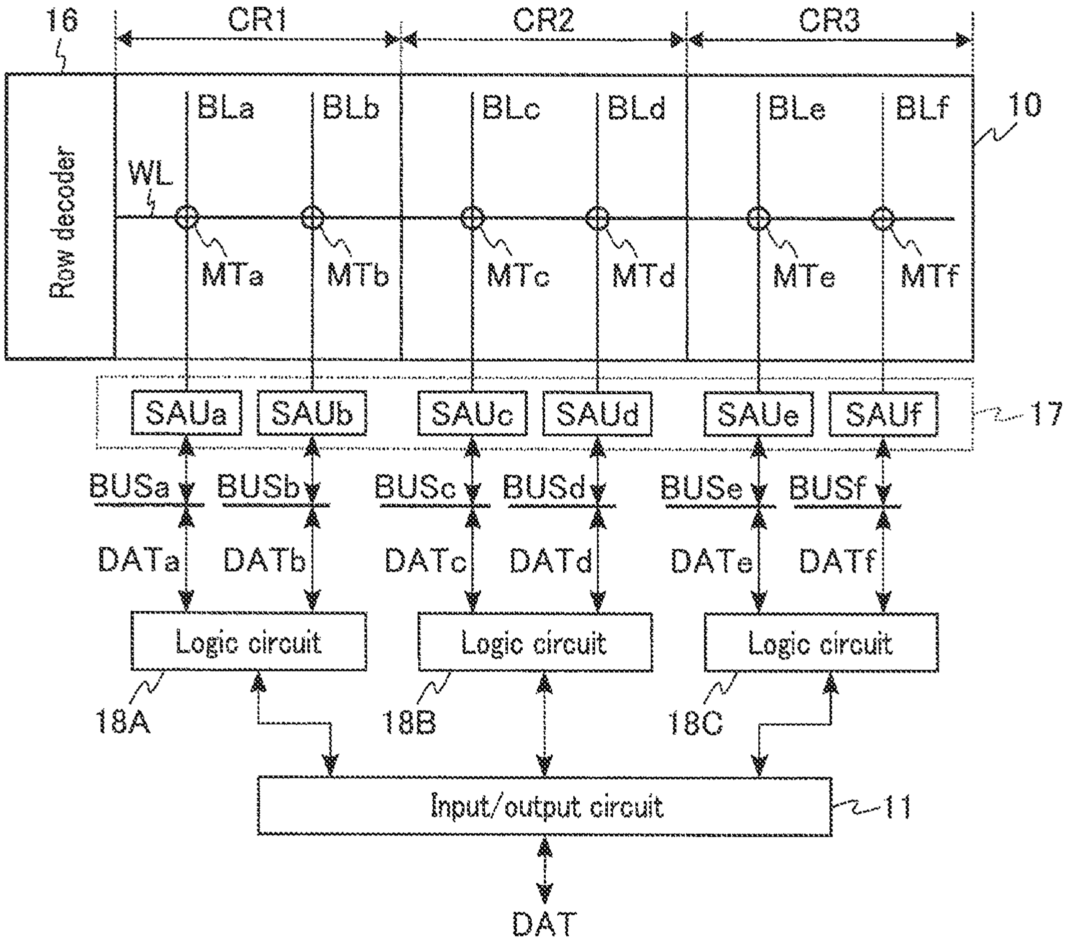
FIG. 86 is a circuit diagram showing an example of couplings used in page data storage in the semiconductor memory device according to the eighth embodiment.

FIG. 86 shows an example of couplings used in page data storage in the semiconductor memory device 1 according to the eighth embodiment. As shown in FIG. 86, the semiconductor memory device 1 according to the eighth embodiment includes three logic circuits 18A, 18B, and 18C. Each of the logic circuits 18A, 18B, and 18C performs calculating relating to the 7 bit/2 cell share coding explained in the fourth embodiment, for example.

In the eighth embodiment, the first area CR1 includes a plurality of memory cell transistors MTa and a plurality of memory cell transistors MTb. The second area CR2 includes a plurality of memory cell transistors MTc and a plurality of memory cell transistors MTd. The third area CR3 includes a plurality of memory cell transistors MTe and a plurality of memory cell transistors MTf. The memory cell transistors MTa and MTb in the first area CR1, the memory cell transistors MTc and MTd in the second area CR2, and the memory cell transistors MTe and MTf in the third area CR3 share the word lines WL. The memory cell transistors MTa, MTb, MTc, MTd, MTe, and MTf are coupled to the bit lines BLa, BLb, BLc, BLd, BLe, and BLf respectively.

The couplings relating to the combinations of the memory cell transistors MTa and MTb and the couplings relating to the combinations of the memory cell transistors MTc and MTd are the same as those in the seventh embodiment. Data DATe stored in the memory cell transistor MTe is read by a sense amplifier unit SAUe included in the sense amplifier module 17 and transferred to the logic circuit 18C via the data bus BUSe. Data DATf stored in the memory cell transistor MTf is read by a sense amplifier unit SAUf included in the sense amplifier module 17 and transferred to the logic circuit 18C via the data bus BUSf. The logic circuit 18C performs a decoding process using the data DATe read from the memory cell transistor MTe and the data DATf read from the memory cell transistor MTf, and outputs the decoded data DAT to the memory controller 2 via the input/output circuit 11.

The foregoing descriptions describe the case where the semiconductor memory device 1 includes three logic circuits 18A, 18B, and 18C; however, the embodiment is not limited thereto. For example, calculating in the first area CR1, the second area CR2, and the third area CR3 may be performed by a single logic circuit 18. The logic circuit 18 may have a portion shared by the areas CR and portions provided for each area CR. The data buses BUSa, BUSb, BUSc, BUSd, BUSe, and BUSf are not necessarily separated. If it is possible to perform the operations described in the eighth embodiment, the data buses may be shared as needed.

[8-2] Read Operation

Figures 87, 88:
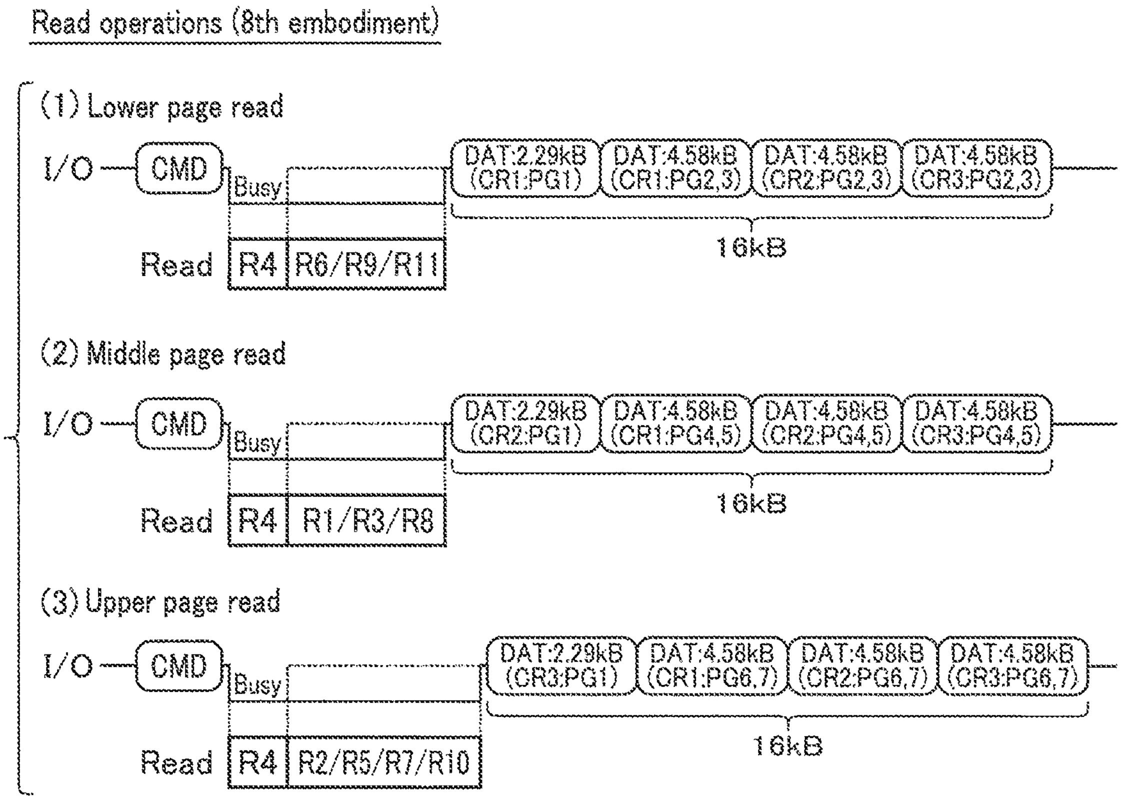
FIG. 87 is a schematic diagram showing an example of a flow of a read operation for each page in the semiconductor memory device according to the eighth embodiment.
FIG. 88 is a table showing an example of combinations of read pages used in a read operation in the semiconductor memory device according to the eighth embodiment.

FIG. 87 shows an example of a flow of a read operation for each page in the semiconductor memory device 1 according to the eighth embodiment. As shown in FIG. 87, the semiconductor memory device 1 according to the eighth embodiment is capable of performing a read operation for each page of 3-page data based on an instruction from the memory controller 2. FIGS. 87 (1) through (3) correspond to a lower-page read operation, a middle-page read operation, and an upper-page read operation, respectively. In the following, a read operation for each page in the eighth embodiment is explained in detail.

(Lower-Page Read Operation)

The lower-page data corresponds to a combination of page PG1 of the first area CR1 and pages PG2 and PG3 of each of the first area CR1, the second area CR2, and the third area CR3. As shown in FIG. 87 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R4, R6, R9, and R11 are sequentially applied to a selected word line WL. When a read operation using the read voltage R4 is completed, data of page PG1 in each of the first area CR1, the second area CR2, and the third area CR3 is confirmed. When a read operation using the read voltages R6, R9, and R11 is completed, data of pages PG2 and PG3 in each of the first area CR1, the second area CR2, and the third area CR3 is confirmed.

After the read operations using the read voltages R4, R6, R9, and R11 are completed, the semiconductor memory device 1 transitions from a busy state to a ready state and commences outputting of data DAT. In a lower-page read operation, data DAT is output in order of page PG1 of the first area CR1 (2.29 kB), pages PG2 and PG3 of the first area CR1 (4.58 kB), pages PG2 and PG3 of the second area CR2 (4.58 kB), and then pages PG2 and PG3 of the third area CR3 (4.58 kB), for example. On the other hand, the output of data DAT of page PG1 of each of the second area CR2 and the third area CR3 is omitted. The page size of lower-page data is 2.29 kB (CR1:PG1)+4.58 kB (CR1:PG2 and PG3)+4.58 kB (CR2:PG2 and PG3)+4.58 kB (CR3:PG2 and PG3)=16.03 kB.

(Middle-Page Read Operation)

The middle-page data corresponds to a combination of page PG1 of the second area CR2 and pages PG4 and PG5 of each of the first area CR1, the second area CR2, and the third area CR3. As shown in FIG. 87 (2), upon receipt of a command set CMD that instructs a middle-page read operation from the memory controller 2, the semiconductor memory device 1 transitions from a ready state to a busy state and performs a middle-page read operation.

In the middle-page read operation, for example the read voltages R4, R1, R3, and R8 are sequentially applied to a selected word line WL. When a read operation using the read voltage R4 is completed, data of page PG1 in each of the first area CR1, the second area CR2, and the third area CR3 is confirmed. When a read operation using the read voltage R1, R3, and R8 is completed, data of page PG4 and step PG5 in each of the first area CR1, the second area CR2, and the third area CR3 is confirmed.

After the read operations using the read voltages R4, R1, R3, and R8 are completed, the semiconductor memory device 1 transitions from a busy state to a ready state and commences outputting of data DAT. In a middle-page read operation, data DAT is output in order of page PG1 of the second area CR2 (2.29 kB), pages PG4 and PG5 of the first area CR1 (4.58 kB), pages PG4 and PG5 of the second area CR2 (4.58 kB), and then pages PG4 and PG5 of the third area CR3 (4.58 kB), for example. On the other hand, the output of data DAT of page PG1 of each of the first area CR1 and the third area CR3 is omitted. The page size of middle-page data is 2.29 kB (CR2:PG1)+4.58 kB (CR1:PG4 and PG5)+4.58 kB (CR2:PG4 and PG5)+4.58 kB (CR3:PG4 and PG5)=16.03 kB.

(Upper-Page Read Operation)

The upper-page data corresponds to a combination of page PG1 of the third area CR3 and pages PG6 and PG7 of each of the first area CR1, the second area CR2, and the third area CR3. As shown in FIG. 87 (3), upon receipt of a command set CMD that instructs an upper-page read operation from the memory controller 2, the semiconductor memory device 1 transitions from a ready state to a busy state and performs an upper-page read operation.

In the upper-page read operation, for example the read voltages R4, R2, R5, R7, and R10 are sequentially applied to a selected word line WL. When a read operation using the read voltage R4 is completed, data of page PG1 in each of the first area CR1, the second area CR2, and the third area CR3 is confirmed. When a read operation using the read voltages R2, R5, R7, and R10 is completed, data of pages PG6 and PG7 in each of the first area CR1, the second area CR2, and the third area CR3 is confirmed.

After the read operations using the read voltages R4, R2, R5, R7, and R10 are completed, the semiconductor memory device 1 transitions from a busy state to a ready state and commences outputting of data DAT. In an upper memory-page read operation, data DAT is output in order of page PG1 of the third area CR3 (2.29 kB), pages PG6 and PG7 of the first area CR1 (4.58 kB), pages PG6 and PG7 of the second area CR2 (4.58 kB), and then pages PG6 and PG7 of the third area CR3 (4.58 kB), for example. On the other hand, the output of data DAT of page PG1 of each of the first area CR1 and the second area CR2 is omitted. The page size of the upper memory-page data is 2.29 kB (CR3:PG1)+4.58 kB (CR1:PG6 and PG7)+4.58 kB (CR2:PG6 and PG7)+4.58 kB (CR3:PG6 and PG7)=16.03 kB.

(Combinations of Read Pages)

FIG. 88 shows combinations of read pages that are output in each page-read operation in the semiconductor memory device 1 according to the eighth embodiment. Combinations of the read pages shown in FIG. 88 are listed below.

The lower-page data includes three pages (PG1, PG2, and PG3) of the first area CR1, two pages (PG2 and PG3) of the second area CR2, and two pages (PG2 and PG3) of the third area CR3.

The middle-page data includes two pages (PG4 and PG5) of the first area CR1, three pages (PG1, PG4, and PG5) of the second area CR2, and two pages (PG4 and PG5) of the third area CR3.

The upper-page data includes two pages (PG6 and PG7) of the first area CR1, two pages (PG6 and PG7) of the second area CR2, and three pages (PG1, PG6, and PG7) of the third area CR3.

In other words, in the semiconductor memory device 1 of the eighth embodiment, each of the lower page data, the middle page data, and the upper page data includes 7-page data in the first area CR1, the second area CR2, and the third area CR3. As a result, the data sizes of all pages in the eighth embodiment are equalized to about 16 kB.

The order of the data output in each read operation may be changed as needed. The semiconductor memory device 1 in the lower-page read operation may transition to a ready state after the data of page PG1 of the first area CR1 is confirmed and then commence outputting of the confirmed data. The semiconductor memory device 1 in the middle-page read operation may transition to a ready state after the data of page PG1 of the second area CR2 is confirmed and then commence outputting of the confirmed data. The semiconductor memory device 1 in the upper-page read operation may transition to a ready state after the data of page PG1 of the third area CR3 is confirmed and then commence outputting of the confirmed data.

[8-3] Advantageous Effects of Eighth Embodiment

As described above, the semiconductor memory device 1 of the eighth embodiment has three storage areas (first area CR1, second area CR2, and third area CR3) having approximately the same area and to which the same coding is applied. In each of the three storage areas, 7 bit/2 cell share coding (D3.5) is applied. Then, the semiconductor memory device 1 of the eighth embodiment forms 3-page data using the three storage areas and the 7 bit/2 cell share coding.

Briefly, in a lower-page read operation, the semiconductor memory device 1 simultaneously performs a read operation for page PG1 of the first area CR1 and a read operation for pages PG2 and PG3 of each of the first area CR1, the second area CR2, and the third area CR3. In a middle-page read operation, the semiconductor memory device 1 simultaneously performs a read operation for page PG1 of the second area CR2 and a read operation for pages PG4 and PG5 of each of the first area CR1, the second area CR2, and the third area CR3. In an upper-page read operation, the semiconductor memory device 1 simultaneously performs a read operation for page PG1 of the third area CR1 and a read operation for pages PG6 and PG7 of each of the first area CR1, the second area CR2, and the third area CR3.

Thus, seven pages formed by 7 bit/2 cell share coding in the first area CR1, seven pages formed by 7 bit/2 cell share coding in the second area CR2, and seven pages formed by 7 bit/2 cell share coding in the third area CR3, for a total of 21 pages, are divided into three groups of seven pages. The three groups of seven pages are respectively allocated to the lower page data, the middle page data, and the upper page data.

As a result, the semiconductor memory device 1 of the eighth embodiment can make the page size of each read page uniform when share coding is used. Furthermore, the memory controller 2 that controls the semiconductor memory device 1 of the eighth embodiment can simplify the handling of data, and it is thereby possible to suppress design costs for the memory controller 2.

[9] Ninth Embodiment

In the semiconductor memory device 1 according to the ninth embodiment, 9 bit/2 cell share coding is used and timings of outputting data of a certain page are changed in four storage areas so as to make the page sizes of the read pages uniform. In the following, differences in the semiconductor memory device 1 between the ninth embodiment and the first to eighth embodiments will be described.

[9-1] Configuration

The semiconductor memory device 1 of the ninth embodiment differs from that of the third embodiment in the layout of storage areas and coding used therein. The rest of the configuration of the semiconductor memory device 1 according to the ninth embodiment is the same as that of the third embodiment. Hereinafter, matters regarding the data storage method in the semiconductor memory device 1 according to the ninth embodiment will be described.

(Layout of Storage Area)

Figure 89:
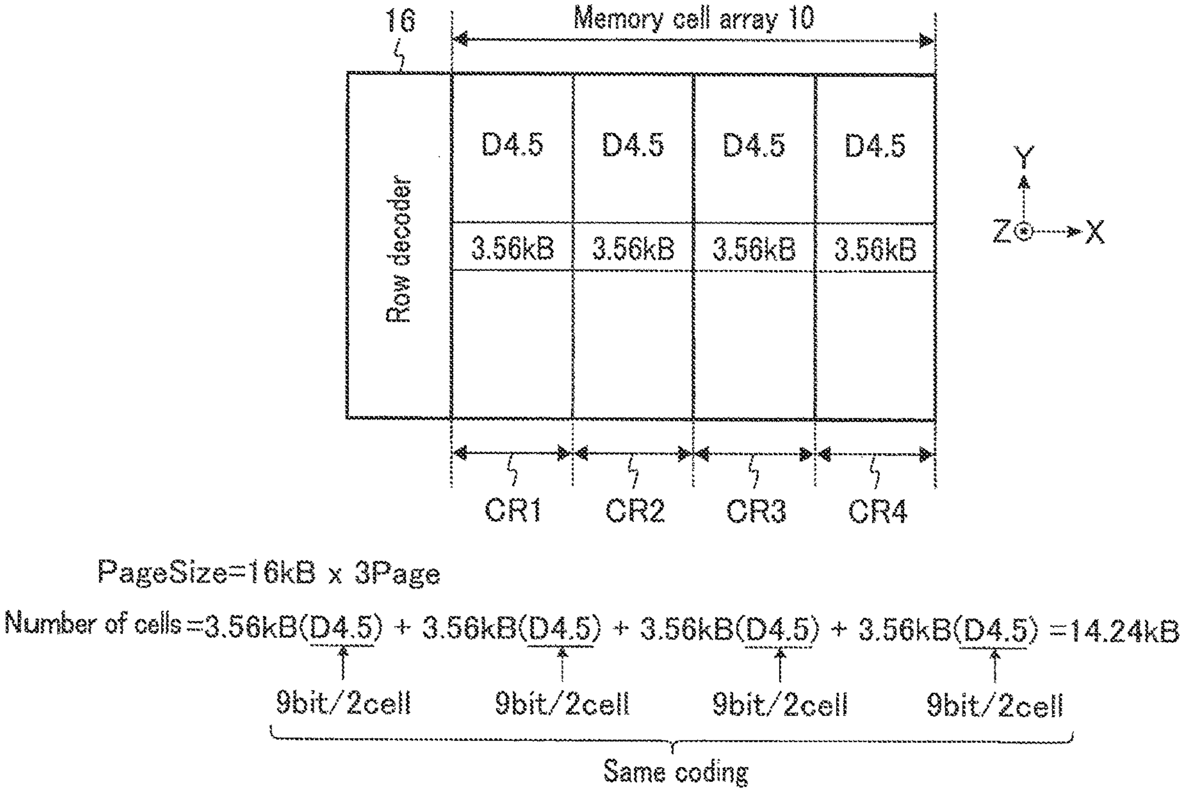
FIG. 89 is a block diagram showing an example of a configuration of a memory cell array included in the semiconductor memory device according to a ninth embodiment.

FIG. 89 shows an example of a layout of the storage areas of the memory cell array 10 included in the semiconductor memory device 1 according to the ninth embodiment. As shown in FIG. 89, the memory cell array 10 of the ninth embodiment includes a first area CR1, a second area CR2, a third area CR3, and a fourth area CR4 arranged in the X direction. The row decoder module 16 is provided on, for example, the first area CR1 side, and controls the memory cell transistors MT using the word lines WL shared among the first area CR1, the second area CR2, the third area CR3, and the fourth area CR4.

Furthermore, the same share coding is applied to each of the first area CR1, the second area CR2, the third area CR3, and the fourth area CR4 in the ninth embodiment. As the share coding used in the ninth embodiment, the 9 bit/2 cell share coding (D4.5) described in the fifth embodiment with reference to FIG. 68 is used, for example.

For example, a single word line WL is coupled to at least 3.56 k memory cell transistors MT in each of the first area CR1, the second area CR2, the third area CR3, and the fourth area CR4 (the number of cells=3.56 kB). Thus, in the semiconductor memory device 1 of the ninth embodiment, 3-page data is stored in a single cell unit CU that includes at least 14.24 k memory cell transistors MT, and a size of each page of 3-page data is made uniform to be 16 kB.

(Circuit Configuration Relating to Share Coding)

Figure 90:
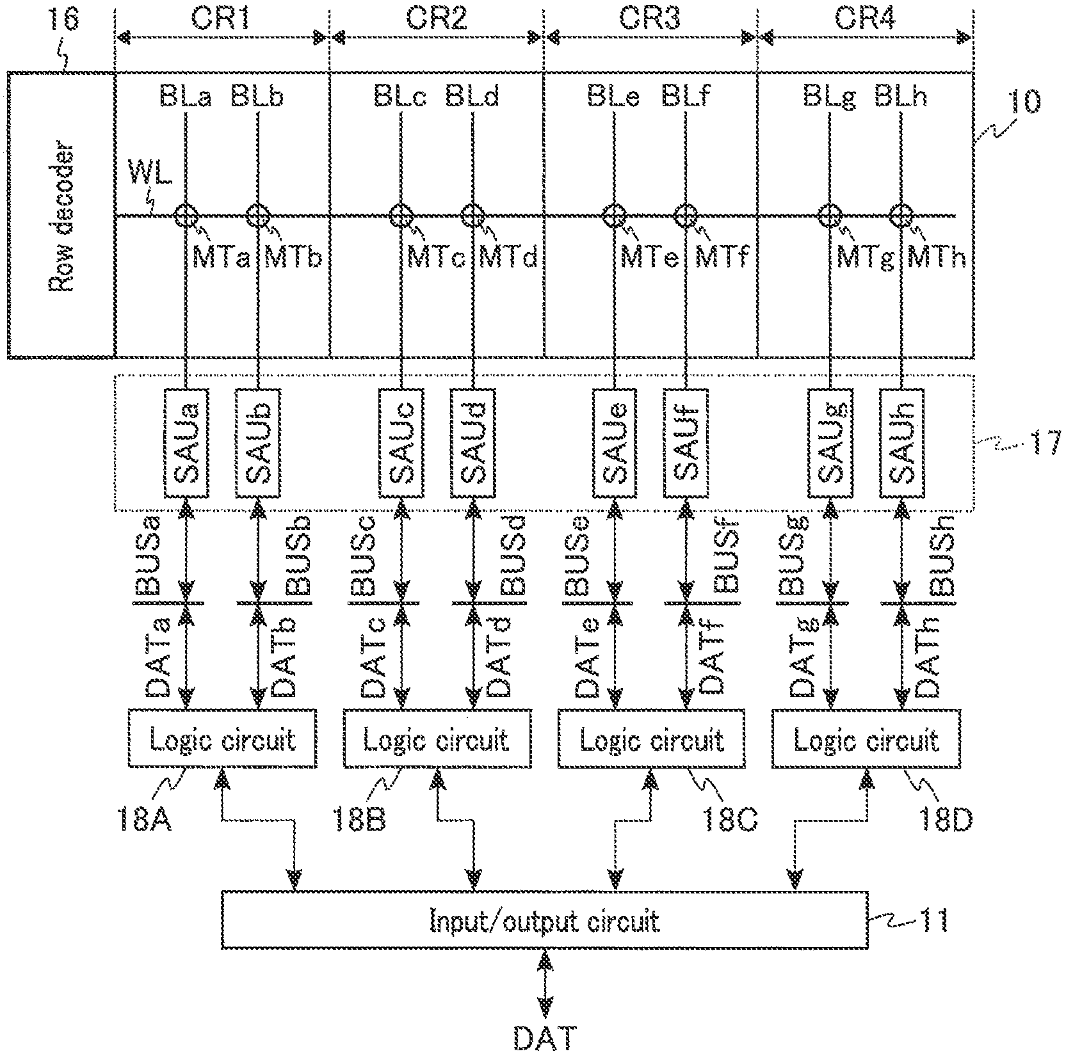
FIG. 90 is a circuit diagram showing an example of couplings used in page data storage in the semiconductor memory device according to the ninth embodiment.

FIG. 90 shows an example of couplings used in page data storage in the semiconductor memory device 1 according to the ninth embodiment. As shown in FIG. 90, the semiconductor memory device 1 according to the ninth embodiment includes four logic circuits 18A, 18B, 18C, and 18D. Each of logic circuits 18A, 18B, 18C, and 18D performs calculating relating to the 9 bit/2 cell share coding explained in the fifth embodiment.

In the ninth embodiment, the first area CR1 includes a plurality of memory cell transistors MTa and a plurality of memory cell transistors MTb. The second area CR2 includes a plurality of memory cell transistors MTc and a plurality of memory cell transistors MTd. The third area CR3 includes a plurality of memory cell transistors MTe and a plurality of memory cell transistors MTf. The fourth area CR4 includes a plurality of memory cell transistors MTg and a plurality of memory cell transistors MTh. The memory cell transistors MTa and MTb in the first area CR1, the memory cell transistors MTc and MTd in the second area CR2, the memory cell transistors MTe and MTf in the third area CR3, and the memory cell transistors MTg and MTh in the fourth area CR4 share the word lines WL. The memory cell transistors MTa, MTb, MTc, MTd, MTe, MTf, MTg, and MTh are coupled to the bit lines BLa, BLb, BLc, BLd, BLe, BLf, BLg, and BLh respectively.

The couplings relating to the combinations of the memory cell transistors MTa and MTb, the couplings relating to the combinations of the memory cell transistors MTc and MTd, and the couplings relating to the combinations of the memory cell transistors MTe and MTf are the same as those in the eighth embodiment. Data DATg stored in the memory cell transistor MTg is read by a sense amplifier unit SAUg included in the sense amplifier module 17 and transferred to the logic circuit 18D via the data bus BUSg. Data DATh stored in the memory cell transistor MTh is read by a sense amplifier unit SAUh included in the sense amplifier module 17 and transferred to the logic circuit 18D via the data bus BUSh. The logic circuit 18D performs a decoding process using the data DATg read from the memory cell transistor MTg and the data DATh read from the memory cell transistor MTh, and outputs the decoded data DAT to the memory controller 2 via the input/output circuit 11.

The foregoing descriptions describe the case where the semiconductor memory device 1 includes four logic circuits 18A, 18B, 18C and 18D; however, the embodiment is not limited thereto. For example, calculating in each of the first area CR1, the second area CR2, the third area CR3, and the fourth area CR4 may be performed by a single logic circuit 18. The circuit area 18 has a portion shared by the areas CR portions provided for each area CR. The data buses BUSa, BUSb, BUSc, BUSd, BUSe, BUSf, BUSg, and BUSh are not necessarily separated. If it is possible to perform the operations described in the ninth embodiment, the data buses may be shared as needed.

[9-2] Read Operation

Figure 91:
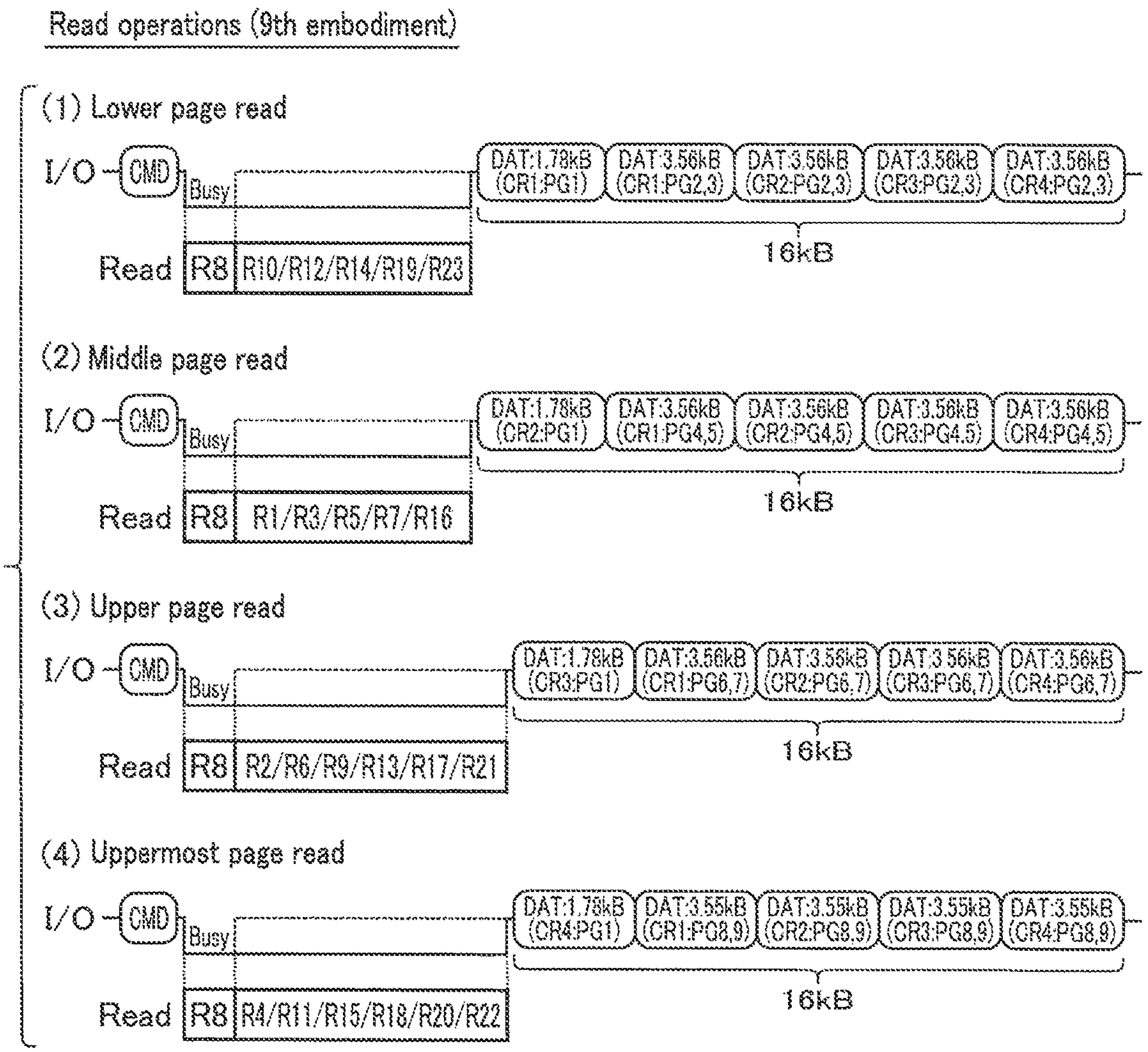
FIG. 91 is a schematic diagram showing an example of a flow of a read operation for each page in the semiconductor memory device according to the ninth embodiment.

FIG. 91 shows an example of a flow of a read operation for each page in the semiconductor memory device 1 according to the ninth embodiment. As shown in FIG. 91, the semiconductor memory device 1 according to the ninth embodiment is capable of performing a read operation for each page of four-page data based on an instruction from the memory controller 2. FIGS. 91 (1) through (4) correspond to a lower-page read operation, a middle-page read operation, an upper-page read operation, and an uppermost-page read operation, respectively. In the following, a read operation for each page in the ninth embodiment is explained in detail.

(Lower-Page Read Operation)

The lower-page data corresponds to a combination of page PG1 of the first area CR1 and pages PG2 and PG3 of each of the first area CR1, the second area CR2, the third area CR3, and the fourth area CR4. As shown in FIG. 91 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R8, R10, R12, R14, R19, and R23 are sequentially applied to a selected word line WL. When a read operation using the read voltage R8 is completed, data of page PG1 in each of the first area CR1, the second area CR2, the third area CR3, and the fourth area CR4 is confirmed. When a read operation using the read voltages R10, R12, R14, R19, and R23 is completed, data of pages PG2 and PG3 in each of the first area CR1, the second area CR2, the third area CR3, and the fourth area CR4 is confirmed.

After the read operations using the read voltages R8, R10, R12, R14, R19, and R23 are completed, the semiconductor memory device 1 transitions from a busy state to a ready state and commences outputting of data DAT. In a lower-page read operation, data DAT is output in order of page PG1 of the first area CR1 (1.78 kB), pages PG2 and PG3 of the first area CR1 (3.56 kB), pages PG2 and PG3 of the second area CR2 (3.56 kB), pages PG2 and PG3 of the third area CR3 (3.56 kB), and then pages PG2 and PG3 of the fourth area CR4 (3.56 kB) for example. On the other hand, the output of data DAT of page PG1 of each of the second area CR2, the third area CR3, and the fourth area CR4 is omitted. The page size of lower-page data is 1.78 kB (CR1:PG1)+3.56 kB (CR1:PG2 and PG3)+3.56 kB (CR2:PG2 and PG3)+3.56 kB (CR3:PG2 and PG3)+3.56 kB (CR4:PG2 and PG3)=16.02 kB.

(Middle-Page Read Operation)

The middle-page data corresponds to a combination of page PG1 of the second area CR2 and pages PG4 and PG5 of each of the first area CR1, the second area CR2, the third area CR3, and the fourth area CR4. As shown in FIG. 91 (2), upon receipt of a command set CMD that instructs a middle-page read operation from the memory controller 2, the semiconductor memory device 1 transitions from a ready state to a busy state and performs a middle-page read operation.

In the middle-page read operation, for example the read voltages R8, R1, R3, R5, R7, and R16 are sequentially applied to a selected word line WL. When a read operation using the read voltage R8 is completed, data of page PG1 in each of the first area CR1, the second area CR2, the third area CR3, and the fourth area CR4 is confirmed. When a read operation using the read voltages R1, R3, R5, R7, and R16 is completed, data of pages PG4 and PG5 in each of the first area CR1, the second area CR2, the third area CR3, and the fourth area CR4 is confirmed.

After the read operations using the read voltages R8, R1, R3, R5, R7, and R16 are completed, the semiconductor memory device 1 transitions from a busy state to a ready state and commences outputting of data DAT. In a middle-page read operation, data DAT is output in order of page PG1 of the second area CR2 (1.78 kB), pages PG4 and PG5 of the first area CR1 (3.56 kB), pages PG4 and PG5 of the second area CR2 (3.56 kB), pages PG4 and PG5 of the third area CR3 (3.56 kB), and then pages PG4 and PG5 of the fourth area CR4 (3.56 kB) for example. On the other hand, the output of data DAT of page PG1 of each of the first area CR1, the third area CR3, and the fourth area CR4 is omitted. The page size of middle-page data is 1.78 kB (CR2:PG1)+3.56 kB (CR1:PG4 and PG5)+3.56 kB (CR2:PG4 and PG5)+3.56 kB (CR3:PG4 and PG5)+3.56 kB (CR4:PG4 and PG5)=16.02 kB.

(Upper-Page Read Operation)

The upper-page data corresponds to a combination of page PG1 of the third area CR3 and pages PG6 and PG7 of each of the first area CR1, the second area CR2, the third area CR3, and the fourth area CR4. As shown in FIG. 91 (3), upon receipt of a command set CMD that instructs an upper-page read operation from the memory controller 2, the semiconductor memory device 1 transitions from a ready state to a busy state and performs an upper-page read operation.

In the upper-page read operation, for example the read voltages R8, R2, R6, R9, R13, R17, and R21 are sequentially applied to a selected word line WL. When a read operation using the read voltage R8 is completed, data of page PG1 in each of the first area CR1, the second area CR2, the third area CR3, and the fourth area CR4 is confirmed. When a read operation using the read voltages R2, R6, R9, R13, R17, and R21 is completed, data of pages PG6 and PG7 in each of the first area CR1, the second area CR2, the third area CR3, and the fourth area CR4 is confirmed.

After the read operations using the read voltages R8, R2, R6, R9, R13, R17, and R21 are completed, the semiconductor memory device 1 transitions from a busy state to a ready state and commences outputting of data DAT. In an upper-page read operation, data DAT is output in order of page PG1 of the third area CR3 (1.78 kB), pages PG6 and PG7 of the first area CR1 (3.56 kB), pages PG6 and PG7 of the second area CR2 (3.56 kB), pages PG6 and PG7 of the third area CR3 (3.56 kB), and then pages PG6 and PG7 of the fourth area CR4 (3.56 kB) for example. On the other hand, the output of data DAT of page PG1 of each of the first area CR1, the second area CR2, and the fourth area CR4 is omitted. The page size of upper-page data is 1.78 kB (CR3:PG1)+3.56 kB (CR1:PG6 and PG7)+3.56 kB (CR2:PG6 and PG7)+3.56 kB (CR3:PG6 and PG7)+3.56 kB (CR4:PG6 and PG7)=16.02 kB.

(Uppermost-Page Read Operation)

The uppermost-page data corresponds to a combination of page PG1 of the fourth area CR4 and pages PG8 and PG9 of each of the first area CR1, the second area CR2, the third area CR3, and the fourth area CR4. As shown in FIG. 91 (4), upon receipt of a command set CMD that instructs an uppermost-page read operation from the memory controller 2, the semiconductor memory device 1 transitions from a ready state to a busy state and performs an uppermost-page read operation.

In the uppermost-page read operation, for example the read voltages R8, R4, R11, R15, R18, R20, and R22 are sequentially applied to a selected word line WL. When a read operation using the read voltage RB is completed, data of page PG1 in each of the first area CR1, the second area CR2, the third area CR3, and the fourth area CR4 is confirmed. When a read operation using the read voltages R4, R11, R15, R18, R20, and R22 is completed, data of pages PG8 and PG9 in each of the first area CR1, the second area CR2, the third area CR3, and the fourth area CR4 is confirmed.

After the read operations using the read voltages R8, R4, R11, R15, R18, R20, and R22 are completed, the semiconductor memory device 1 transitions from a busy state to a ready state and commences outputting of data DAT. In an uppermost-page read operation, data DAT is output in order of page PG1 of the fourth area CR4 (1.78 kB), pages PG8 and PG9 of the first area CR1 (3.56 kB), pages PG8 and PG9 of the second area CR2 (3.56 kB), pages PG8 and PG9 of the third area CR3 (3.56 kB), and then pages PG8 and PG9 of the fourth area CR4 (3.56 kB) for example. On the other hand, the output of data DAT of page PG1 of each of the first area CR1, the second area CR2, and the third area CR3 is omitted. The page size of the uppermost data is 1.78 kB (CR4: PG1)+3.56 kB (CR1:PG8 and PG9)+3.56 kB (CR2: PG8 and PG9)+3.56 kB (CR3:PG8 and PG9)+3.56 kB (CR4:PG8 and PG9)=16.02 kB.

(Combinations of Read Pages)

Figures 92, 93:
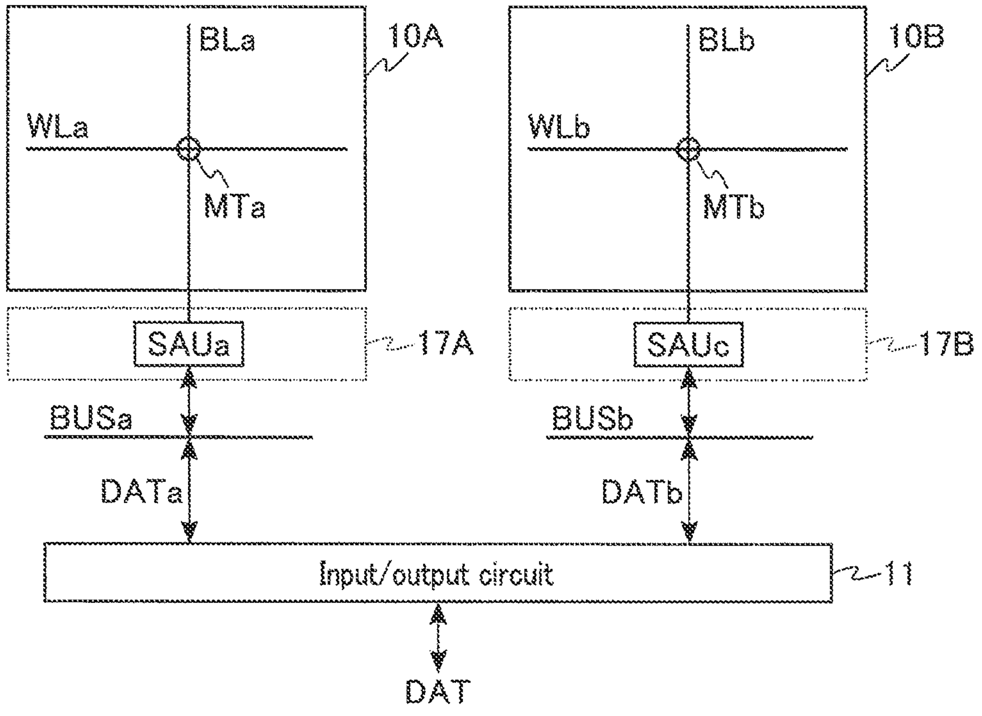
FIG. 92 is a table showing an example of combinations of read pages used in a read operation in the semiconductor memory device according to the ninth embodiment.
FIG. 93 is a circuit diagram showing an example of couplings used in coding in the semiconductor memory device according to a 10th embodiment.

FIG. 92 shows combinations of read pages that are output in each page-read operation in the semiconductor memory device 1 according to the ninth embodiment. Combinations of the read pages shown in FIG. 92 are listed below.

The lower-page data includes three pages (PG1, PG2, and PG3) of the first area CR1, two pages (PG2 and PG3) of the second area CR2, two pages (PG2 and PG3) of the third area CR3, and two pages (PG2 and PG3) of the fourth area CR4.

The middle-page data includes two pages (PG4 and PG5) of the first area CR1, three pages (PG1, PG4, and PG5) of the second area CR2, two pages (PG2 and PG5) of the third area CR3, and two pages (PG4 and PG5) of the fourth area CR4.

The upper-page data includes two pages (PG6 and PG7) of the first area CR1, two pages (PG6 and PG7) of the second area CR2, three pages (PG1, PG6, and PG7) of the third area CR3, and two pages (PG6 and PG7) of the fourth area CR4.

The uppermost-page data includes two pages (PG8 and PG9) of the first area CR1, two pages (PG8 and PG9) of the second area CR2, two pages (PG8 and PG9) of the third area CR3, and three pages (PG1, PG8, and PG9) of the fourth area CR4.

In other words, in the semiconductor memory device 1 of the ninth embodiment, each of the lower page data, the middle page data, the upper page data, and the uppermost page data includes 9-page data in the first area CR1, the second area CR2, the third area CR3, and the fourth area CR4. As a result, the data sizes of all pages in the ninth embodiment are equalized to about 16 kB.

The order of the data output in a read operation for each page may be changed as needed. The semiconductor memory device 1 in the lower-page read operation may transition to a ready state after each of the data of page PG1 of the first area CR1 is confirmed and then commence outputting of the confirmed data. The semiconductor memory device 1 in the middle-page read operation may transition to a ready state after the data of page PG1 of the second area CR2 is confirmed and then commence outputting of the confirmed data. The semiconductor memory device 1 in the upper-page read operation may transition to a ready state after the data of page PG1 of the third area CR3 is confirmed and then commence outputting of the confirmed data. The semiconductor memory device 1 in the uppermost-page read operation may transition to a ready state after each of the data of page PG1 of the fourth area CR4 is confirmed and then commence outputting of the confirmed data.

[9-3] Advantageous Effects of Ninth Embodiment

As described above, the semiconductor memory device 1 of the ninth embodiment has four storage areas (first area CR1, second area CR2, third area CR3, and fourth area CR4) having approximately the same area size and to which the same coding is applied. In each of the four storage areas, 9 bit/2 cell share coding (D4.5) is applied. Then, the semiconductor memory device 1 of the ninth embodiment forms 4-page data using the four storage areas and the 9 bit/2 cell share coding.

Briefly, in a lower-page read operation, the semiconductor memory device 1 simultaneously performs a read operation for page PG1 of the first area CR1 and a read operation for pages PG2 and PG3 of each of the first area CR1, the second area CR2, the third area CR3, and the fourth area CR4. In a middle-page read operation, the semiconductor memory device 1 simultaneously performs a read operation for page PG1 of the second area CR2 and a read operation for pages PG4 and PG5 of each of the first area CR1, the second area CR2, the third area CR3, and the fourth area CR4. In an upper-page read operation, the semiconductor memory device 1 simultaneously performs a read operation for page PG1 of the third area CR3 and a read operation for pages PG6 and PG7 of each of the first area CR1, the second area CR2, the third area CR3, and the fourth area CR4. In an uppermost-page read operation, the semiconductor memory device 1 simultaneously performs a read operation for page PG1 of the fourth area CR4 and a read operation for pages PG7 and PG8 of each of the first area CR1, the second area CR2, the third area CR3, and the fourth area CR4.

Thus, nine pages formed by 9 bit/2 cell share coding in the first area CR1, nine pages formed by 9 bit/2 cell share coding in the second area CR2, nine pages formed by 9 bit/2 cell share coding in the third area CR3, nine pages formed by 9 bit/2 cell share coding in the fourth area CR4, 36 pages in total, are divided into four groups of nine pages. The four groups of nine pages are respectively allocated to the lower page data, the middle page data, the upper page data, and the uppermost page data.

As a result, the semiconductor memory device 1 of the ninth embodiment can make the page size of each read page uniform when share coding is used. Furthermore, the memory controller 2 that controls the semiconductor memory device 1 of the ninth embodiment can simplify the handling of data, and it is thereby possible to suppress design costs for the memory controller 2.

[10] 10th Embodiment

By devising a way to combine read pages in 2-bit/1-cell coding, the semiconductor memory device 1 of the 10th embodiment having a plurality of planes PL increases the speed of the output of read data in each page-read operation. In the following, differences in the semiconductor memory device 1 between the 10th embodiment and the first to ninth embodiments will be described.

[10-1] Configuration

The semiconductor memory device 1 according to the 10th embodiment includes two memory cell arrays, 10A and 10B, similarly to the first embodiment. 2 bit/1 cell, namely 1-2 coding, which is described in the second embodiment with reference to FIG. 35, is applied to each of the memory cell array 10A and 10B.

FIG. 93 shows an example of couplings used in page data storage in the semiconductor memory device 1 according to the 10th embodiment. As shown in FIG. 93, the memory cell array 10A includes a plurality of memory cell transistors MTa, and the memory cell array 10B includes a plurality of memory cell transistors MTb. The memory cell transistors MTa and MTb are coupled to the word lines WLa and WLb, respectively. The memory cell transistors MTa and MTb are coupled to the bit lines BLa and BLb, respectively.

Data stored in the memory cell transistor MTa is read by a sense amplifier unit SAUa included in the sense amplifier module 17A and transferred to the input/output circuit 11 via the data bus BUSa. Data DATb stored in the memory cell transistor MTb is read by a sense amplifier unit SAUb included in the sense amplifier module 17B and transferred to the input/output circuit 11 via the data bus BUSb. The input/output circuit 11 outputs data read from the memory cell transistors MTa and data DATb read from the memory cell transistors MTb to the memory controller 2 as read data DAT.

The rest of the configuration of the semiconductor memory device 1 according to the 10th embodiment is the same as that of the first embodiment. In the present example, 4 k memory cell transistors MTa are coupled to a word line WLa, and 4 k memory cell transistors MTb are coupled to a word line WLb. The data buses BUSa and BUSb are not necessarily separated. If it is possible to perform the operations described in the 10th embodiment, the data buses may be shared as needed. In the 10th embodiment, it is preferable that the number of planes PL included in the semiconductor memory device 1 be an odd number. For example, it suffices that the planes PL corresponding to the memory cell array 10A and the planes PL corresponding to the memory cell array 10B are provided in the same number.

[10-2] Read Operation

The semiconductor memory device 1 of the 10th embodiment performs a combination of an upper-page read operation on the memory cell array 10A and a lower-page read operation on the memory cell array 10B, and performs a combination of a lower-page read operation on the memory cell array 10A and an upper-page read operation on the memory cell array 10B.

In the 10th embodiment, a combination of an upper-page read operation on the memory cell array 10A and a lower-page read operation on the memory cell array 10B will be called a "lower-page read operation", and a combination of a lower-page read operation on the memory cell array 10A and an upper-page read operation on the memory cell array 10B will be called an "upper-page read operation". Hereinafter, a read operation in the semiconductor memory device 1 according to the 10th embodiment will be described below, in order of a lower-page read operation and an upper-page read operation.

(Lower-Page Read Operation)

Figure 94:
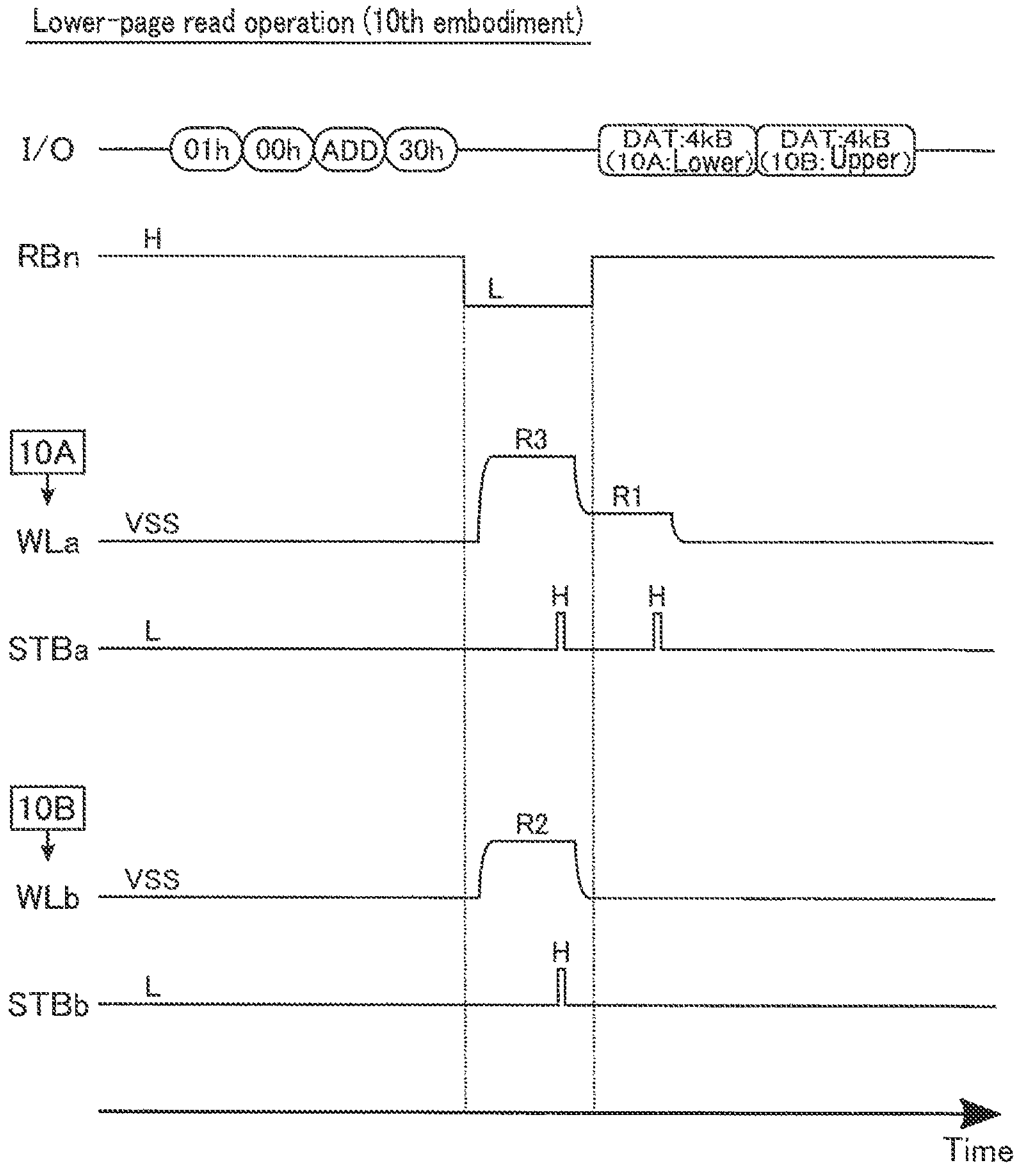
FIG. 94 is a timing chart showing an example of a lower page read operation in the semiconductor memory device according to the 10th embodiment.

FIG. 94 shows a timing chart of the lower-page read operation in the semiconductor memory device 1 according to the 10th embodiment. FIG. 94 shows an input/output signal I/O, a ready/busy signal RBn, voltages of the word lines WLa and WLb, and control signals STBa and STBb. An initial state before the semiconductor memory device 1 of the 10th embodiment commences a read operation is the same as that in the first embodiment.

As shown in FIG. 94, the command sequence of the lower-page read operation is the same as that in the PG1 read operation described in the first embodiment, for example. When the command "30h" is stored in the command register 12, the sequencer 14 changes a ready state of the semiconductor memory device 1 to a busy state and commences a lower-page read operation. In the lower-page read operation, the sequencer 14 simultaneously commences a read operation on the memory cell array 10A and a read operation on the memory cell array 10B and performs those operations in parallel.

In a read operation on the memory cell array 10A, the read voltages R3 and R1 are applied to a selected word line WLa in this order. In a read operation on the memory cell array 10B, the read voltage R2 is applied to a selected word line WLb in this order. The application of the read voltage R3 to the word line WLa and the application of the voltage R2 to the word line WLb are performed in parallel. While the read voltage R1 is being applied to the word line WLa, the voltage applied to the word line WLb is lowered.

In the 1-2 coding used in the 10th embodiment, the lower-page read data is confirmed by a result of a read operation using the read voltage R2, and the upper-page read data is confirmed by a result of a read operation using the read voltages R1 and R3. Thus, in the lower-page read operation, the timing of confirming the read data in the memory cell array 10B is earlier than that in memory cell array 10A.

For this reason, the semiconductor memory device 1 of the 10th embodiment transitions from a busy state to a ready state while the read voltage R1 is being applied to the word line WLa and outputs lower-page data (4 kB) of the memory cell array 10B. Thereafter, upon completion of the read operation using the read voltage R1 on the word line WLa, the semiconductor memory device 1 outputs upper-page data (4 kB) of the memory cell array 10A.

(Upper-Page Read Operation)

Figure 95:
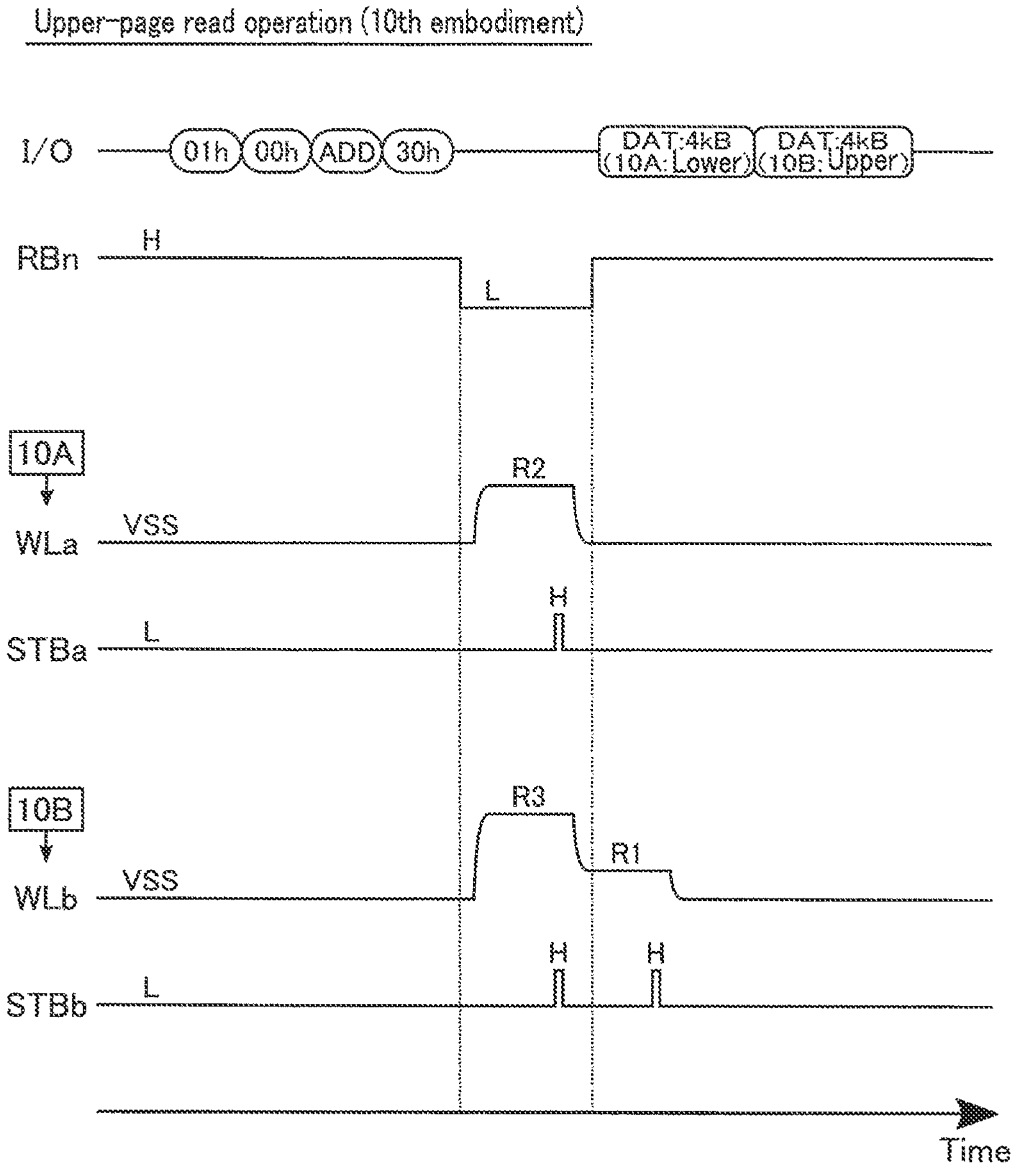
FIG. 95 is a timing chart showing an example of an upper page read operation in the semiconductor memory device according to the 10th embodiment.

FIG. 95 shows an example of a timing chart of the upper-page read operation in the semiconductor memory device 1 according to the 10th embodiment. As shown in FIG. 95, the command sequence of the upper-page read operation is the same as that in the PG2 read operation described in the first embodiment, for example. When the command "30h" is stored in the command register 12, the sequencer 14 changes a ready state of the semiconductor memory device 1 to a busy state and commences an upper-page read operation.

The upper-page read operation in the 10th embodiment is the same as the lower-page read operation but the operations on the memory cell arrays 10A and 10B are interchanged. The semiconductor memory device 1 transitions from a busy state to a ready state while the read voltage R1 is being applied to the word line WLb and outputs lower-page data (4 kB) of the memory cell array 10A. Thereafter, upon completion of the read operation using the read voltage R1 on the word line WLb, the semiconductor memory device 1 outputs upper page data (4 kB) of the memory cell array 10B.

The semiconductor memory device 1 of the 10th embodiment, in either the lower-page read operation or the upper-page read operation, may once again transition from a ready state to a busy state if a read operation on one memory cell array 10 has not been completed at the timing when the data output is completed in the other memory cell array 10. In this case, in response to the completion of the read operation in the other memory cell array 10, the semiconductor memory device 1 once again transitions from a busy state to a ready state and outputs the data of this memory cell array 10.

[10-3] Advantageous Effects of 10th Embodiment

As described above, the semiconductor memory device 1 of the 10th embodiment includes two memory cell arrays 10A and 10B to which 2 bit/1 cell coding, namely 1-2 coding, is applied. Furthermore, in a read operation performed in each page, two memory cell transistors MT coupled to different word lines WL are combined.

Specifically, in the lower-page read operation, the upper-bit data of the memory cell array 10A and the lower-bit data of the memory cell array 10B are read. In the upper-page read operation, lower-bit data of the memory cell array 10A and upper-bit data of the memory cell array 10B are read. Thus, each page includes lower-bit data that can be confirmed by an application of a single read voltage.

Thus, the semiconductor memory device 1 of the 10th embodiment can output half of the data of each page after a 1-level read operation is completed. Furthermore, the semiconductor memory device 1 of the 10th embodiment can proceed with two-level read operation while outputting the half of the data and can hide a part of the time required for the 2-level read operation. As a result, the semiconductor memory device 1 according to the 10th embodiment can make a latency of a read operation in each page uniform and can suppress delay in the latency.

[11] 11th Embodiment

In the semiconductor memory device 1 according to the 11th embodiment, first and second storage areas to which different types of 7 bit/2 cell share coding are respectively applied and a third storage area to which conventional coding is applied are combined so as to make the page sizes of the read pages uniform. In the following, differences in the semiconductor memory device 1 between the 11th embodiment and the first to 10th embodiments will be described.

[11-1] Configuration

The semiconductor memory device 1 according to the 11th embodiment has a configuration that includes only a single plane PL, similarly to the third embodiment. The semiconductor memory device 1 of the 11th embodiment may include a plurality of planes PL. The configuration and operations described below may be applied to each of a plurality of planes PL. Hereinafter, matters regarding the data storage method in the semiconductor memory device 1 according to the 11th embodiment will be described.

(Layout of Storage Areas)

Figure 96:
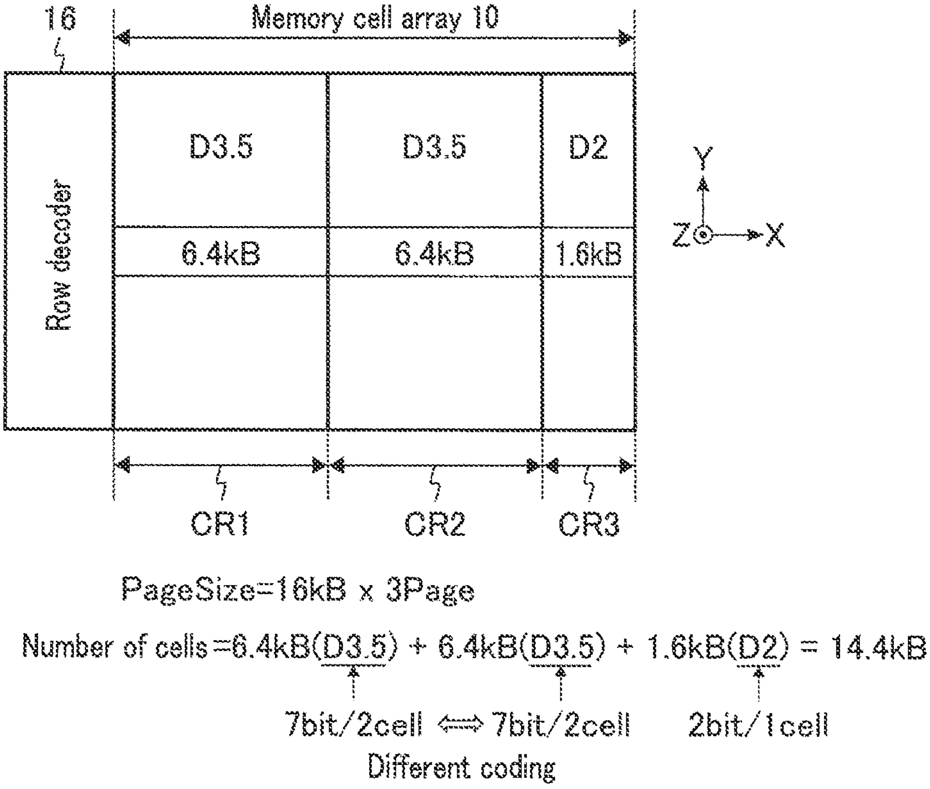
FIG. 96 is a block diagram showing an example of a configuration of a memory cell array included in the semiconductor memory device according to an 11th embodiment.

FIG. 96 shows an example of a layout of the storage areas of the memory cell array 10 included in the semiconductor memory device 1 according to the 11th embodiment. As shown in FIG. 96, the memory cell array 10 of the 11th embodiment includes a first area CR1, a second area CR2, and a third area CR3 arranged in the X direction. The row decoder module 16 is provided on, for example, the first area CR1 side, and controls the memory cell transistors MT using the word lines WL shared among the first area CR1, the second area CR2, and the third area CR3.

The storage methods adopted in the first area CR1, the second area CR2, and the third area CR3 are different. For example, the 7 bit/2 cell share coding (D3.5) described in the fourth embodiment with reference to FIG. 59 is applied to the first area CR1. For this reason, 7 bit/2 cell share coding differing from that applied to the first area CR1 is applied to the second area CR2. 2 bit/1 cell share coding (D2) is applied to the third area CR3.

For example, a single word line WL is coupled to at least 6.4 k memory cell transistors MT in the first area CR1 (the number of cells=6.4 kB), at least 6.4 k memory cell transistors MT in the second area CR2 (the number of cells=6.4 kB), and at least 1.6 k memory cell transistors MT in the third area CR3 (the number of cells=1.6 kB). Thus, in the semiconductor memory device 1 of the 11th embodiment, 3-page data is stored in a single cell unit CU, and a size of each page of 3-page data is made uniform to be 16 kB.

(Circuit Configuration Relating to Share Coding)

Figures 97, 98:
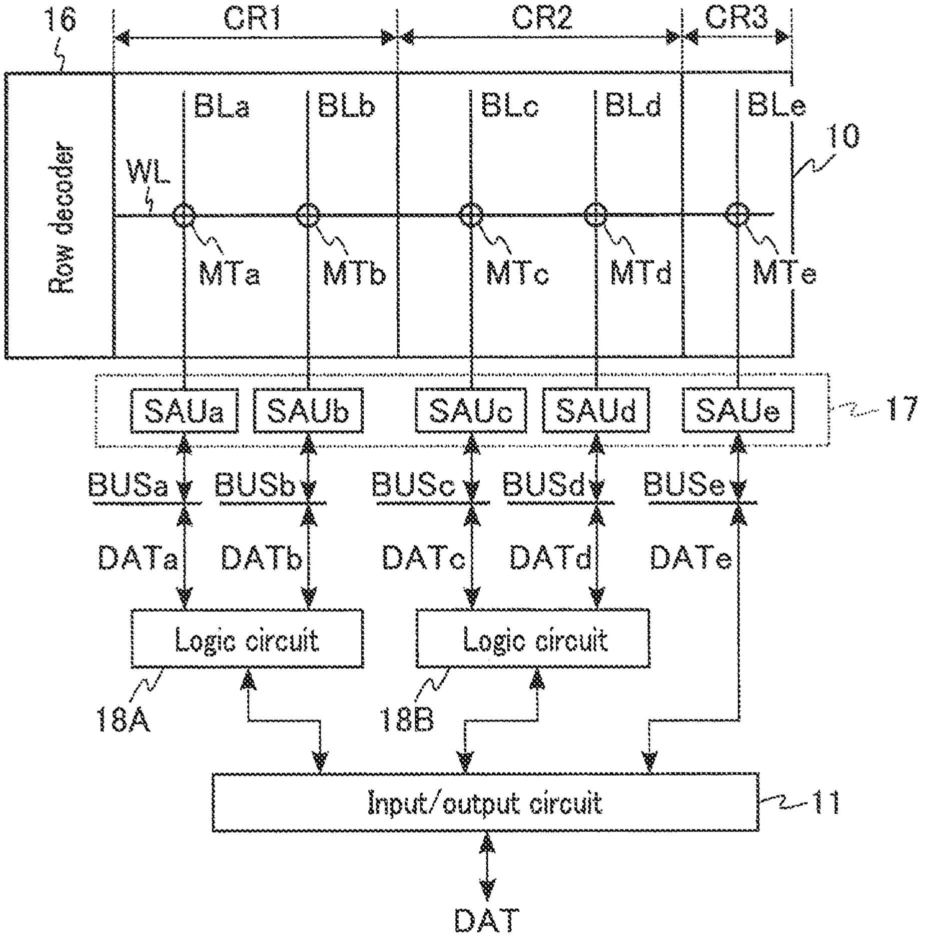
FIG. 97 is a circuit diagram showing an example of couplings used in page data storage in the semiconductor memory device according to the 11th embodiment.
FIG. 98 is a table showing an example of share coding used in a second area of a memory cell array included in the semiconductor memory device according to the 11th embodiment.

FIG. 97 shows an example of couplings used in page data storage in the semiconductor memory device 1 according to the 11th embodiment. As shown in FIG. 97, the semiconductor memory device 1 according to the 11th embodiment includes two logic circuits 18A and 18B. The logic circuit 18A performs calculating relating to the 7 bit/2 cell share coding explained in the fourth embodiment. The logic circuit 18B performs calculating relating to the 7 bit/2 cell share coding which will be described later.

In the 11th embodiment, the first area CR1 includes a plurality of memory cell transistors MTa and a plurality of memory cell transistors MTb. The second area CR2 includes a plurality of memory cell transistors MTc and a plurality of memory cell transistors MTd. The third area CR3 includes a plurality of memory cell transistors MTe. The memory cell transistors MTa and MTb in the first area CR1, the memory cell transistors MTc and MTd in the second area CR2, and the memory cell transistors MTe in the third area CR3 share the word lines WL. The memory cell transistors MTa, MTb, MTc, MTd, and MTe are coupled to the bit lines BLa, BLb, BLc, BLd, and BLe, respectively.

The couplings relating to the combinations of the memory cell transistors MTa and MTb and the couplings relating to the combinations of the memory cell transistors MTc and MTd are the same as those in the sixth embodiment. Data DATe stored in the memory cell transistor MTe is read by a sense amplifier unit SAUe included in the sense amplifier module 17 and transferred to the input/output circuit 11 via the data bus BUSe.

The foregoing descriptions describe the case where the semiconductor memory device 1 includes two logic circuits 18A and 18B; however, the embodiment is not limited thereto. For example, calculating in each of the first area CR1 and the second area CR2 may be performed by a single logic circuit 18. The circuit area 18 has a portion shared by the areas CR portions provided for each area CR. The data buses BUSa, BUSb, BUSc, BUSd, and BUSe are not necessarily separated. If it is possible to perform the operations described in the 11th embodiment, the data buses may be shared as needed.

(Details of Share Coding Used in Second Area CR2)

A threshold voltage of each of the memory cell transistors MTc and MTd in the second area CR2 may be included in one of 12 states shown in FIG. 58. In other words, in the second area CR2 of the 11th embodiment, there are 144 combinations made up of 12 states applicable to the memory cell transistor MTc and 12 states applicable to the memory cell transistor MTd. Different 7-bit data is allocated to each of 144 combinations in the semiconductor memory device 1 of the 11th embodiment. For this reason, the same 7-bit data may be allocated to some of the combinations.

FIG. 98 shows an example of share coding used in the second area CR2 of the memory cell array 10 included in the semiconductor memory device 1 according to the 11th embodiment. In the second area CR2 in the 11th embodiment, decoding rules and read voltages are set for each page, as shown in FIG. 98 and in the following.

(Example) Read page: decoding rules [a,b,c,d], read voltages to be used [read voltages set for MTc/read voltages set for MTd]

PG1:[0111], [R8/R8]
PG2:[0100], [R8/(R1,R3,R6)]
PG3:[0110], [(R1,R3,R6)/R8]
PG4:[0011], [(R4,R9,R11)/–]
PG5:[0101], [–/(R4,R9,R11)]
PG6:[0011], [(R2,R5,R7,R10)/–]
PG7:[0101], [–/(R2,R5,R7,R10)]

In the share coding used in the second area CR2 of the 11th embodiment, the number of read operations performed in each of PG1, PG2, PG3, PG4, PG5, PG6, PG7 is one, four, four, three, three, four, and three. In other words, in the semiconductor memory device 1 of the 11th embodiment, the share coding used in the second area CR2 corresponds to 1-4-4-3-3-4-4 coding, similarly to the first area CR1.

The share coding used in the second area CR2 has a certain relationship with the share coding used in the first area CR1. For example, the plurality of read voltages allocated to pages PG1 to PG3 of the share coding used in the first area CR1 include the plurality of read voltages allocated to pages PG4 and pG5 of the share coding used in the second area CR2. The plurality of read voltages allocated to pages PG1 to PG3 of the share coding used in the second area CR2 include the plurality of read voltages allocated to pages PG4 and PG5 of the share coding used in the first area CR1. The plurality of read voltages allocated to pages PG6 and PG7 of the share coding used in the first area CR1 are the same as those used in the second area CR2.

(Details of Share Coding Used in Third Area CR3)

Figure 99:
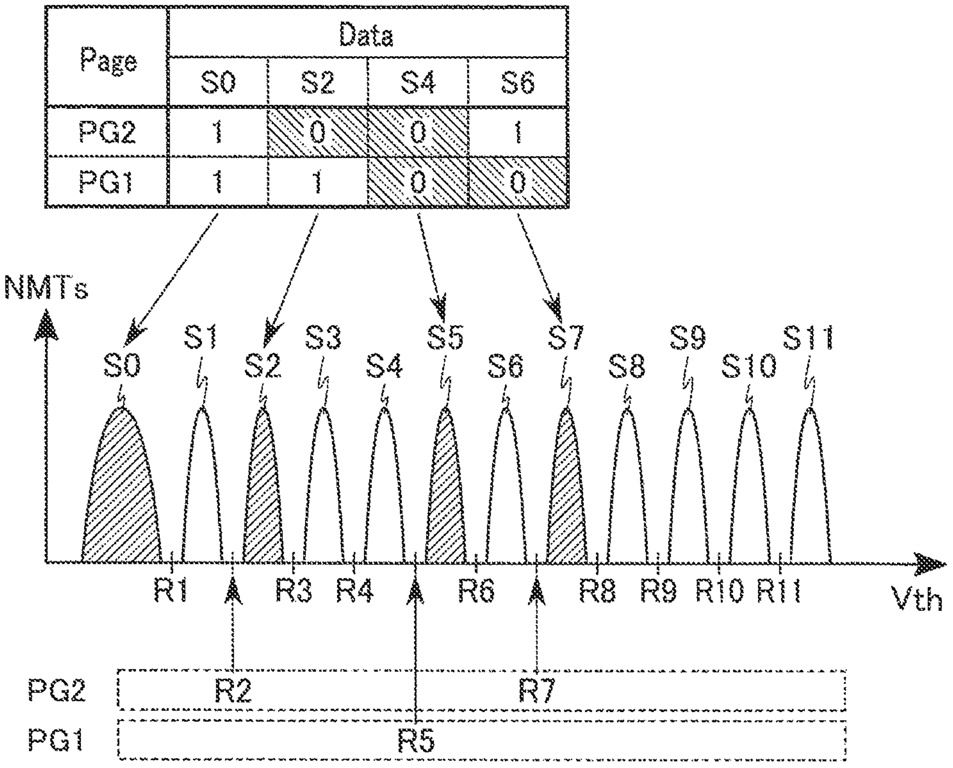
FIG. 99 is a schematic diagram showing an example of an allocation of coding and data used in a third area of a memory cell array included in the semiconductor memory device according to the 11th embodiment.

FIG. 99 is a table showing an example of coding used in the third area CR3 of the memory cell array 10 included in the semiconductor memory device 1 according to the 11th embodiment. As shown in FIG. 99, in the third area CR3 of the 11th embodiment, 2-bit data is allocated to some of the 12 states used in the first area CR1 and the second area CR2.

In the example, “11 (first bit/second bit)” data is allocated to the “S0” state. “10” data is allocated to the “S2” state. “00” data is allocated to the “S5” state. “01” data is allocated to the “S7” state.

In a read operation for page PG1 including a first bit, the read voltage R5 is used. In a read operation for page PG2 including a second bit, the read voltages R2 and R7 are used. Thus, in this example, 2 bit/1 cell coding, namely 1-2 coding, is used in the third area CR3. The rest of the configuration of the semiconductor memory device 1 according to the 11th embodiment is the same as that of the fourth embodiment.

The data allocation in the third area CR3 is not limited to the above-described data allocation. Any type of 2 bit/1 cell coding may be used in the third area CR3, as long as the coding uses the read voltages used in a PG6&PG7 read operation performed in the first area CR1 and the second area CR2. Specifically, the 2 bit/1 cell coding in this example is sufficient if three of the read voltages R2, R5, R7, and R10 are used.

[11-2] Read Operation

Figure 100:
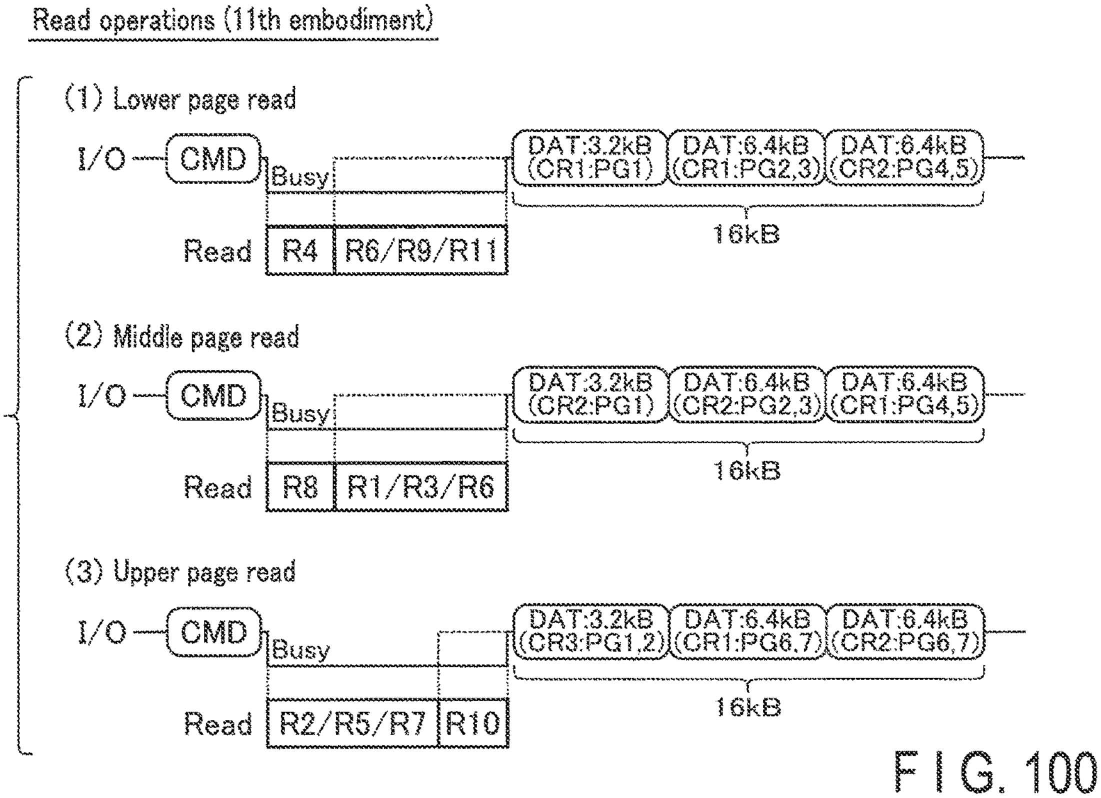
FIG. 100 is a schematic diagram showing an example of a flow of a read operation for each page in the semiconductor memory device according to the 11th embodiment.

FIG. 100 shows an example of a flow of a read operation for each page in the semiconductor memory device 1 according to the 11th embodiment. As shown in FIG. 100, the semiconductor memory device 1 according to the 11th embodiment is capable of performing a read operation for each page of three-page data based on an instruction from the memory controller 2. FIGS. 100(1) through (3) correspond to a lower-page read operation, a middle-page read operation, and an upper-page read operation, respectively. In the following, details of a read operation for each page in the 11th embodiment are explained.

(Lower-Page Read Operation)

The lower-page data corresponds to a combination of pages PG1 to PG3 of the first area CR1 and pages PG4 and PG5 of the second area CR2. As shown in FIG. 100 (1), upon receipt of a command set CMD that instructs a lower-page read operation from the memory controller 2, the semiconductor memory device 1 transitions from a ready state to a busy state and performs a lower-page read operation.

In the lower-page read operation, for example the read voltages R4, R6, R9, and R11 are sequentially applied to a selected word line WL. When a read operation using the read voltage R4 is completed, data of page PG1 in the first area CR1 is confirmed. When a read operation using the read voltages R6, R9, and R11 is completed, data of pages PG2 and PG3 in the first area CR1 and data of pages PG4 and PG5 in the second area CR2 are confirmed.

After the read operations using the read voltages R4, R6, R9, and R11 are completed, the semiconductor memory device 1 transitions from a busy state to a ready state and commences outputting data DAT. In a lower-page read operation, data DAT is output in order of page PG1 of the first area CR1 (3.2 kB), pages PG2 and PG3 of the first area CR1 (6.4 kB), and pages PG4 and PG5 of the second area CR2 (6.4 kB), for example. The page size of the lower page data is 3.2 kB (CR2:PG1)+6.4 kB (CR1:PG2 and PG3)+6.4 kB (CR2:PG4 and PG5)=16 kB.

(Middle-Page Read Operation)

The upper-page data corresponds to a combination of pages PG1 to PG3 of the second area CR2, and pages PG4 and PG5 of the first area CR1. As shown in FIG. 100 (2), upon receipt of a command set CMD that instructs a middle-page read operation from the memory controller 2, the semiconductor memory device 1 transitions from a ready state to a busy state and performs a middle-page read operation.

In the middle-page read operation, for example the read voltages R8, R1, R3, and R6 are sequentially applied to a selected word line WL. When a read operation using the read voltage R8 is completed, data of page PG1 in the second area CR2 is confirmed. When a read operation using the read voltages R1, R3, and R6 is completed, data in pages PG2 and PG3 of the second area CR2 and data in pages PG4 and PG5 in the first area CR1 are confirmed.

After the read operations using the read voltages R8, R1, R3, and R6 are completed, the semiconductor memory device 1 transitions from a busy state to a ready state and commences outputting data DAT. In a middle-page read operation, data DAT is output in order of page PG1 of the second area CR2 (3.2 kB), pages PG2 and PG3 of the second area CR2 (6.4 kB), and then pages PG4 and PG5 of the first area CR1 (6.4 kB), for example. The page size of the middle page data is 3.2 kB (CR2:PG1)+6.4 kB (CR2:PG2 and PG3)+6.4 kB (CR1:PG4 and PG5)=16 kB.

(Upper-Page Read Operation)

The upper-page data corresponds to a combination of pages PG1 and PG2 of the third area CR3 and pages PG6 and PG7 of each of the first area CR1 and the second area CR2. As shown in FIG. 100 (3), upon receipt of a command set CMD that instructs an upper-page read operation from the memory controller 2, the semiconductor memory device 1 transitions from a ready state to a busy state and performs an upper-page read operation.

In the upper-page read operation, for example the read voltages R2, R5, R7, and R10 are sequentially applied to a selected word line WL. When a read operation using the read voltages R2, R5, and R7 is completed, data of pages PG1 and PG2 in the third area CR3 is confirmed. When a read operation using the read voltage R10 is completed, data of pages PG6 and PG7 in each of the first area CR1 and the second area CR2 is confirmed.

After the read operations using the read voltages R2, R5, R7, and R10 are completed, the semiconductor memory device 1 transitions from a busy state to a ready state and commences outputting data DAT. In an upper-page read operation, data DAT is output in order of pages PG1 and PG2 of the third area CR3 (3.2 kB), pages PG6 and PG7 of the first area CR1 (6.4 kB), and then pages PG6 and PG7 of the second area CR2 (6.4 kB), for example. The page size of the upper page data is 3.2 kB (CR3:PG1 and PG2)+6.4 kB (CR1:PG6 and PG7)+6.4 kB (CR2:PG6 and PG7)=16 kB.

Thus, the data sizes of all pages in the 11th embodiment are equalized to 16 kB. The order of the data output in a read operation for each page may be changed as needed. The semiconductor memory device 1 in the lower-page read operation may transition to a ready state after the data of page PG1 of the first area CR1 is confirmed and then commence outputting of the confirmed data. The semiconductor memory device 1 in the middle-page read operation may transition to a ready state after the data of page PG1 of the second area CR2 is confirmed and then commence outputting of the confirmed data. The semiconductor memory device 1 in the upper-page read operation may transition to a ready state after the data of at least one of page PG1 or PG2 of the third area CR3 is confirmed and then commence outputting of the confirmed data.

[11-3] Advantageous Effects of 11th Embodiment

As described above, the semiconductor memory device 1 of the 11th embodiment has three storage areas (first area CR1, second area CR2, third area CR3) using different types of coding. Specifically, the first area CR1 and the second area CR2 are used as main storage areas, and different types of 7 bit/2 cell share coding are applied to the first area CR1 and the second area CR2. The third area CR3 is used as a sub-storage area, and 2 bit/1 cell coding is applied to the third area CR3.

Then, in a lower-page read operation, the semiconductor memory device 1 of the 11th embodiment simultaneously performs a read operation for pages PG1, PG2, and PG3 of the first area CR1 and a read operation for pages PG4 and PG5 of the second area CR2. In an upper-page read operation, the semiconductor memory device 1 simultaneously performs a read operation for pages PG1, PG2, and PG3 of the second area CR2 and a read operation for pages PG4 and PG5 of the first area CR1. In an upper-page read operation, the semiconductor memory device 1 simultaneously performs a read operation for pages PG1 and PG2 of the third area CR3 and a read operation for pages PG6 and PG7 of each of the first area CR1 and the second area CR2.

The page size of the upper memory-page data is 16 kB, which is the same as the data size of the other pages, if a plurality of memory cell transistors MT arranged in the third area CR3 have the same storage capacity as page PG1 of the first area CR1 or the second area CR2. As a result, the semiconductor memory device 1 of the 11th embodiment can make the page size of each read page uniform when share coding is used, similarly to the fourth embodiment.

Furthermore, in the semiconductor memory device 1 of the 11th embodiment, the number of read operations performed per page is (4+4+4)/3=4. On the other hand, in the eighth embodiment wherein the page sizes are made uniform through the use of 7 bit/2 cell share coding in multiple areas, the number of read operations performed per page is (4+4+5)/4=4.4. Thus, the semiconductor memory device 1 of the first embodiment can further reduce the number of read operations performed in each page compared to the eighth embodiment, and can increase the speed of the read operation in each page.

For this reason, in the semiconductor memory device 1 of the 11th embodiment, the third area CR3 to which 2 bit/1 cell coding is applied is arranged in an area which is further from the row decoder module 16 than the first area CR1 is, similarly to the third embodiment. For this reason, the arrangement of the areas CR described in the 11th embodiment can suppress the occurrence of error bits caused by delays in voltage changes in the word line WL, similarly to the third embodiment.

[12] 12th Embodiment

The semiconductor memory device 1 of the 12th embodiment relates to a circuit configuration in the case where share coding is used when the word lines WL are shared. In the following, differences in the semiconductor memory device 1 between the 12th embodiment and the first to 11th embodiments will be described.

[12-1] Configuration

Figure 101:
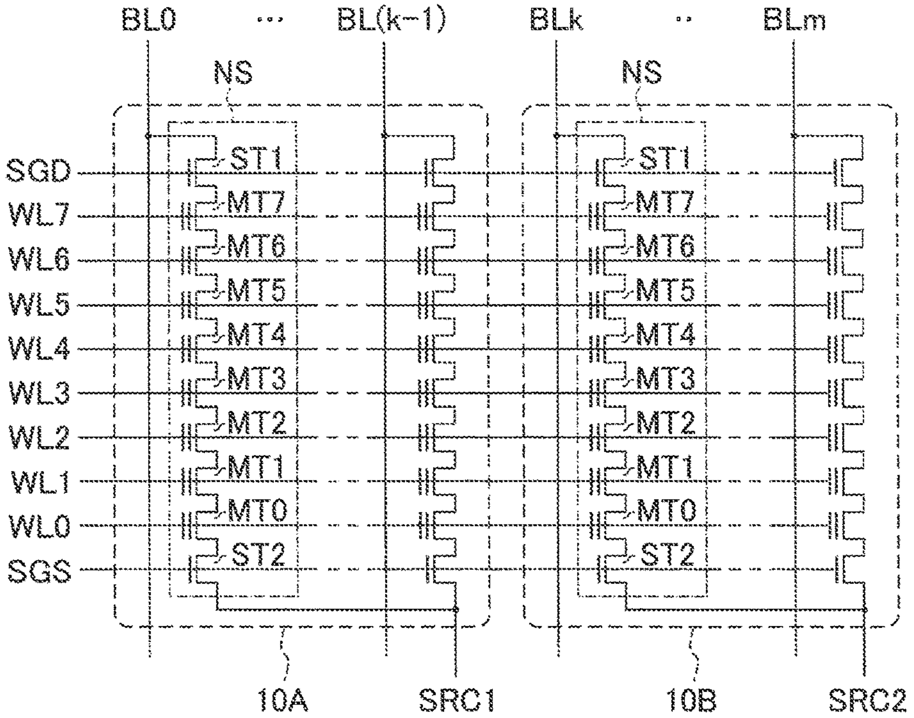
FIG. 101 is a circuit diagram showing an example of a circuit configuration of a memory cell array included in the semiconductor memory device according to the 12th embodiment.

FIG. 101 shows an example of the circuit configuration of the memory cell array 10 included in the semiconductor memory device 1 according to the 12th embodiment. As shown in FIG. 101, the semiconductor memory device 1 according to the 12th embodiment includes memory cell arrays 10A and 10B. FIG. 101 shows a circuit configuration of a single string unit SU in each memory cell array 10. The memory cell array 10A is coupled to bit lines BL0 through BL(k−1), and the memory cell array 10B is coupled to bit lines BLk through BLm.

The memory cell arrays 10A and 10B share the word lines WL. Specifically, a plurality of word lines WL associated with the same block BLK in the memory cell arrays 10A and 10B are coupled to the memory cell arrays 10A and 10B, respectively. Similarly, the select gate lines SGD and SGS associated with the same block BLK in the memory cell arrays 10A and 10B are coupled to the memory cell arrays 10A and 10B, respectively. With this configuration, voltages are applied to the word lines WL, etc. of the memory cell arrays 10A and 10B by a shared row decoder module 16.

Furthermore, source lines are independently provided in the memory cell arrays 10A and 10B. Specifically, a plurality of NAND strings NS included in the memory cell array 10A is coupled to a source line SRC1. A plurality of NAND strings NS included in the memory cell array 10B is coupled to a source line SRC2. The driver circuit 15 is capable of applying different voltages to the source lines SRC1 and SRC2. In other words, the driver circuit 15 can control the source line voltages in each of the memory cell arrays 10A and 10B separately. The rest of the configuration of the semiconductor memory device 1 according to the 12th embodiment is the same as that of the second embodiment.

[12-2] Read Operation

Figure 102:
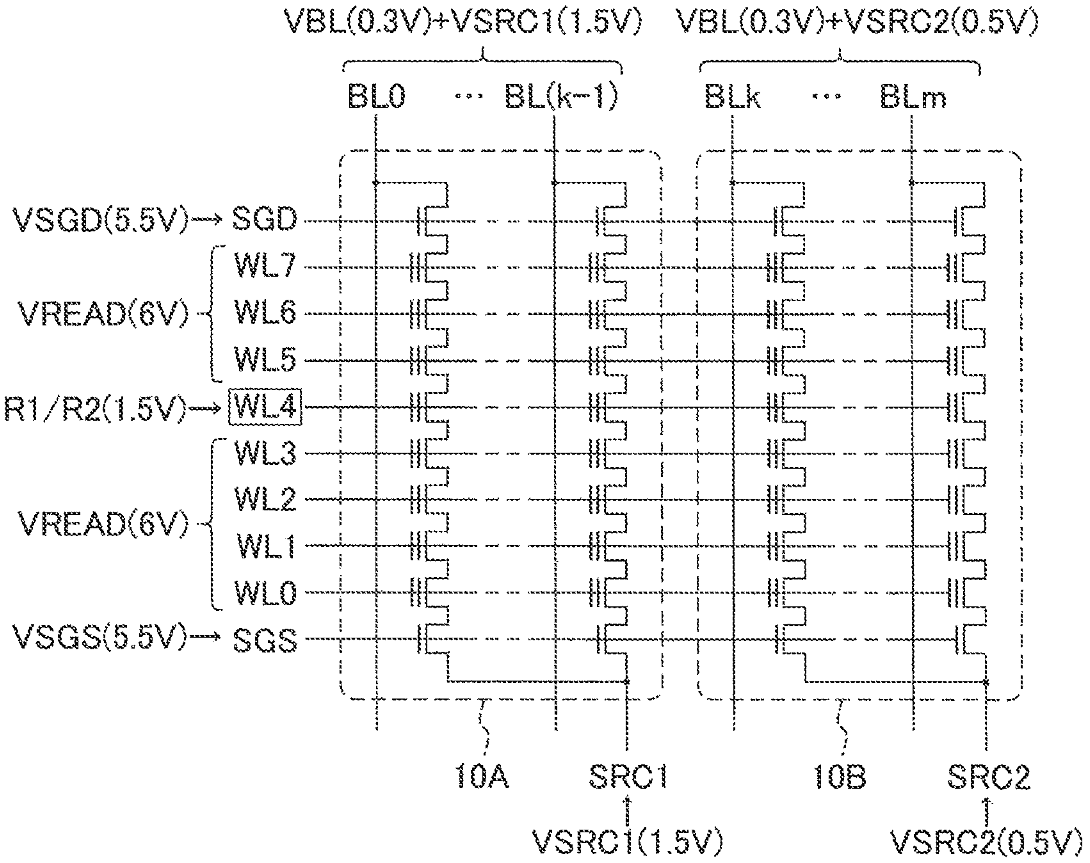
FIG. 102 is a schematic diagram showing an example of voltages applied during a read operation in the semiconductor memory device according to the 12th embodiment.

FIG. 102 shows an example of voltages applied during a read operation in the semiconductor memory device 1 according to the 12th embodiment, and displays the voltages applied to the circuit configuration shown in FIG. 101. Hereinafter, the operations in the case where the word line WL4 is selected in the PG1&PG2 read operation described in the second embodiment will be described. In the following descriptions, the values of the voltages applied to the lines are merely examples.

As shown in FIG. 102, the voltage VSGD (5.5 V) is applied to the select gate line SGD. The voltage VSGS (5.5 V) is applied to the select gate line SGS. The read voltage R1/R2 (1.5 V) is applied to the selected word line WL4. The read pass voltage VREAD (6 V) is applied to the non-selected word lines WL.

The voltages applied to the bit lines BL and the source lines SRC1 and SRC2 are different between the memory cell arrays 10A and 10B. Specifically, the voltages VBL (0.3 V)+VSRC1 (1.5 V) are applied to the bit lines BL of the memory cell array 10A. The voltages VBL (0.3 V)+VSRC2 (0.5 V) are applied to the bit lines BL of the memory cell array 10B. The voltage VSRC1 (1.5 V) is applied to the source line SRC1 of the memory cell array 10A. The voltage VSRC2 (0.5 V) is applied to the source SRC2 of the memory cell array 10B.

The voltage VSGD applied to the select gate line SGD is set at a voltage that turns on the select transistor ST1 in the memory cell array 10A and the select transistor ST1 in the memory cell array 10B. The voltage VSGS applied to the select gate line SGS is set at a voltage that turns on the select transistor ST2 in the memory cell array 10A and the select transistor ST2 in the memory cell array 10B. The voltage VREAD applied to non-selected word lines WL is set at a voltage that turns on the memory cell transistors MT in the memory cell array 10A and the memory cell transistors MT in the memory cell array 10B. Thus, the conditions of the current supplied to the NAND strings NS of the memory cell array 10A, and the conditions of the current supplied to the NAND strings NS of the memory cell array 10B become the same.

The voltage that is a sum of VSRC1 and VBL is applied to the bit lines BL of the memory cell array 10A, and the voltage that is a sum of VSRC2 and VBL is applied to the bit lines BL of the memory cell array 10B. In other words, the voltage difference between the bit lines BL and the source line SRC1 in the NAND string NS of the memory cell array 10A and the voltage difference between the bit lines BL and the source line SRC2 in the NAND string NS of the memory cell array 10B are equally set.

When the voltages are thus applied to the lines, the voltages applied to the selected word line WL4 and the voltage difference between the channels of the NAND string NS differ between the memory cell arrays 10A and 10B. In other words, a potential difference between the channel and control gate of each memory cell transistor MT is produced based on a voltage difference between the voltage VSRC1 applied to the source SRC1 and the voltage VSRC2 applied to the source line SRC2.

For example, in the memory cell array 10A, the voltage VSRC1 of 1.5 V is applied to the source line SRC1, whereas the voltage VSRC2 of 0.5 V is applied to the source line SRC2 in the memory cell array 10B. This voltage difference between VSRC1 and VSRC2 is set in accordance with the voltage difference between the read voltages R1 and R2. Thus, in a state where a single type of voltage is applied to the selected word line WL4, a voltage corresponding to a read voltage AR is applied in the memory cell array 10A and a voltage corresponding to a read voltage BR is applied in the memory cell array 10B.

As a result, the semiconductor memory device 1 according to the 12th embodiment is capable of performing a PG1&PG2 read operation, which was described in the second embodiment. Furthermore, the semiconductor memory device 1 of the 12th embodiment may change the voltages applied to the source lines SRC1 and SRC2 as appropriate based on share coding settings. In other words, the semiconductor memory device 1 of the 12th embodiment can perform a read operation using the share coding described in the second embodiment in the memory cell arrays 10A and 10B that share the word lines WL.

When the semiconductor memory device 1 of the 12th embodiment performs a write operation, a read operation may be performed as a verify operation through applying different voltages to the source lines and the bit lines coupled to the different memory cell arrays, or through applying the same voltages to the source lines and the bit lines coupled to the different memory cell arrays.

[12-3] Advantageous Effects of 12th Embodiment

Figure 103:
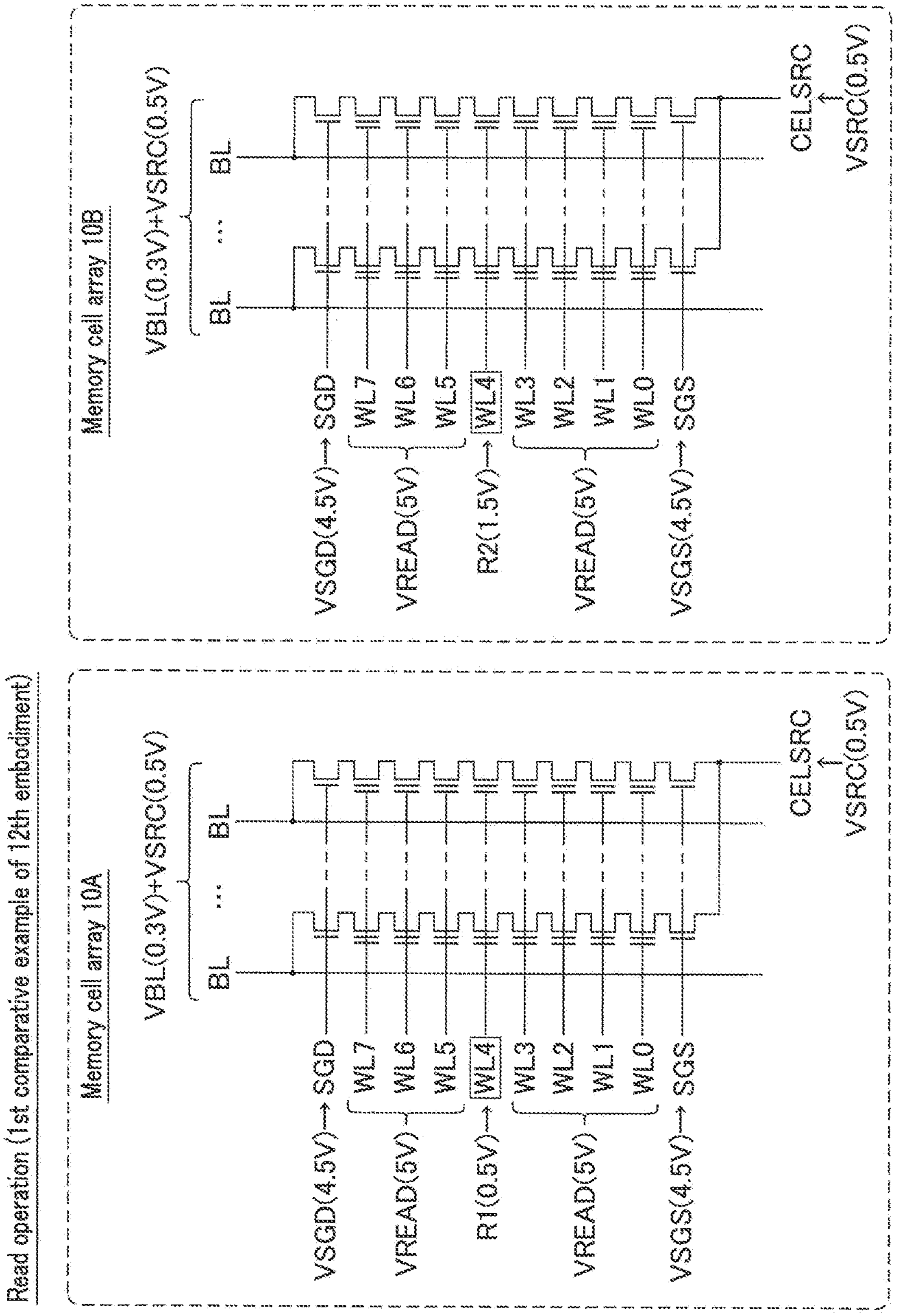
FIG. 103 is a schematic diagram showing an example of voltages applied during a read operation in a first comparative example of the 12th embodiment.
Figure 104:
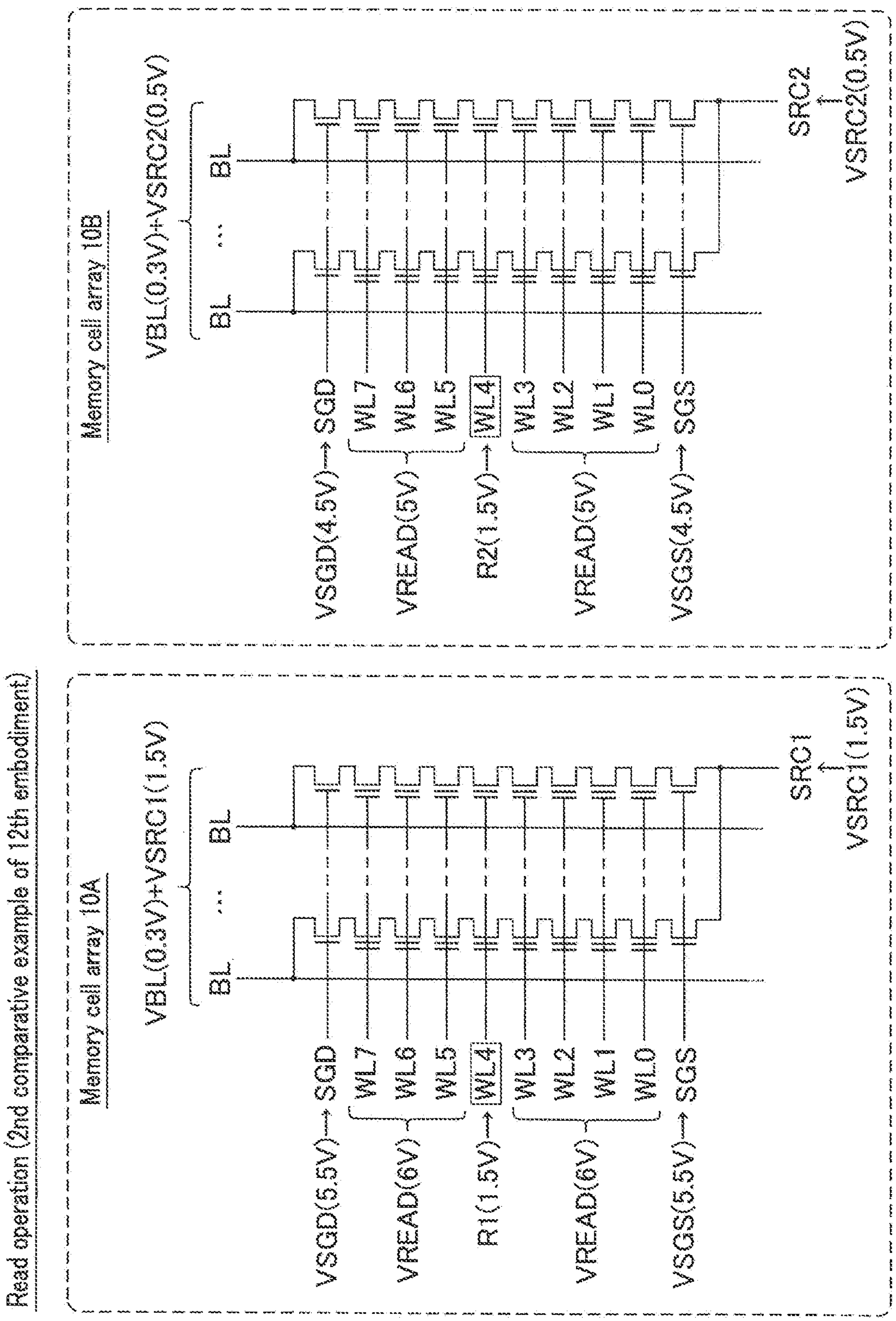
FIG. 104 is a schematic diagram showing an example of voltages applied during a read operation in a second comparative example of the 12th embodiment.

The above described semiconductor memory device 1 according to the 12th embodiment can reduce the chip area size of the semiconductor memory device 1. Hereinafter, advantageous effects of the semiconductor memory device 1 according to the 12th embodiment will be described in detail, using first and second comparative examples of the 12th embodiment. FIGS. 103 and 104 are schematic diagrams each showing an example of voltages applied during a read operation in the first and second comparative examples of the 12th embodiment.

As shown in FIG. 103, the first comparative example of the 12th embodiment has a configuration in which the word lines WL are divided between the memory cell arrays 10A and 10B, similarly to the second embodiment. In this case, in a read operation, the voltages applied to the bit lines BL, the select gate lines SGD and SGS, and non-selected word lines WL are the same between the memory cell arrays 10A and 10B. On the other hand, the read voltages are different between the memory cell arrays 10A and 10B.

For example, in a PG1&PG2 read operation in the first comparative example of the second embodiment, the read voltage AR (0.5 V) is applied to a selected word line WL in the memory cell array 10A, and the read voltage BR (1.5 V) is applied to a selected word line WL in the memory cell array 10B. The read pass voltage VREAD (5 V) is applied to the non-selected word lines WL. The voltage VSGD (4.5V) is applied to the select gate line SGD. The voltage VSGS (4.5V) is applied to the select gate line SGS. The voltage VBL (0.3 V)+VSRC (0.5 V) are applied to the bit lines BL. The voltage VSRC (0.5 V) is applied to the source CELSRC shared between the memory cell arrays 10A and 10B.

Thus, in the first comparative example of the 12th embodiment, data stored in selected memory cell transistors MT can be determined. In the second comparative example of the 12th embodiment on the other hand, the source lines are separated between the memory cell arrays 10A and 10B as shown in FIG. 104. Furthermore, in a read operation in the second comparative example of the 12th embodiment, the voltages applied to the bit lines BL, the source lines, and the selected word line WL are different, unlike the first comparative example of the 12th embodiment.

Specifically, in a PG1&PG2 read operation in the second comparative example of the 12th embodiment, all voltages corresponding to the memory cell array 10A are set to +1 V above the voltages in the first comparative example of the 12th embodiment. This "+1V" corresponds to a voltage difference between the selected word lines WL in the memory cell array 10A and the memory cell array 10B. Thus, in the second comparative example of the 12th embodiment, it is possible to perform a read operation in which the read voltage R1 applied to a word line WL selected in the first memory cell array 10A and the read voltage R2 applied to a word line WL selected in the second memory cell array 10B are set at approximately the same values.

Furthermore, the semiconductor memory device 1 of the 12th embodiment has a configuration in which the word lines WL and the select gate lines SGD and SGS are shared between the memory cell arrays 10A and 10B, as a further application of the second comparative example of the 12th embodiment. In such a case, the semiconductor memory device 1 of the 12th embodiment can perform a read operation using voltages different between the memory cell arrays 10A and 10B. In the 12th embodiment, the voltages applied to the select gate lines SGS and SGD and the non-selected word lines WL are preferably set at such values that at least corresponding transistors are turned on.

As a result, the semiconductor memory device 1 of the 12th embodiment shares the row decoder module 16 used in the memory cell arrays 10A and 10B. Since the memory cell arrays 10A and 10B are provided next to each other, a circuit area of the memory cell array 10 can be reduced. Thus, the semiconductor memory device 1 of the 12th embodiment can reduce a chip area size of the semiconductor memory device 1.

In the read operation described in the 12th embodiment, a channel resistance difference in the NAND strings NS may occur between the memory cell arrays 10A and 10B, as the voltages applied to the selected gate lines SGD and SGS and to non-selected word lines WL are different. Specifically, the channel resistance in the NAND strings NS of one of the memory cell arrays 10 in which high voltages are applied to these interconnects may be lower than the channel resistance in the NAND strings NS of the other memory cell array 10.

To address this phenomenon, the semiconductor memory device 1 of the 12th embodiment may correct the difference in channel resistance of the NAND strings NS by correcting the voltages applied to the bit lines BL in the memory cell arrays 10A and 10B. For example, the semiconductor memory device 1 sets the voltages in such a manner that the voltage applied to the bit line BL coupled to the NAND string NS having a higher channel resistance has a value higher than the voltage of the other bit line BL.

Either the select gate line SGD or the select gate line SGS may be separated between the memory cell arrays 10A and 10B. In this case, the semiconductor memory device 1 can set the voltage of at least one of the select gate lines SGD and SGS at different values between the memory cell arrays 10A and 10B. Thus, the semiconductor memory device 1 can reduce the aforementioned difference in channel resistance of the NAND strings NS.

Furthermore, the configuration and operations described in the 12th embodiment may be applied to a semiconductor memory device 1 that has three or more memory cell arrays 10. In order for the operations described in the 12th embodiment to be performed, at least an independent source line is provided in each of the memory cell arrays 10.

Figure 105:
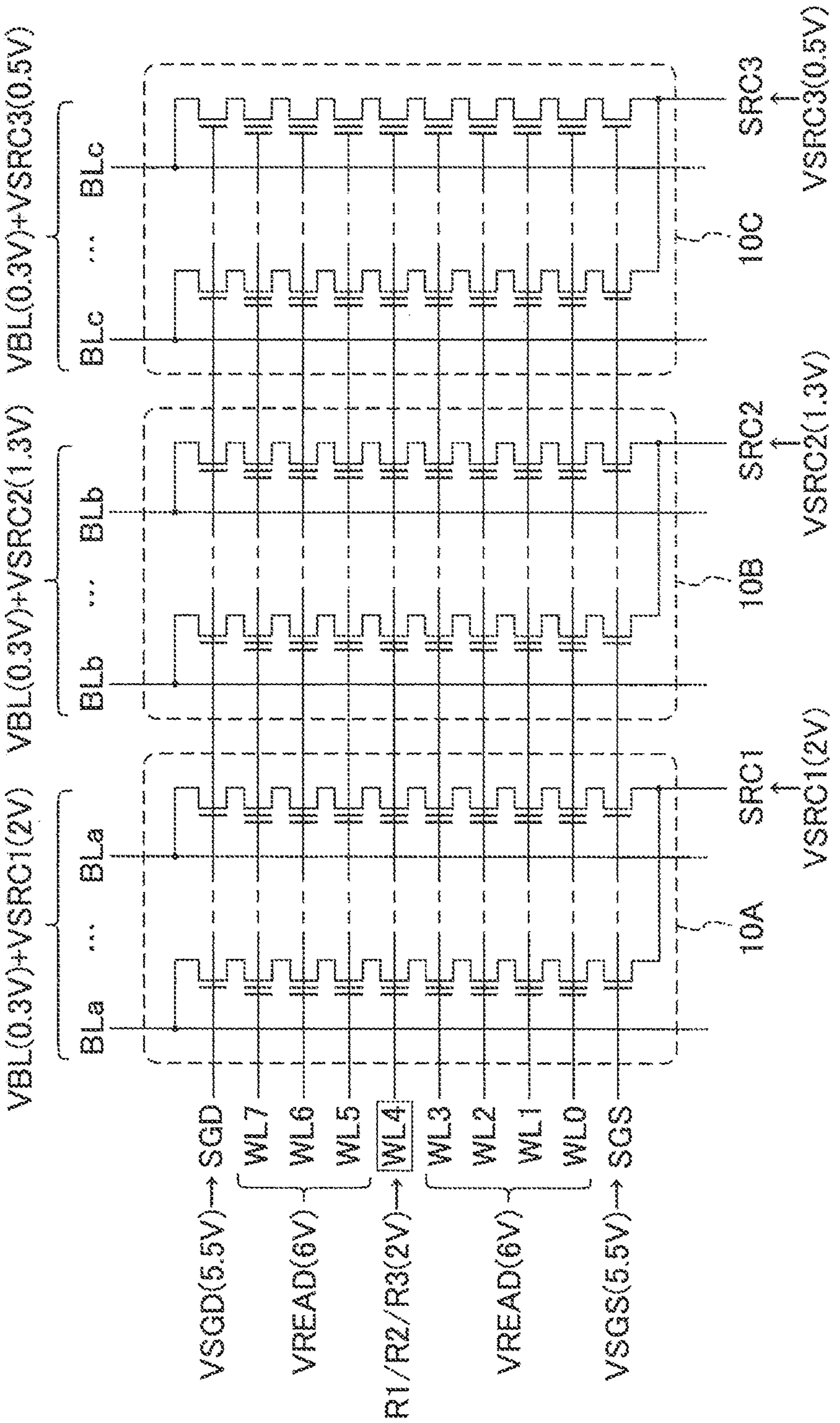
FIG. 105 is a schematic diagram showing an example of voltages applied during a read operation in the semiconductor memory device according to a first modification of the 12th embodiment.

For example, as shown in FIG. 105, if the semiconductor memory device 1 includes three memory cell arrays 10A, 10B, and 10C to which the source lines SRC1, SRC2, and SRC3 and bit lines BLa, BLb, and BLc are respectively coupled, it is possible to simultaneously perform read operations for three or more thresholds by using combinations of three types of source line voltages and bit line voltages, and the read results can be combined to obtain read data. The bit lines BLa, BLb, and BLc herein are a plurality of bit lines coupled to the memory cell transistors included in each of the memory cell arrays 10A, 10B, and 10C.

Figure 106:
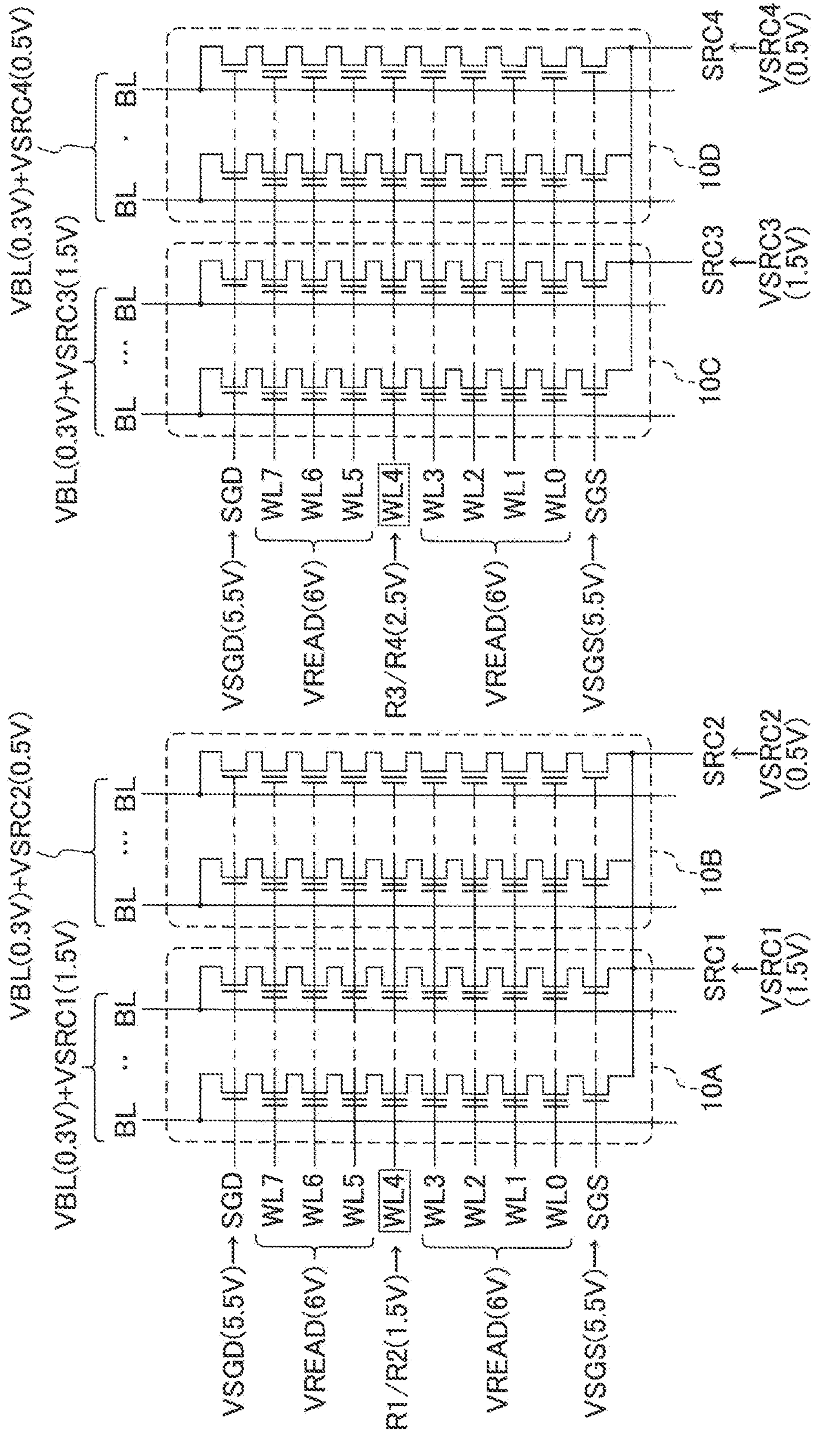
FIG. 106 is a schematic diagram showing an example of voltages applied during a read operation in the semiconductor memory device according to a second modification the 12th embodiment.
Figure 107:
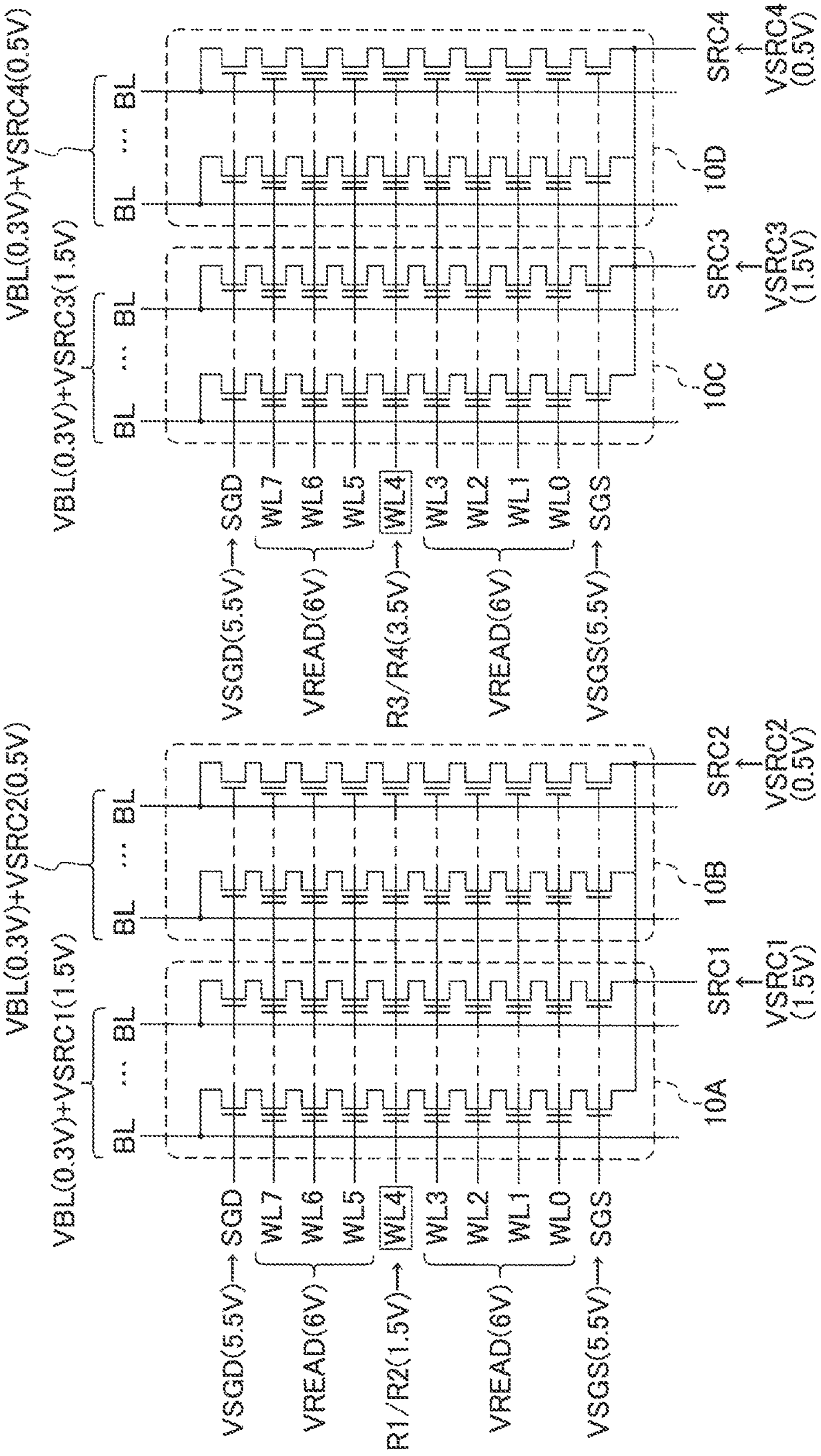
FIG. 107 is a schematic diagram showing an example of voltages applied during a read operation in the semiconductor memory device according to a second modification the 12th embodiment.

For example, as shown in FIGS. 106 and 107, if the semiconductor memory device 1 includes four memory cell arrays 10A, 10B, 10C, and 10D to which the source lines SRC1, SRC2, SRC3, and SRC4 and bit lines BLa, BLb, BLc, and BLd are respectively coupled, it is possible to simultaneously perform read operations for four or more thresholds by using combinations of different types of source line voltages and bit line voltages, and the read results can be combined to obtain read data. The bit lines BLa, BLb, BLc, and BLd described herein are a plurality of bit lines coupled to the memory cell transistors included in each of the memory cell arrays 10A, 10B, 10C, and 10D.

Other than that, the 12th embodiment may be combined with any one of the first to 11th embodiments. Furthermore, the 12th embodiment can be combined with each of the embodiments disclosed in U.S. patent application Ser. No. 16/123,162 entitled "Semiconductor Memory", filed on Sep. 6, 2018, and in U.S. patent application Ser. No. 16/724,100 entitled "Semiconductor Memory", filed on Dec. 20, 2019. The entire contents of these applications are incorporated herein by reference.

[13] 13th Embodiment

In the semiconductor memory device 1 according to the 13th embodiment, two storage areas to which two different types of 7 bit/2 cell share coding are applied are combined so as to make the page sizes of the read pages uniform.

The semiconductor memory device 1 of the 13th embodiment includes four memory cell arrays 10A, 10B, 10C, and 10D to which source lines SRC1, SRC2, SRC3, SRC4, and the bit lines BLa, BLb, BLc, and BLd are respectively coupled, similarly to FIG. 107 described with reference to the 12th embodiment.

Figure 108:
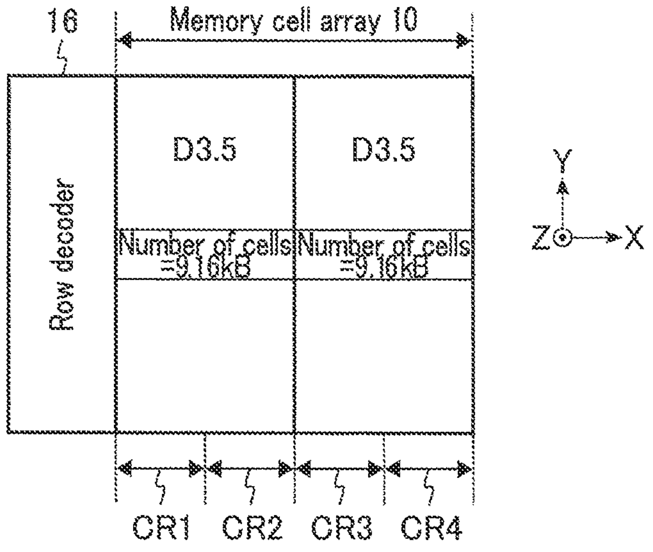
FIG. 108 is a block diagram showing an example of a configuration of a memory cell array included in the semiconductor memory device according to a 13th embodiment.

FIG. 108 shows an example of a layout of the storage areas of the memory cell array 10 included in the semiconductor memory device 1 according to the 13th embodiment. As shown in FIG. 108, the memory cell array 10 of the 11th embodiment includes a first area CR1, a second area CR2, a third area CR3, and a fourth area CR4 arranged in the X direction.

The first area CR1 and the second area CR2 respectively correspond to the source lines SRC1 and SRC2, and the third area CR3 and the fourth area CR4 respectively correspond to the source lines SRC3 and SRC4, and different types of 7 bit/2 cell share coding (D3.5) are applied as shown in FIG. 109.

For example, a single word line WL is coupled to at least 4.58 k memory cell transistors MT in the first area CR1 (the number of cells=4.58 kB), at least 4.58 k memory cell transistors MT in the second area CR2 (the number of cells=4.58 kB), which is 9.16 k memory cell transistors MT in total (the number of cells=9.16 kB). Another single word line WL is coupled to at least 4.58 k memory cell transistors MT in the third area CR3 (the number of cells=4.58 kB), at least 4.58 k memory cell transistors MT in the fourth area CR4 (the number of cells=4.58 kB), which is 9.16 k memory cell transistors in total (the number of cells=9.16 kB).

The word lines coupled to the memory cell transistors MT in the first area CR1 and the second area CR2 and the word lines coupled to the memory cell transistors MT in the third area CR3 and the fourth area CR4 may be separated; or the word lines may be shared and the voltages applied to the source lines and bit lines corresponding to the first area CR1 and the second area CR2 may be differentiated from the voltages applied to the source lines and bit lines corresponding to the third area CR3 and the fourth area CR4. In the following, the case wherein the word lines coupled to the memory cell transistors MT in the first area CR1 and the second area CR2 are separated from the word lines coupled to the memory cell transistors MT in the third area CR3 and the fourth area CR4 will be described.

Figure 110:
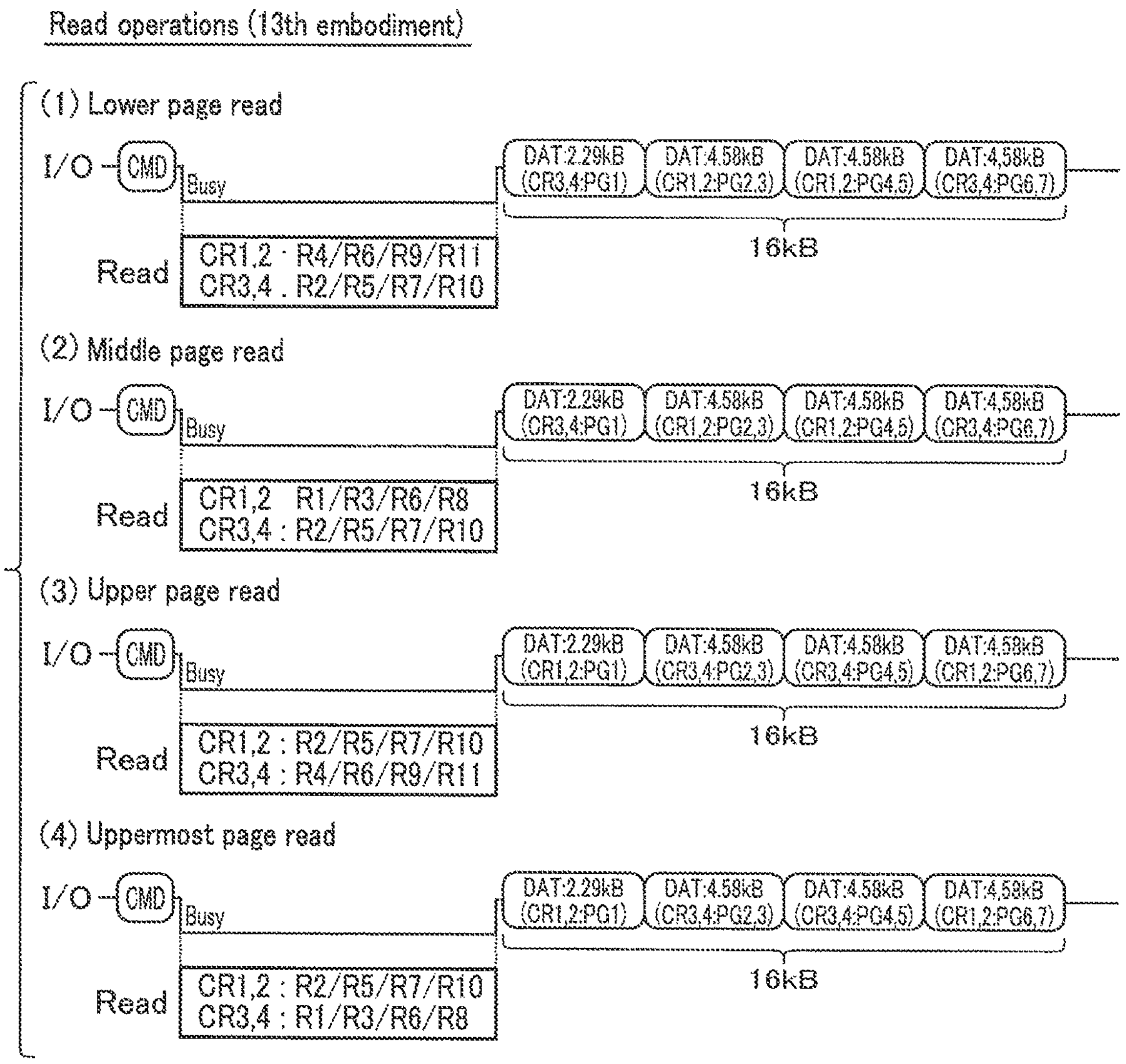
FIG. 110 is a schematic diagram showing an example of a flow of a read operation for each page in the semiconductor memory device according to the 13th embodiment.

FIG. 110 shows an example of a flow of a read operation for each page in the semiconductor memory device 1 according to the 11th embodiment. As shown in FIG. 110, the semiconductor memory device 1 according to the 13th embodiment is capable of performing a read operation for each page of four-page data based on an instruction from the memory controller 2. FIG. 110 corresponds to a lower-page read operation, a middle-page read operation, an upper-page read operation, and an uppermost-page read operation.

In the lower-page read operation, for example, the read voltages R4, R6, R9, and R11 are sequentially applied to the selected word lines WL in the first area CR1 and the second area CR2, and the read voltages R2, R5, R7, and R10 are sequentially applied to the selected word lines WL in the third area CR3 and the fourth area CR4. At this time, the voltages applied to the source lines and the voltages applied to the bit lines may be changed, whereas the voltages applied to the word lines remain the same. When the read operation is completed, data of page PG1 in the first coding of the third area CR3 and the fourth area CR4, data of pages PG2 and PG3 in the first coding of the first area CR1 and the second area CR2, data of pages PG4 and PG5 in the second coding of the first area CR1 and the second area CR2, and data of pages PG6 and PG7 in the second coding of the third area CR3 and the fourth area CR4 are confirmed. These data items are combined and output as lower page data of 16 kB.

The data of page PG1 in the first coding of the third area CR3 and the fourth area CR4 is confirmed by a read operation using a voltage of a single level (the read voltage R4). For this reason, a voltage of a level close to the read voltage R4 among the read voltages R2, R5, R7, and R10 applied to a selected word line WL in the third area CR3 and the fourth area CR4, for example the read voltage R5, is applied, and data can be read by changing the voltages applied to the source lines and the voltages applied to the bit lines.

In the middle-page read operation, for example, the read voltages R1, R3, R6, and R8 are sequentially applied to the selected word lines WL in the first area CR1 and the second area CR2, and the read voltages R2, R5, R7, and R10 are sequentially applied to the selected word lines WL in the third area CR3 and the fourth area CR4. At this time, the voltages applied to the source lines and the voltages applied to the bit lines may be changed, whereas the voltages applied to the word lines remain the same. When the read operation is completed, data of page PG1 in the first coding of the third area CR3 and the fourth area CR4, data of pages PG2 and PG3 in the first coding of the first area CR1 and the second area CR2, data of pages PG4 and PG5 in the second coding of the first area CR1 and the second area CR2, and data of pages PG6 and PG7 in the second coding of the third area CR3 and the fourth area CR4 are confirmed. These data items are combined and output as middle page data of 16 kB.

The data of page PG1 in the second coding of the third area CR3 and the fourth area CR4 is confirmed by a read operation using a voltage of the single level (the read voltage R8). For this reason, a voltage of a level close to the read voltage R4 among the read voltages R2, R5, R7, and R10 applied to a selected word line WL in the third area CR3 and the fourth area CR4, for example the read voltage R7, is applied, and data can be read by changing the voltages applied to the source lines and the voltages applied to the bit lines.

In the upper-page read operation, for example, the read voltages R2, R5, R7, and R10 are sequentially applied to the selected word lines WL in the first area CR1 and the second area CR2, and the read voltages R4, R6, R9, and R11 are sequentially applied to the selected word lines WL in the third area CR3 and the fourth area CR4. At this time, the voltages applied to the source lines and the voltages applied to the bit lines may be changed, whereas the voltages applied to the word lines remain the same. When the read operation is completed, data of page PG1 in the second coding of the first area CR1 and the second area CR2, data of pages PG2 and PG3 in the first coding of the third area CR3 and the fourth area CR4, data of pages PG4 and PG5 in the second coding of the third area CR3 and the fourth area CR4, and data of pages PG6 and PG7 in the first coding of the first area CR1 and the second area CR2 are confirmed. These data items are combined and output as upper page data of 16 kB.

The data of page PG1 in the second coding of the first area CR1 and the second area CR2 is confirmed by a read operation using a voltage of a single level (the read voltage R8). For this reason, a voltage of a level close to the read voltage R4 among the read voltages R2, R5, R7, and R10 applied to a selected word line WL in the first area CR1 and the second area CR2, for example the read voltage R7, is applied, and data can be read by changing the voltages applied to the source lines and the voltages applied to the bit lines.

In the uppermost-page read operation, for example, the read voltages R2, R5, R7, and R10 are sequentially applied to the selected word lines WL in the first area CR1 and the second area CR2, and the read voltages R1, R3, R6, and R8 are sequentially applied to the selected word lines WL in the third area CR3 and the fourth area CR4. At this time, the voltages applied to the source lines and the voltages applied to the bit lines may be changed, whereas the voltages applied to the word lines remain the same. When the read operation is completed, data of page PG1 in the first coding of the first area CR1 and the second area CR2, data of pages PG2 and PG3 in the second coding of the third area CR3 and the fourth area CR4, data of pages PG4 and PG5 in the first coding of the third area CR3 and the fourth area CR4, and data of pages PG6 and PG7 in the second coding of the first area CR1 and the second area CR2 are confirmed. These data items are combined and output as uppermost page data of 16 kB.

The data of page PG1 in the first coding of the first area CR1 and the second area CR2 is confirmed by a read operation using a voltage of a single level (the read voltage R4). For this reason, a voltage of a level close to the read voltage R4 among the read voltages R2, R5, R7, and R10 applied to a selected word line WL in the first area CR1 and the second area CR2, for example the read voltage R5, is applied, and data can be read by changing the voltages applied to the source lines and the voltages applied to the bit lines.

If the source lines in the first area CR1 and the second area CR2 are shared (the voltages applied to the source lines are the same) and the source lines in the third area CR3 and the fourth area CR4 are shared (the voltages applied to the source lines are the same), the read operations respectively for lower page data, middle page data, upper page data, and uppermost page data are as follows.

The word lines coupled to the memory cell transistors MT in the first area CR1 and the second area CR2 and the word lines coupled to the memory cell transistors MT in the third area CR3 and the fourth area CR4 may be divided; or the word lines may be shared and the voltages applied to the source lines and bit lines corresponding to the first area CR1 and the second area CR2 may be differentiated from the voltages applied to the source lines and bit lines corresponding to the third area CR3 and the fourth area CR4. In the following, the case wherein the word lines coupled to the memory cell transistors MT in the first area CR1 and the second area CR2 are separated from the word lines coupled to the memory cell transistors MT in the third area CR3 and the fourth area CR4 will be described.

In the lower-page read operation, for example, the read voltages R4, R6, R9, and R11 are sequentially applied to the word lines WL in the first area CR1 and the second area CR2, and the read voltages R2, R5, R7, and R10 are sequentially applied to the word lines WL in the third area CR3 and the fourth area CR4, and the data of page PG1 read based on the first coding in the memory cell arrays of the first area CR1 and the second area CR2 are transferred to the memory cell arrays of the third area CR3 and the fourth area CR4.

In the middle-page read operation, for example, the read voltages R1, R3, R6, and R8 are sequentially applied to the word lines WL in the first area CR1 and the second area CR2, and the read voltages R2, R5, R7, and R10 are sequentially applied to the word lines WL in the third area CR3 and the fourth area CR4, and the data of page PG1 read based on the second coding in the memory cell arrays of the first area CR1 and the second area CR2 are transferred to the memory cell arrays of the third area CR3 and the fourth area CR4.

In the upper-page read operation, for example, the read voltages R2, R5, R7, and R10 are sequentially applied to the word lines WL in the first area CR1 and the second area CR2, and the read voltages R4, R6, R9, and R11 are sequentially applied to the word lines WL in the third area CR3 and the fourth area CR4, and the data of page PG1 read base on the first coding in the memory cell arrays of the third area CR3 and the fourth area CR4 are transferred to the memory cell arrays of the first area CR1 and the second area CR2.

In the uppermost-page read operation, for example, the read voltages R2, R5, R7, and R10 are sequentially applied to the word lines WL in the first area CR1 and the second area CR2, and the read voltages R1, R3, R6, and R8 are sequentially applied to the word lines WL in the third area CR3 and the fourth area CR4, and the data of page PG1 read based on the second coding in the memory cell arrays of the third area CR3 and the fourth area CR4 are transferred to the memory cell arrays of the first area CR1 and the second area CR2.

[13-1] Modification of 13th Embodiment

The semiconductor memory device 1 of the 13th embodiment may have two row decoder modules 16A and 16B.

Figure 111:
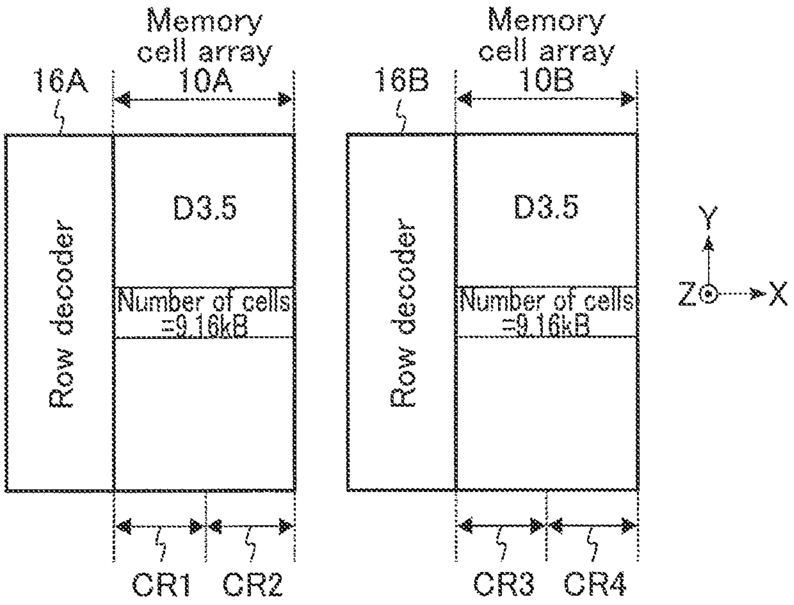
FIG. 111 is a block diagram showing an example of a configuration of a memory cell array included in the semiconductor memory device according to a first modification of the 13th embodiment.

FIG. 111 shows an example of a layout of the storage areas of memory cell arrays 10A and 10B included in the semiconductor memory device 1 according to a modification of the 13th embodiment.

As shown in FIG. 108, the memory cell array 10 of the 13th embodiment includes a first area CR1, a second area CR2, a third area CR3, and a fourth area CR4 arranged in the X direction. On the other hand, the semiconductor memory device 1 according to the modification of the 13th embodiment includes the memory cell array 10A in which the first area CR1 and the second area CR2 are arranged in the X direction, and the memory cell array 10B in which the third area CR3 and the fourth area CR4 are arranged in the X direction. The row decoder module 16A is provided correspondingly with the memory cell array 10A, and the row decoder module 16B is provided correspondingly with the memory cell array 10B. That is, the word lines coupled to the memory cell transistors MT in the first area CR1 and the second area CR2 and the word lines coupled to the memory cell transistors MT in the third area CR3 and the fourth area CR4 are divided and controlled by the respective row decoder modules 16A and 16B.

[14] Others

The first embodiment shows the case where multiple-bit data is stored in a combination of a memory cell transistor MTa in plane PL1 and a memory cell transistor MTh in plane PL2; however, the embodiment is not limited thereto. The first embodiment may be applied to the case where multiple-bit data is stored in a combination of memory cell transistors MTa and MTb coupled to a shared word line WL.

The sense amplifier set SAS described in the eighth and ninth modifications of the second embodiment is applicable to the other embodiments. For example, the sense amplifier set SAS may be provided for the first area CR1 in the third through fifth embodiments. Similarly, the sense amplifier set SAS may be provided for each of the first area CR1 and the second area CR2 in the sixth through ninth embodiments.

The layout of the first area CR1 and the second area CR2 described in each of the third through fifth embodiments is merely an example. Any type of memory cell array 10 is sufficient as long as it includes at least the second area CR2; for example, it may be arranged between the first area CR1 and the row decoder module 16, or the second area CR2 may be inserted within the first area CR1. Similarly, the setting of the areas CR described in each of the sixth through eleventh embodiments is merely an example. The areas CR in these embodiments may not necessarily distinguishably separated. For example, each area CR may be arranged in a striped pattern, or an area may be inserted between two areas CR separated from each other. Each area CR may be freely arranged as long as the operations described in each of the third through eleventh embodiments can be performed.

In the definitions of page data in the first through ninth embodiments, the definitions "1" and "0" assigned to read data from some or all pages may be interchangeable. The configurations and operations described in each of the third through ninth embodiments are applicable to the case where the page size is 16 kB or smaller. For example, the page size may be 8 kB or 32 kB. Even in such cases, a page is formed in a desired size by appropriately changing the number of couplings between a single word line WL and the memory cell transistors MT in the first area CR1 and the number of couplings between the same single word line WL and the memory cell transistors MT in the second area CR2.

In the foregoing embodiments, data allocation corresponding to each page may be changed as appropriate. For example, in the first embodiment, the data allocation applied to the second page and the data allocation applied to the third page may be interchanged. Data allocation for other pages is also interchangeable. Even in such a case, by courtesy of the setting of an optimal read voltage for each page, it is possible to store data in a manner similar to the foregoing embodiments.

In a read operation for each page in the foregoing embodiments, if a read voltage is not allocated, the logic circuit 18 treats data in a corresponding portion as fixed as “1” or “0”. It is thereby possible for the logic circuit 18 to perform the decoding process as described in each of the foregoing embodiments.

In the second embodiment, the case where multiple-bit data is stored in a combination of memory cell transistors MTa and MTb in plane PL1 and memory cell transistors MTc and MTd in plane PL2 was described; however, the embodiment is not limited thereto. The second embodiment may be applied to the case where multiple-bit data is stored in a combination of memory cell transistors MTa, MTh, MTc, and MTd coupled to a common word line WL.

In the foregoing embodiments, there may be a combination not used for data storage in combinations of multiple threshold voltages of memory cell transistors MT. For example, in 5 bit/2 cell share coding in the third embodiment, four combinations may be excess. In 7 bit/2 cell share coding in the fourth embodiment, 16 combinations may be excess. In 9 bit/2 cell share coding in the fifth embodiment, 64 combinations may be excess. The semiconductor memory device 1 may use these excess combinations to store some kind of data. For example, data indicating defects of a memory cell transistor MT or secret data may be stored in such excess combinations.

In the read operation in each of the foregoing embodiments, a voltage to be applied to a selected word line WL is, for example, the same as the voltage of a signal line CG that supplies voltages to the row decoder module 16 from the driver circuit 15. In other words, voltages applied to the lines and a period during which each of the voltages is applied can be roughly known by checking a voltage of a signal line CG corresponding to a line. To estimate voltages applied to the select gate lines and word lines, etc., based on the voltages applied to each signal line coupled to the driver circuit 15, a voltage drop occurring due to a transistor TR included in a row decoder RD may be considered. In this case, the voltages applied to each of the select gate lines and word lines will be lowered by an amount of a voltage drop occurring due to the transistor TR, compared to the voltages applied to the signal lines respectively corresponding to those lines.

In the read operation in each of the foregoing embodiments, the semiconductor memory device 1 may change the read voltages applied to a selected word line WL from a low level to a high level or from a high level to a low level. The order of outputting the read voltages may be changed as appropriate. The semiconductor memory device 1 is capable of reading data from the memory cell transistors MT in all cases. The various types of coding and share coding explained in the foregoing embodiments are merely examples. The above-described configurations and operations are applicable to any type of coding and share coding.

In the 3rd to 10th embodiments, the page size of each page is made uniform to be 16 kB (or 8 k B, or 32 kB), whereas the number of bit lines provided in each memory cell array and the number of sense amplifiers coupled to the bit lines are smaller than the page size (the number of bits included in each page). For this reason, the read data is distributed among the latch circuits SDL, ADL, BDL, CDL, and DDL shown in FIG. 5, for example. Furthermore, since it is not possible to store all read data in the latch circuit XDL as a cache memory, if the read data is transferred from the latch circuit XDL to the logic circuit 18, a part of the read data is first moved from one of the latch circuits SDL, ADL, BDL, CDL, or DDL to the latch circuit XDL, and the moved part is then transferred to the logic circuit 18 and output to the memory controller 20. For example, assuming that half of the latch circuits XDL constitute Group 1 and the other half constitute Group 2, data in the latch circuits XDL of Group 1 is externally output. After externally outputting the data in the latch circuits XDL of Group 1, data in the latch circuits XDL of Group 2 is externally output and the remaining read data in one of the latch circuits SDL, ADL, BDL, CDL, or DDL is moved to the latch circuits XDL of Group 1. After externally outputting the data in the latch circuits XDL of Group 2, the data in the latch circuits XDL of Group 1 is externally output. Similarly, in the third to 11th embodiments, when write data is externally input, first a portion of write data is input into the latch circuits XDL of Group 1. After inputting data into the latch circuits XDL of Group 1, another portion of write data is input into the latch circuits XDL of Group 2 and the data is moved from the latch circuits XDL of Group 1 to one of the latch circuits SDL, ADL, BDL, CDL, or DDL. After inputting data into the latch circuits XDL of Group 2, the remaining write data is input into the latch circuits XDL of Group 1.

In the foregoing embodiments, each of the commands “01h” through “08h”, “xxh”, “xyh”, “xzh”, and “yxh” used in the explanations may be replaced with other command as appropriate. In the foregoing embodiments, examples in which commands “01h” through “08h” as commands for instructing operations corresponding to the first to eighth pages are described; however, the commands “01h” through “08h” may be replaced with other commands as appropriate. The commands that designate read pages may be omitted if page information is included in address information ADD.

The configuration of the memory cell array 10 in each of the above-described embodiments may be a different configuration. Other configurations of the memory cell array 10 are described in U.S. patent application Ser. No. 12/407,403, entitled “THREE-DIMENSIONAL STACKED NON-VOLATILE SEMICONDUCTOR MEMORY”, filed on Mar. 19, 2009; U.S. patent application Ser. No. 12/406,524, entitled “THREE-DIMENSIONAL STACKED NON-VOLATILE SEMICONDUCTOR MEMORY”, filed on Mar. 18, 2009; U.S. patent application Ser. No. 12/679,991, entitled “NONVOLATILE SEMICONDUCTOR MEMORY DEVICE AND MANUFACTURING METHOD THEREOF”, filed on Mar. 25, 2010; and U.S. patent application Ser. No. 12/532,030, entitled “SEMICONDUCTOR MEMORY AND MANUFACTURING METHOD THEREOF”, filed on Mar. 23, 2009. The entire contents of these applications are incorporated herein by reference.

In the foregoing embodiments, the memory cell transistors MT provided in the memory cell array 10 are three-dimensionally stacked; however, the embodiments are not limited to this example. For example, the semiconductor memory device 1 may be a flat NAND flash memory in which memory cell transistors MT are two-dimensionally arranged. Even in such a configuration, the above embodiments can be realized, and similar advantageous effects can be achieved.

In the foregoing embodiments, a block BLK does not have to be a unit of erasure. Other erase operations are described in U.S. patent application Ser. No. 13/235,389, entitled "NONVOLATILE SEMICONDUCTOR MEMORY DEVICE", filed on Sep. 18, 2011, and U.S. patent application Ser. No. 12/694,690, entitled "NON-VOLATILE SEMICONDUCTOR MEMORY DEVICE", filed on Jan. 27, 2010. The entire contents of these applications are incorporated herein by reference.

In the present description, the term "coupled" means an electrical coupling, and does not exclude a coupling with an element being interposed in the coupling, for example. In the present description, "off state" refers to a state in which a voltage less than a threshold voltage of a transistor is applied to a gate of the transistor, and does not exclude a state in which a microcurrent, such as a leakage current in a transistor, flows in the gate.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a plurality of first memory cells and a plurality of second memory cells, a threshold voltage of each of the plurality of first memory cells and the plurality of second memory cells being included in one of a first state, a second state, a third state, a fourth state, a fifth state, a sixth state, a seventh state, an eighth state, a ninth state, a tenth state, an eleventh state, a twelfth state, a thirteenth state, a fourteenth state, a fifteenth state, or a sixteenth state, and the states being set from low to high voltages;

a first memory cell array that includes the plurality of first memory cells;

a second memory cell array that includes the plurality of second memory cells;

a first word line coupled to the plurality of first memory cells;

a second word line coupled to the plurality of second memory cells;

an input/output circuit that communicates between the semiconductor memory device and an external device;

a driver circuit;

a row decoder module; and a logic circuit provided between the first and second memory cell arrays and the input/output circuit, wherein:

the semiconductor memory device stores 8-bit data that includes a first bit, a second bit, a third bit, a fourth bit, a fifth bit, a sixth bit, a seventh bit, and an eighth bit using a combination of a threshold voltage of the first memory cell and a threshold voltage of the second memory cell, and the driver circuit and the row decoder module apply, in parallel, a plurality of types of read voltages to each of the first word line and the second word line, and the input/output circuit externally outputs data confirmed by the logic circuit based on first data read from the first memory cells and second data read from the second memory cells, in each of a read operation for a first page that includes the first bit, a read operation for a second page that includes the second bit, a read operation for a third page that includes the third bit, a read operation for a fourth page that includes the fourth bit, a read operation for a fifth page that includes the fifth bit, a read operation for a sixth page that includes the sixth bit, a read operation for a seventh page that includes the seventh bit, and a read operation for an eighth page that includes the eighth bit.

2. The device of claim 1, wherein the driver circuit and the row decoder module:

apply two types of read voltages to each of the first word line and the second word line in the read operation for the first page;

apply two types of read voltages to each of the first word line and the second word line in the read operation for the second page;

apply two types of read voltages to each of the first word line and the second word line in the read operation for the third page;

apply three types of read voltages to each of the first word line and the second word line in the read operation for the fourth page;

apply three types of read voltages to each of the first word line and the second word line in the read operation for the fifth page;

apply three types of read voltages to the first word line and two types of read voltages to the second word line in the read operation for the sixth page;

apply two types of read voltages to the first word line and three types of read voltages to the second word line in the read operation for the seventh page; and apply two types of read voltages to the first word line and three types of read voltages to the second word line in the read operation for the eighth page.

3. The device of claim 2, wherein:

the two types of read voltages applied to the second word line in the read operation for the first page are the same as the two types of read voltages applied to the second word line in the read operation for the sixth page, the two types of read voltages applied to the first word line in the read operation for the second page are the same as the two types of read voltages applied to the first word line in the read operation for the seventh page, the two types of read voltages applied to the first word line in the read operation for the third page are the same as the two types of read voltages applied to the first word line in the read operation for the eighth page, and the three types of read voltages applied to the second word line in the read operation for the fourth page are the same as the three types of read voltages applied to the second word line in the read operation for the fifth page.

4. The device of claim 1, wherein the logic circuit confirms the data to be externally output based on decoding rules allocated to four combinations made of "0" or "1"-bit data read as the first data and "0" or "1"-bit data read as the second data.

5. The device of claim 1, further comprising:

a sense amplifier provided between the first and second memory cell arrays and the logic circuit; and a bus connecting between the sense amplifier and the logic circuit.

6. The device of claim 5, wherein:

the sense amplifier comprises a first sense amplifier and a second sense amplifier, the first sense amplifier is provided between the first memory cell array and the logic circuit, the second sense amplifier is provided between the second memory cell array and the logic circuit, and the bus comprises a first bus provided between the first sense amplifier and the logic circuit and a second bus provided between the second sense amplifier and the logic circuit.

7. The device of claim 6, further comprising a switch provided between the first bus and the second bus, wherein the first sense amplifier is switchably connectable to the second sense amplifier via the switch.

* * * * *